United States Patent
Stiblert et al.

(10) Patent No.: US 8,122,846 B2
(45) Date of Patent: Feb. 28, 2012

(54) PLATFORMS, APPARATUSES, SYSTEMS AND METHODS FOR PROCESSING AND ANALYZING SUBSTRATES

(75) Inventors: Lars Stiblert, Göteborg (SE); Torbjörn Sandström, Pixbo (SE); Jarek Luberek, Mölndal (SE); Tomas Lock, Göteborg (SE)

(73) Assignee: Micronic Mydata AB, Taby (SE)

( * ) Notice: Subject to any disclaimer, the term of this patent is extended or adjusted under 35 U.S.C. 154(b) by 1001 days.

(21) Appl. No.: 11/711,895

(22) Filed: Feb. 28, 2007

(65) Prior Publication Data
US 2008/0032066 A1 Feb. 7, 2008

Related U.S. Application Data

(63) Continuation-in-part of application No. 11/586,612, filed on Oct. 26, 2006, and a continuation-in-part of application No. 11/586,614, filed on Oct. 26, 2006.

(60) Provisional application No. 60/730,009, filed on Oct. 26, 2005, provisional application No. 60/776,919, filed on Feb. 28, 2006.

(51) Int. Cl.
 B05B 7/00 (2006.01)
 B05B 5/00 (2006.01)
 H05B 6/00 (2006.01)
 B41J 2/435 (2006.01)
 G01B 11/24 (2006.01)

(52) U.S. Cl. ........ 118/300; 118/305; 427/595; 347/248; 347/234; 356/601

(58) Field of Classification Search ............ 118/669, 118/300; 427/595; 347/248, 234; 356/601
See application file for complete search history.

(56) References Cited

U.S. PATENT DOCUMENTS

| | | | |
|---|---|---|---|
| 4,131,782 A | 12/1978 | Einstein et al. |
| 4,322,600 A | 3/1982 | Crahay |
| 4,377,736 A | 3/1983 | Daunt et al. |
| 4,533,813 A | 8/1985 | Rayburn et al. |
| 4,628,179 A | 12/1986 | Crahay |
| 4,652,722 A | 3/1987 | Stone et al. |
| 4,758,705 A | 7/1988 | Hertzel et al. |
| 4,806,731 A | 2/1989 | Bragard et al. |

(Continued)

FOREIGN PATENT DOCUMENTS

EP 0 157 546 3/1985
(Continued)

OTHER PUBLICATIONS

U.S. Office Action dated Jun. 17, 2010 for U.S. Appl. No. 11/586,614.

(Continued)

*Primary Examiner* — Dah-Wei Yuan
*Assistant Examiner* — Charles Capozzi
(74) *Attorney, Agent, or Firm* — Harness, Dickey & Pierce, P.L.C.

(57) ABSTRACT

Devices and methods for manufacturing displays, solar panels and other devices using larger size workpieces are provided. The workpiece is rolled into a cylinder, thereby reducing the physical size by a factor of 3 in one dimension. The stages on which the workpieces are rolled have a cylindrical shape, which allows a more robust and/or compact movement of the glass, reduced machine weight. The workpieces are relatively thin, more flexible, and are rolled onto a cylinder with a diameter of about 1 meter.

22 Claims, 102 Drawing Sheets

U.S. PATENT DOCUMENTS

| | | | | |
|---|---|---|---|---|
| 4,905,025 A | * | 2/1990 | Sakamoto et al. | 347/132 |
| 4,977,458 A | | 12/1990 | Granger et al. | |
| 5,065,193 A | | 11/1991 | Saitoh et al. | |
| 5,147,680 A | | 9/1992 | Slysh | |
| 5,247,155 A | | 9/1993 | Steen et al. | |
| 5,278,385 A | * | 1/1994 | Gerome et al. | 219/121.68 |
| 5,296,036 A | | 3/1994 | Matsuyama et al. | |
| 5,402,155 A | | 3/1995 | Hatayama et al. | |
| 5,495,279 A | | 2/1996 | Sandstrom | |
| 5,535,672 A | * | 7/1996 | Kuwahara | 101/170 |
| 5,663,783 A | | 9/1997 | Ueda | |
| 5,668,588 A | | 9/1997 | Morizumi et al. | |
| 5,868,075 A | | 2/1999 | Kline et al. | |
| 6,066,830 A | | 5/2000 | Cline et al. | |
| 6,130,405 A | | 10/2000 | Loringer | |
| 6,151,109 A | | 11/2000 | Bromssen et al. | |
| 6,542,178 B2 | | 4/2003 | Miyagawa et al. | |
| 6,586,702 B2 | | 7/2003 | Wiener-Avnear et al. | |
| 6,625,181 B1 | | 9/2003 | Oshemkov et al. | |
| 6,717,756 B2 | | 4/2004 | Berman et al. | |
| 6,822,192 B1 | | 11/2004 | Young | |
| 6,847,433 B2 | * | 1/2005 | White et al. | 355/72 |
| 6,900,826 B2 | * | 5/2005 | Williams et al. | 347/248 |
| 7,098,993 B2 | | 8/2006 | Fujii et al. | |
| 7,289,137 B2 | | 10/2007 | Liebig et al. | |
| 2001/0046053 A1 | * | 11/2001 | Hill | 356/496 |
| 2002/0180988 A1 | | 12/2002 | Johnston et al. | 356/602 |
| 2003/0218667 A1 | * | 11/2003 | Williams et al. | 347/169 |
| 2004/0081499 A1 | | 4/2004 | Sasaki | |
| 2004/0150707 A1 | * | 8/2004 | Stiblert et al. | 347/224 |
| 2005/0018255 A1 | | 1/2005 | Nakaya et al. | |
| 2005/0052464 A1 | | 3/2005 | Okuyama | |
| 2005/0082496 A1 | * | 4/2005 | Bjuggren et al. | 250/492.1 |
| 2005/0104952 A1 | * | 5/2005 | Haushahn et al. | 347/224 |
| 2005/0104953 A1 | | 5/2005 | Suzuki et al. | |
| 2006/0092199 A1 | * | 5/2006 | White et al. | 347/9 |

FOREIGN PATENT DOCUMENTS

| | | |
|---|---|---|
| EP | 1 132 776 | 9/2001 |
| EP | 1 645 657 | 4/2006 |
| EP | 1 582 928 | 2/2008 |
| JP | 60-227988 | 11/1985 |
| JP | 7-72401 | 3/1995 |
| JP | 7-101032 | 4/1995 |
| JP | 9-27447 | 1/1997 |
| JP | 2001-523167 | 11/2001 |
| JP | 2001-524893 | 12/2001 |
| JP | 2002-311597 | 10/2002 |
| JP | 2002-543607 | 12/2002 |
| JP | 2003-195470 | 7/2003 |
| JP | 2004-175078 | 6/2004 |
| JP | 2004-191985 | 7/2004 |
| JP | 2004-524706 | 8/2004 |
| JP | 2004-351938 | 12/2004 |
| JP | 2005-43555 | 2/2005 |
| JP | 2005-55524 | 3/2005 |
| JP | 4-501798 | 7/2010 |
| WO | WO 9006033 | 5/1990 |
| WO | WO 9850196 | 11/1998 |
| WO | WO 9852345 | 11/1998 |
| WO | WO 00/62324 | 10/2000 |
| WO | WO 0067291 | 11/2000 |
| WO | WO 02082598 | 10/2002 |
| WO | WO 03/081966 | 10/2003 |
| WO | WO 2005/007927 | 1/2005 |

OTHER PUBLICATIONS

Elizur et al., "Printing Methods for Flat-Panel Display Manufacturing" J. of Graphic Tech. Aug. 2003.

Leterrier et al., "Mechanical properties of transparent functional thin films for flexible displays" 46th Annual Tech. Conf. Proc. (2003), ISSN 0737-5921.

International Preliminary Report on Patentability dated Aug. 19, 2008 for International Application No. PCT/EP2007/001725.

U.S. Office Action from related U.S. Appl. No. 11/586,612 dated Nov. 1, 2010.

Office Action issued in U.S. Appl. No. 11/586,612 dated May 3, 2011.

Office Action issued in related U.S. Appl. No. 11/586,614 dated Dec. 22, 2010.

Japanese Office Action dated Aug. 30, 2011, issued in Japanese Patent Application No. 2008-537641.

Japanese Office Action dated Aug. 30, 2011, issued in Japanese Patent Application No. 2008-537640.

U.S. Office Action dated Sep. 28, 2011, issued in co-pending U.S. Appl. No. 11/586,612.

U.S. Office Action dated Sep. 29, 2011, issued in co-pending U.S. Appl. No. 12/805,708.

* cited by examiner

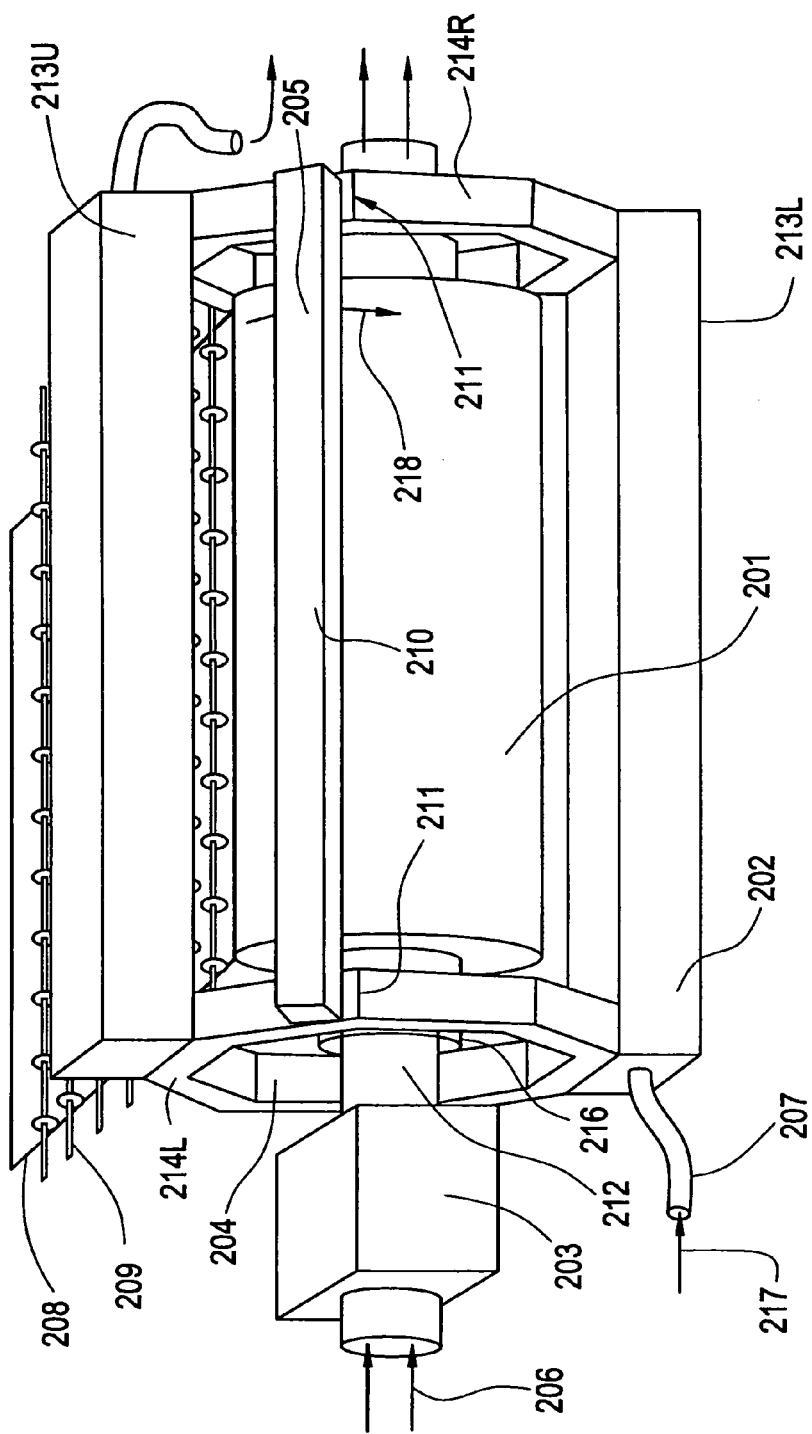

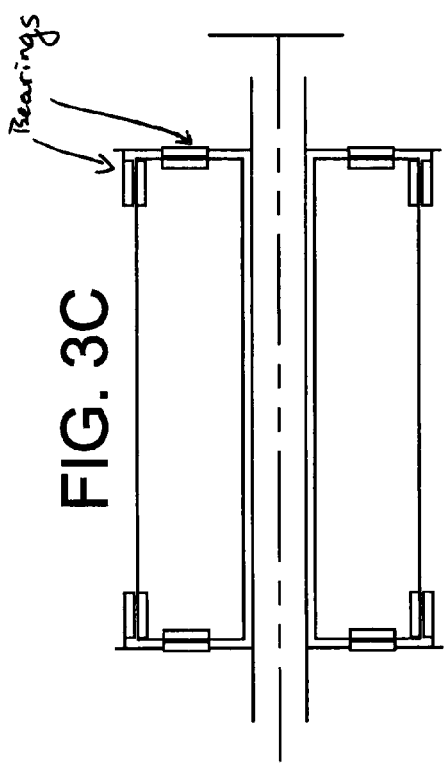
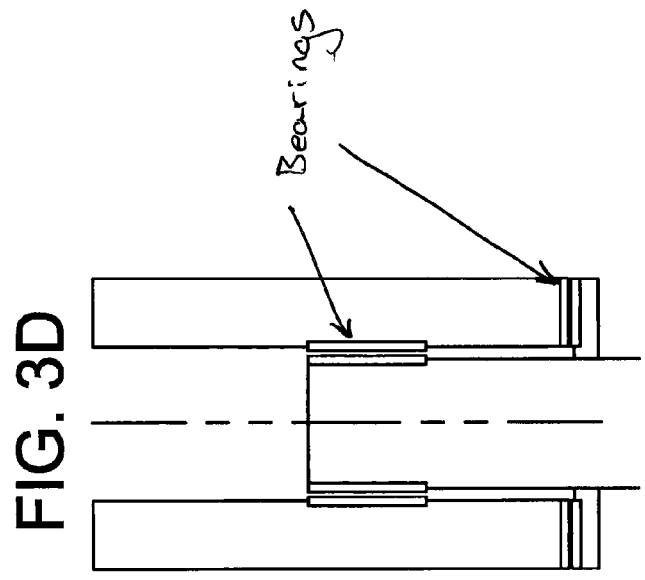
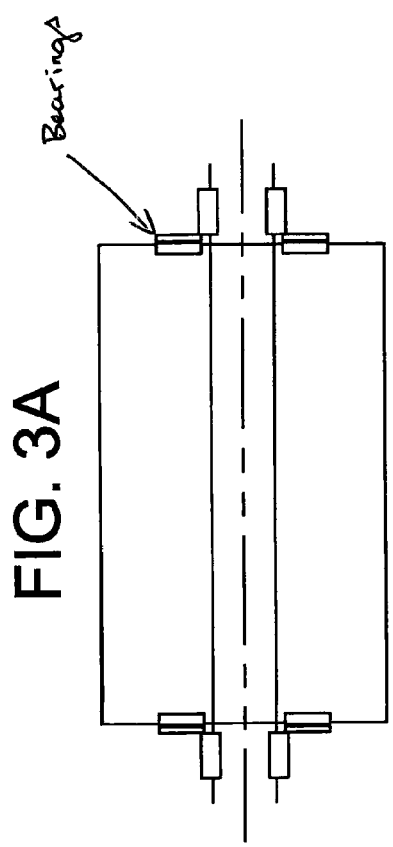
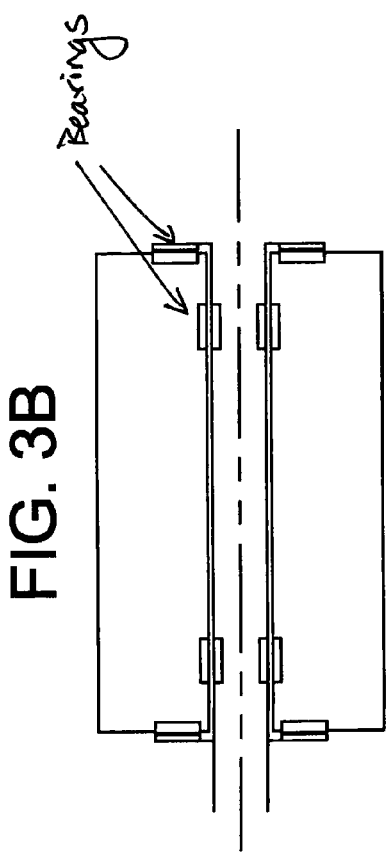
FIG. 3A
FIG. 3B
FIG. 3C
FIG. 3D

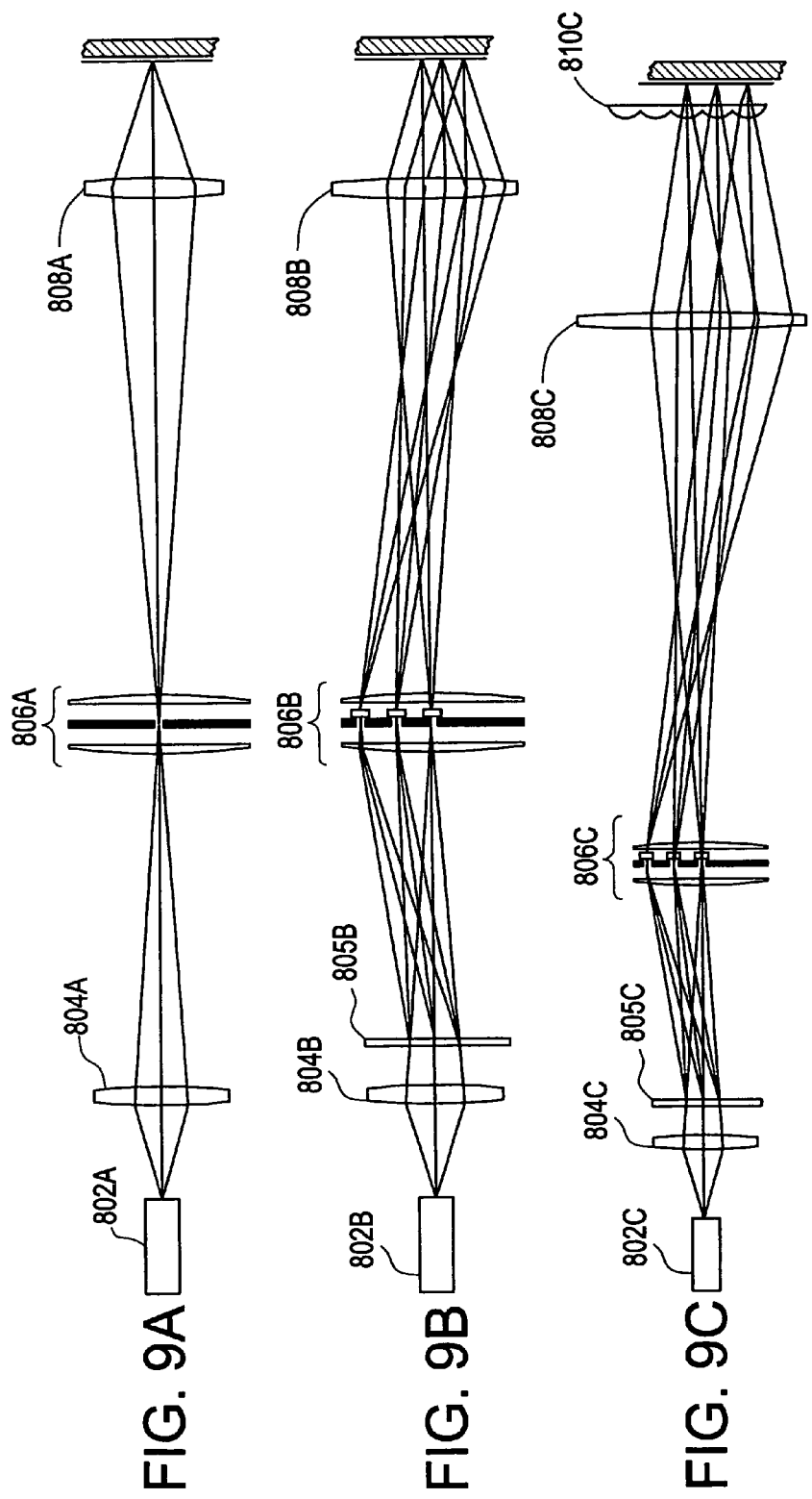

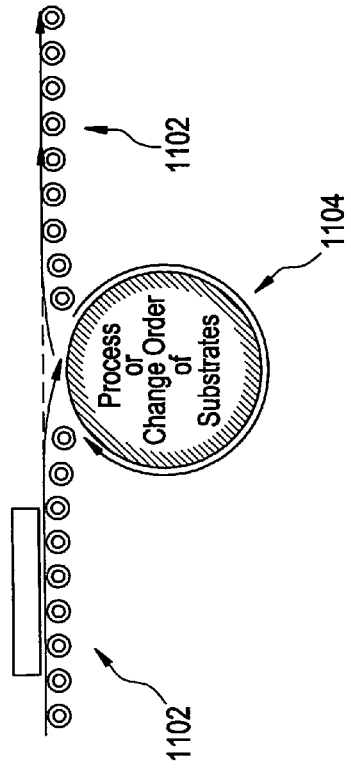
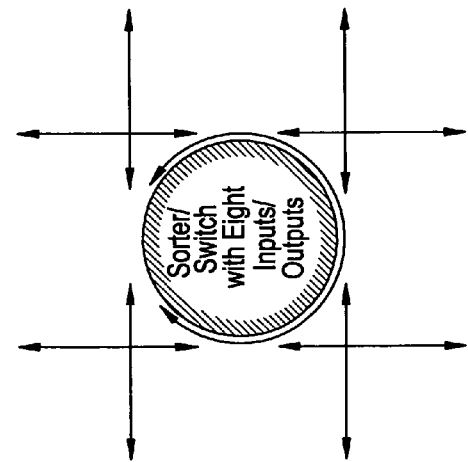
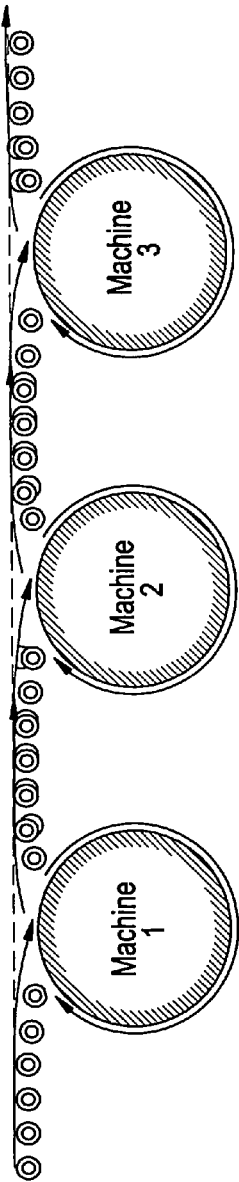
FIG. 12A
FIG. 12B
FIG. 12C

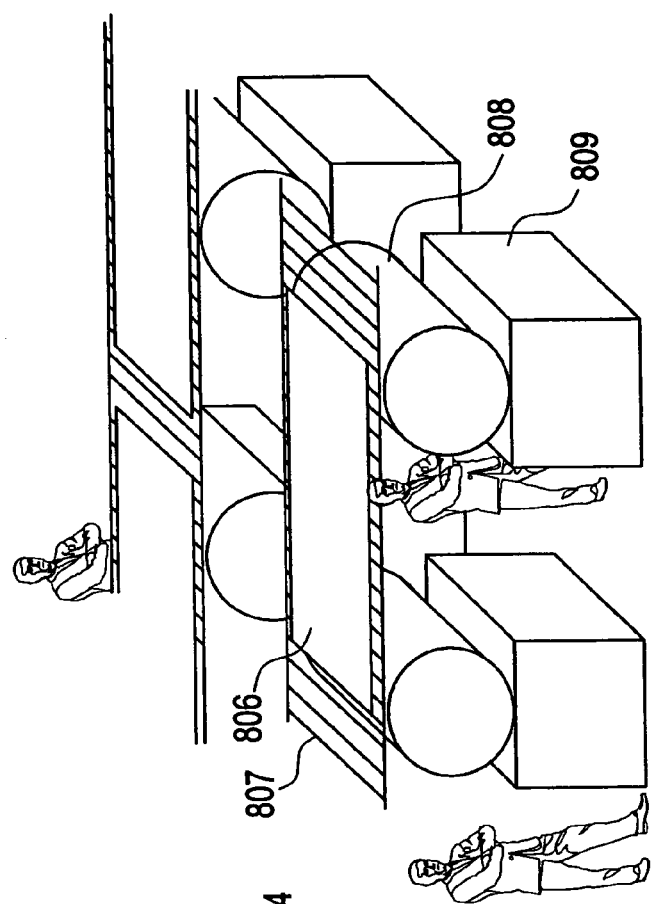
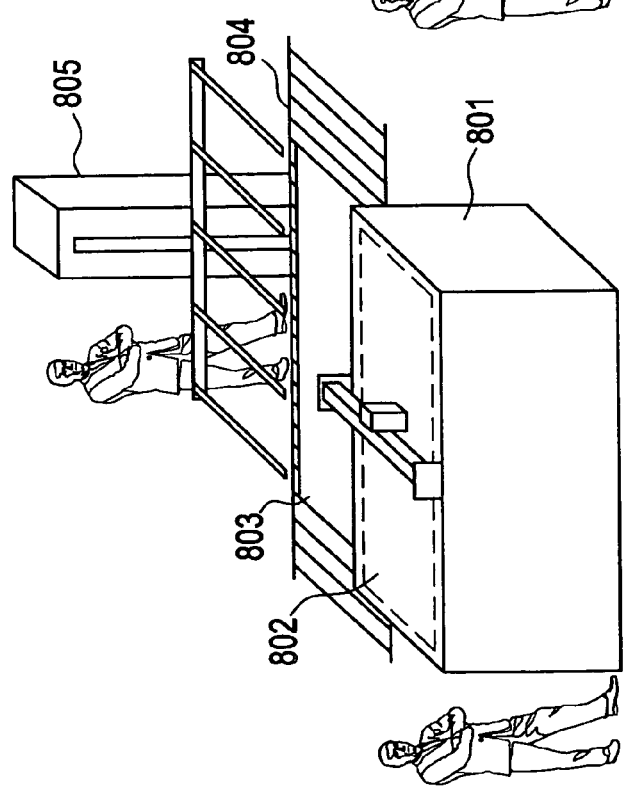
FIG. 15A
FIG. 15B

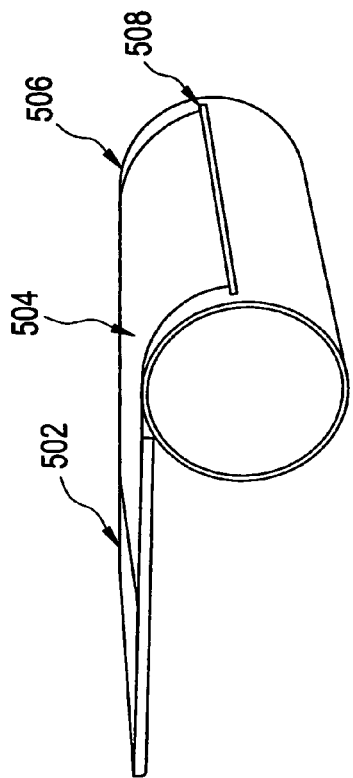
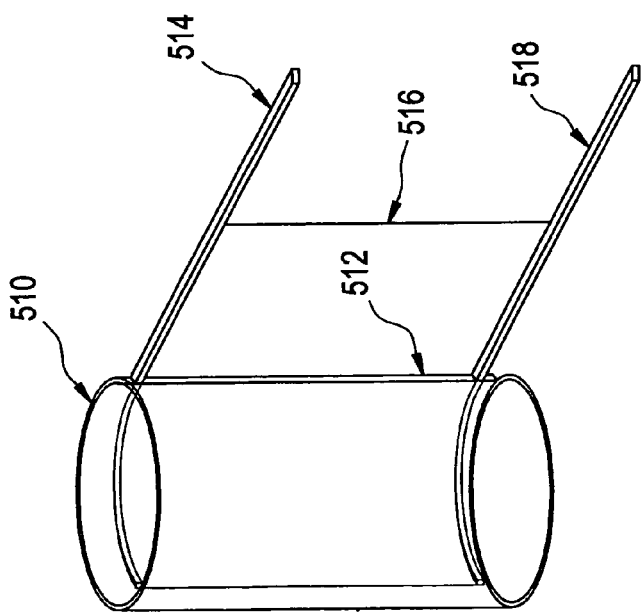
FIG. 18A
FIG. 18B

Rollers (Contact)

Porous Air Bearings (Non-Contact)

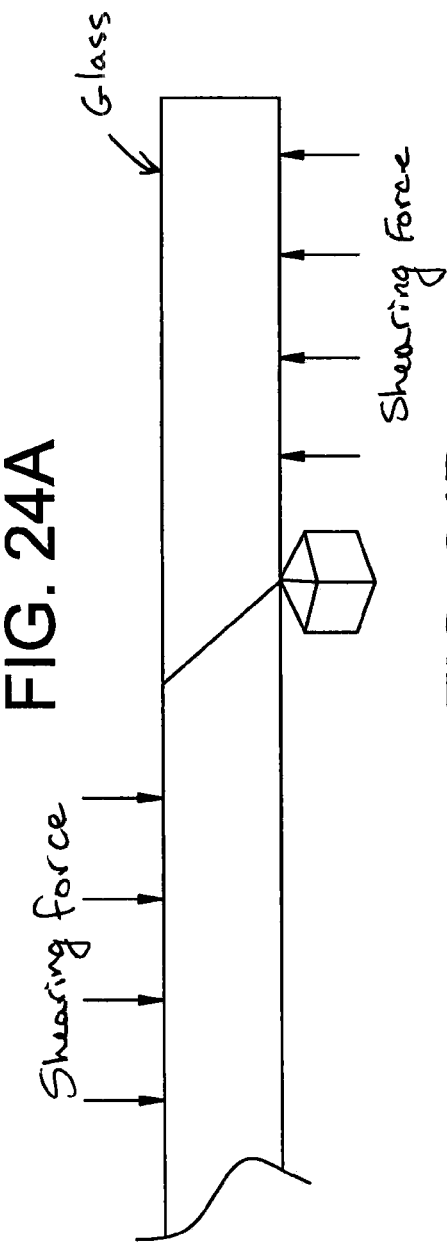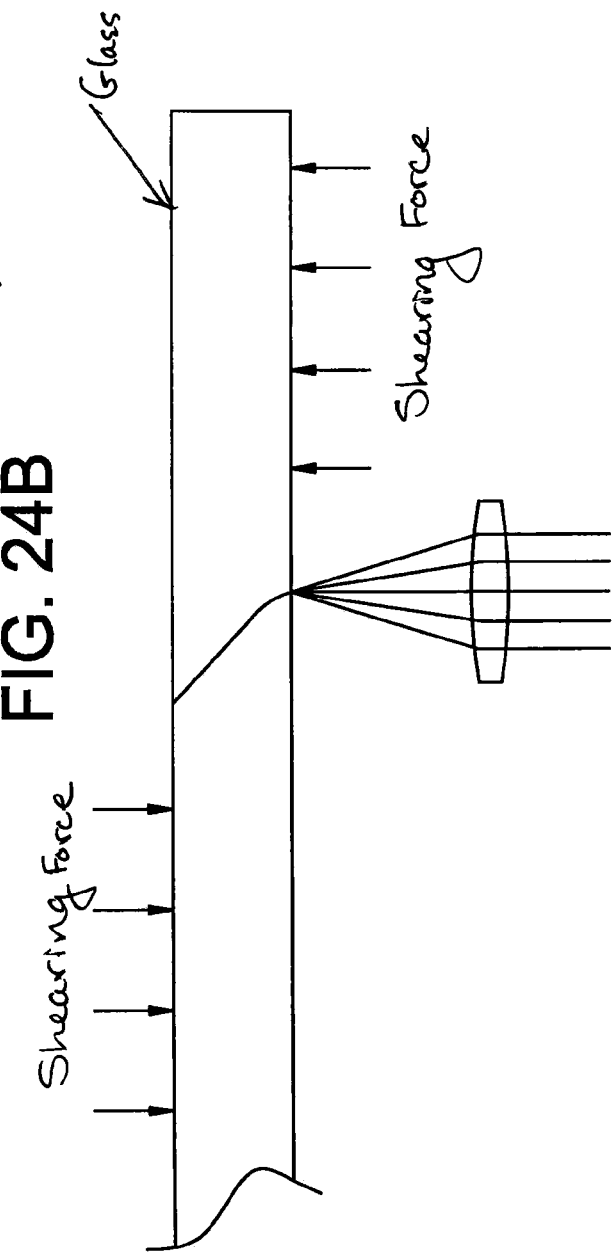

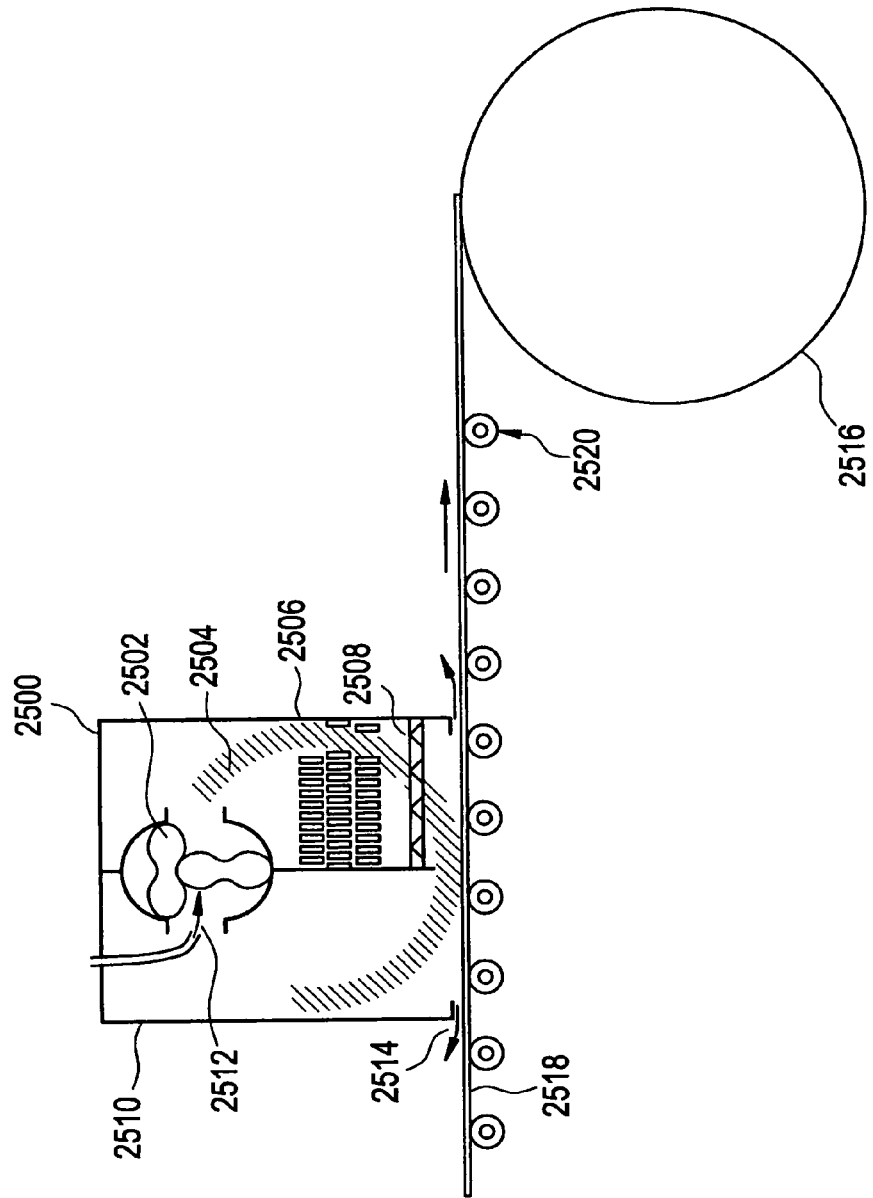

Cylinder

Cylinder mask aligner mask aligner mask aligner

Cylinder

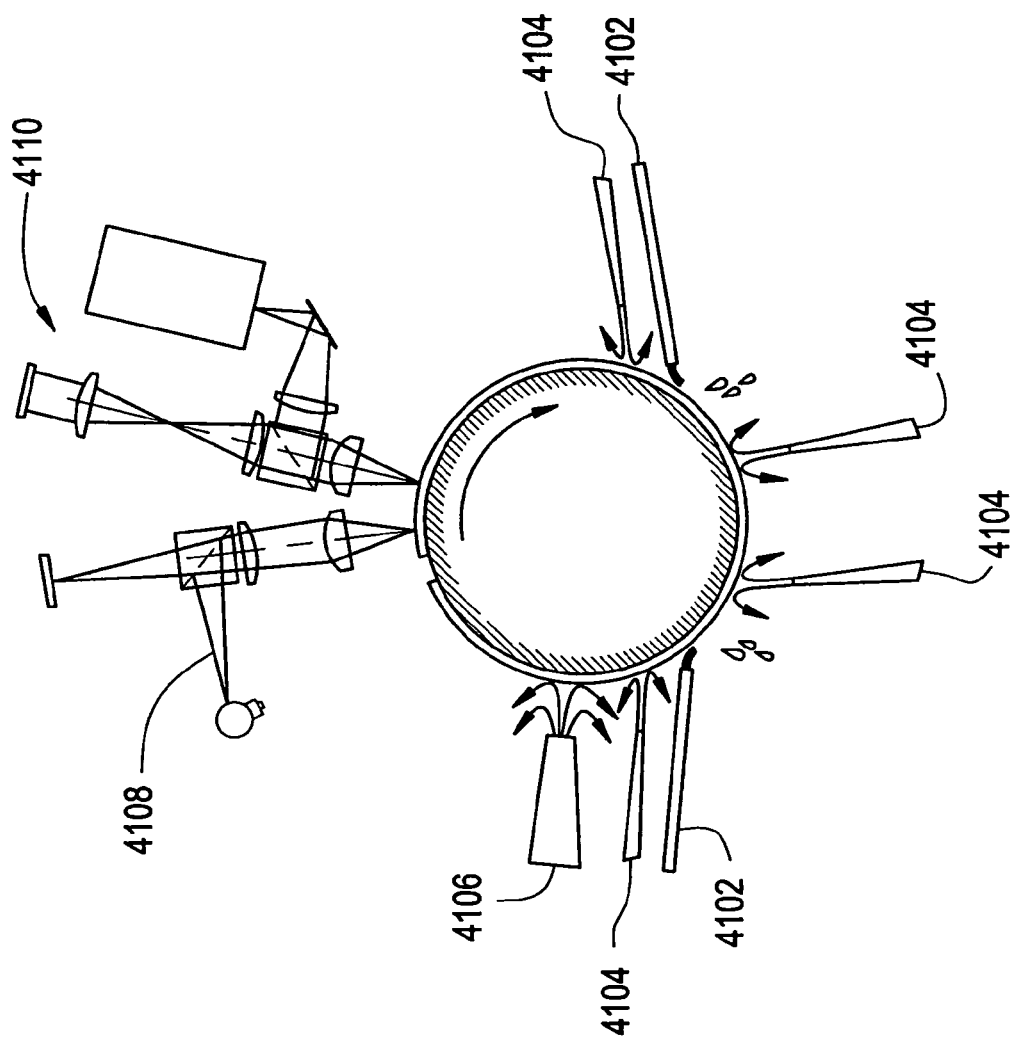

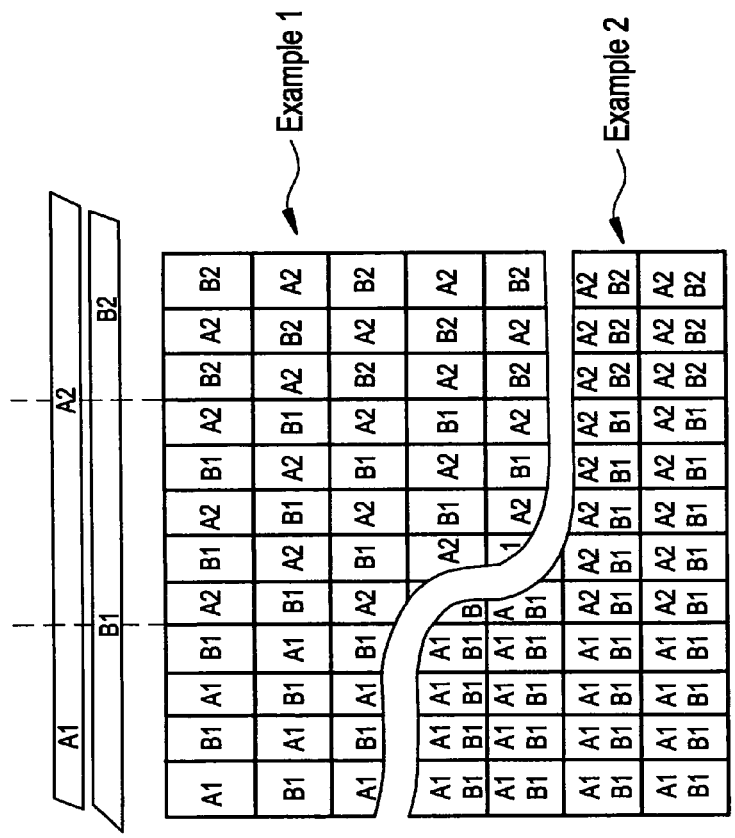
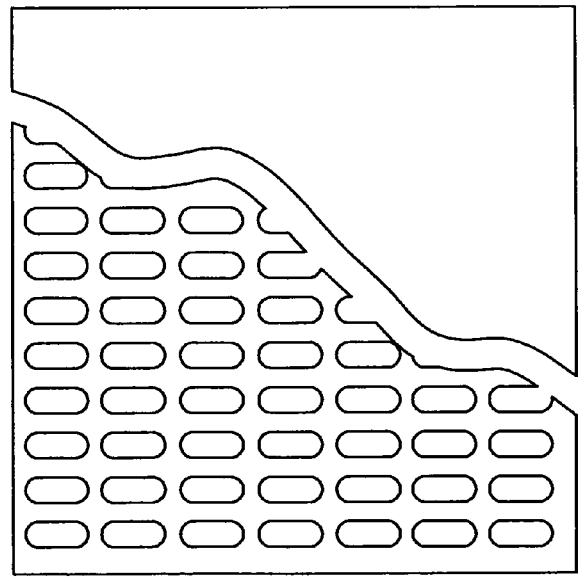
FIG. 46B
FIG. 46A

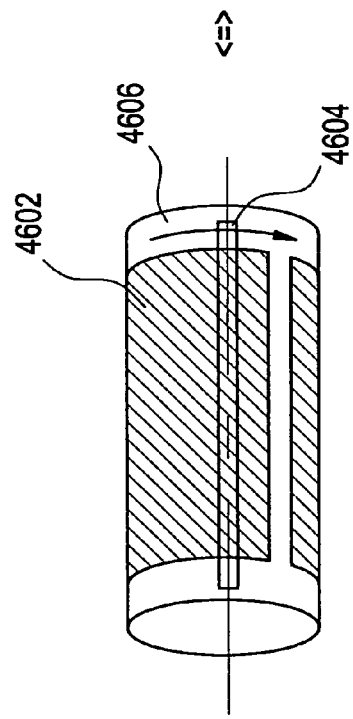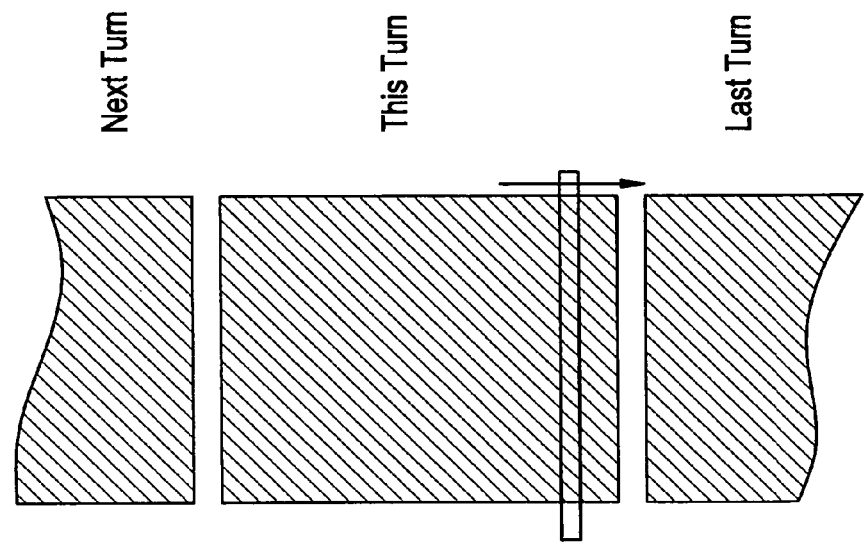
FIG. 48

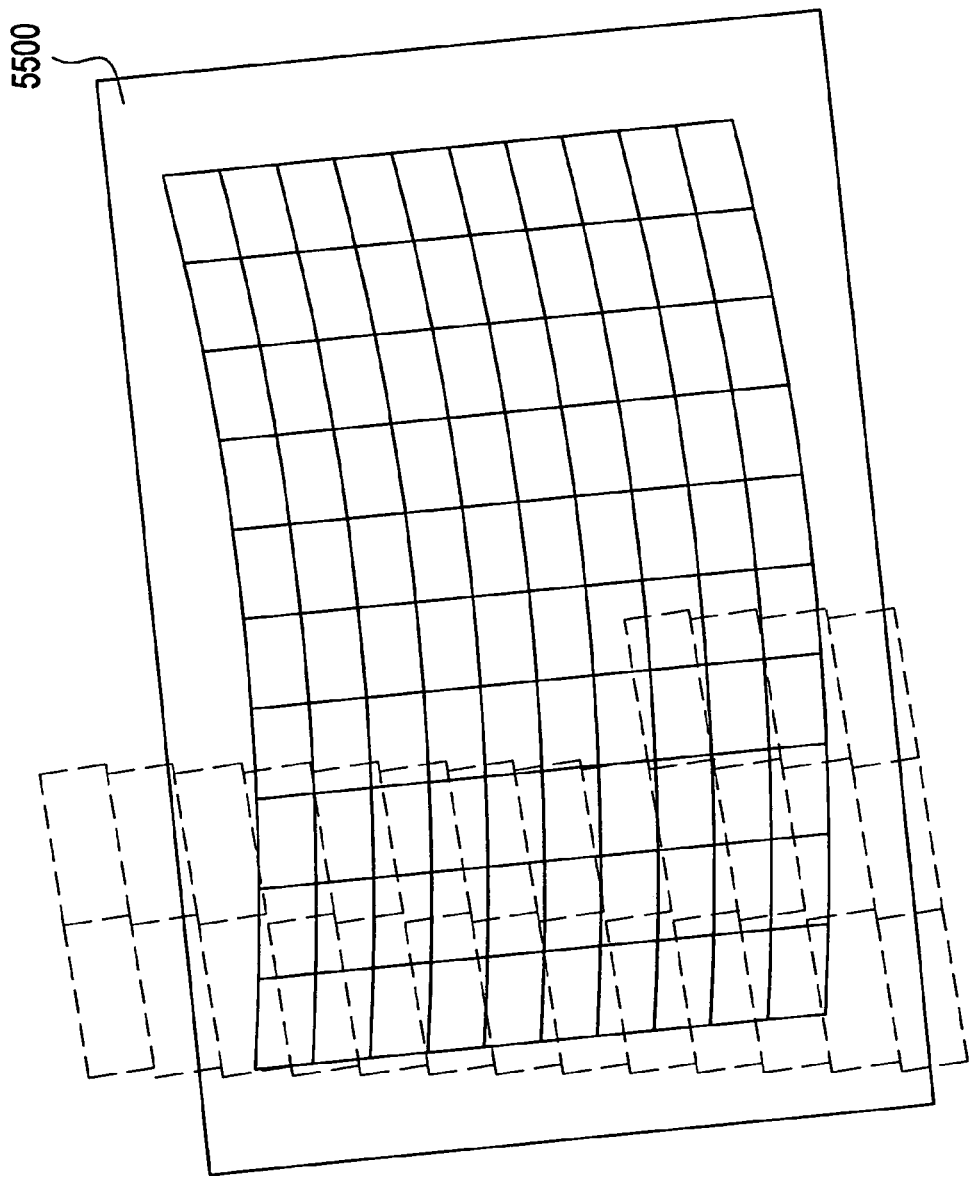

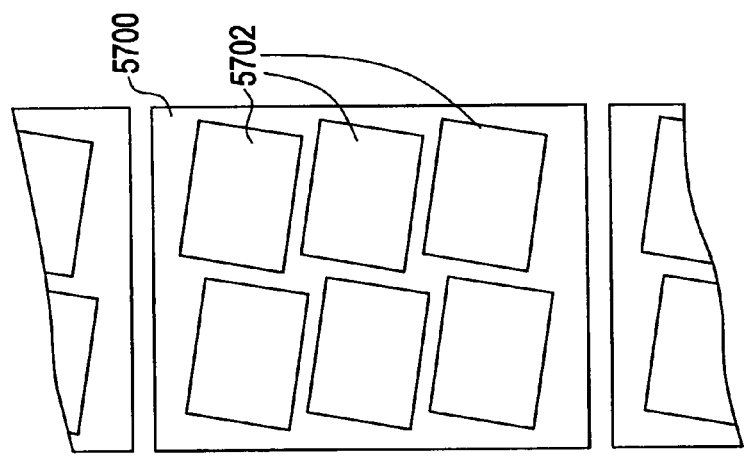
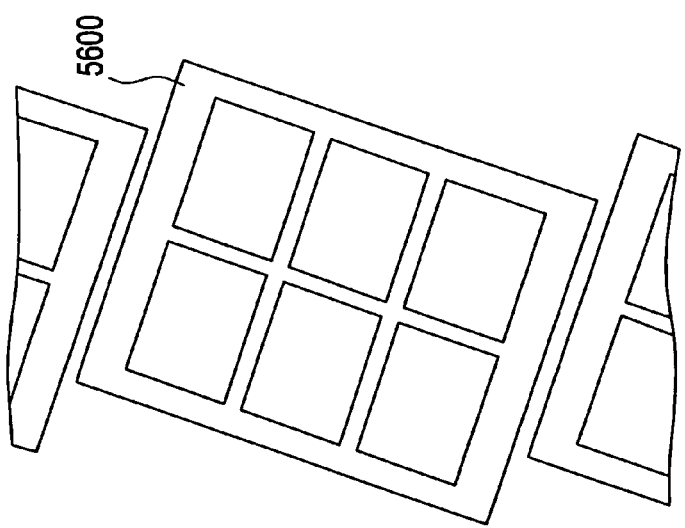

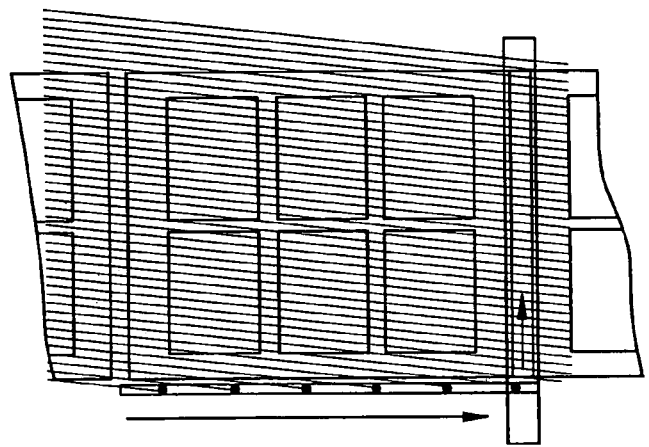
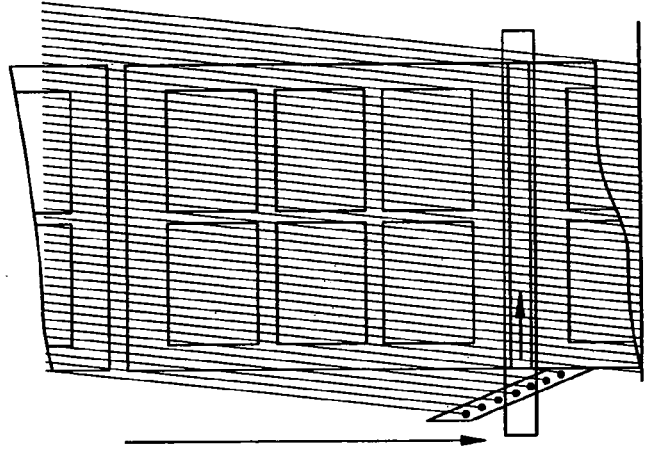
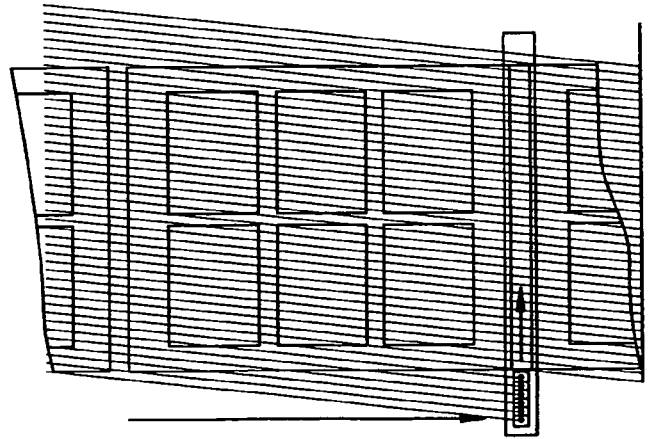

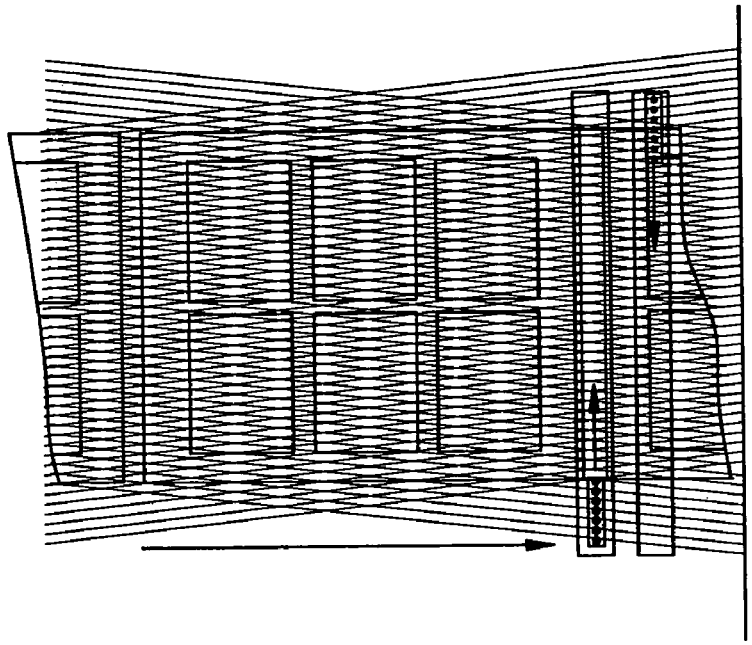
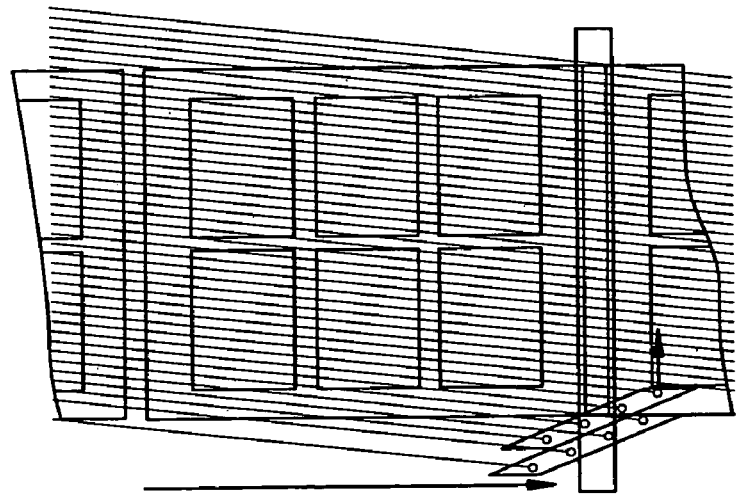

(50) Scan Direction 1
10 Circle of blue LD write heads
10 Substrate
30 Helical pattern
50 Rotation Axis Virtual Mask Power CAL
Timing CAL
y-pos correction Narrow   Wide Image Rotation Location
Image Distortion
Pixel Cal
Illumination Cal
Stitching & Butting
Moonwalk/Flashtime Focus Interferometers measure circle position Interferometers measure circle position Interferometers measure circle position FIG. 72A
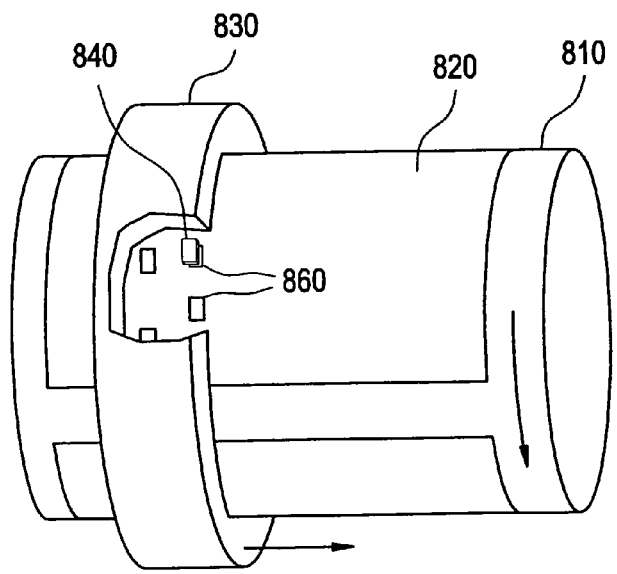
FIG. 72B
FIG. 72C
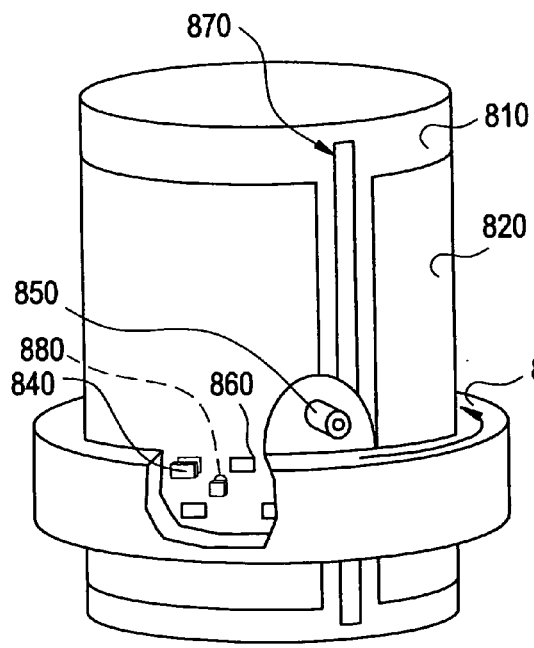
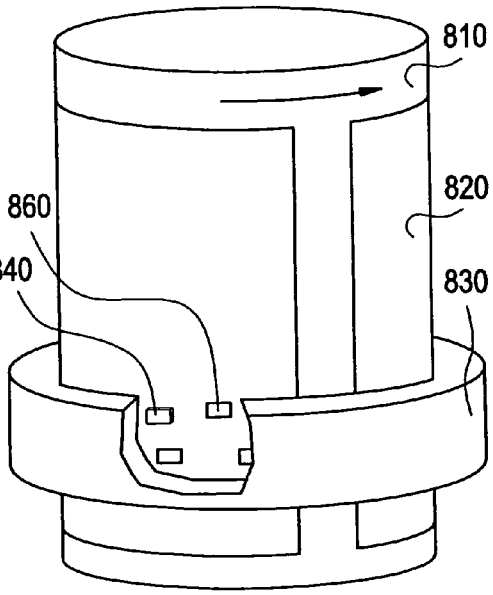

FIG. 83
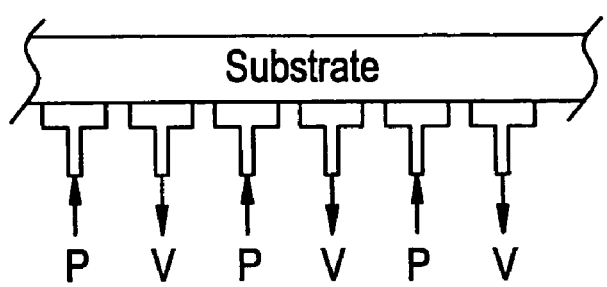
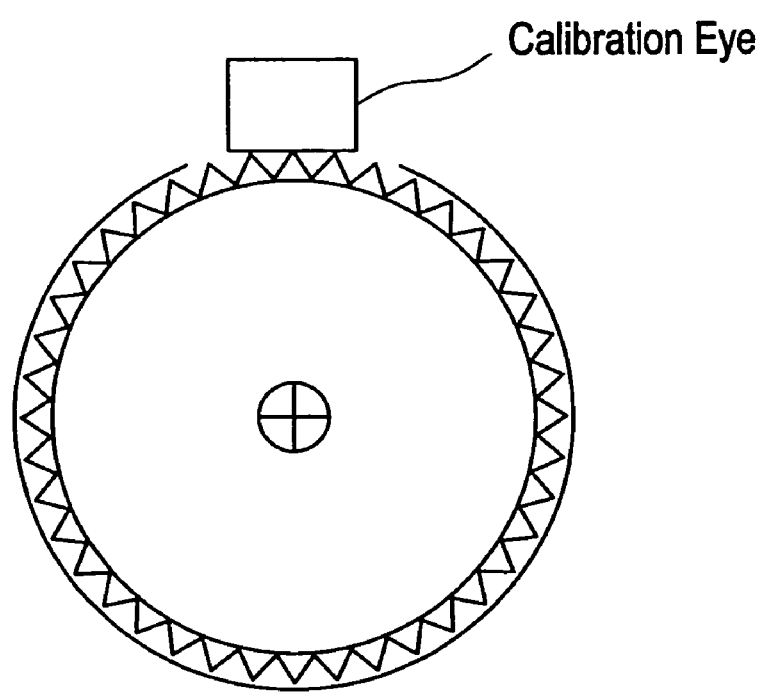

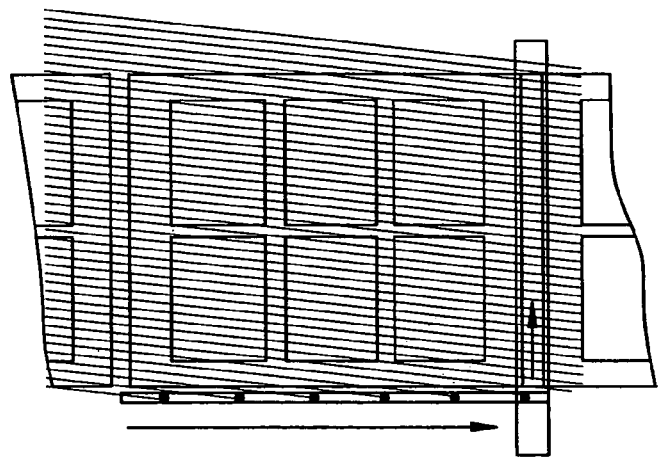
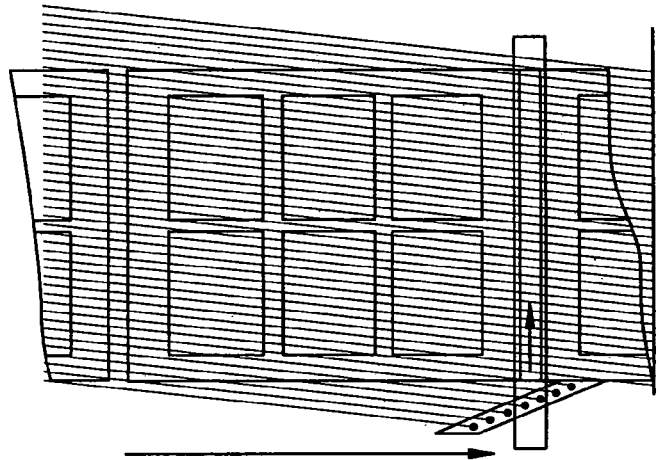
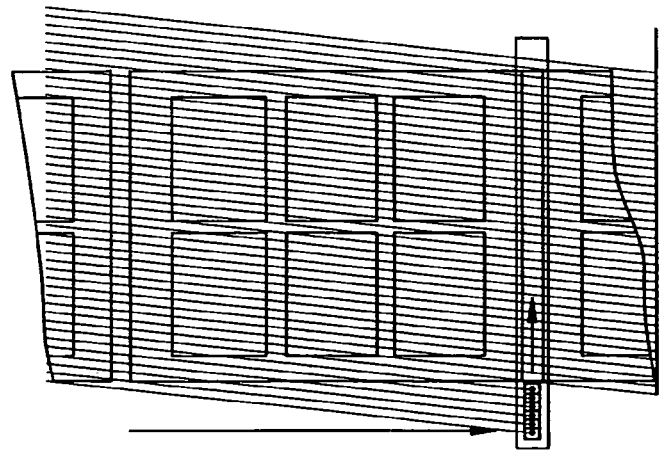

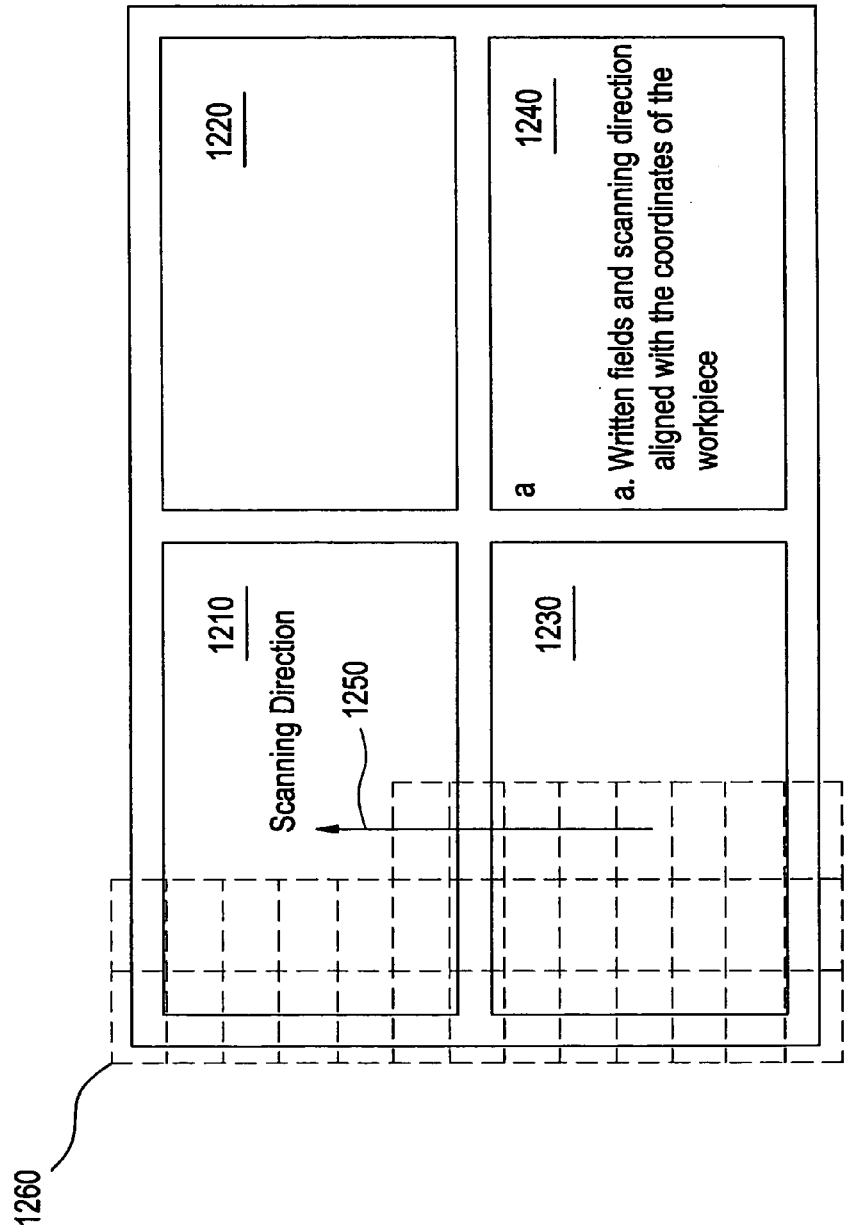

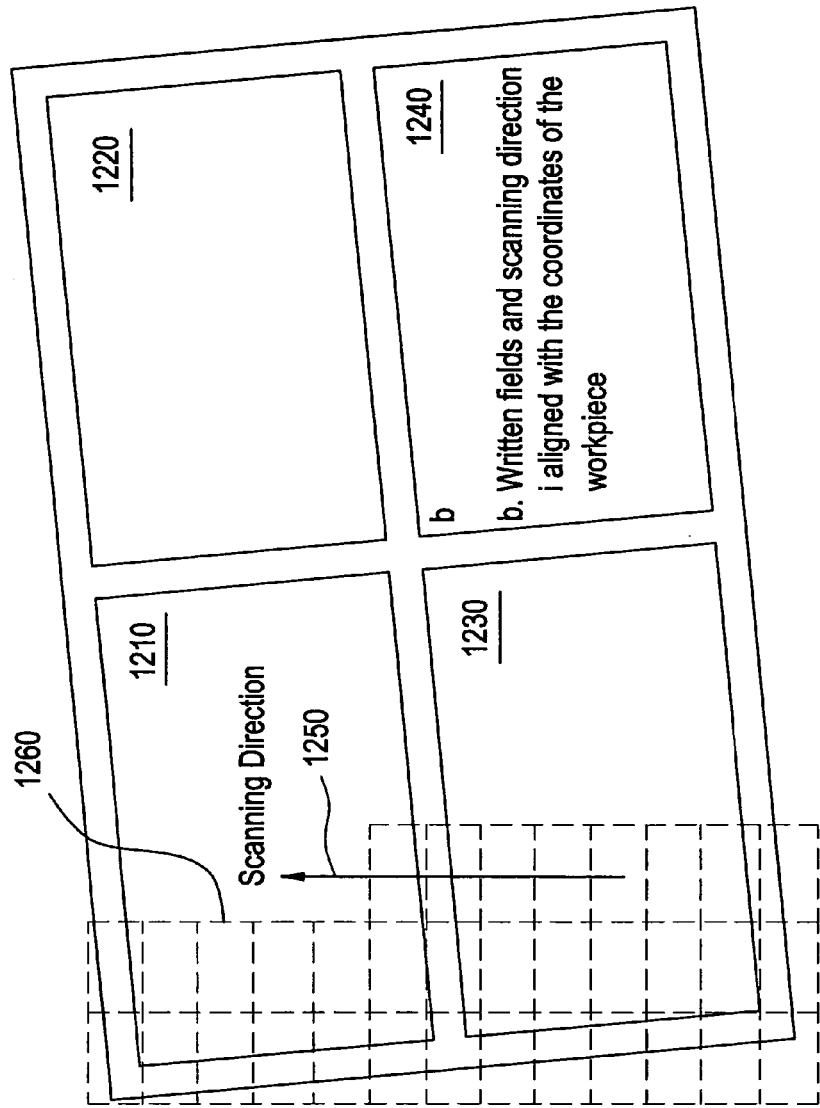

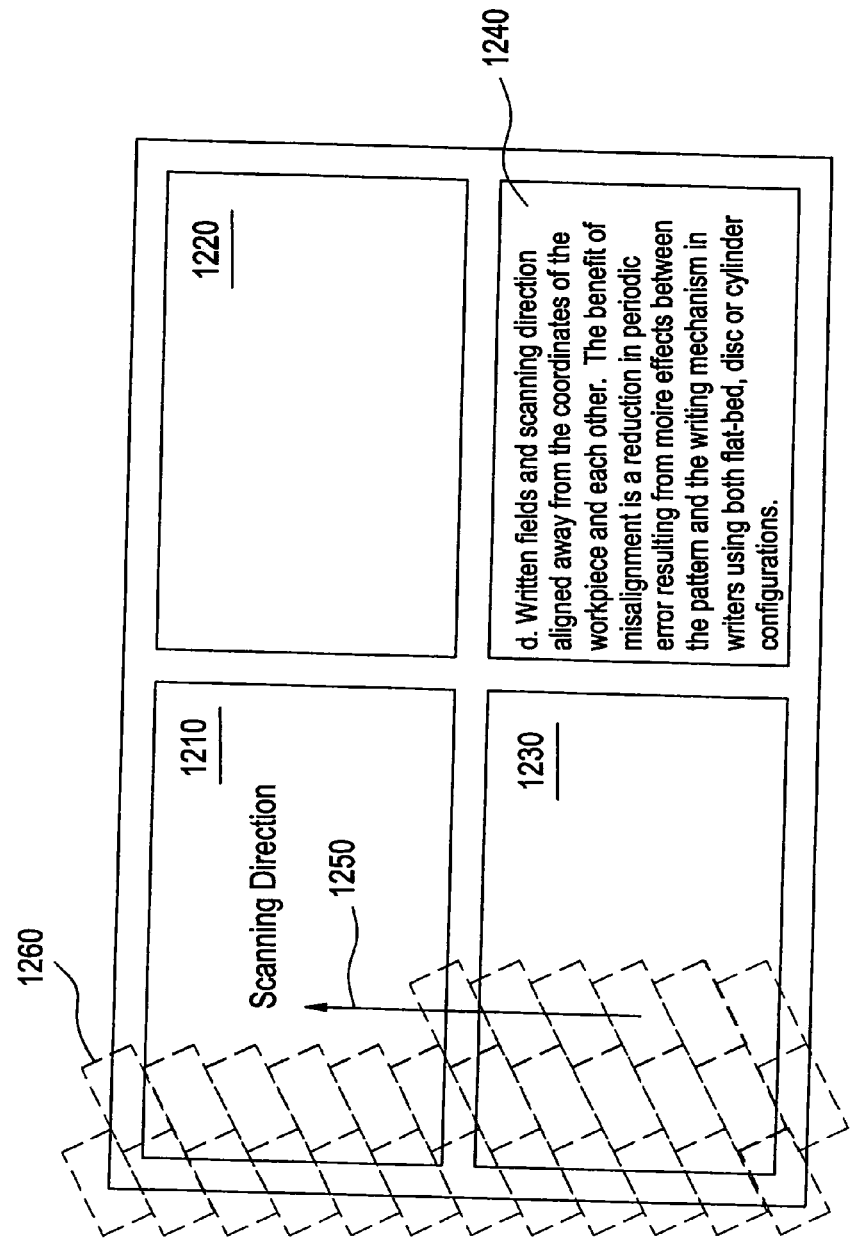

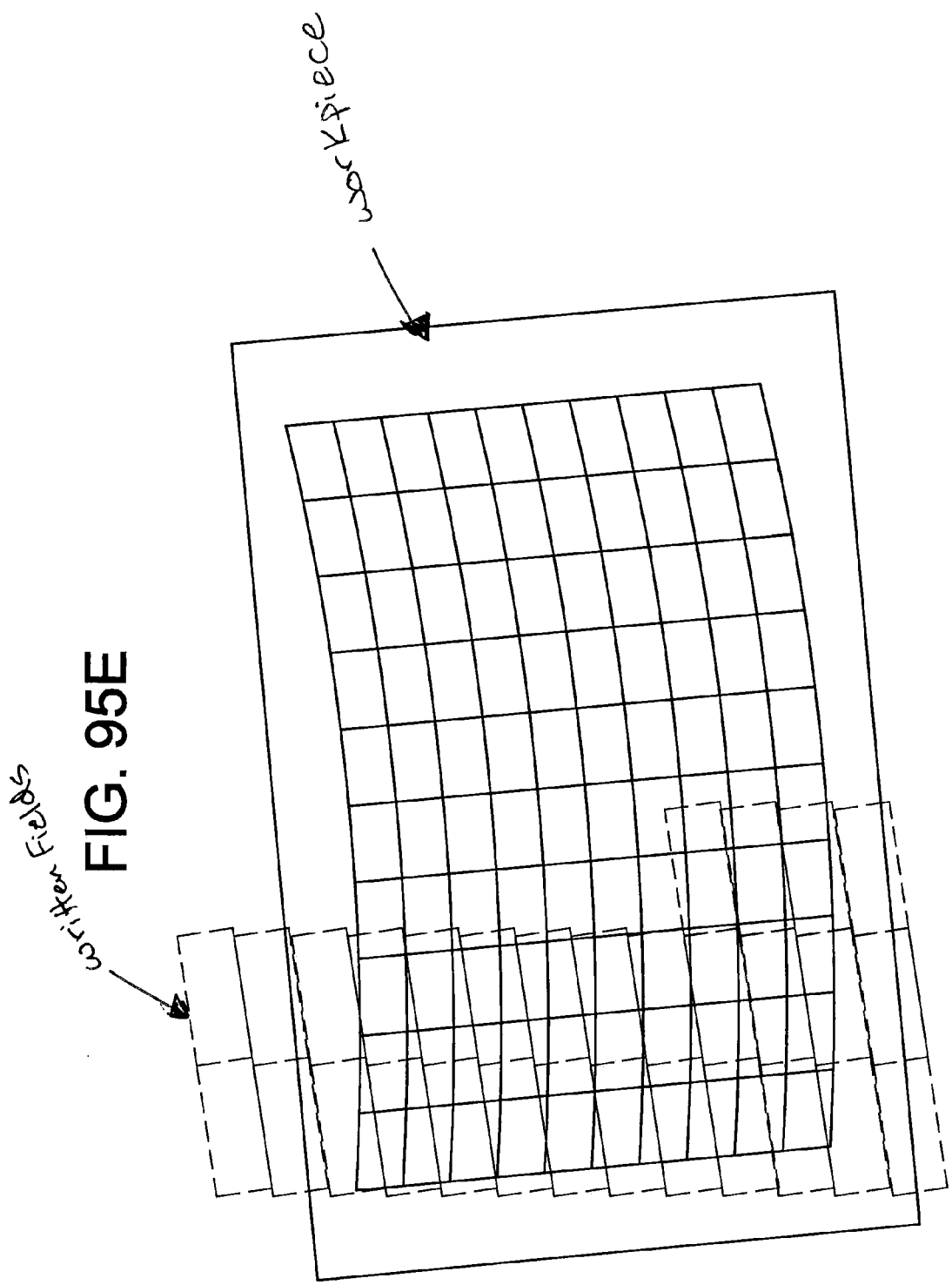

PLATFORMS, APPARATUSES, SYSTEMS AND METHODS FOR PROCESSING AND ANALYZING SUBSTRATES

PRIORITY STATEMENT

This non-provisional U.S. patent application claims priority under 35 U.S.C. §119(e) to U.S. provisional patent application Ser. No. 60/776,919, filed on Feb. 28, 2006, and is a continuation-in-part of non-provisional U.S. patent application Ser. No. 11/586,612, filed on Oct. 26, 2006, and non-provisional U.S. patent application Ser. No. 11/586,614, filed on Oct. 26, 2006, each of which claim priority under 35 U.S.C. §119(e) to U.S. provisional patent application Ser. Nos. 60/730,009, filed on Oct. 26, 2005 and 60/776,919, filed on Feb. 28, 2006. The entire contents of all of these documents are incorporated herein by reference.

BACKGROUND

Description of the Conventional Art

Conventional flat panel televisions (TVs) are replacing conventional cathode ray tube televisions (CRT TVs). Conventional manufacturing methodologies utilize larger glass sizes of approximately 2×2.5 meters. The larger size glass may allow more freedom to place screens of different sizes on the mother glass with a limited loss over area. Conventionally, the larger the screen size being manufactured, the more difficult the placement of the screens and the larger the area loss. Conventional production technology is limited to about 2.5 times 3 meters. If the glass is any larger the equipment must be very large, very heavy and difficult to transport.

Conventional image recorders based on a cylindrical workpiece holder are used in the graphics industry. FIGS. 1A and 1B show an example conventional drum scanners. In this example, the workpiece may be a flexible sheet such as plastic film or paper. In FIG. 1B the substrate is a thin glass sheet intended for making display devices by thermal transfer, in particular for colour filter production.

Related art larger class machines for manufacturing display screens and solar panels have two types of problems: machine size and mechanical overhead. The large size of equipment makes it very heavy, expensive, and difficult to transport. In order to satisfy high throughput requirements the mechanical speeds have to be high. The combination of larger mass and higher speed increases the mechanical overhead because of acceleration and deceleration times.

SUMMARY OF THE INVENTION

Example embodiments of the present invention relate to flat panel displays, and methods of manufacturing the same. For example, at least one example embodiment of the present invention provides a method of manufacturing displays using thin substrates. Examples of such displays may be TFT-LCD, OLED, and SED; however, other display technologies using at least one thin substrate may also make use of example embodiments of the present invention. Example embodiments are described herein with regard to sheet material. However, example embodiments may be equally applicable to continuous and/or roll-to-roll processing.

Example embodiments of the present invention provide devices and methods for using larger glass sizes. In at least one example embodiment, the glass may be rolled into a cylinder, thereby reducing the physical size by a factor of 3 in one dimension. Example embodiments of the present invention may have a cylindrical shape, which may allow a more robust and/or compact movement of the glass, reduced machine weight. Example embodiments of the present invention utilize relatively thin glass (e.g., about 0.7 mm, 0.62 mm and/or 0.5 mm thick). Thinner glass may be more flexible, and may be rolled onto a cylinder with a diameter of about 1 meter.

At least one example embodiment provides a modular platform and tool bars. The modular platform may be based on stages for holding and moving the workpiece, and the tool bars may be configured to carry and move tools for performing processing and/or analytical operations on the substrate. The stages, toolbars and tools may be configured to be used in different combinations and may have at least one of standardized mechanical, pneumatic, hydraulic, electric, electronic, servo and information communication interfaces.

At least one example embodiment provides an instrument platform for performing quality analysis and other evaluations of larger substrates. At least one other example embodiment provides a processing platform for use in manufacturing of display devices, solar panels, LED, electroluminescent and other solid state lighting panels.

At least one example embodiment may be used for relatively high precision measuring and/or processing of workpieces greater than or equal to about 5 m². Such workpieces may be glass, plastic or metal, and may be less than or equal to about 1 mm thick. Example embodiments of the present invention may be used in, for example, cleaning, depositing, annealing, etching, coating, developing, stripping, rubbing, inspecting, repairing, patterning, singulating, scribing, isolating, etc., and also for analyzing, measuring, reviewing, inspection, repairing. In many cases semiconductor devices may be formed on a workpiece using these operations. For example, in transistor arrays for LCD-TFT screens, in transistor backplanes for OLED and other display types, the OLED structure itself and in photovoltaic devices on solar panels, and in LED and electroluminescent panels for solid state lighting.

BRIEF DESCRIPTION OF THE DRAWINGS

FIG. 2A illustrates a platform, according to an example embodiment of the present invention;

FIG. 3A-3E illustrates bearing arrangements, according to example embodiments of the present invention;

FIGS. 9A-9C illustrate optical channels included in the optical writing head of an optical writing apparatus, according to an example embodiment of the present invention;

FIGS. 9D-9E illustrate two-dimensional fan-out pattern, which may be produced using an optical writing apparatus, according to an example embodiment of the present invention;

FIG. 12A shows how the cylindrical stage, according to an example embodiment;

FIG. 12B shows how the cylindrical stage may be arranged within a processing track such that the workplaces may be captured or allowed to pass;

FIG. 12C illustrates a plurality of cylindrical stages arranged serially;

FIGS. 15A and 15B show a comparison of the floor space required for a single conventional flatbed machinery (FIG. 15A) and the cylindrical machinery, according to at least some example embodiments (FIG. 15B);

FIG. 18A shows a horizontal orientation of a cylindrical stage, according to an example embodiment;

FIG. 18B shows a vertical orientation of a cylindrical stage, according to an example embodiment;

FIGS. 24A and 24B show methods for cutting a glass edge, according to an example embodiment of the present invention;

As shown in FIG. 23A the glass may have a film on both top and bottom, and the neutral layer may be formed in the middle;

FIG. 27 illustrates a device for controlling temperature of a workpiece (e.g., glass) before being loaded onto the cylinder, according to an example embodiment;

FIGS. 36D and 36E illustrate methods for converting from abstracted standard coordinates to tool and/or stage coordinates and vice versa;

FIG. 38A shows a more detailed view of the projection system, according to an example embodiment;

FIG. 43 illustrates a developing system, according to an example embodiment;

FIGS. 46A and 46B shows a method for forming a black matrix, according to an example embodiment;

FIG. 48 shows the area of the cylinder covered by tools including in a processing platform, according to an example embodiment;

FIG. 55 illustrates an example embodiment in which the workpiece is rotated, the writing head is rotated and an intentional distortion is introduced.

FIGS. 56 and 57 show two example methods for rotating workpiece patterns, according to example embodiments;

FIGS. 64A-64E illustrate methods for filling an area using continuous scanning in the x and y directions, according to an example embodiment;

FIGS. 72A-72C illustrate different implementations and orientations of a ring-type writing apparatus, according to another example embodiment;

FIG. 83 shows a vacuum arrangement for holding the workpiece on the cylinder;

FIGS. 86A-86E illustrate methods for continuous scanning in the x and y directions, according to an example embodiment;

FIGS. 95A-95E illustrate an SLM arrangement and workpiece arrangement relative to the rotational direction of the rotor scanner.

DETAILED DESCRIPTION OF EXAMPLE EMBODIMENTS

Figure 1A:
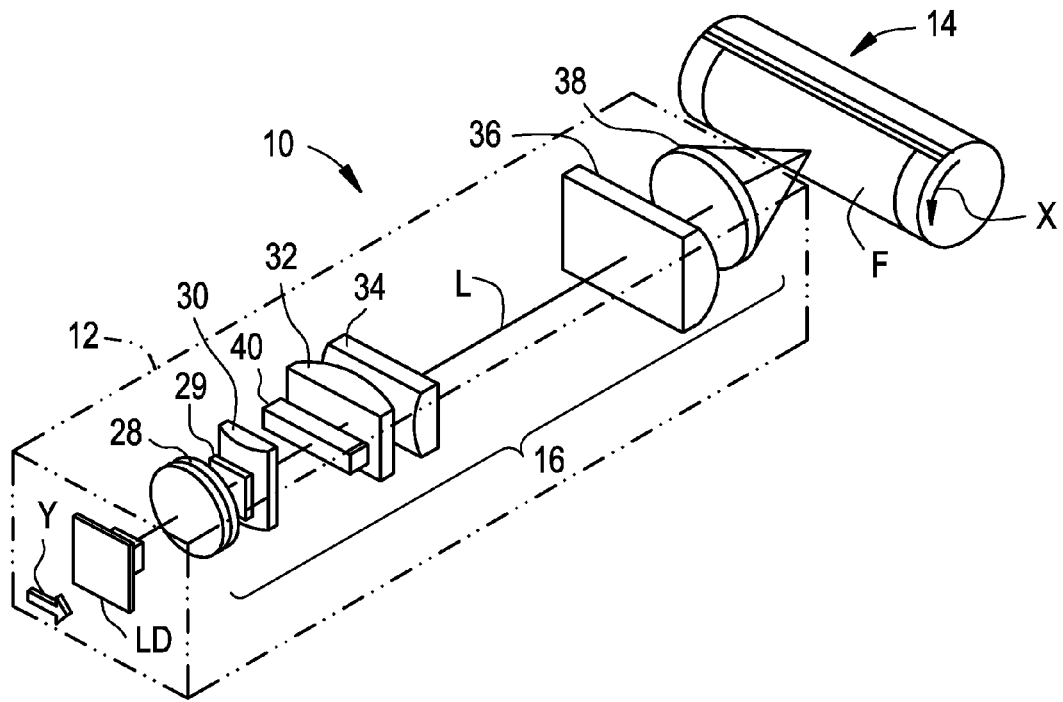
FIGS. 1A and 1B illustrate conventional processing systems.

Example embodiments of the present invention provide a platform for processing larger substrates. A platform, according to at least one example embodiment of the present invention, may have a lower mass, smaller mechanical overhead and/or be more easily integrated with a variety of process tools.

FIG. 2A illustrates a platform, according to an example embodiment. The platform of FIG. 2A may include a frame 202. The frame 202 may include upper and lower supporting structures 213U and 213L and end support structures 214L and 214R. The support structures 213U, 213L, 214L and 214R may be formed, for example, of a continuous piece of metallic material (e.g., sheet metal), and may include a tube 207 formed therein for temperature control. The temperature of the support structures 213U, 213L, 214L and 214R may be controlled by flowing fluid (e.g., air, liquid, gas, etc.) through the tube 207 in direction 217. Alternatively, the support structures 213U, 213L, 214L and 214R may be formed in a piecemeal fashion, in which each of the support structures 213U, 213L, 214L and 214R are formed individually, and subsequently assembled.

Each end support structure 214L and 214R may include plurality of mounting surfaces 211 upon which a plurality of toolbars 210 may be arranged, mounted or fixed. A cylinder or cylindrical stage 201 may be arranged within the frame 202. The cylinder 201 may have a diameter of about 1 m and the length of about 2 m. The cylinder 201 may be mounted on a rotating axis 212 using bearings 216. A driving device such as a motor 203 may be attached to one end of cylinder axis 212. The driving device 203 may drive the rotating axis 212 causing the cylinder 201 to rotate in a direction 218. The cylinder 201 may be, for example, about 500 kg and the bearings 216 may be, for example, hydrostatic fluid bearings; however, any suitable bearings may be used. The fluid may be, for example, air, liquid, gas, etc. Hydrostatic fluid bearings are well-known in the art, and therefore, a detailed discussion will be omitted for the sake of brevity.

In at least one example, a cylinder about 1 m in diameter and about 2.5 m long may be supported, for example, by hydrostatic bearings. The axis may be either an extension of the rotor or may be fixed.

FIGS. 3A-3D shows a plurality of different ways to arrange the hydrostatic bearings, according to example embodiments. FIGS. 3A-3C show bearing arrangements for a horizontal cylinder, and FIG. 3D shows a bearing arrangement for a vertical cylinder. The bearing surfaces are represented by thick black lines in FIGS. 3A-3D.

Figure 3E:
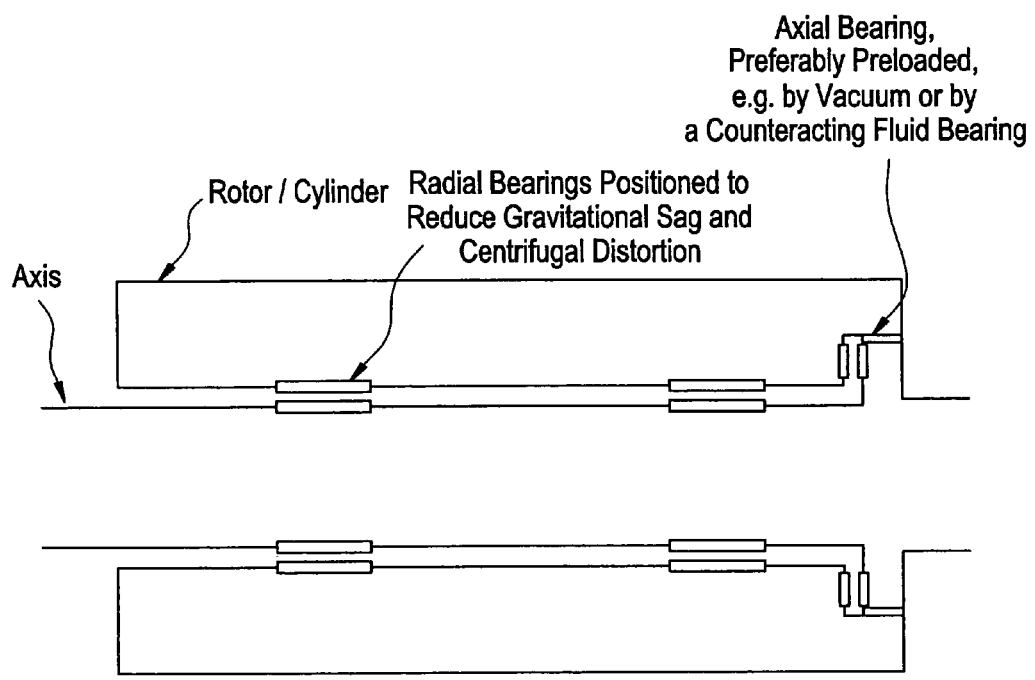

FIG. 3E shows an arrangement of bearings that may remove the bending force on the cylinder, and may suppress bending due to centrifugal effects while spinning. In the horizontal direction, the arrangement has hydrostatic bearings at one end, and may be pushed against the hydrostatic bearing by a spring force. The spring force may be created by the bearing itself if the bearing uses both pressure and a vacuum. In this way a gap in the bearing may not form depending upon the temperature expansion of the axis or the cylinder.

Referring again to FIG. 2A, the temperature of the frame 202 and the cylinder 201 may be controlled by forced cooling. The forced cooling may be done by flowing fluid (e.g., liquid, air, gas, etc.) through the rotating axis 212 in a direction 206. The temperature of the frame 202 and the cylinder 201 may be controlled to a temperature of between about 0 and about 0.01° Celsius, inclusive. For example, the cylinder may be temperature controlled to about 0.05° Celsius or to about 0.01° Celsius.

Referring still to FIG. 2A, the processing platform may also include a conveyor 208 for transporting workpieces to the cylinder 201. Loading and unloading of workpieces to and from the cylinder 201 will be discussed in more detail with respect to FIGS. 18A and 18B.

Processing platforms according to at least some example embodiments may be built as a modular system in which the cylindrical stage may be outfitted with one or several tool bars. Each tool bar may have one or more tools. As a result, a single function may be implemented with ordinary or conventional processing speed using only a single tool. Example embodiments may also handle a higher capacity using multiple tools on a single tool bar, multiple tools on multiple tool bars, etc. Multiple functions may be built into the same system. According to at least one example embodiment, processing tools may have multiple functions, such as a processing function and metrology for alignment of the workpiece and for analysis of the process result.

A modular platform design with standardized interfaces may increase flexibility. Standardized interfaces include, for example, mechanical interfaces, electrical interfaces communication interfaces, coordinate systems, diagnostic routines, user interface representation, etc. Different tools may be mounted on the cylinder stage, but the same tools may also be used on flat-bed stages fitting into the modular system, further increasing flexibility across the modular system. A modular system may allow different display manufacturers to not have to settle for different screen sizes and therefore often for different substrate sizes even at the same generation. A modular approach with reusable interfaces and components, according to at least some example embodiments, may reduce costs associated with customization.

Figure 2B:
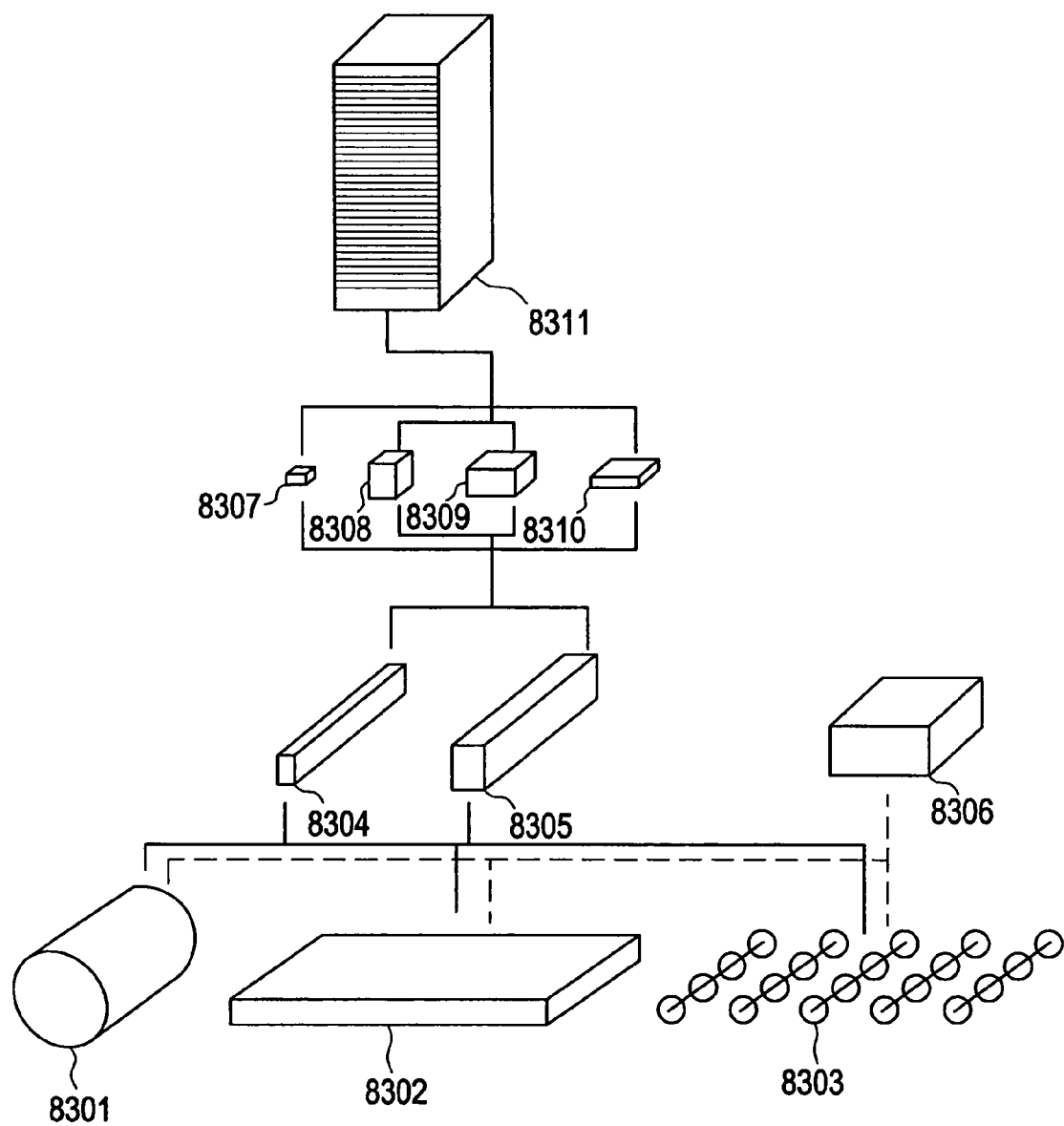
FIG. 2B illustrates an example modular equipment system based on stages, tool bars, tools and control according to an example embodiment.

FIG. 2B illustrates a modular system according to an example embodiment. As shown, the modular system may include stages, tool bars and/or tools. At least a portion of the interfaces are indicated by lines between the modules.

Some interfaces may be standardized, so that modules may be exchanged. This includes, for example, mechanical reats, such as standardized kinematic mounts for toolbars and tools or software. The standardized software interfaces may allow identical operations to be performed by and on the modules.

In addition, at least some of the modules may have a common coordinate system, such that, for example, an inspection camera and a repair tool may use the same coordinates for the same defect. In one example, the common coordinate system may reference the coordinates on the workpiece, in particular the workpiece in a standard state, a particular bending, stress and temperature state, for example, unstressed with the front surface flat at a temperature of about 22.00° C. after finished processing. The common coordinate system may be oriented in the same way and have an origin in the same place, but in some examples the coordinate system needs to be accurately aligned between different tools and tool bars, down to the nanometer level.

With a common coordinate system much of the hardware and calibrations may be abstracted. For example, a MOVE TO operation need only be given in the common coordinate system for the workpiece in the standard state and the distortion, temperature and/or alignment of the workpiece on the stage, the alignment of the tool and the coordinate transformations may be corrected for by the lower abstraction layers (e.g., machine, workpiece control and/or calibration systems).

Referring back to FIG. 2B, the stage modules may include a cylindrical stage 8301, a flat-bed stage 8302 and a "stageless" stage where the processing and/or metrology takes place on a transport conveyor 8303. The stages have a standard interface to a stage controller 8306 and to one or multiple types of tool bars, for example, with tool movement 8305 or without it 8304. A larger number of tool types 8307, 8308, 8309 and/or 8310 may be mounted on one or more of the tool bars and the tool bars may interface with a data system 8311 containing tool control hardware and software, calibration software, diagnostics, etc. The modular system may perform multiple operations on the same system simultaneously.

Referring back to FIG. 2A, at least one toolbar 210 may be arranged or mounted on mounting surfaces 211. However, platforms, according to example embodiments of the present invention, may include any number of toolbars including any number and any type of tools.

Figure 4:
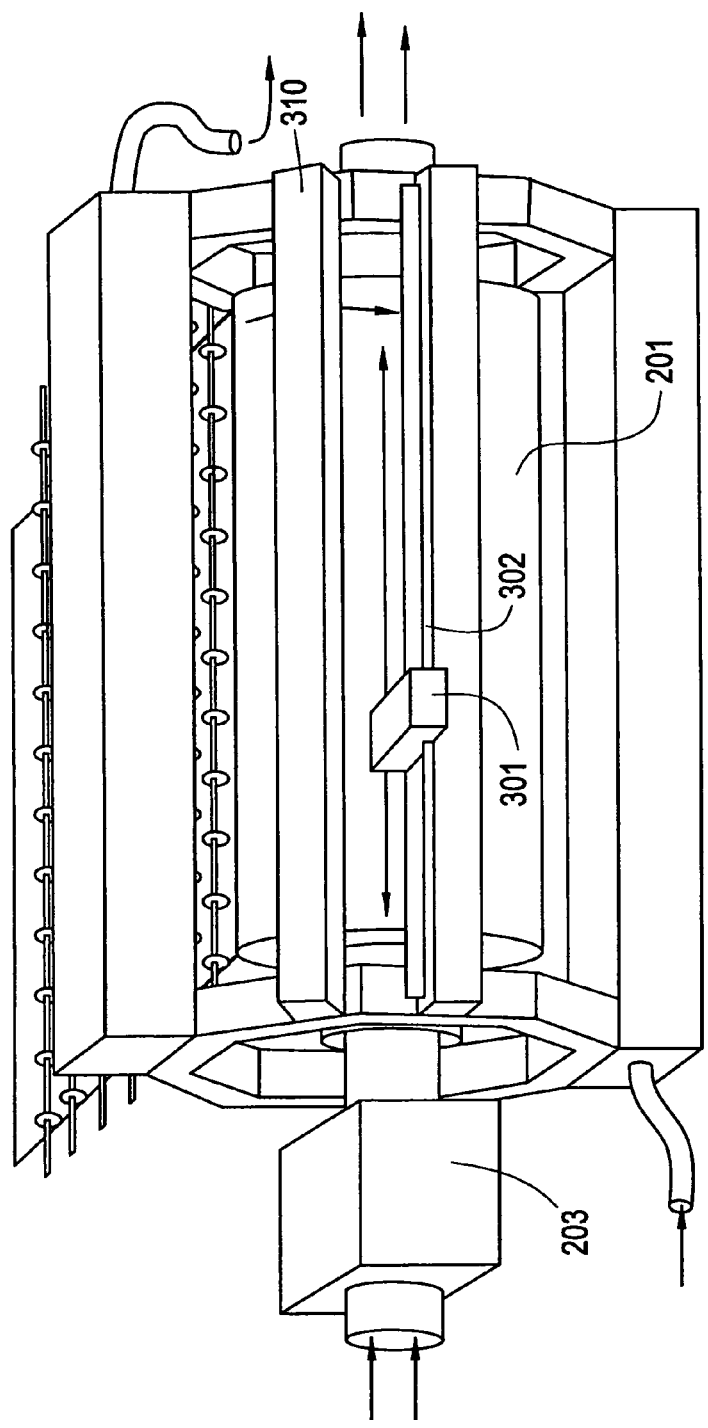
FIG. 4 illustrates a platform, according to another example embodiment of the present invention.

FIG. 4 illustrates a platform, according to another example embodiment. As shown, the platform of FIG. 4 may be similar or substantially similar to the platform of FIG. 2A except that the platform of FIG. 4 may include an additional toolbar 302 including a tool 301 mounted thereon. The driving device 203 may rotate the stage 201 to any angle and the tool 301 may slide along the toolbar 302, such that the tool 301 may access any point on the surface of a workpiece loaded on the cylinder 201.

Still referring to FIG. 4, the toolbar 302 may include at least one metrology device 301 for establishing a more accurate coordinate system on the workpiece. The coordinate system may be calculated with corrections for the bending of the glass, for example, to provide the true coordinates when the workpiece (e.g. glass sheet) is later in a flat state. Calculation of a flat coordinate system will be described in more detail below.

In at least one example embodiment, the metrology device 301 may include optics (not shown in FIG. 4) for reading fiducials on the surface of the glass and/or features of a previously formed and/or patterned layer on the workpiece. The optics of the metrology device 301 may be fixed or slide along the toolbar 302 to access any point on the workpiece. The data from the metrology device 301 may be used for a variety of operations and/or functions. For example, the data from the metrology device 301 may be used for taking measurements used in assessing distortion created by high-temperature processing and/or coating/etching. The metrology device may also be used for aligning analytical, inspection, patterning and/or processing tools relative to a formed pattern, creating a distortion map on-the-fly for more accurate overlay between the current operation (e.g., patterning) and the previous pattern and/or monitoring distortion and/or drift in the coordinate system or support structure.

An example embodiment of the processing platform including only a toolbar having a metrology device may be referred to as a substrate metrology system. The substrate metrology system may have an accuracy of a few tens of nanometers.

The tool may slide along the toolbar and stop at one or more positions for an analysis. For example, a tool such as a microscope may automatically focus on a workpiece when the tool stops and send a video image to an operator. Because fine positioning may be done by the operator or by image recognition, the precision by which the tool has to locate the particular position need only be moderately accurate. Other analytical instruments may be integrated into the same platform to create multi-purpose analytical platform. Examples of other analytical instruments are optical instruments such as ellipsometers, reflectometers, scatterometers, FTIRs, and various types of cameras; scanning probe instruments, such as, STMs, AFMs, near field optical probes, scanning magnetic probes, Kelvin probes, and profilometers; surface analysis tools using photons, electrons, ions, atoms or x-ray; chemical and physical probes, such as, contact angle probes, temperature probes, acoustic microscopes, etc.; and electrical test instruments, such as, four-point probes and other instruments.

The platform shown in FIG. 4 has a plurality (e.g., four) of additional free positions for toolbars and may hold a plurality of (e.g., five) separate instruments, each one scanning the entire width of the stage. Platforms according to example embodiments of the present invention may include any number of toolbars and multiple tools may be mounted on each toolbar.

A workpiece may be a semiconductor (e.g., silicon) substrate or glass for manufacturing TFT screens and/or similar types of display devices. Useable glass size may depend on the size of the cylinder. TABLE 1 shows usable glass sizes for different cylinders. As shown, L represents the length and D represents the diameter of the cylindrical stage

TABLE 1

|  | L = 2000 mm | L = 3000 mm | L = 4000 mm |
|---|---|---|---|
| D = 1000 mm | G7 (about 1.9 × 2.2 m) | G9 (about 2.4 m × 2.8 m) | 4 × 3 m |
| D = 1400 mm | 2 m × 4 m | 3 m × 4 m | 4 × 4 m |
| D = 2000 mm | 2 m × 6 m | 3 m × 6 m | 4 × 6 m |

Although G9 (2400×2800 mm) is shown in Table 1 as the largest standard size glass for a platform having a length of 3000 mm and a diameter of 1000 mm, the platform may handle larger glass sheets, including about 4 m×about 6 m with a larger cylinder.

TFT displays may include two glass sheets one for the transistor array and one for the color filter. Both the glass sheets may be manufactured using similar or substantially similar processes, for example, blanket deposition of thin films, patterning by photolithography and etched. Each of the two glass sheets may have a thickness of about 0.5 mm to about 0.7 mm, inclusive, and may measure about 2 m by about 3 m. However, the thickness and/or size of the glass may vary.

Figure 5:
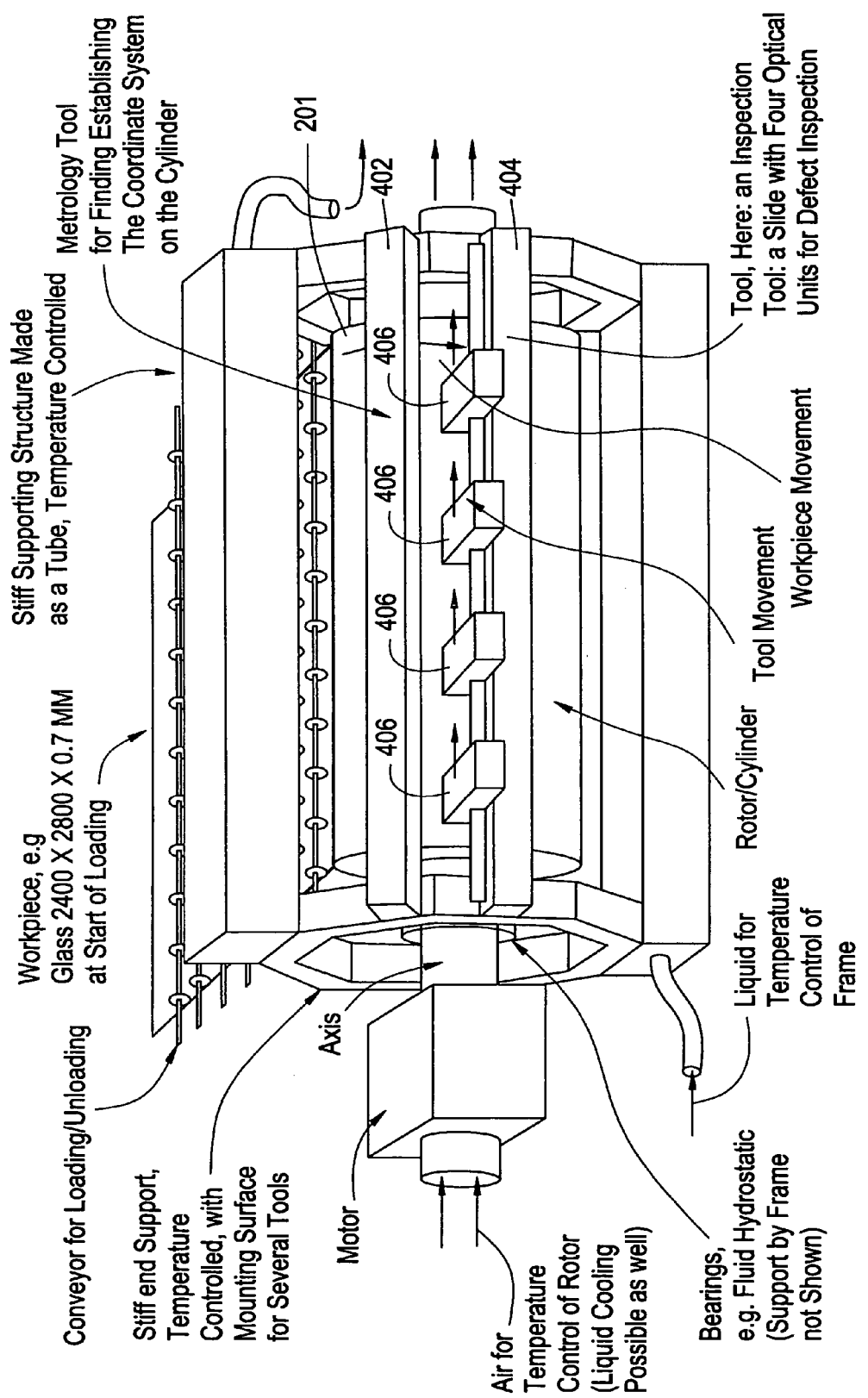
FIG. 5 illustrates a platform, according to another example embodiment of the present invention.

FIG. 5 shows an example embodiment of a platform, according to another example embodiment of the present invention. The platform of FIG. 5 may be similar or substantially similar to the platform shown in FIG. 2A, except that the platform of FIG. 5 may include a metrology toolbar 402 and an inspection toolbar 404. The inspection toolbar 404 may include a plurality (e.g., four) of optical inspection heads 406. The optical inspection heads 406 may be the same as one another, or different.

Referring to FIG. 5, as shown by the arrows the cylinder 201 may rotate and optical heads 404 may slide along toolbar 404 to cover the entire width of a workpiece loaded on the cylinder. Each optical head 406 may read a stripe of the workpiece with a camera and compare the read stripe to a known reference pattern. The reference pattern may be a time-delayed portion of the same stripe, a pattern from another tool on the same or another toolbar or a reference pattern obtained from a database. Comparing the read stripe to a time-delayed portion of the same stripe or a pattern from another tool may be referred to as die-to-die inspections, whereas comparing the read stripe to a reference pattern obtained from a database is referred to as die-to-database inspection. Example embodiments may use each method individually or in combination with one another.

For example, die-to-die inspection may be used for portions of a pattern that are predominantly periodic, whereas die-to-database inspection may be used for portions of a pattern that are aperiodic. Having multiple tools may enable the use of die-to-database inspection in more situations. The optical inspection heads 406 may be, for example, cameras, such as time-delay and integration (TDI) cameras. TDI cameras may provide a sharper image of a moving object.

Figure 6:
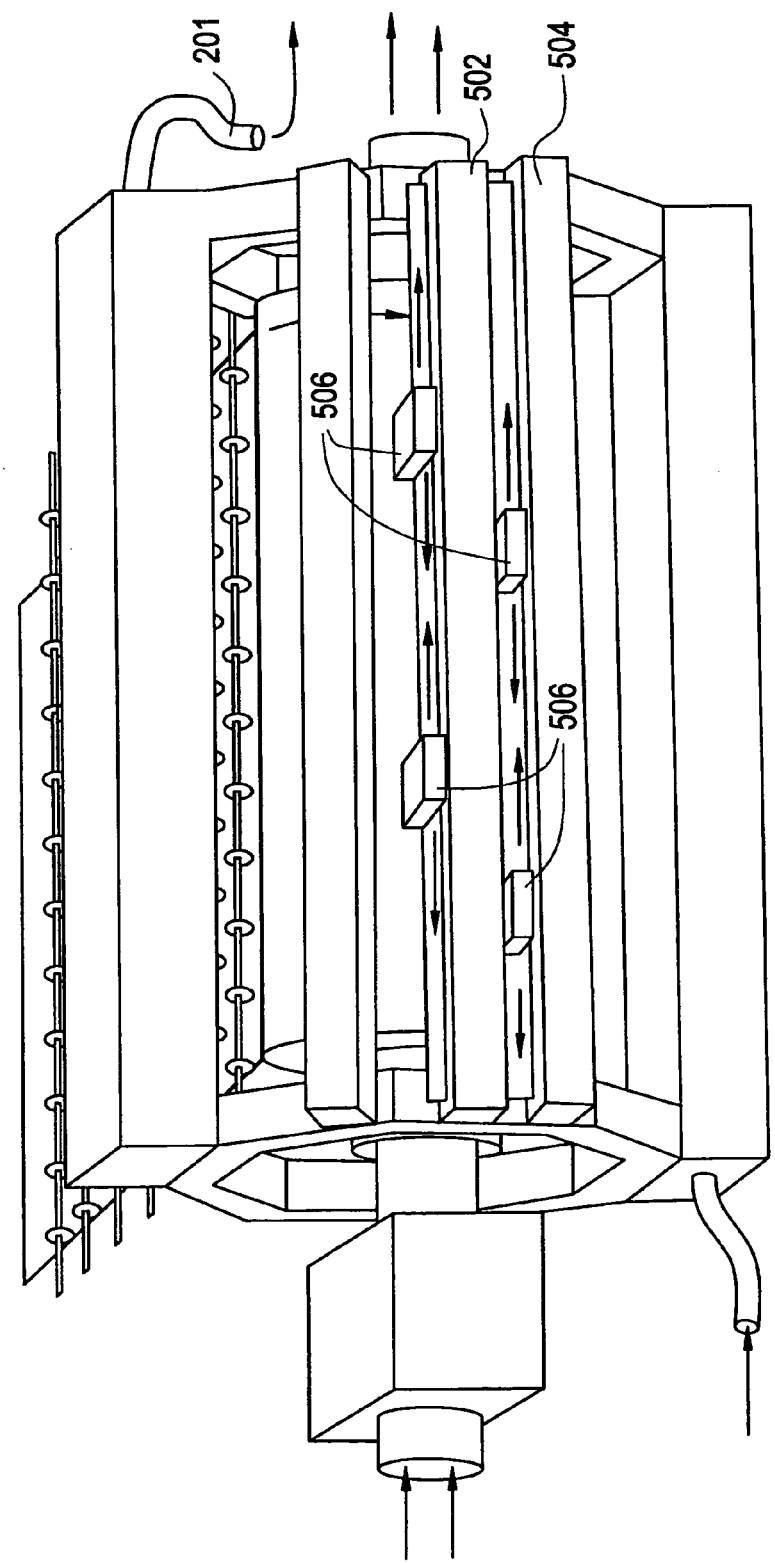
FIG. 6 illustrates a platform, according to another example embodiment of the present invention.

FIG. 6 shows a platform, according to another example embodiment of the present invention. The platform shown in FIG. 6 may be similar or substantially similar to the platform shown in FIG. 2A, for example, except that the platform of FIG. 6 may include a plurality of (e.g., two) patterning toolbars 502 and 504. Each of the patterning toolbars 502 and 504 may include at least one inkjet writing head 506. For example purposes, the toolbars 502 and 504 in FIG. 6 include two inkjet writing heads. Each inkjet writing head 506 may write or fill a stripe-like area when the cylinder 201 rotates. The stripe may have an oblique angle due to the simultaneous scanning via rotation of the cylinder 201 while the inkjet writing heads slide in an axial direction along a toolbars 502 and 504. The inkjet writing heads 506 may write overlapping stripes, and the patterning, writing or printing operation may involve more than one pass. In other words, the inkjet writing heads 506 may pass over the same or substantially the same portion of the workpiece more than one time.

The workpiece may be, for example, a substrate for color filter production and the inkjet writing heads 506 may print color filter dots and/or black matrix patterns. The inkjet writing heads may also print spacers, LCD liquid itself, resist, polyimide, organic and/or inorganic dielectric, passivation and/or protection films, active layers for organic LEDs, precursors for metal and inorganic layers, etc.

Figure 7:
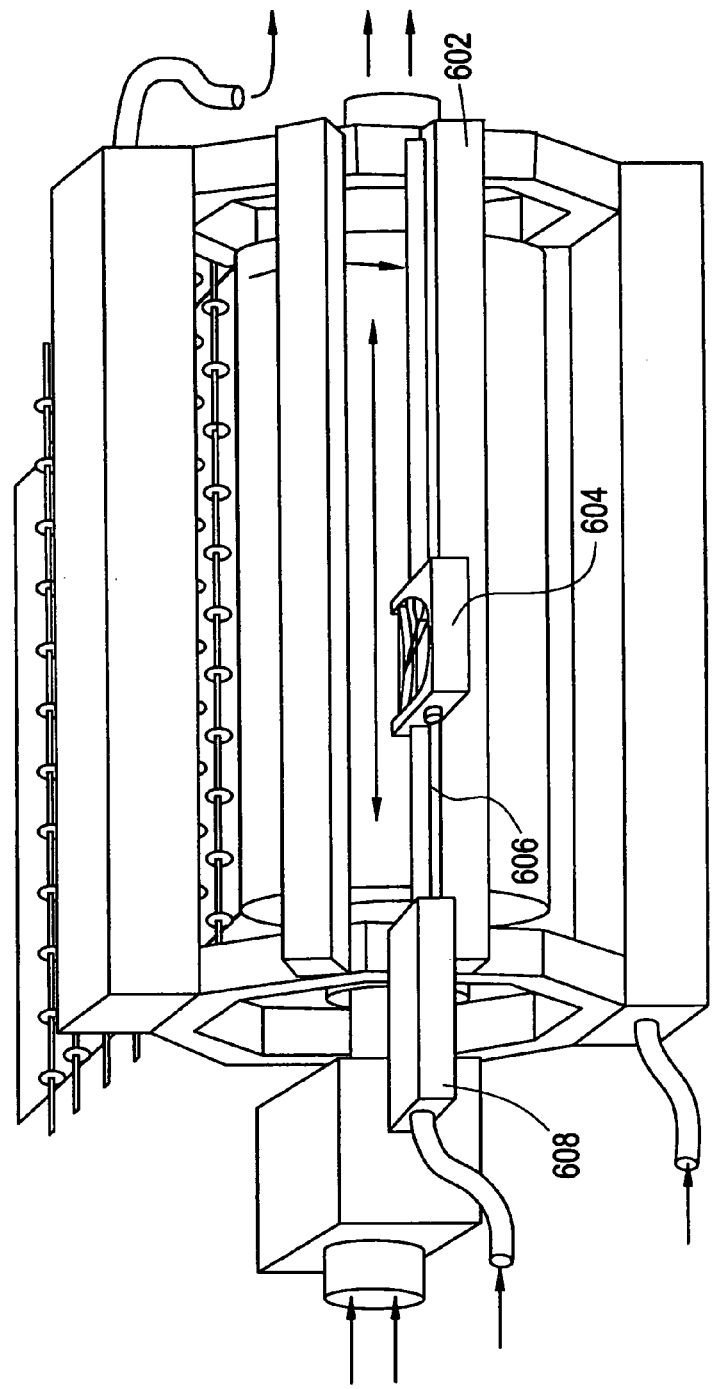
FIG. 7 illustrates an optical writing apparatus including a platform, according to an example embodiment of the present invention.

FIG. 7 illustrates an optical writer including a platform, according to an example embodiment of the present invention. As shown, the optical writer of FIG. 7 may include the processing platform of FIG. 2A, for example, and at least one additional toolbar 602. The toolbar 602 may be a single patterning toolbar including at least one tool 604. In this example embodiment, the toolbar 602 may include a single tool 604, and the tool 604 may be an optical writing head including a laser scanner. The laser scanner may be a polygon laser scanner, or any other suitable laser scanner; however, for example purposes FIG. 7 will be discussed with regard to a polygon laser scanner. A laser 608 fixed to the toolbar 602 may provide a laser beam 606 to the laser scanner. The laser 608 may be, for example, a pulsed excimer laser, a continuous laser, a modulated continuous laser, etc. However, for example purposes, FIG. 7 will be discussed with regard to a pulsed laser with a period of about 100 ns. In one example, the wavelength of the laser 608 may be about 1.06 microns and the pulse repletion rate may be about 50 kHz. The pulse energy may be about 10 mJ and the total energy may be about 500 W. Laser pulses from the may be triggered by an electronic circuit (not shown). The electronic circuit may calculate a time position of the next pulse to irradiate a specified or particular position on the workpiece based on, for example, scanning movements, such as, cylinder scanning, tool scanning and sub-scanning (e.g., scanning relative to the tool position).

The optical writer shown in FIG. 7 may be suitable for forming a pattern without using a resist referred to as direct structuring, e.g. directly forming semiconductor devices on the substrate without. Examples of direct structuring include laser ablation, thermal transfer lithography, etc. Depending on the direct structuring process, the wavelength may be different. For example, the wavelength of the laser beam 606 may be in the range about 1.06 nm to about 0.193 nm, inclusive. In addition, or alternatively, the pulse energy may be higher or lower, the pulse repletion frequency may be higher or lower and/or multiple toolbars with one or several scanner tools may be used depending on the direct structuring process.

The laser scanner in tool 604 may be implemented in a variety of ways depending on the particular application. For example, the laser scanner may be a galvanometer, a polygon, a holographic element or micromechanical element, an acousto-optical or electro-optical element or the mechanical scanning of the cylinder and/or the tool. In addition, or alternatively, example methods for scanning light beams are acousto-optic, electro-optic, rotating or oscillating mechanical or micromechanical, and holographic scanning, scanning by the cylinder and/or tools.

Optical writers, according to at least this example embodiment, may be used to create a latent and/or direct pattern using photon energy and/or heat. Latent and/or direct patterns may be written in, for example, a photoresist, emulsion, metal or metallic alloy film, organic film or other photosensitive material. In another example embodiment, material may be removed by ablation, or the formation of a pattern may depend on a laser-induced chemical reaction, a laser-induced change in surface energy or chemistry and/or a laser-assisted transfer of material from a donor film or from the workpiece. In yet another example embodiment, the optical writer may use a charged particle beam or an atom beam to pattern the workpiece.

When using optical writing heads, patterns may be formed by one or several scanning laser beams, projecting one or more one-dimensional or two-dimensional spatial light modulators or using one or more individually modulated arrays of spots from lenslet arrays. The wavelength of the laser beams may be chosen from, for example, EUV, over vacuum UV, deep V, mid UV, near UV, visible, near infrared to far infrared or a combination of more than one range. Illumination by lasers using the bandgap of gallium nitride to generate radiation with a wavelength is been described in U.S. Pat. No. 7,098,993, the entire contents of which are incorporated herein by reference. Alternatively, the wavelength of the laser beams may be selected from between about 1 nm to about 100 microns, inclusive. The laser 608 may be continuous, semi-continuous, direct-modulated or pulsed. Many example embodiment of laser writing equipment convert an input pattern specification in a vector or algorithmic format, e.g. GDSII, Gerber, or OASIS formats, to modulation signals for the optical writing hardware by a data path.

Figure 8:
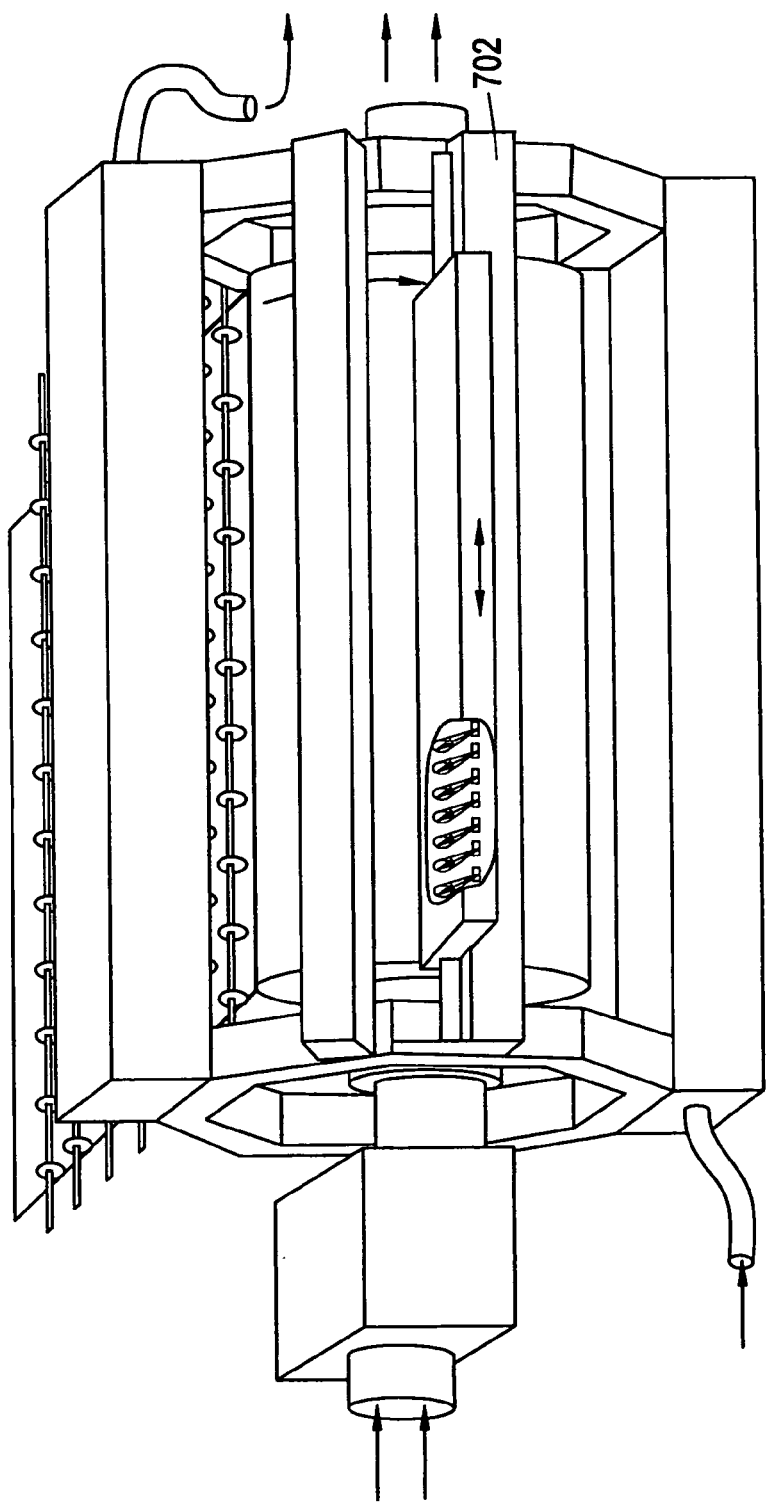
FIG. 8 illustrates an optical writing apparatus, according to another example embodiment of the present invention.

FIG. 8 illustrates an optical writer, according to another example embodiment of the present invention. The optical writer in FIG. 8 is somewhat similar to the optical writer of FIG. 7 except that the optical writer of FIG. 8 includes an optical writing head 702 including a plurality of continuous diode laser channels. In at least this example embodiment, laser diodes may generate the laser beams having a wavelength of, for example, about 406 nm. Each laser diode may emit a laser beam toward a given spot on the workpiece. The optical writing head 702 may include a plurality of laser diodes (e.g., about 12,000). The laser diodes may be arranged such that the number of parallel lines written on the workpiece when the cylinder rotates is equal or substantially equal to the number of laser diodes.

With a rotational velocity of about 10 m/s a workpiece area of about 6 m$^2$ may be written or covered with pixels of about 1 micron$^2$ in about one minute. The laser diodes may be direct-modulated with an on-off rate of about 10 MHz.

Still referring to FIG. 8, the optical writing head 702 may further include projection optics (not shown). FIG. 9A illustrates example projection optics included in the optical writing head 702.

FIGS. 9A and 9B illustrate example embodiments of optical channels stacked in the writing head tool in FIG. 8.

Referring to FIG. 9A, the optical channel 800A may include a spatial filter 806A for shaping and/or cleaning up the quality of the laser beam output from laser diode 802A. FIG. 9A shows a simpler arrangement in which a light source 802A (e.g., a laser diode) may be modulated (e.g., by modulation of the current to the laser diode). The beam may be focussed on the workpiece by the lens 808A. The beam quality of real-world laser diodes may not be sufficient for higher-quality lithography, and FIG. 9A shows the beam filtered by a spatial filter 804A and 806A. In another example embodiment the light source may not be modulated, but an external modulator may be used.

FIG. 9B illustrates another optical channel, according to an example embodiment. The optical channel in FIG. 9B may include multiple individually modulated beams.

Referring to FIG. 9B, the laser beam from the laser source 802B may be split by a beam splitter or fan-out element (e.g., a fan-out diffractive optical element DOE), the multiple beams may be individually modulated (e.g., using electro-optic or micromechanical modulators, shown as transmission devices, but an example embodiment may also be applicable to reflecting modulators, acoustooptic modulators or other suitable types), and projected onto the workpiece. In this example, a single laser source 802b may provide a plurality (e.g., 32) modulated beams, and the cost per beam may be reduced. In at least one example embodiment, the 12,000 laser beams described above may be created by 12,000/32 or 375 optical channels, each with 32 beams.

FIG. 9C illustrates an example embodiment similar to that in FIG. 9B, but further including a lens array 810C added. The lens array may allow the rest of the optics to be built with a relatively low numerical aperture (NA, e.g., relatively weak lenses), and thus, be simplified. The resolution of the system is determined by the NA of the lens array and this may be significantly higher (e.g., NA=0.25). The lens array elements may also be smaller, have a shorter focal length and may be used only on the axis. Smaller lenses may be easier than relatively larger lenses to make to a specified wavefront quality and while the lens 808B in FIG. 9B may need about 6-10 optical elements, each of the lens array elements may be a single, possibly spherical, refracting surface. The distortion in FIG. 9C is controlled by the manufacturing tolerances of the array, not by the alignment of the lens elements in 808B as in FIG. 9B.

As discussed above, the optical channel of FIG. 9C may be similar or substantially similar to the optical channel of FIG. 9B; however, the optical channel of FIG. 9C may further include a lenslet array 808C. The lenslet array 808C may relax the required etendue of the lens (e.g., the product of NA and field) since each lenslet images only a single point on the axis. The lenslet array may have a single, possibly aspheric, surface for each beam. For smaller or relatively small lenses used on axis, the optical quality of a single surface may be adequate. The lenslet array 808C may be created by mounting or etching a refractive surface or by using diffractive lens elements. Using a lenslet array where each laser beam is split into a plurality of beams may be more cost effective, than having one laser per channel as in FIG. 9A.

FIG. 9D illustrates a two-dimensional fan-out pattern in 806C with 138 beams lets that may be stitched to a surface-filling pattern. The lenslet array for creating this fan-out pattern may be the same or substantially the same as the lenslet array 808C, also shown in FIG. 9E, except that in this example the lenslet array may be rotated about 180 degrees to account for the image reversal of the projection system. The example embodiments discussed herein have a hexagonal pattern for stacking the lens lets, may be rotated and/or truncated so that the tool may draw 138 equally or substantially equally spaced parallel lines on the workpiece. If the tool is moving continuously and simultaneously with the cylinder, the beam pattern may be rotated to a combined scanning angle. The rhombic envelope of the beam pattern may provide a smoother transition to the next stripe, for example, because gradually fewer and fewer beams are provided from the left stripe, while more and more beams are provided by the right stripe. Alternatively, lines may be written near the stripe boundary twice, once in the left and once in the right, but the power used may be reduced so that the total exposure dose is the same or substantially the same in overlapping as in non-overlapped areas.

Figure 9F:
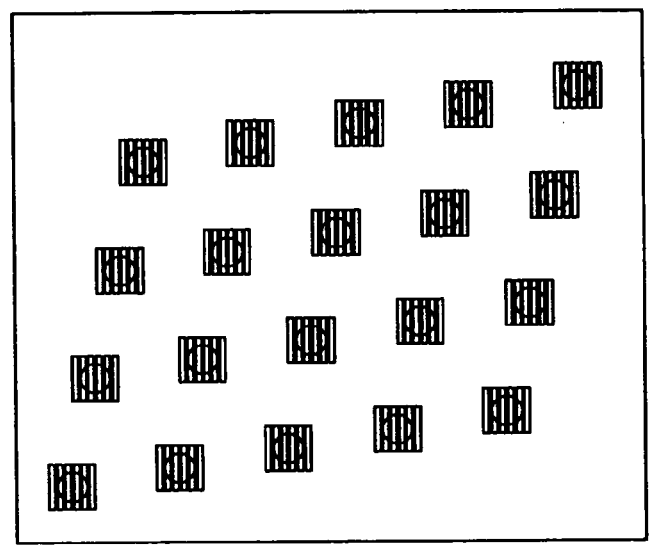
FIGS. 9F, 9G, and 9H illustrate modulator elements that may be used in FIGS. 9B and/or 9C.
Figure 9G:
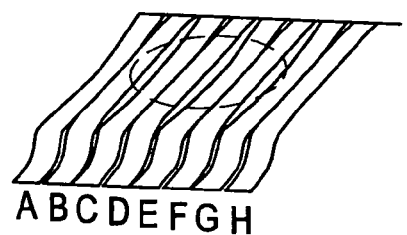
Figure 9H:
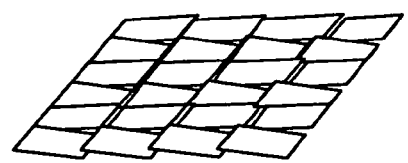

FIGS. 9F, 9G, and 9H illustrate modulator elements that may be used in FIGS. 9B and/or 9C. FIG. 9F shows a sparse array of modulator elements corresponding to 806B or 806C. The sparse array of modulator elements may be an array of modulator patches based on grating light valves. One such patch is shown in more detail in FIG. 9G. The reflecting mirror strips may be set in a reflecting state with all reflecting surface area in the same phase or in a non-reflecting state where some of the strips have been pulled electrostatically to a position where they create destructive interference, hence a non-reflecting state is created. In FIG. 9H a different micromechanical reflection modulator patch is shown. In this example, tilting mirrors may extinguish the reflection either by sending the laser beam specularly in another direction (e.g., DMD-type mirrors) or by diffraction (e.g., diffractive micromirrors), each of which are well known in the art. At least one example embodiment uses an array of electro-optic modulators and/or a liquid crystal shutter.

Figure 52:
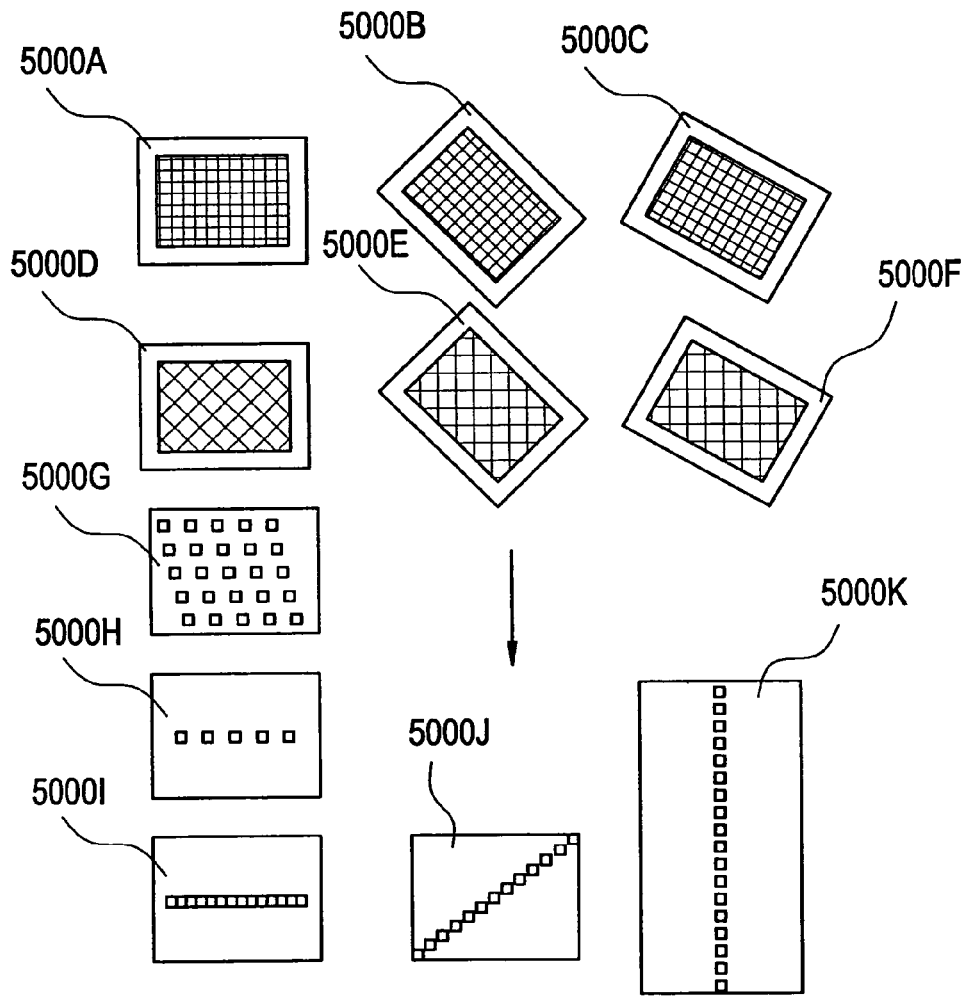
FIG. 52 shows an example spatial arrangement of simultaneously printed pixels, according to an example embodiment.

FIG. 52 shows an example spatial arrangement of simultaneously printed pixels, according to an example embodiment. The arrow in FIG. 52 represents the scanning direction.

Referring to FIG. 52, 5000A-5000C are dense matrices of pixels, for example, images of a rectangular spatial light modulator with the rows and columns of the array aligned with the sides of the rectangle. 5000A illustrates an SLM in which a pixel grid is parallel, or substantially parallel, to the writing direction. In other words, in 5000A is aligned with the direction of scanning, 5000B is rotated 45 degrees and 5000C is rotated to a different angle. 5000D, 5000E and 5000F are images of a dense matrix with the array rotated relative to the SLM sides, for example, by 45 degrees and rotated 0, 45 and a third angle. 5000G is a sparse matrix skewed or rotated so that the rows fall at different positions during scanning. In this example manner, the area may be filled in one or several scans. 5000H is a sparse row of pixels and may require multiple passes to fill the area; if such area-filling is desired. 5000I is a dense row, for example, an image of a one-dimensional SLM, and 5000J and 5000K are single rows with the pixels displaced in the scanning direction.

Figure 10A:
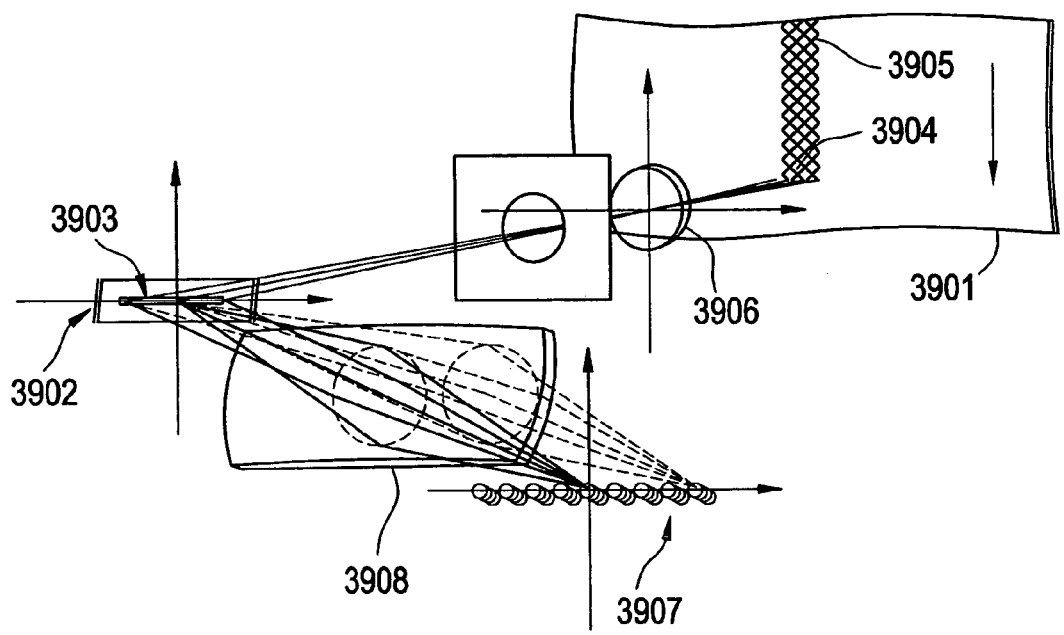
FIG. 10A illustrates an optical writing head, according to an example embodiment of the present invention.
Figure 10B:
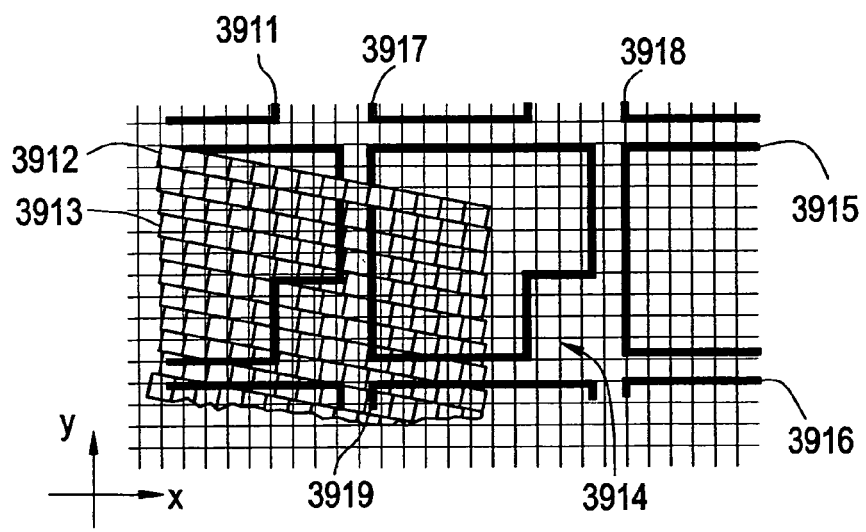
FIG. 10B illustrates a method for printing a pattern, according to an example embodiment.
Figure 10C:
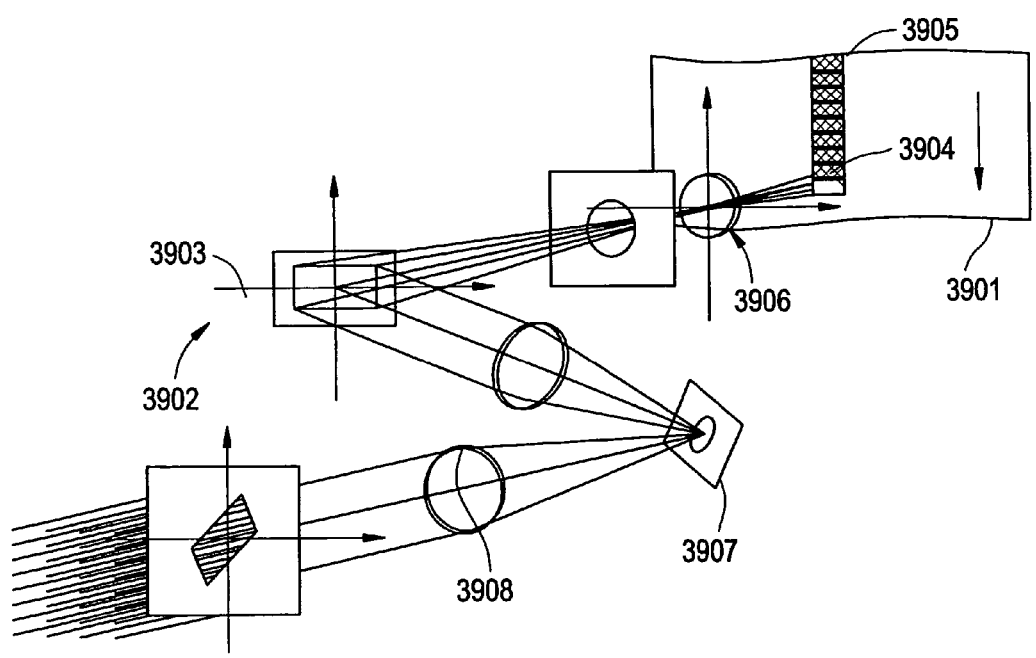
FIG. 10C illustrates an optical writing head according to an example embodiment.

FIGS. 10A and 10C illustrate optical writing heads, according to example embodiments of the present invention. At least one optical writing head of FIG. 10A and/or FIG. 10C may be included in a toolbar of an optical writer, according to at least some example embodiments.

FIG. 10A shows a writing head based on a one-dimensional spatial light modulator 3902, for example, a grating light valve (GLV). A row of modulator elements 3903 may be illuminated by a number of light sources 3907, for example, LEDs, laser diodes, fiber-coupled laser diodes, gas lasers, excimer laser, solid state lasers, with or without wavelength conversion, or the like. The illumination optics may have anamorphic optics 3908, which may spread the light from one light source over one or more (e.g., many or all) of the modulator elements, while all or substantially all light is collected in a line in the direction across the row of modulator elements. Each element of the one-dimensional SLM may be illuminated by one or more light source and/or may be separated by angle, polarisation, and/or wavelength in order not to create interference patterns over the SLM. An image 3904 may be formed using a focussing lens system on the workpiece 3901 and relative motion between the optical head and the workpiece may produce a stripe 3905.

The image of the SLM line may or may not be parallel to the axes of the workpiece.

FIG. 10B shows a manner in which a pattern 3911, 3917, 3918, 3915, 3916, and 3914 may be written by successive images of the SLM 3912, 3913, etc. The angle between the SLM image may reduce the incidence of moiré effects or so called "mura" as will be discussed in more detail below. FIG.

10C illustrates a writing head based on a two-dimensional SLM according to an example embodiment. One or more light sources may illuminate a field stop in the illumination path of the writing head. The lens 3908 may focus the light on an illumination aperture 3907, which may determine the angular content of the light illuminating the active area 3903 of the SLM 3902. The SLM may have a two-dimensional plurality of micromechanical mirrors, for example, diffractive mirrors or tilting mirrors, or alternatively an electro-optical or liquid crystal spatial light modulator. As in FIG. 10A an image 3904 may be formed on the workpiece 3901 and multiple images may be stitched together forming a stripe 3905.

Figure 10D:
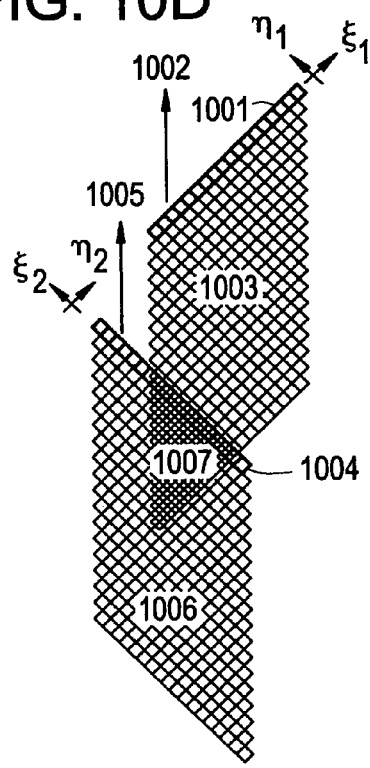
FIGS. 10D-10G shows example writings created using example embodiments.
Figure 10E:
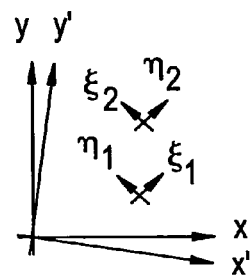

The writing head in FIG. 10C may provide an image which is x-y symmetrical, while FIG. 10A may not. FIG. 10D illustrates an arrangement of two one-dimensional (1-D) SLMs providing an x-y symmetrical image. Two 1-D SLMs 1001 and 1004 may be inclined by plus and minus about 45 degrees relative to the direction of movement 1002 and 1005. There may be two separate SLMs or one SLM used in a sequential fashion. The SLMs may write stripes 1003 and 1006. Where the two stripes overlap 1007 the image is x-y symmetrical. This is shown in FIG. 10E. As shown, x and y are the coordinates of the workpiece. The direction of movement may be parallel to y. In a direction perpendicular to an SLM ($\eta$) the imaging may be essentially incoherent, while in the direction parallel to the SLM ($\xi$) the image may be partially coherent. In the overlap area 1007 (which may cover all or substantially all parts of the workpiece) the image may be the sum of a first and a second exposure with $\xi$ and $\eta$ exchanged between exposures 1 and 2 as indicated in FIG. 10E.

Figure 10F:
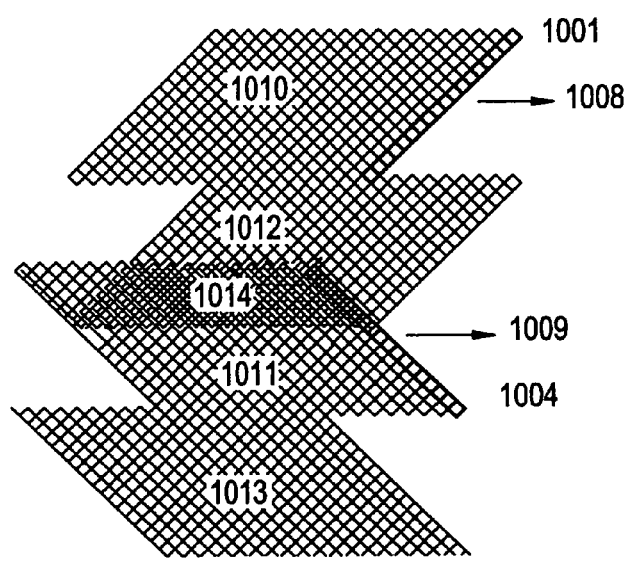

Referring to FIG. 10F, if the direction of movement is changed from y to x the system may write with essentially identical properties using the plus/minus about 45 degree rotation. Depending on the placement of the two SLMs the overlap may occur in a single pass with two SLMs 1007, or between what is currently written 1010, 1011 and what was written in a previous stripe 1012 and 1013. Arranging two SLMs at about 90 degrees relative to one another, and moving them about 45 degrees from the angle of the SLMs as shown in FIGS. 10D and 10F may provide a higher degree of flexibility for writing sparse patterns. The stage may scan horizontally or vertically, whichever covers the area to be written more efficiently.

Figure 10G:
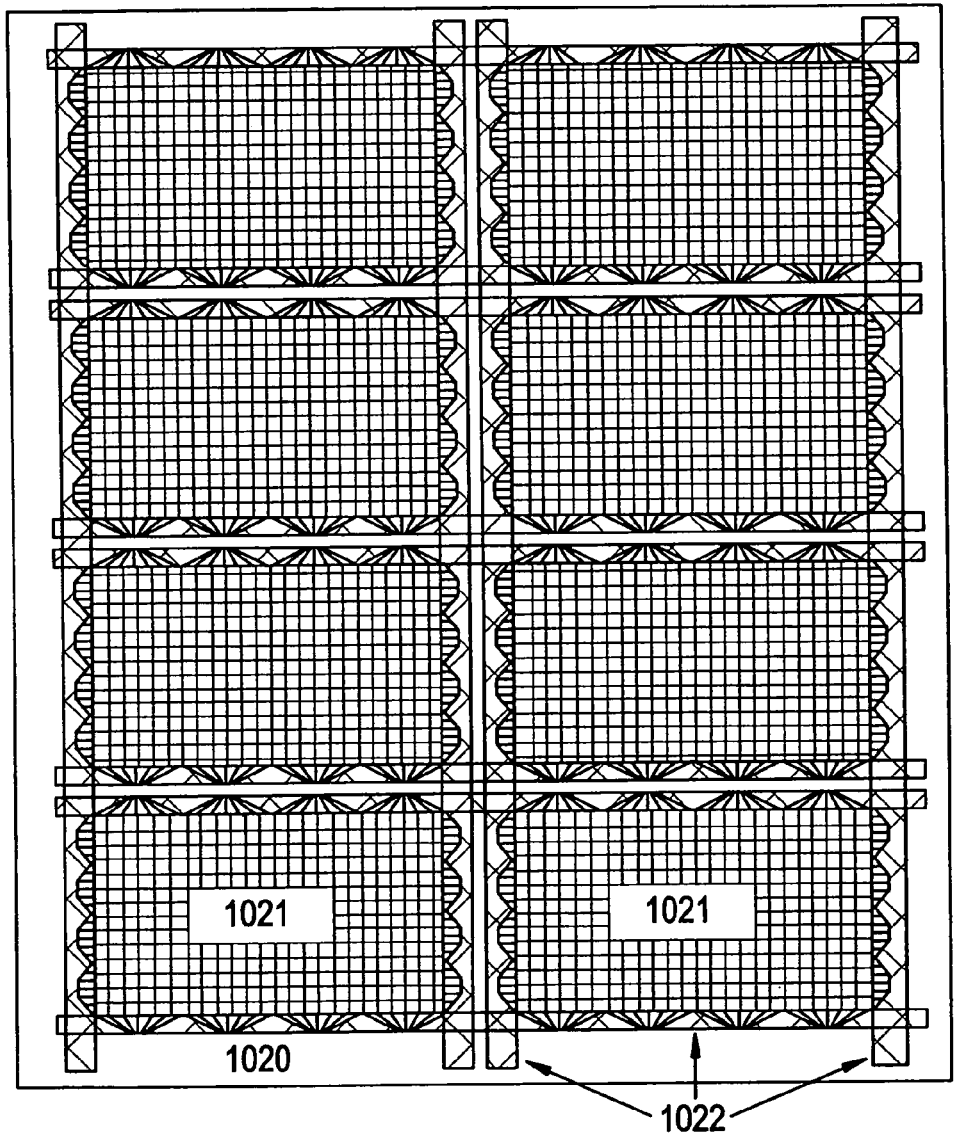

FIG. 10G shows an example pattern. The substrate 1020 may have eight displays 1021. Each display may have a central regular array area and a less regular peripheral area. Two areas may be exposed using different methods, for example, the regular area may be exposed using repetition of a small mask, and the peripheral areas may be exposed using mask-less exposure. The peripheral areas may be scanned alone. For example, first the vertical peripheral areas may be scanned, and then the horizontal areas, or vice versa. As shown in FIG. 10E the method may be generalized and used also when the coordinate directions of the workpiece are offset in order to reduce moiré and "mura" effects. Although example embodiments have been described with regard to one-dimensional SLMs, example embodiments may be equally applicable to other writing schemes, for example, writing with one or more laser beams scanning along a line. Laser scanners have the same x-y asymmetry as described above, and thus, example embodiments may increase flexibility as to the direction of the stripe.

Figure 10H:
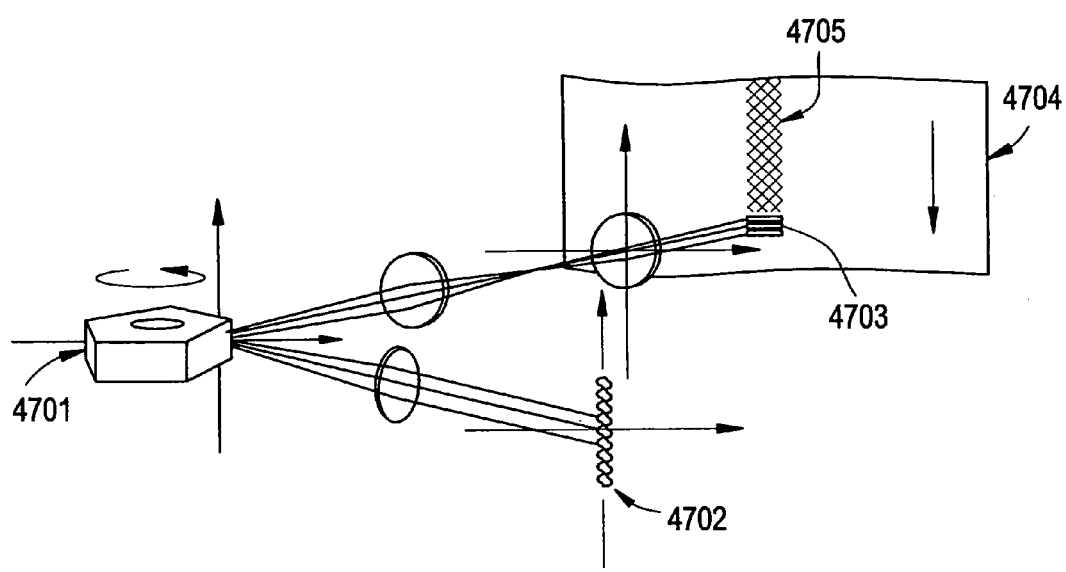
FIG. 10H illustrates an example laser scanner.

FIG. 10H illustrates an example laser scanner. As shown, at least one light source 4702 (e.g., a laser diode, gas laser, solid state laser, LED, continuous or pulsed, direct or via a fan-out element, etc.) may be imaged as a spot 4703 on the workpiece 4704. The spot may be scanned over the workpiece by an optical scanner 4702 (e.g., although a polygon scanner is shown, other scanners such as electro-optic, micromechanical, resonant, galvanometer, prism, holographic, or the like may be used). A relative motion between the optics and the workpiece creates a stripe 4705.

The optical writing head may further include cameras and/or sensors for aligning and/or focusing. The focusing may be performed by a feed-forward focus system using a height map, which may be created before or during scanning. The height map may be used for feed-forward focus corrections.

As compared to a pure feedback focus system the feed-forward focus system may suppress noise and/or enhance dynamic properties. A feedback system may use instantaneous sensor information to correct focus. As a result, the correction is applied later than the measurement, also known as servo lag. To reduce the servo lag, the speed of the entire servo loop may be increased; however, a faster loop may result in increased noise. In a feed-forward system, measurements may be collected, filtered and stored for application later, for example, on the next scan. In this example, correction may be applied without lag, and therefore, the bandwidth of the servo need only be sufficient to accommodate the needed slew-rate in focus, and may be independent of the servo lag. The dynamics of the focus system may provide substantially improved dynamic properties.

The cameras for aligning and/or focusing may pick up images of fiducials and/or the pattern already on the workpiece and a controller may calculate the distortion of the workpiece, for example, in real-time. The cameras may take the image when the cylinder is stationary, may freeze movement with pulsed illumination and/or use TDI sensors for capturing high quality images while scanning at high-speeds.

FIG. 10B illustrates an example pattern written using the optical writing head of FIG. 10A or 10C.

Referring to FIG. 10B, the image of a one-dimensional SLM (or equivalent laser scanner) may be rotated with respect to the axes of the data. The data may be rasterized 3914 in the coordinate system of the data and re-mapped to the grid of the writing hardware 3919. In at least one example embodiment the rasterization may be done (e.g., immediately) in the grid of the rotated hardware. For example, each data element written by the hardware may be assigned to a geometrical figure, for example, a basic pixel. The basic pixels together may fill the area without overlap. The rasterization hardware may compute the overlap area of each pixel with the written features in the patterns (or alternatively and equivalently the non-written ones).

In example embodiments a weight-function may be assigned over the area of each pixel, so that the pixel map becomes a weighted overlap. In addition, pixels used for weighted overlap calculation may by partly overlapping, for example, the weight function for the pixels may have support outside the basic area. If multiple exposure passes are written, they may be rasterized and/or written with different grid offsets such that the pixel map is different between at least two passes.

Figure 11:
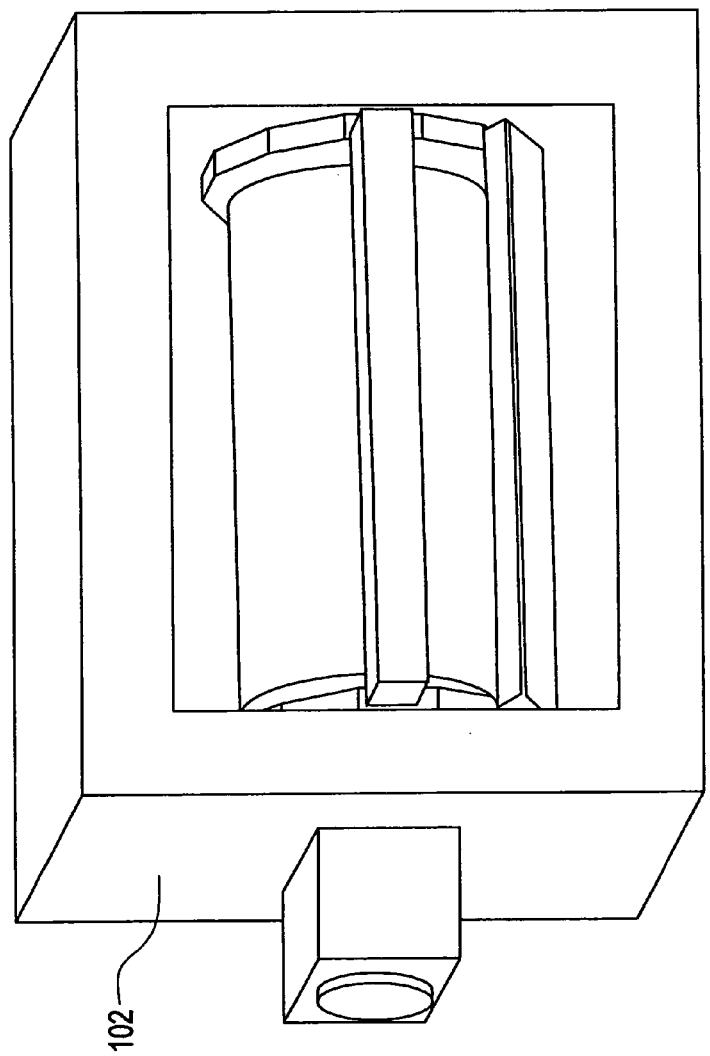
FIG. 11 illustrates a processing platform encased in a housing, according to an example embodiment of the present invention.

FIG. 11 illustrates a processing platform encased in a housing, according to an example embodiment of the present invention. The processing platform included in the housing 102 may be any processing platform, according to example embodiments of the present invention. The housing 102 may also house other components for vibration isolation, temperature control, control of contamination and control devices for operating the stage. The housing of FIG. 11 may also have mechanisms for loading and unloading the workpiece (not shown).

A cylindrical stage, according to at least some example embodiments of the present invention, may be oriented in a variety of ways, and/or may have the ability to load and/or unload workpieces in more than one direction. Because the cylindrical stage may be loaded and/or unloaded in more than one direction, a robotic handler for controlling and/or changing material flow in a processing track may be omitted.

FIG. 12A illustrates a cylinder arrangement having a plurality of inputs and outputs, according to an example embodiment.

FIG. 12B shows how the cylindrical stage may be arranged within a processing track such that the workplaces may be captured or allowed to pass. As shown, one or more workpieces 1100 carried on processing track 1102 may pass over the cylindrical stage 1104 or be taken by the cylindrical stage 1104 depending on the desired order of the workpieces. For example, if workpiece 1100 need be delayed, workpiece 1100 may be taken off the processing track 1102 by cylindrical stage 1104. While on the cylindrical stage 1104, other workpieces may pass-over the cylindrical stage 1104 and be processed ahead of workpiece 1100. On the other hand, if no delay is required, workpiece 1100 may pass-over the cylindrical stage 1104 and continue on the processing track 1102. This arrangement may be used for an analytical instrument such as those used for sampling quality control.

The cylindrical stage may also be used to capture a workpiece, hold the workpiece and release the workpiece after a period of time to change the order of workpieces on the track. As is well-known in the art, changing the order of two elements in a sequence is a more elementary operation enabling arbitrary sorting, and the ability to capture and/or hold a workpiece allows sorting of the workpieces.

FIG. 12C illustrates a plurality of cylindrical stages arranged serially. Although FIG. 12C only illustrates three cylindrical stages, a similar arrangement may include any number of cylindrical stages. Each cylindrical stage in FIG. 12C may be the same or substantially the same as the cylindrical stage shown in FIG. 12B, and may have the ability to pass and capture a workpiece. Using the arrangement shown in FIG. 12C, the total throughput may be correlated to the number of cascaded cylindrical stages. For example, the more cylindrical stages, the higher the total throughput. Any workpiece may be sent to any of the machines, processed, and sent back into the material flow on the processing track. This may provide improved flexibility for utilising the combined capacity of the three pieces of equipment. The cylindrical stages may also be three different types of equipment, or may be used for sorting or changing the order between the workpieces.

Figure 13:
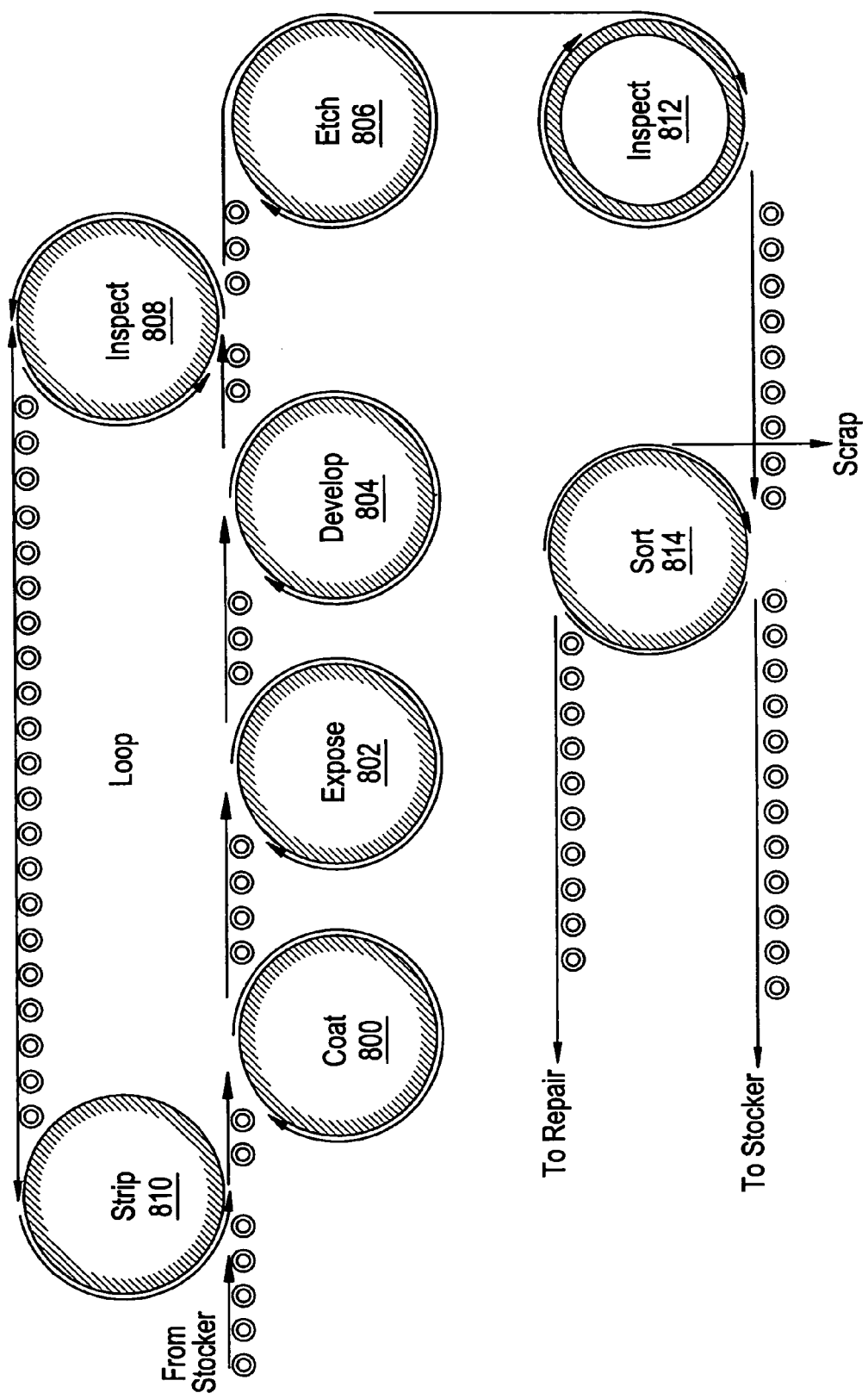
FIG. 13 shows a processing unit, according to an example embodiment of the present invention.

Because workpieces may be processed and/or the workflow of the workpieces changed using a cylindrical stage, more compact processing units such as the one shown in FIG. 13 may be realized.

FIG. 13 shows a processing unit, according to an example embodiment of the present invention. The processing unit shown in FIG. 13 may be used for lithography and/or etching. Referring to FIG. 13, a workpieces may enter from the left (e.g., provided from a stocker). The workpiece may be coated with a photoresist and baked at coating station 800. After being coated and baked, the workpiece may be exposed at exposure station 802 and developed at developer 804. After development the resultant resist pattern on the workpiece may be inspected by inspection station 808. If the resist pattern fails inspection, the workpiece may be stripped at strip station 810, and return to the coating station 800.

Still referring to FIG. 13, if the resist pattern passes inspection, the workpiece may be etched at etching station 806, and inspected again at inspection station 812. If the workpiece passes inspection or has repairable defects, the workpiece may be output to the stocker or a repair station accordingly. If the workpiece fails inspection, (e.g., the workpiece is irreparable) the workpiece may be output to scrap and discarded.

By inspecting the workpiece at inspection station 808, and re-spinning the workpiece if necessary, defects in the resist image may be removed from determination of yield. Although a similar process may be performed using conventional flatbed machinery, the same or substantially the same process done by flatbed machinery and robot handlers may occupy an area (e.g., footprint) several times larger than that required by example embodiments of the present invention.

The ability to build more compact inspect-and-re-spin and inspect-and-repair loops may be valuable to the industry because TV sized display devices may be difficult to manufacture without yield loss due to defects. The large area per device and the few devices per mother glass may increase the economic impact of a single defect. The defect may not be repaired after the devices are completed because the defect is then embedded in the thin-film stack. Methods for remedying defects include inspecting and re-spinning or repairing defects immediately after a defect has been created. In doing so, defects may be more effectively removed from yield loss. Of the production cost, about 70% is materials, 10% salaries, and 20% is depreciation of equipment. Therefore, an increase in yield may relatively strongly affect production economy and additional investments in equipment may be rapidly paid back by less wasted material and/or higher productivity.

Figure 14A:
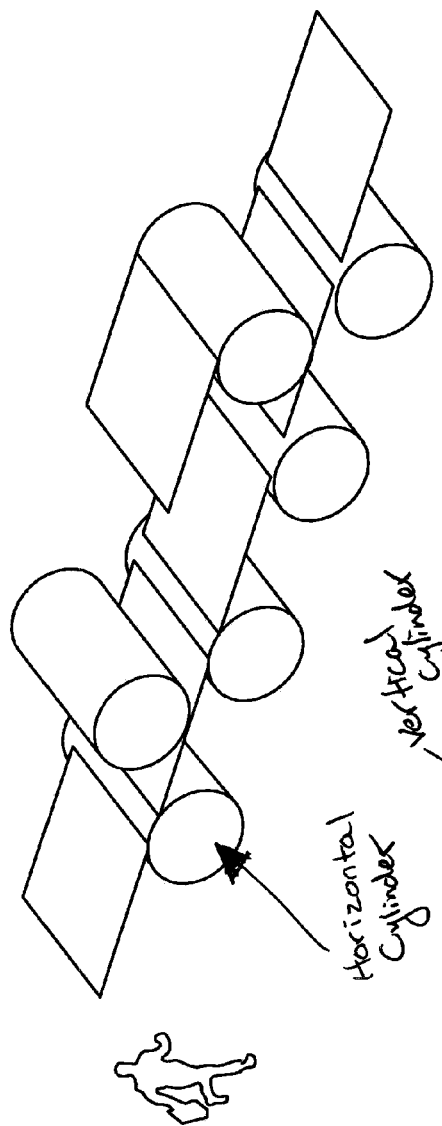
FIGS. 14A and 14B show example arrangements of the processing unit of FIG. 13.
Figure 14B:
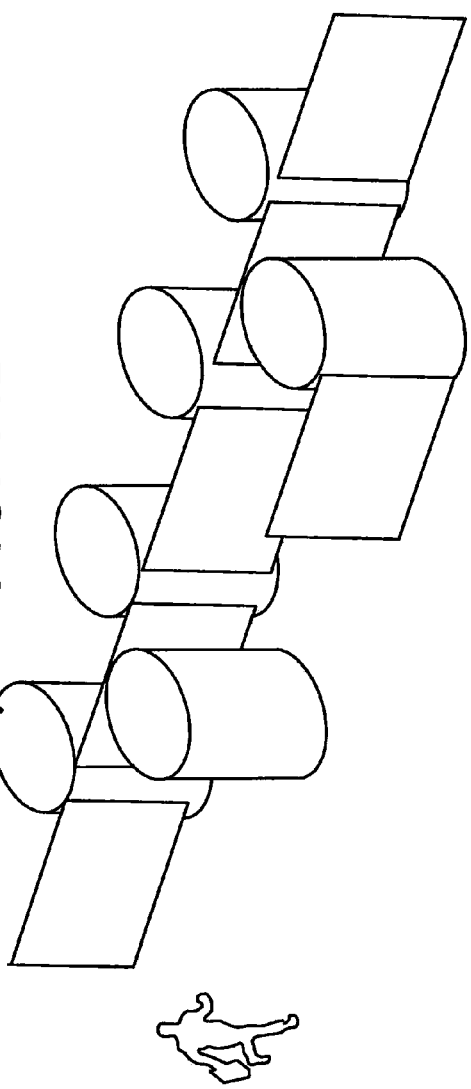

The processing unit of FIG. 13 may be oriented in a plurality of ways, for example, horizontally or vertically, as shown in FIGS. 14A and 14B, respectively.

FIGS. 14A and 14B illustrate example orientations of the processing unit of FIG. 13. As shown in FIG. 14A, the processing unit is arranged in a horizontal arrangement, whereas in FIG. 14B, the processing unit is arranged vertically.

FIGS. 15A and 15B show a comparison of the floor space required for a single conventional flatbed machinery (FIG. 15A) and the cylindrical machinery, according to at least some example embodiments (FIG. 15B). As shown, a single piece of equipment may be several times smaller using a cylinder stage embedded in the track as compared to conventional flatbed equipment positioned alongside the track and with a robot. FIGS. 15A and 15B also illustrate that building a factory with equipment based on cylindrical stages and tracks going above the head of the operators may provide increased accessibility and/or serviceability for the equipment. Because air flows from ceiling to floor within a factory, processing tracks and/or workpieces carried thereon are more protected from contamination higher up. In addition, using cylindrical stages, according to at least some example embodiments of the present invention, may enable the primary sources of contamination (e.g., people) to be below the processing area.

Figure 16:
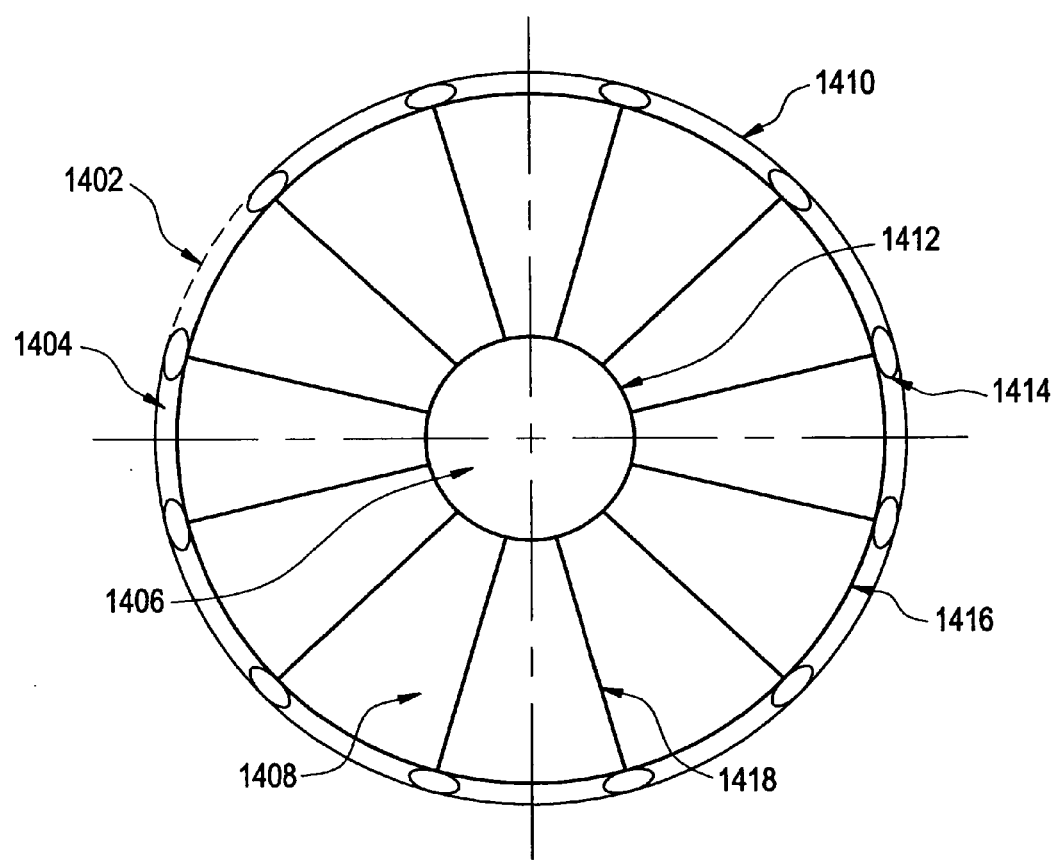
FIG. 16 shows a cross-sectional view of an example embodiment of a cylinder.

FIG. 16 shows a cross-sectional view of an example embodiment of a cylinder. The cylinder may be relatively stiff and relatively lightweight. As shown in FIG. 16, the cylinder may include a central tube 1412 extending out to the bearings. The tube 1412 may act as an axis around which the cylinder may rotate. The tube 1412 may be comprised of, for example, aluminum, steel, a composite alloy, or the like. The cylinder may be a larger tube centered around an axis 1406, and may be anchored by a web of internal walls 1418. The internal walls 1418 may be comprised of aluminium, for example, aluminium struts. The internal walls 1418 may form compartments in which air may be blown to control the temperature of the cylinder.

A second tube 1416 may be arranged on the outside of the tube and may form the surface of the cylinder. The second tube 1416 may be comprised of, for example, aluminium, titanium, steel, a composite alloy material or the like and may be about 10 mm thick. A space between a surface layer 1410 and the second tube 1416 may be divided into compartments and used for applying a vacuum for clamping a workpiece to the cylinder. The surface layer 1410 may be about 4 mm thick. The surface layer may be perforated to create a path for the vacuum.

The surface of the cylinder may need to be conditioned differently for different operations. For example, Teflon coated stages are well known in the art as being inert, easier to clean and non-scratching. For optical writing or optical reading the reflection from the cylinder surface, the back side of the transparent workpiece and interference effects between them may be harmful, especially when laser light is used. A careless design may give rise to Newton rings that may be visible in the finished product. A non-reflecting cylinder (e.g., a cylinder created from anodized titanium with lower reflectance for the laser wavelength) may remedy these Newton rings.

Alternatively, the cylinder surface may have a surface roughness or profile such that the phase varies quickly from one point to the next. The cylinder may touch the substrate only at some points and these points may be relatively small and/or randomly distributed.

In another example embodiment, the cylinder may be covered with a surface that has a "wet" appearance, for example, a liquid or a viscoelastic or tacky polymer. The varying reflectance described above comes from reflections in the cylinder outer surface, and if it is smooth and close to the workpiece, made worse by Newton rings. In at least this example embodiment, separate surfaces between workpiece and air and between air and cylinder are not present. Instead, there is only a single interface directly from workpiece to cylinder. In order to avoid trapping air between the workpiece and the cylinder the cylinder surface material must be at least somewhat resilient, such as, a thin viscoelastic layer or a layer of a tacky soft polymer.

Because the workpiece is rolled onto the cylinder, air may be pushed out before contact is made and a continuous optical contact without bubbles may be achieved. Likewise the substrate may be peeled more cleanly from a tacky surface when the substrate is unloaded. The surface of the cylinder may pick up particles, but it may be periodically cleaned from contamination and particles by rolling or swiping against, for example, a tackier, cleaning surface, as is known in the art.

The cylinder shown in FIG. 16 may be about 2 m long, and may have a resonance frequency of about 500 Hertz in the bending mode. Resonance frequency may be used to measure of the stiffness of the cylinder. For high-speed operation, (e.g., spinning at high speed), adjustable balance weights may be used to compensate for the weight difference between different glass thicknesses.

Figure 17:
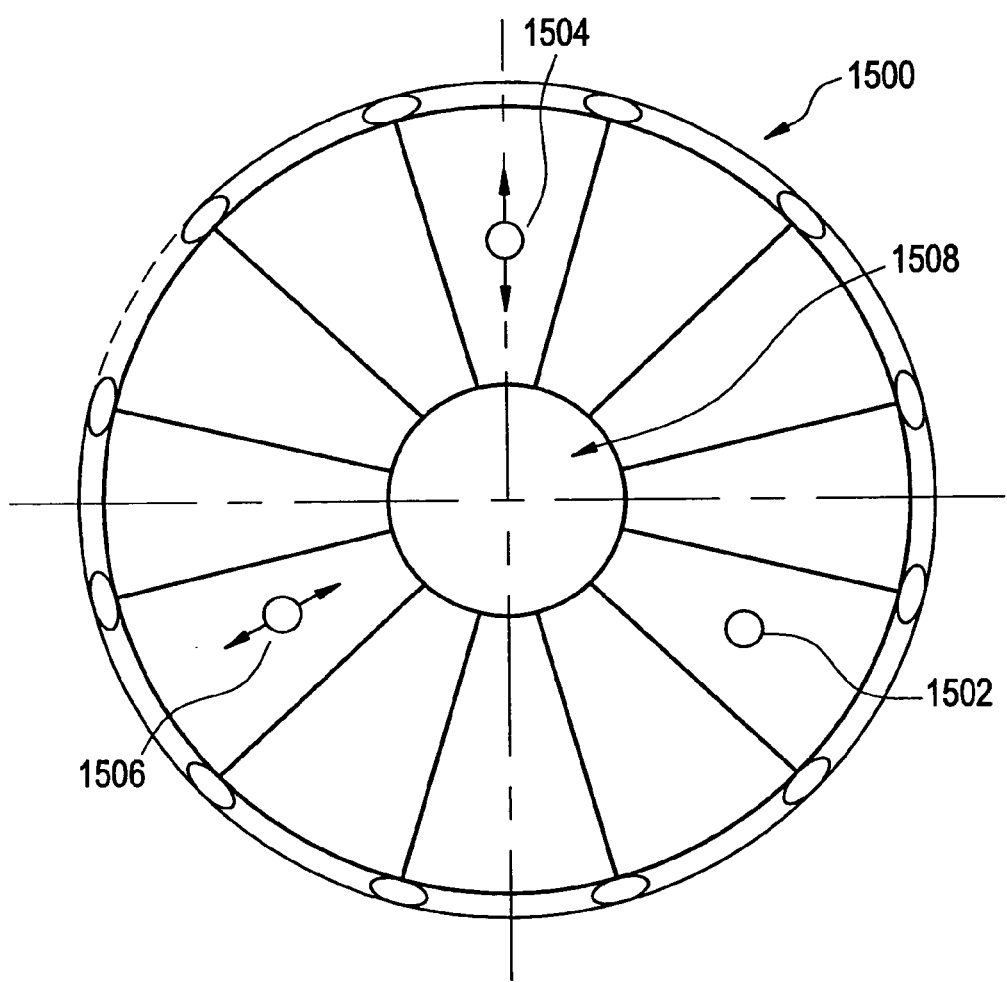
FIG. 17 illustrates a cylinder including adjustable balance weights, according to an example embodiment.

FIG. 17 illustrates a cylinder including adjustable balance weights, according to an example embodiment. As shown, the cylinder 1500 may include a plurality of adjustable and/or fixed weights 1502, 1504 and 1506. Although FIG. 17 illustrates only three adjustable weights for example purposes, any number of adjustable weights may be used. Weight 1502 may be fixed and weights 1504 and 1506 may be moved or adjusted closer or farther from the center of the cylinder 1500 using actuators. The adjustable weights 1504 and 1506 may be used for static and dynamic balancing. By adjusting weights 1504 and 1506, the center of gravity of the cylinder 1500 at the cross-section may fall on the axis of rotation 1508.

If weights are arranged, for example, at each end and at one intermediate position, the cylinder may be balanced statically and/or dynamically for the first bending mode. Dynamic balancing may be done under computer control based on measured forces or accelerations acting on the bearings and/or bending the cylinder while rotating, as is well known in the art of rotary machinery, for example, power generators.

FIG. 18A shows a horizontal orientation of a cylindrical stage, according to an example embodiment. FIG. 18B shows a vertical orientation of a cylindrical stage, according to an example embodiment. When loading the cylinder horizontally, as in FIG. 18A, a workpiece may be taken from a conveyor belt. When loading the cylinder vertically, as in FIG. 18B, the cylinder may be loaded from a guide rail system. When loaded horizontally, the workpiece may be kept in place by gravitational force. In addition to the gravitational force, horizontally loaded cylinders may be held in place by a pusher to force the edge of the workpiece down on the cylinders to latch the workpiece in place. The workpiece may be held in place by a vacuum to ensure that the surface follows the surface of the cylinder closely. At the ends of the workpiece the spring force of the workpiece may be the primary force. Therefore the end of their workpiece has to be fastened more securely to the cylinder. A latch that may be controlled to capture or release the edge of the workpiece may be used. When the edge is released for unloading the pusher takes over the force and follows the end of the workpiece while being unrolled. The pusher may be a contact type or noncontact.

Figure 19:
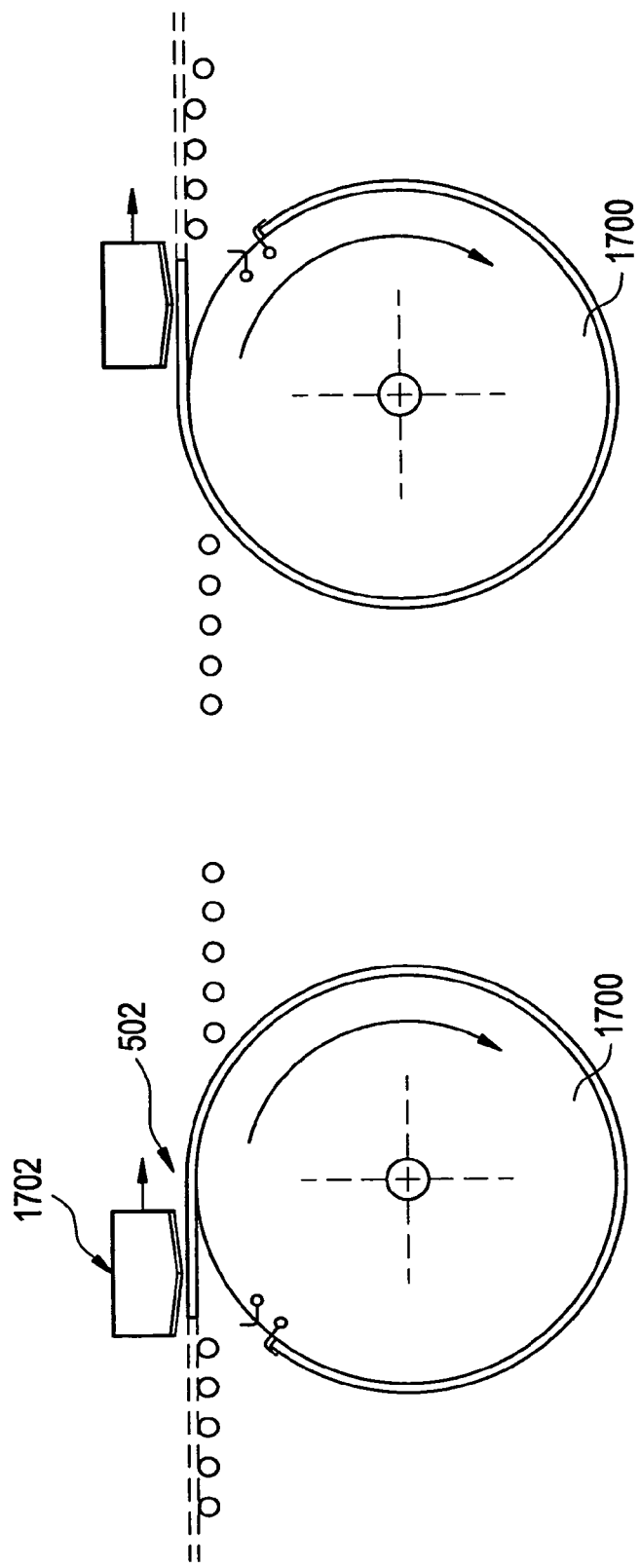
FIG. 19 shows a non-contact pusher having a porous air cushion facing the workpiece, according example embodiment of the present invention.

FIG. 19 shows a non-contact pusher having a porous air cushion facing the workpiece, according to one example embodiment of the present invention. As shown, a non-contact pusher 1702 may be arranged where the workpiece is loaded onto cylinder 1700, and another non-contact pusher 1704 may be arranged where the workpiece is unloaded off of cylinder 1700.

Example embodiments provide methods and apparatuses for building equipment for manufacturing of displays and/or solar panels that is smaller, lighter, and/or more precise than conventional equipment. Applicability and/or usefulness of example embodiments using a cylinder stage may depend on whether the glass can be rolled on the cylinder much smaller than the size of the glass. Example embodiments may use a cylinder with a diameter of about 1 m. The strength of the glass in the volume may be degraded by, for example, random micro-cracks in the surface of the glass that may propagate on the glasses in the stressed state. If the microcracks degrade the strength of the glass, the allowable stress of the glass may be a function of the area of the glass. The more carefully the glass is handled, the less is the probability of the glass having a damaging crack. The probability of failure may also depend on properties of the glass, for example, the energy needed to propagate a crack. Glass used for display manufacturing has been developed with this property in mind and may be stronger than standard glass. Probability of failure may also be reduced by coating the glass. The coating may bridge microcracks. At least a portion of glass sheet breakage is initiated at edges of a glass sheet. The edges may be the most vulnerable to damage during handling and/or when cutting the glass. The glass sheet may be scored and cut to size. In an example scoring process, a roller creates fine cracks at a scoring line. When the glass is later bent over the scoring line, the glass may break. However, the scoring with a roller may leave small cracks at the cut edge. These cracks may propagate into the glass when the glass is stressed and may cause failure at a lower stress level as compared to surface damage. Scoring may be performed using, for example, a diamond or a laser.

Laser scoring is well-known in the art and creates an edge that may be virtually free from cracks. Because laser scoring is well-known in the art, a detailed discussion will be omitted for the sake of brevity.

Figure 20:
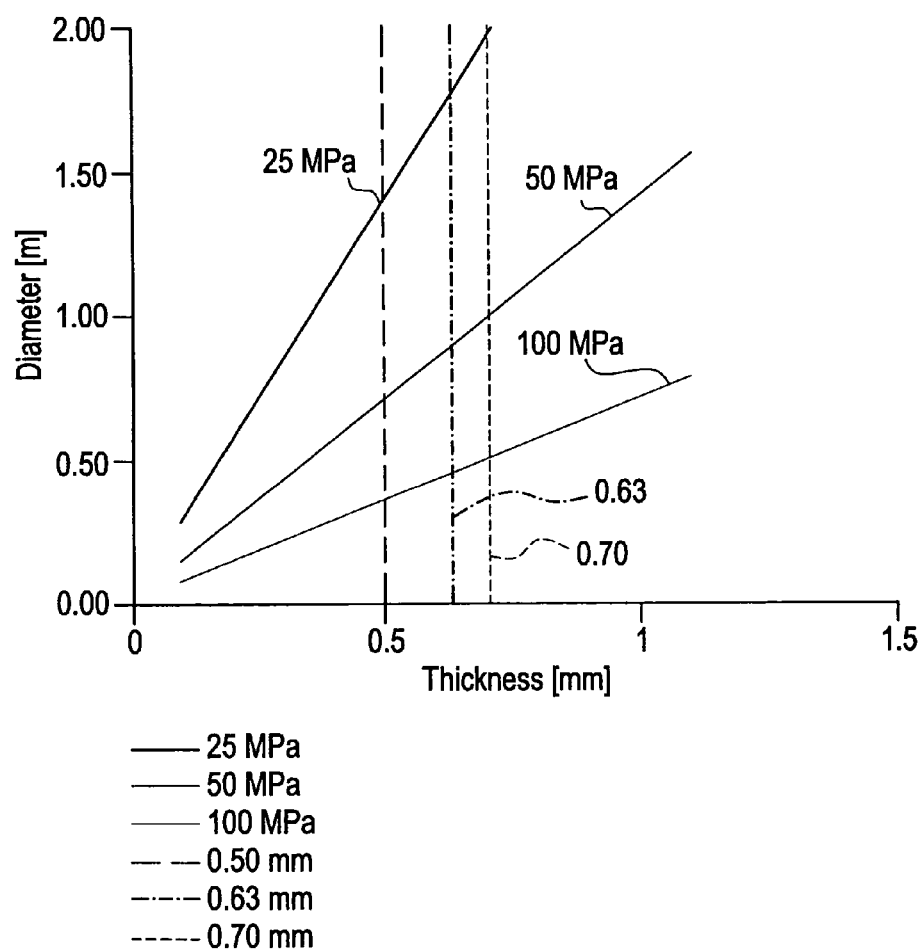
FIG. 20 is a graph of cylinder diameter versus glass thickness showing a relation between the stress in the surface of a uni-axially bent glass, the glass thickness and the diameter of the cylinder.

FIG. 20 is a graph of cylinder diameter versus glass thickness showing a relation between the stress in the surface of a uni-axially bent glass, the glass thickness and the diameter of the cylinder. The glass may have a thickness between about 0.5 mm and about 0.7 mm, inclusive (e.g., about 0.5 mm, about 0.62 mm or about 0.7 mm). The dashed lines in FIG. 20 mark the glass thickness of 0.5 mm, 0.62 mm and 0.7 mm. As shown in FIG. 20, a cylinder with a 1 m diameter provides 50 MPa for a glass that is 0.7 mm thick and about 37 MPa for 0.5 mm. Glass may be up to about 3095 mm long (e.g., need a cylinder about 1.0 m in diameter). In example embodiments of the present invention, the probability of glass breakage when bent to about 1 m diameter must be on the order of 1/100,000 per loading operation. To ensure this probability, the glass sheets may be prestressed to a slightly higher stress, before loading. Glass sheets that have damaging microcracks may break during pre-stressing and be removed. Glass passes the pre-stressing test without damage may be less likely to break during processing.

Figure 21A:
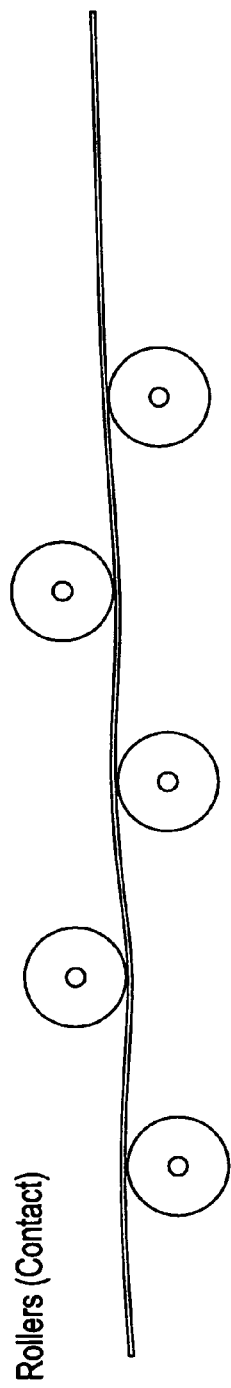
FIGS. 21A and 21B illustrate pre-stressing devices, according to example embodiments.

FIGS. 21A and 211B illustrate prestressing devices, according to example embodiments.

Figure 21B:
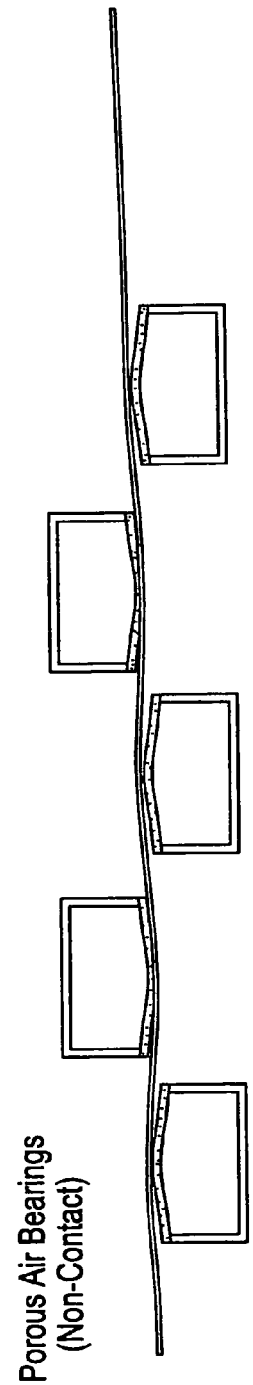

Referring to FIG. 21A a brittle workpiece (e.g., a glass sheet) is prestressed using rollers. For example, the workpiece may be fed through the rollers as shown in FIG. 21A and may be forced to bend in a controlled fashion. FIG. 21B shows a similar device in which the rollers are replaced with non-contact air cushions. Although FIGS. 21A and 21B show approximately symmetrical bending to both sides, by changing the distance between the rollers (or air pads, alternatively), the stress may be asymmetrical.

Figure 22A:
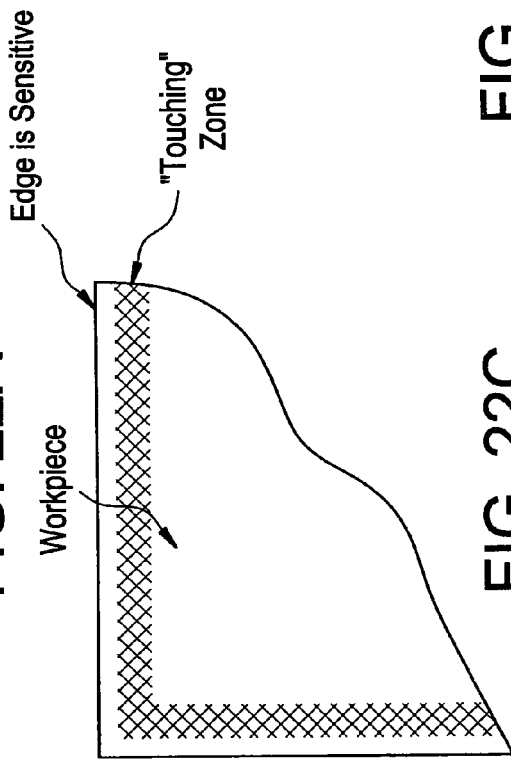
FIGS. 22A-22D show protection coatings for protecting edges of workpieces against damage during handling.
Figure 22D:
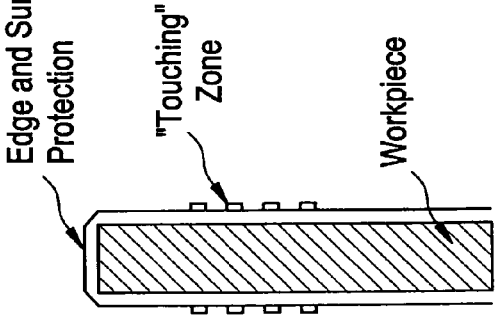
Figure 22C:
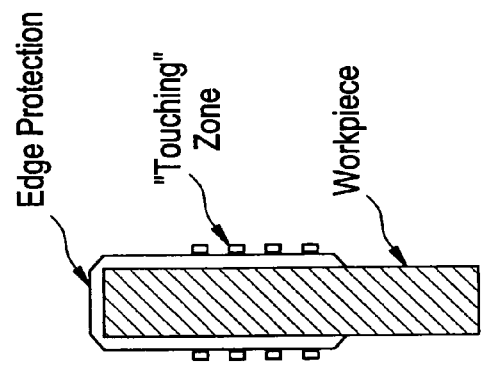
Figure 22B:
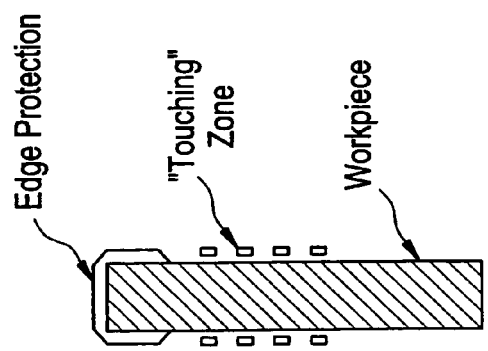

In order to protect the edges against damage while the glass is handled the edge may be coated as shown in FIGS. 22B-22D, and the robots handling the glass sheets may be designed not to touch the extreme edge and a band within a few millimeters from the edge. A handling band on the glass sheets may be, for example, 20 mm wide, and the actual edge may be excluded from the handling area as shown in FIG. 22A. The edge may be coated outside the handling area as shown in FIG. 22B, including the handling area FIG. 22C, or the entire surface may be coated as shown in FIG. 22D.

Figure 23A:
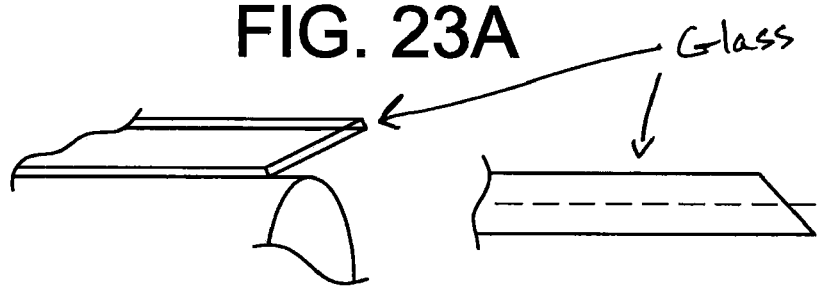
FIG. 23A-23D show a method for avoiding dressing the edge at the same level as the internal portion of the glass, according to an example embodiment of the present invention.
Figure 23B:
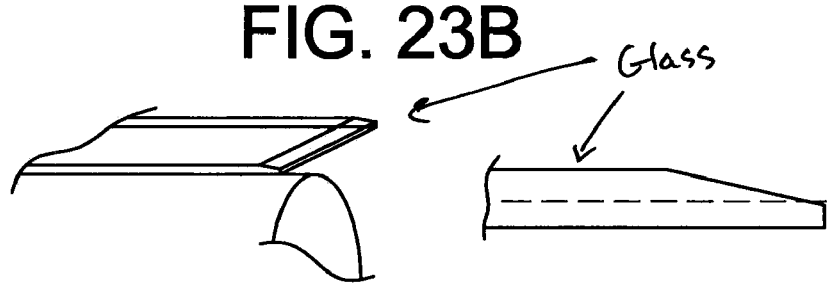
Figure 23C:
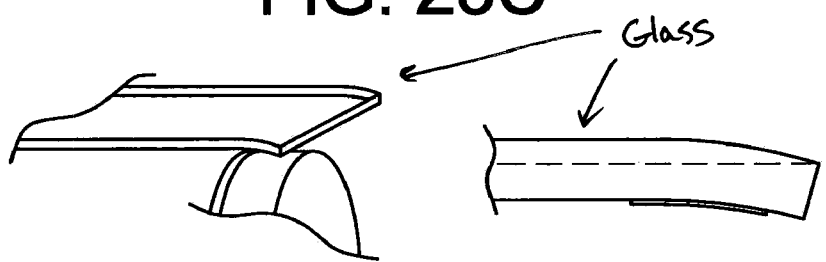
Figure 23D:
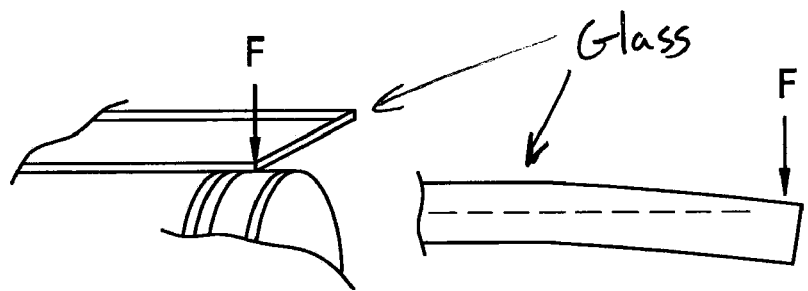

FIG. 23A-23D shows a method for avoiding stressing the edge at the same level as the internal portion of the glass, according to an example embodiment of the present invention. When the glass is bent the outer surface may be dilated and suffer tensile stress, while the inner surface may be compressed and suffer composite stress. Cracks may be propagated as a result of tensile stress. Inside the glass sheet is a position where the stress does not change due to the bending. This is referred to as the neutral layer. If the glass edges are modified so that the neutral layer is closer to the outer surface, the amount of tensile stress near the edge may be reduced. In FIG. 23A the glass may be cut at an angle such that a relatively sharp angle is created where the stress results from compression and an obtuse angle is created when the stress is tensile stress. The obtuse edge may be less likely to crack and the allowable stress for the glass sheet may increase. The edge may be shaped (e.g., ground and/or polished) so that the corner between the cut side and the outer surface may be removed together with any cracks from the glass cutting. As shown in FIG. 23C the edge may be bent inwards using, for example, heat, laser or by forming a stressed layer on the glass that bends the edge. Finally, as shown in FIG. 23D the glass may be forced inward by a clamping force, for example, a vacuum on the inside, or mechanical pressure on the outside.

FIGS. 24A and 24B show methods for cutting a glass edge, according to an example embodiment of the present invention. The glass may be scored in any conventional manner, but a shearing force may be applied when breaking the cut. The combination of bending and shearing provides an inclined cut plane.

Figure 25A:
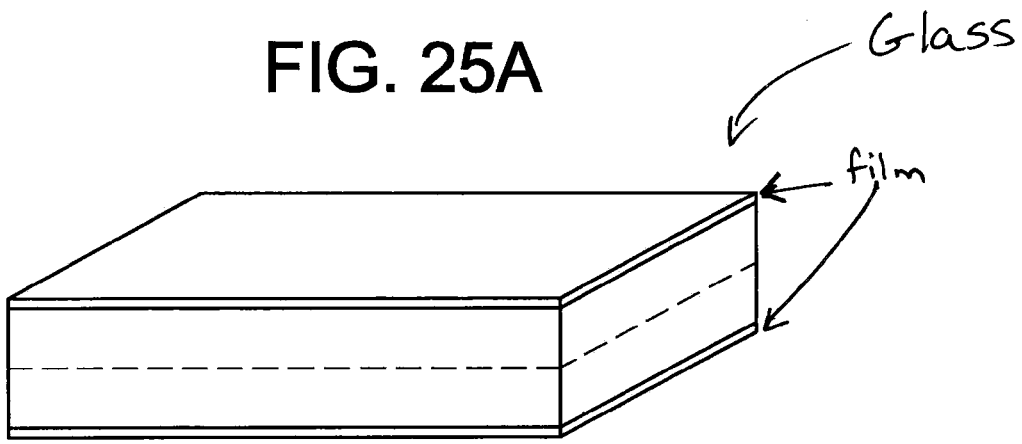
FIG. 25A-25C show how cracks are formed in brittle films.
Figure 25B:
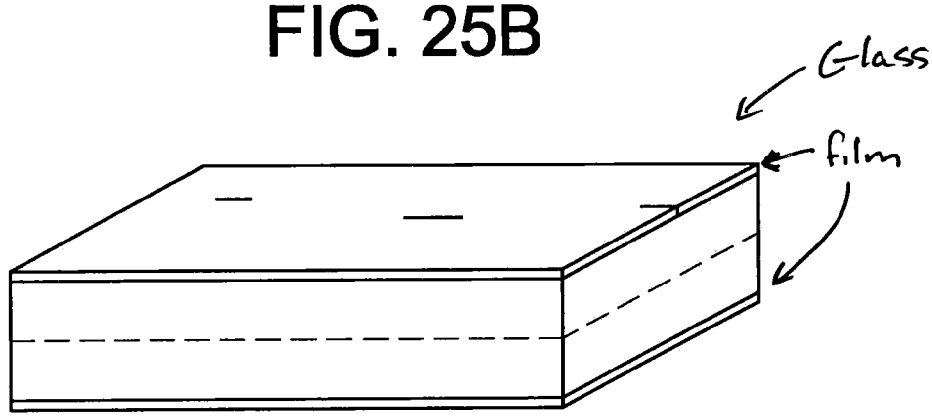
Figure 25C:
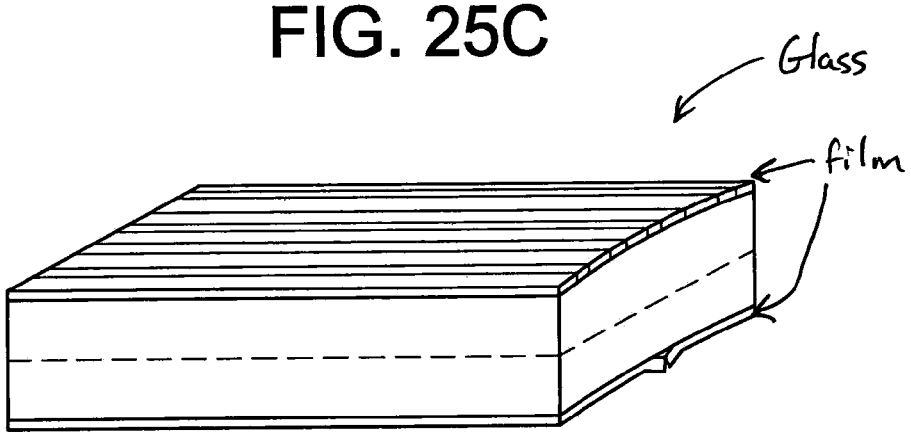

During processing steps, when there is a brittle film on the glass, ensuring that the brittle film does not crack as a result of bending may be increasingly important. FIG. 25A-25C shows how cracks are formed in brittle films. As shown in FIG. 25A the glass may have a film on both top and bottom, and the neutral layer may be formed in the middle. At a certain degree of bending (e.g., strain) cracks may begin to propagate from defects in the film as shown in FIG. 25B. When the glass is bent more cracks may propagate along parallel lines and the film may break. This typically happens when strains above 1% in films like ITO, silicon, silicon dioxide, etc. The onset of short cracks may be more difficult to quantify and depends of the properties of the film, the matching between Young's modulus of the film and the glass, and the adhesion of the film, the distribution of defects in the film, etc. However, safe levels of stress may be estimated by comparing built-in stress in the films when the glass is not bent to stress in the films when the glass is bent. The built-in stress often corresponds to a strain of a few tenths of a percent, while the bending of the glass typically contributes approximately 0.08%. As a result, the stress caused by the bending may not significantly effect the formation of cracks in the film. In this example, the added stress from bending may occur when the glass is flattened and/or compressed. FIG. 25C shows an example of glass buckling failure under compressive stress.

Figure 26:
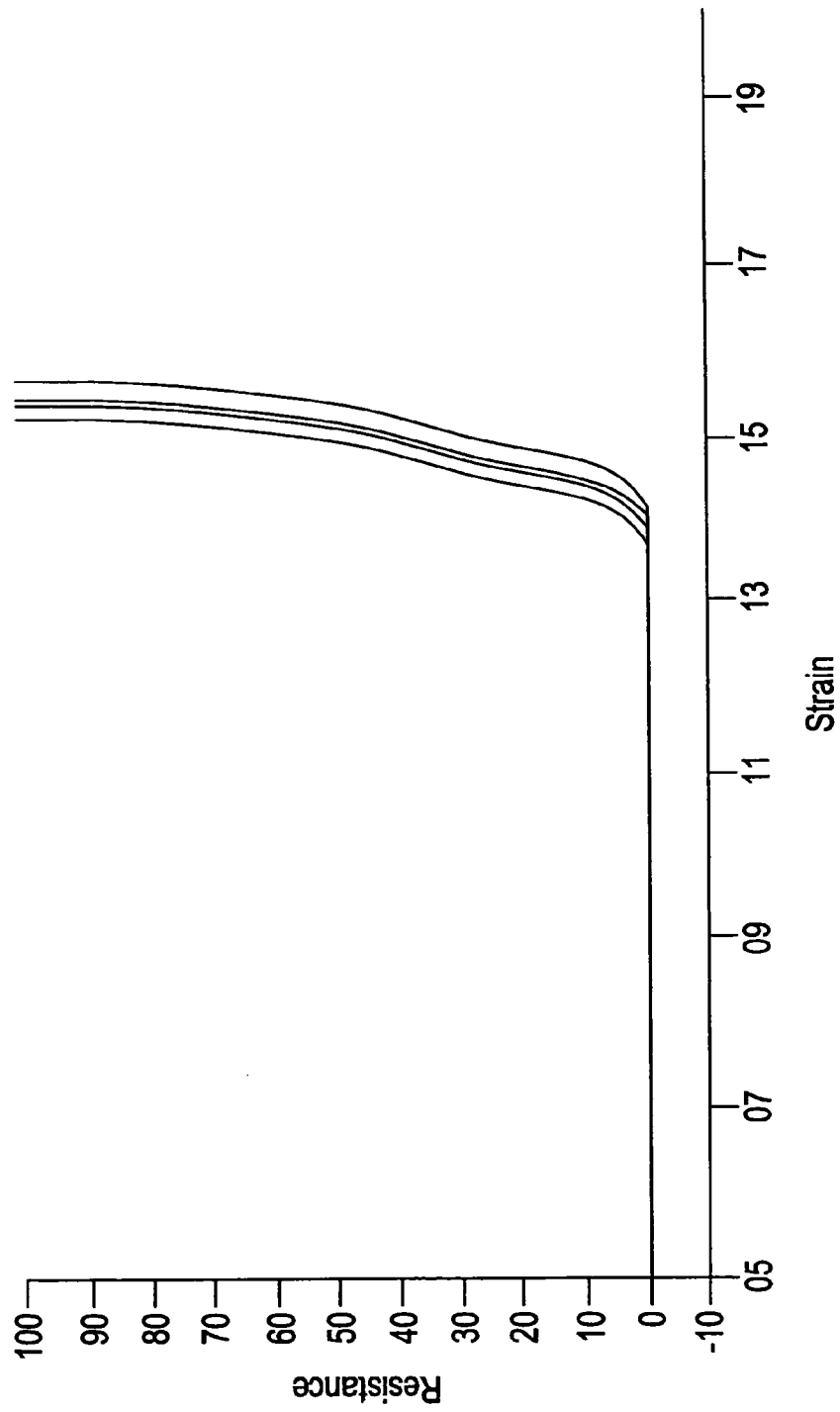
FIG. 26 is an example graph showing how resistance increases with the strain in an ITO film.

FIG. 26 (taken from "Mechanical properties of transparent functional thin films for flexible displays", Y. Leterrier, et. al., 46th Annual Technical Conference Proceedings (2003) ISSN 0737-5921, the entire contents of which is incorporated herein by reference, shows how the resistance increases with the strain in an ITO film. The sharp rise indicates the development of long parallel cracks, and the slower rise before the sharp knee is the formation of shorter cracks around defects. The graph applies to plastic substrates with a brittle ITO film formed thereon, and may only be taken as an indication of how the ITO film on glass may behave.

The substrate may be glass, plastic, steel, paper or any other sheet material. For example, if the substrate is display-grade glass, the substrate may have a thermal expansion of about 4 ppm/K. A brittle film, such as ITO may have a higher expansion coefficient. If the film is deposited at an elevated temperature the mismatch may cause the film to develop tensile stress after cooling. The bending of the workpiece on the outside of the cylinder may add tensile stress when in the bent state. The stage may be temperature-controlled to control the shape and/or size of the stage with higher precision. When the glass is rolled onto the cylinder, or laid upon the flat bed, and clamped, the glass may adapt to the temperature of the stage and shrink or expand depending on the temperature before the glass was loaded. This shrinkage or expansion may cause problems, such as, the change of scale and creep between the stage and the workpiece to release the stress caused by the temperature change.

Figure 61:
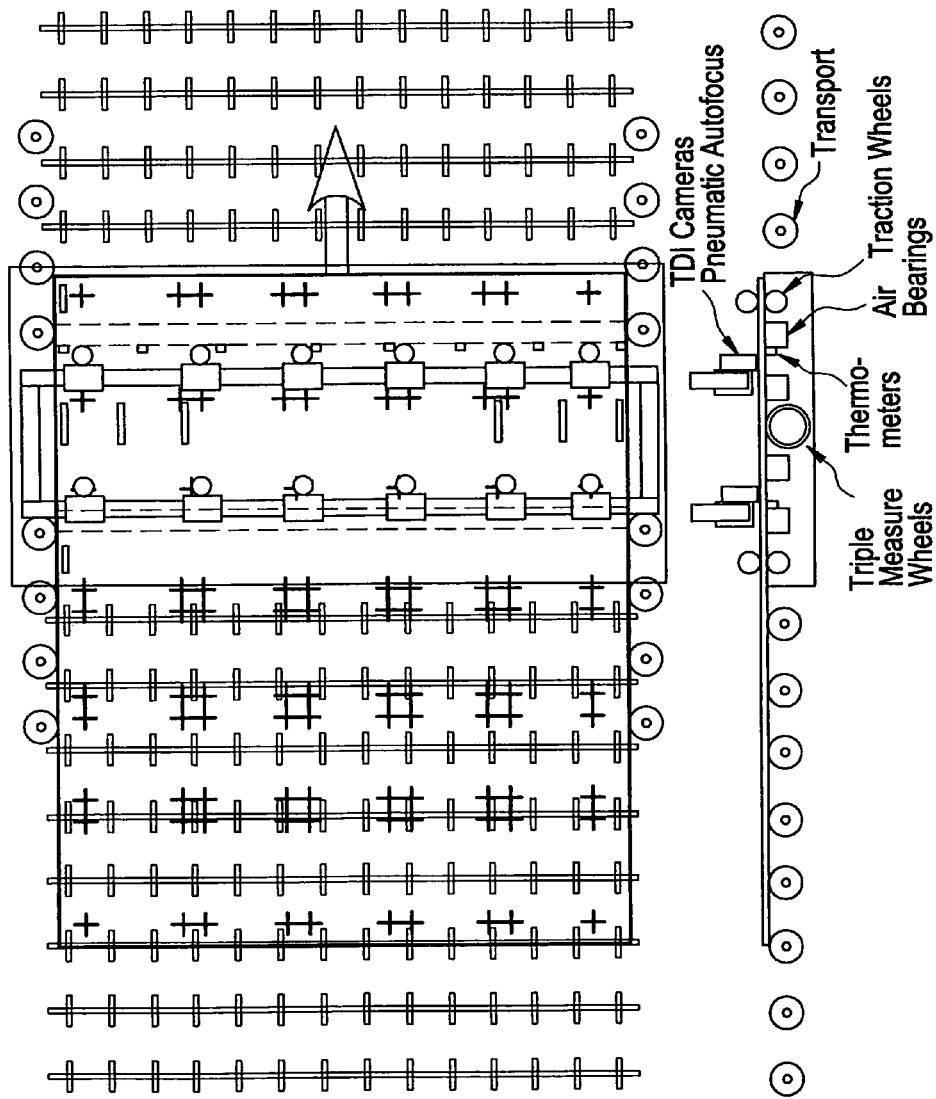
Figure 61A:
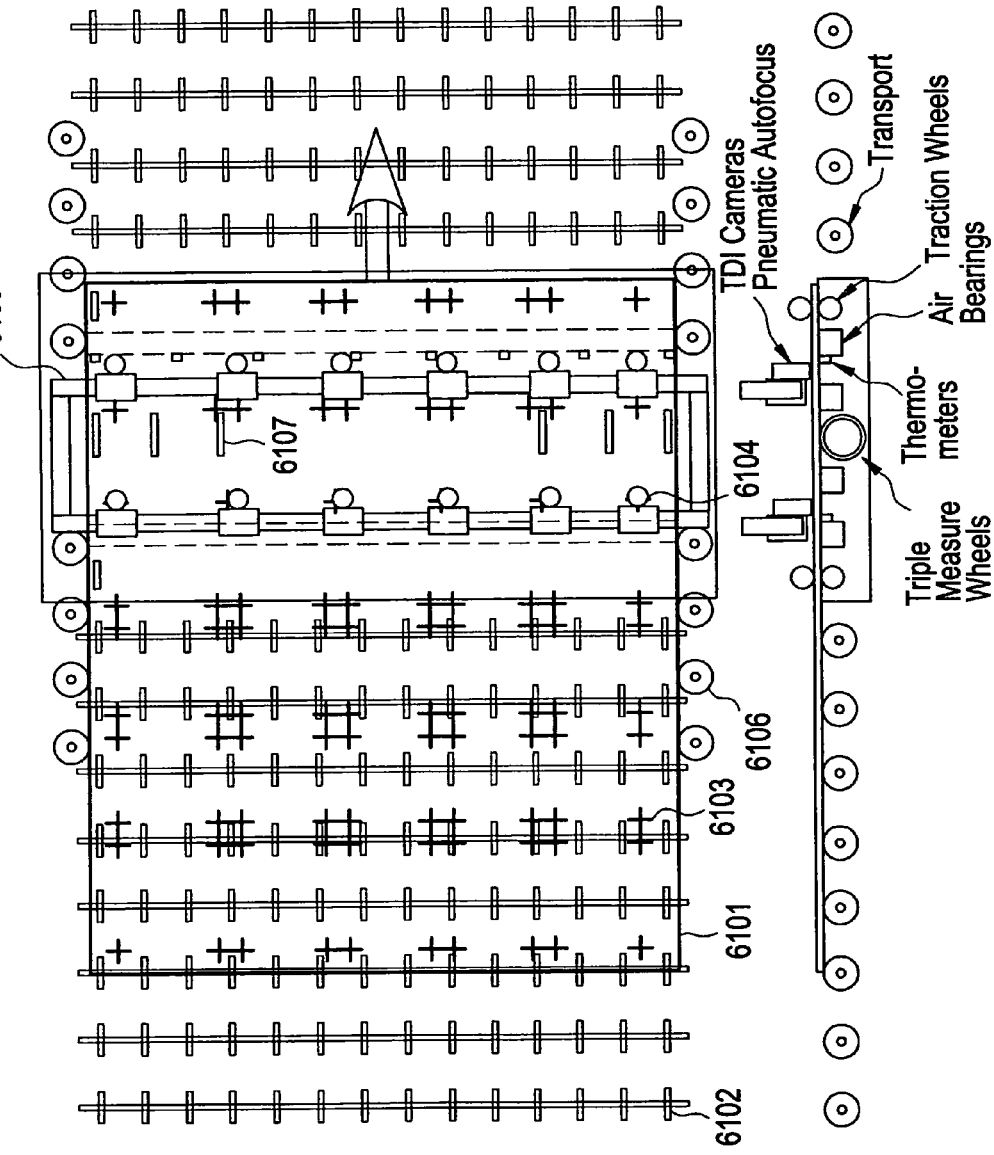

In at least one example embodiment, the temperature may be measured in an array of points over the surface of the workpiece, the temperature deformation of the workpiece may be calculated and the coordinate system may be corrected. This example embodiment may be suitable for a "low-footprint" stage, for example, as shown in FIGS. 61, 61A and/or 61B in which the workpiece passes relatively fast.

In another example embodiment, the substrate may be forcibly tempered before being loaded and clamped to the stage of the system. A system for tempering the workpiece may have a filtered tempered airflow ensuring the substrate does not touch any solid structure. With a strong airflow the substrate may be tempered within seconds due to the short diffusion time for heat in a substrate which may typically be less than or equal to about 0.7 mm thick.

FIG. 27 illustrates such a system for controlling temperature of a workpiece (e.g., glass) before being loaded onto the cylinder, according to an example embodiment. The workpiece 2518 may move on a conveyor belt 2520 and pass beneath the temperature stabilization device 2500 with forced filtered air of a given or desired temperature.

Referring to FIG. 27, a fan or blower 2502, 2504 may produce a comparatively higher air-flow, which may be filtered and/or tempered by a particle filter 2508 and a heat exchanger 2506, respectively. The device 2500 may not make contact with the workpiece 2518, but the air may be drawn into the device and may cause a positive outflow of air in the gap 2514 between the device 2500 and the workpiece 2518 at all or substantially all times. If the workpiece 2518 has a higher temperature than the cylinder 2516 the heat exchanger 2506 may lower the temperature of the workpiece 2518.

As described above, different elements of the equipment may need to have a common coordinate system as a reference to the position on the plate. When using a platform, according to at least some example embodiments (e.g., in metrology and/or patterning) a higher precision coordinate system may be needed, for example, with a total accuracy of greater than or equal to about 3 microns, and/or a differential accuracy between multiple tools of greater than or equal to about 1 micron.

In at least one example embodiment, the differential accuracy between multiple tools may be greater than or equal to about 100 nanometers. This level of accuracy is the result of a deliberate accuracy architecture. The creation of a common standardized coordinate system may have has several elements: creation of a stage coordinate system, alignment of the tools to the stage coordinate system, alignment of the workpiece on the stage, correction for clamping-induced distortion, correction for temperature, and/or correction for processing distortion.

Figure 28A:
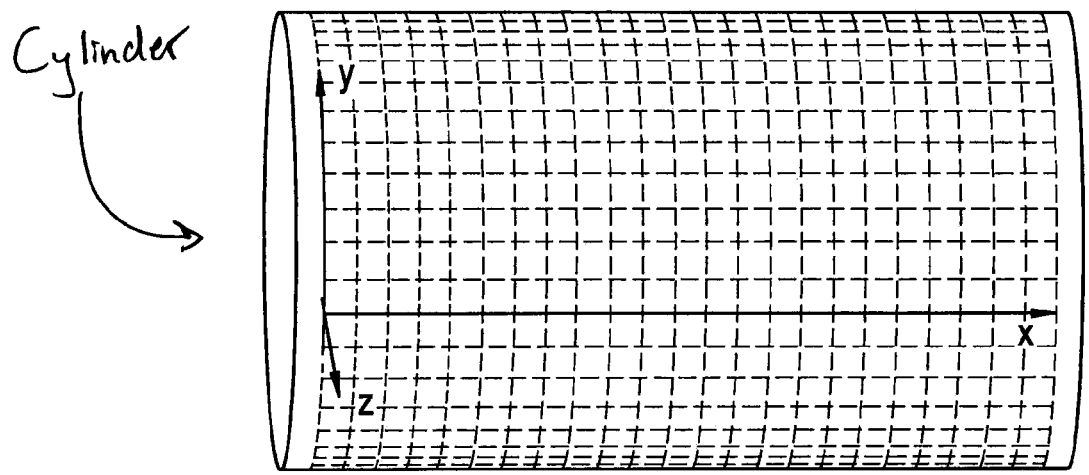
FIGS. 28A and 28B show an example conventional cylindrical coordinate system.
Figure 28B:
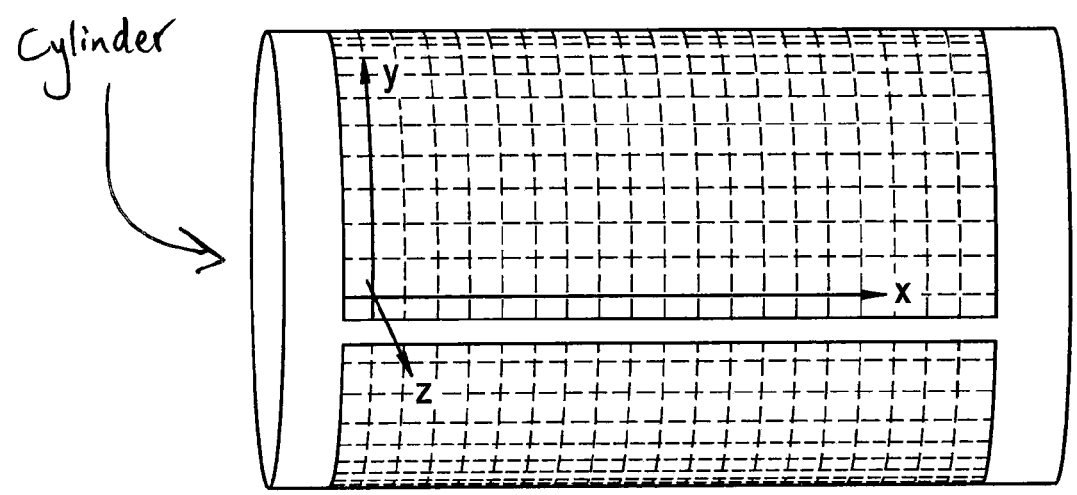

FIGS. 28A and 28B show an example conventional cylindrical coordinate system. However, the precision needed for the coordinate system is that of the glass in a flat state in order to ensure smaller overlay errors with other layers created in flatbed systems and between the transistor array and the color filter. Conventionally, the coordinate system is defined in the flat state, but distorted by bending.

Figure 29:
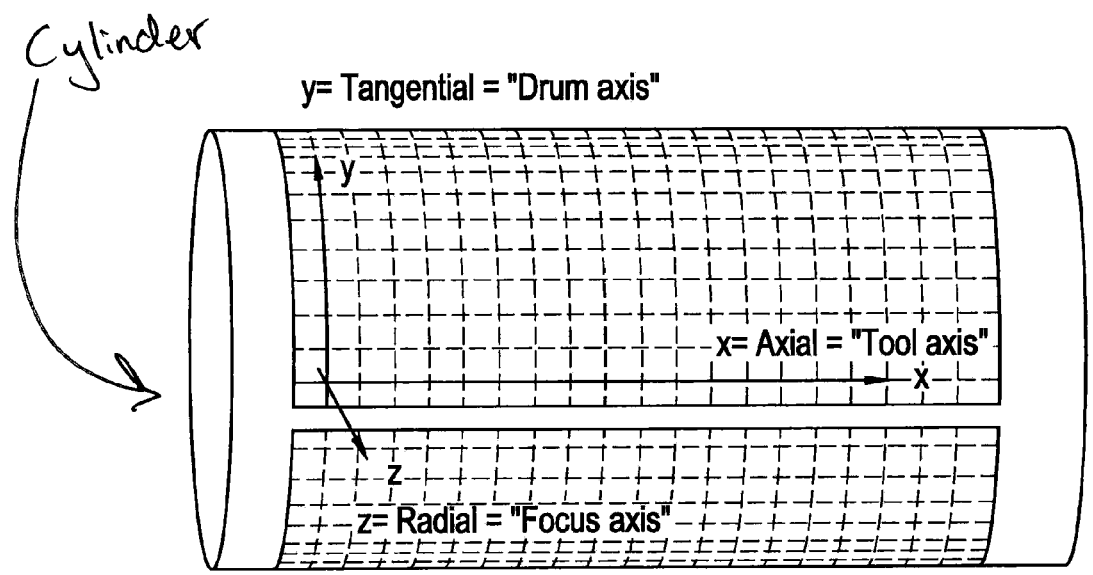
FIG. 29 shows a cylindrical coordinate system, according to an example embodiment.

FIG. 29 shows a cylindrical coordinate system, according to an example embodiment. As shown, the coordinate axes may be defined and named with respect to the directions of the cylinder stage. For example, the axial direction may be referred to as the tool axis because this is the axis along which the tool slides on the toolbar. The tangential axis may be referred to as the drum axis, and the radial axis may be referred to as a focus axis.

Figure 30:
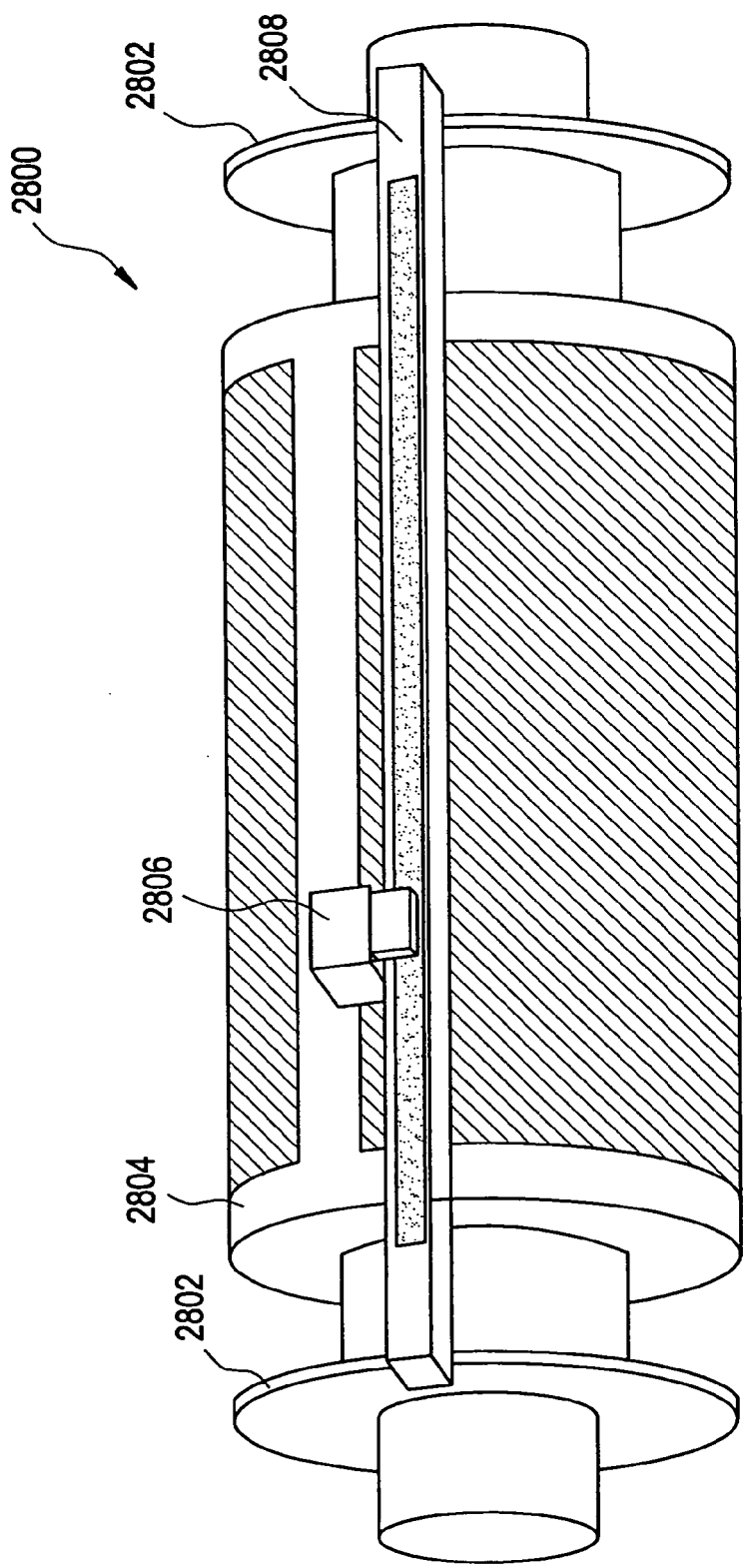
FIG. 30 shows an apparatus for establishing a coordinate system on the cylinder, according to an example embodiment.
Figure 31A:
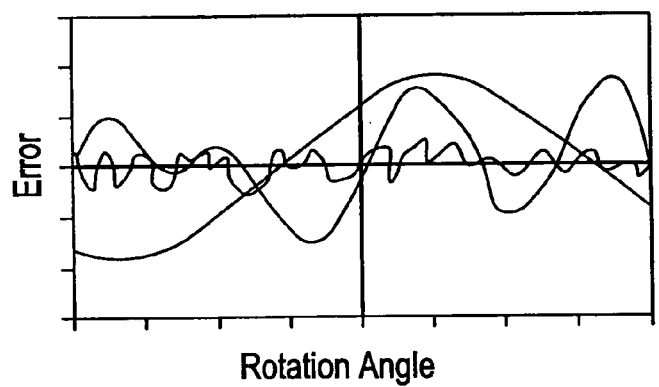
FIG. 31A shows example errors, such as, uncertainty in the position of the rotation axis, non-linearity in the angle codes and/or noise.

FIG. 30 shows an apparatus for establishing a coordinate system on the cylinder, according to an example embodiment. As shown, angle encoder discs 2802 may rotate with the cylinder 2804 and a linear encoder 2806 may be arranged along the tool axis. The toolbar 2808 references the angle encoder discs 2802 and provides the scale used by the tool (is this the linear encoder 2806?). The angle encoders 2802 may suffer from errors, such as, uncertainty in the position of the rotation axis, non-linearity in the angle codes and/or noise as shown in FIG. 31A, for example.

Figure 31B:
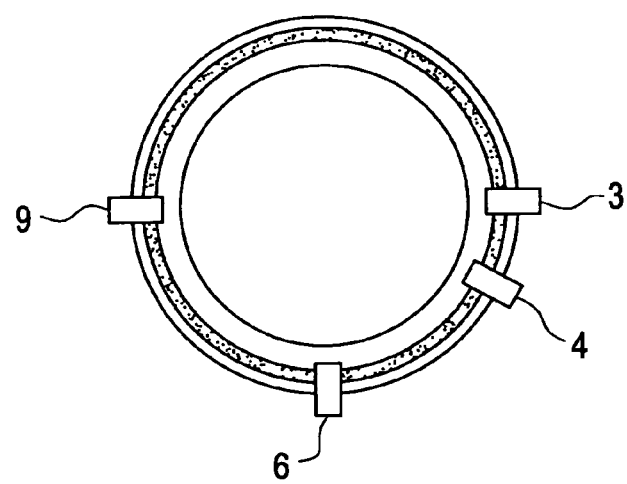
FIG. 31B shows an apparatus for improving the angle measurement for the encoder disk, according to an example embodiment.

FIG. 31B shows an apparatus for improving the angle measurement for the encoder disk, according to an example embodiment. More than one readout head per encoder disk may be used and the angle may be calculated from the sum and difference between the readings. As shown in FIG. 31B or for readout heads in clock positions 3, 4, 6 and 9. If the rotation axis is not centred to the axis of the encoder error may be a sign-shaped error. The difference between three o'clock and nine o'clock identifies movements of the axis up and down. When the average between three and nine o'clock is compared to six o'clock, a sinusoidal error component may provide movement of the axis in the horizontal direction. When the decentring of the axis has been determined, the difference between three o'clock and four o'clock may be used as an indication of shorter period non-linear errors. Finally, random noise-like errors may be reduced by averaging and systematic ones by identifying the same errors moving between the readout heads with the angle of the cylinder. Using the above-described methods, commercial angle encoders may be used to establish a more reliable angle scale with an error on the surface of the cylinder of, for example, a few tens of nanometers.

Figure 32:
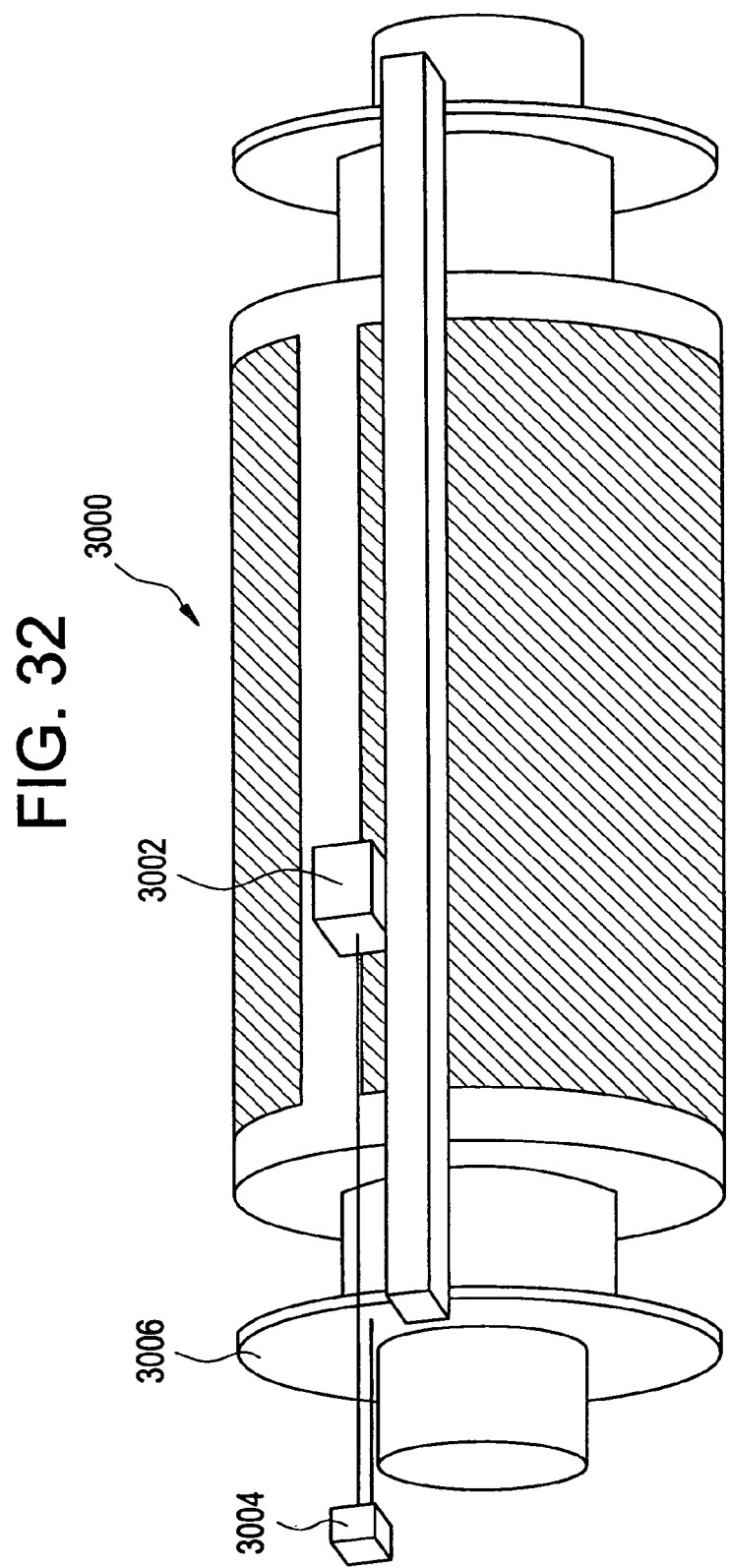
FIG. 32 shows an apparatus for performing axial measurements, according to an example embodiment.

FIG. 32 shows an apparatus for performing axial measurements, according to an example embodiment. The apparatus 3000 may include, for example, an interferometer 3002. The interferometer 3004 may perform a differential measurement between the tool 3002 and the encoder disk 3006.

Figure 33:
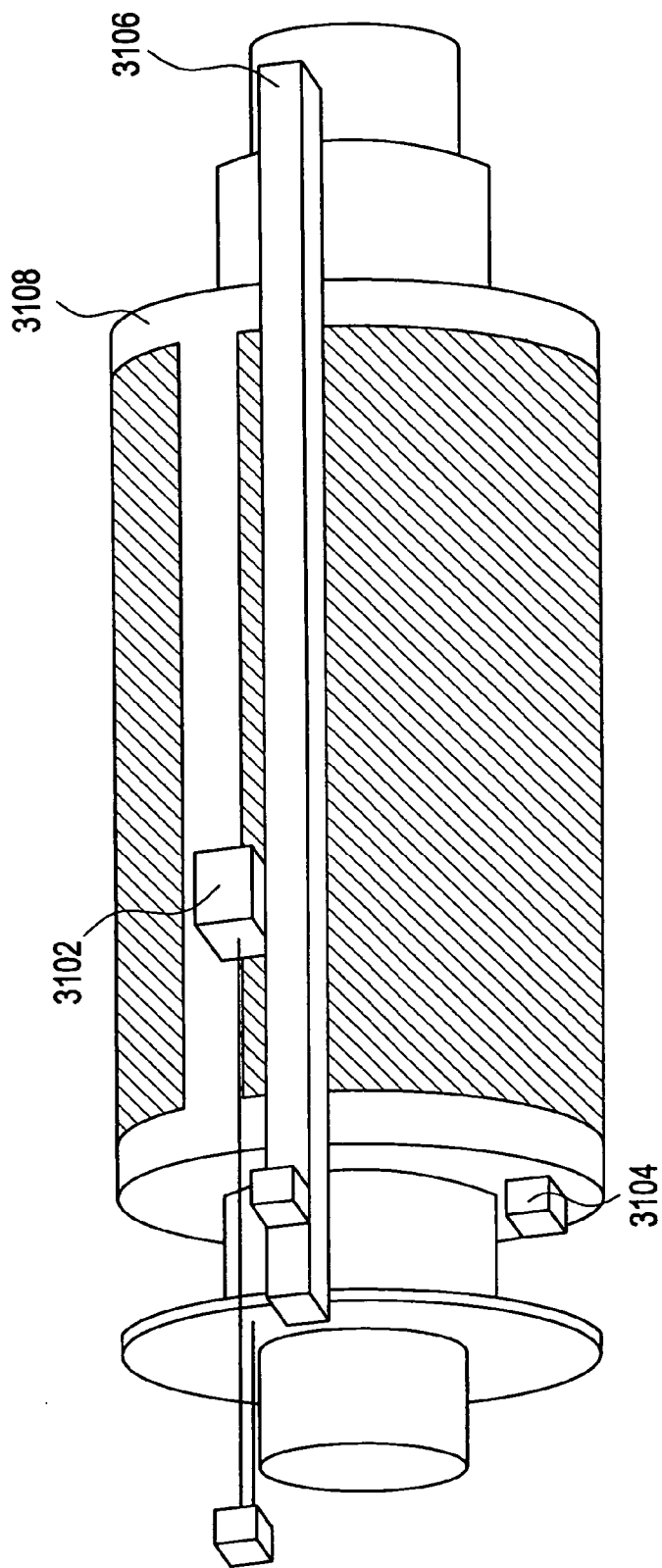
FIG. 33 shows another apparatus for performing axial measurements, according to an example embodiment.

FIG. 33 shows another apparatus for performing axial measurements, according to an example embodiment. Referring to FIG. 33, the angle may be measured by an inertial sensor 3104 on the cylinder 3100 and an inertial sensor 3102 on the fixed structure 3106. The difference in acceleration may be integrated twice to provide the position of the sensor 3104 versus the sensor 3102. Depending on the rotating speed of the cylinder, the apparatus of FIG. 32 or FIG. 33 may provide better accuracy.

Figure 34:
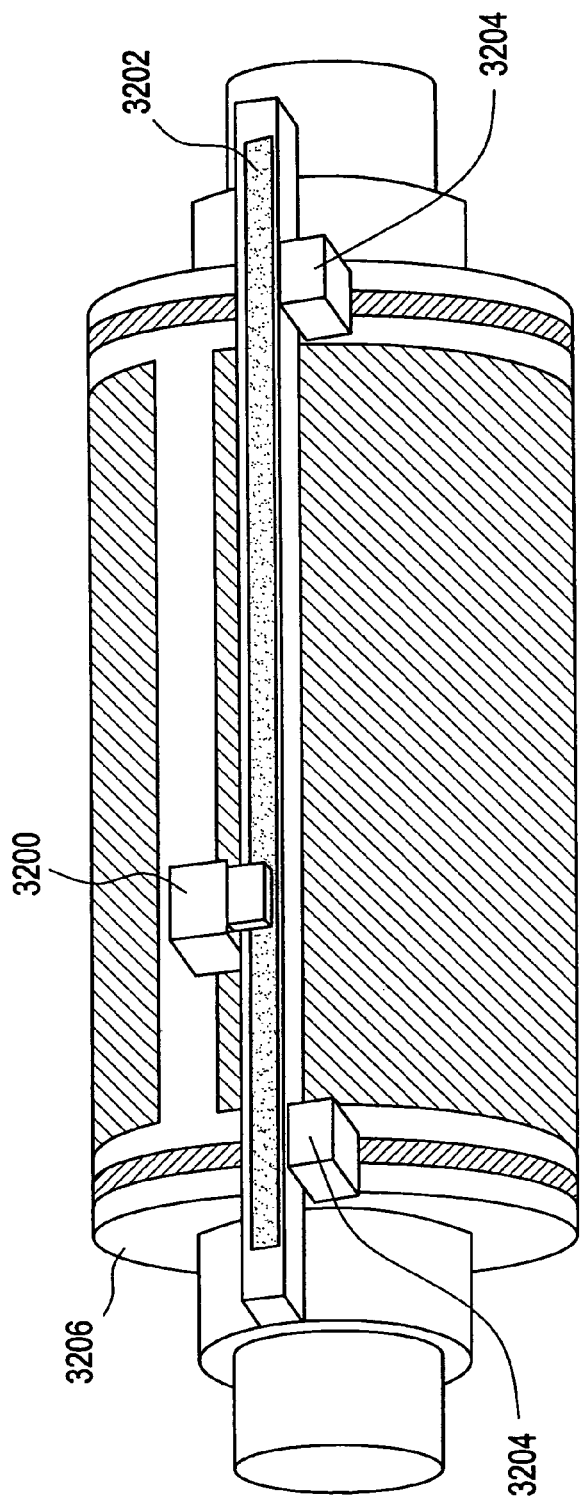
FIG. 34 illustrates another apparatus for performing axial measurements, according to an example embodiment.

FIG. 34 illustrates another apparatus for performing axial measurements, according to an example embodiment. As shown, the apparatus of FIG. 34 may include at least one linear encoder 3200 on the toolbar 3202 combined with at least one linear encoder 3204 at each perimeter of the cylinder 3206. Using the apparatus of FIG. 34, certain errors resulting from non-roundness and the center of the cylinder 3206 may be corrected and/or removed from the measurement.

Figure 35:
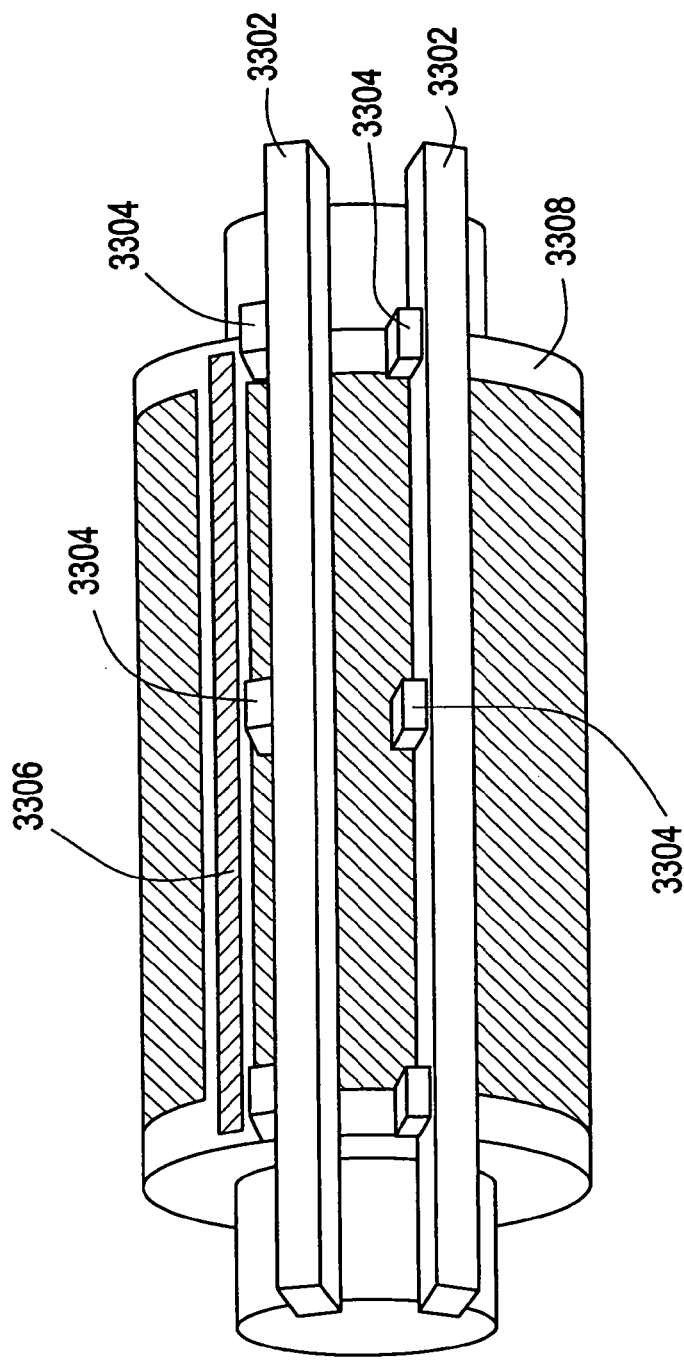
FIG. 35 illustrates an apparatus for creating and using a common coordinate system, according to an example embodiment.

FIG. 35 illustrates an apparatus for creating and using a common coordinate system, according to an example embodiment. As shown, a ruler (e.g., a fiducial ruler) 3306 may be attached to the cylinder 3308 such that the position of the ruler 3308 may be picked up by cameras (e.g., TDI cameras) 3304, when a fiducial passes each toolbar 3302. The fiducials may have two-dimensional marks (e.g., chevron marks), and the cameras 3304 may provide both x and y positions. After the same procedure has been performed for each toolbar 3302, each of the toolbars 3302 reference the coordinate system on the workpiece.

When the workpiece is bent, the outer surface may dilate and the inner surface may contract. The neutral layer may comprise a homogeneous slab of solid material, which may be left unchanged. This neutral layer is located at the center of the slab, and the contraction and dilation at the surfaces may have equal magnitude, but different signs.

Figure 36A:
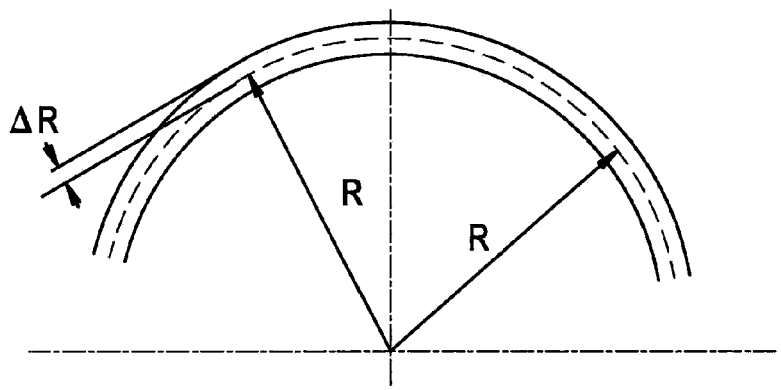
FIGS. 36A and 36B show methods for calculating the coordinate system on the flat workpiece using measurements taken when the workpiece is rolled or bent on the cylinder, according to an example embodiment.
Figure 36B:
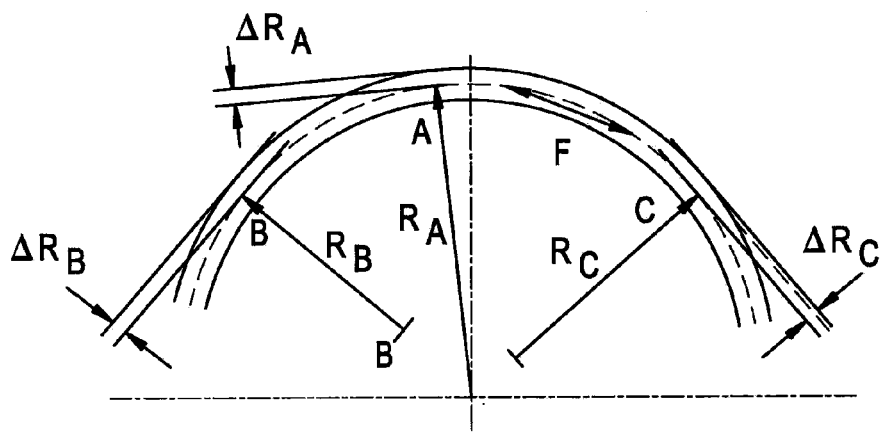

FIGS. 36A and 36B show methods for calculating the coordinate system on the flat workpiece using measurements taken when the workpiece is rolled or bent on the cylinder, according to an example embodiment. In at least one example embodiment, the cylinder angle may be converted to a position along the neutral plane. To do so, the distance from the axis of the angle resolver (e.g., encoder) may be calculated using the known position of the axis and radial positions of the inner and outer surfaces of the workpiece. The local radius of curvature of the neutral layer may be derived from measurements of the outer and inner surfaces in the vicinity of the point to be computed. The local radius of curvature of the neutral layer may be used to calculate the dilation of the surface.

FIG. 36A shows an ideal case, and FIG. 36B shows a more real case with variations in the thickness of the glass, a non-round cylinder and a center of curvature that varies from point to point. The errors are shown in the cross section perpendicular to the cylinder axis, but the curvature of the cylinder and the thickness variation of the workpiece are two-dimensional properties leading to a dilation tensor at the surface. This dilation tensor may be integrated to get the distortion field of the glass when rolled on the cylinder.

Figure 36C:
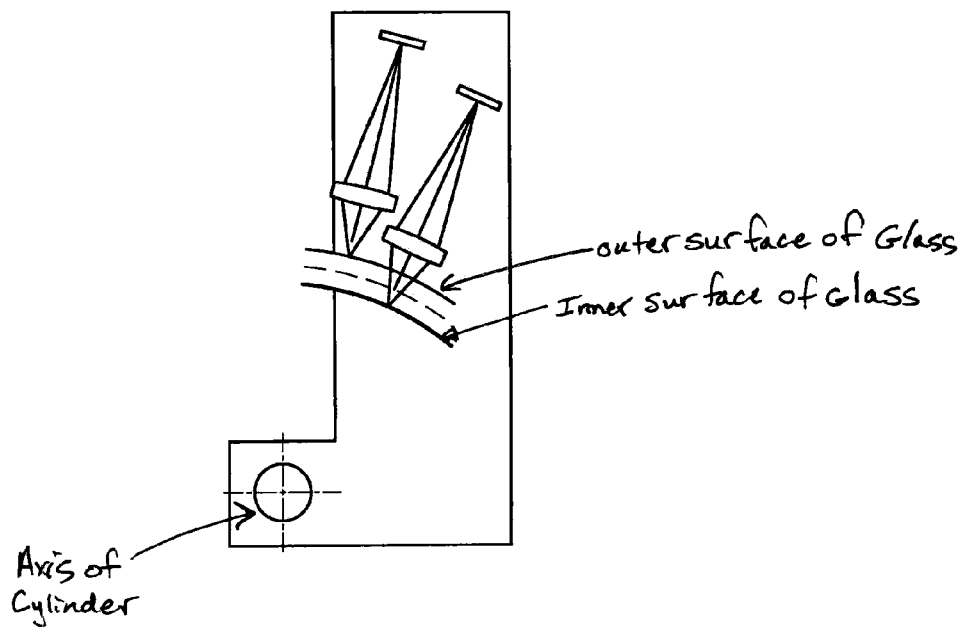
FIG. 36C shows a device for measuring the position of the inner and outer surfaces of the glass, according to an example embodiment.

FIG. 36C shows a device for measuring the position of the inner and outer surfaces of the glass, according to an example embodiment. The device of FIG. 36C may reference the axis of the cylinder. In an example using film-coated workpieces, stress in the film will bend the workpiece in a free state. When clamped to the cylinder the curvature may be determined by the cylinder and workpiece thickness, but the film stress may create stress in the workpiece, displacing the neutral layer and causing lateral distortion. The stress in the film may be included in the computation of the neutral layer may compensate for calculation of the flat coordinate system.

FIG. 36D illustrates in more detail how a command to move to the standardized workpiece coordinates x and y may be converted to a command for the stage and tool to move to specific tool and stage coordinates. Standardized (or abstracted) workpiece coordinates are the coordinates on the workpiece when, for example, later, the workpiece is in a desired or predefined state (e.g., unstressed with flat front side at a uniform temperature of about 22.00° C.). Furthermore the standardized state may be at a specific time, for example, after the substrate has been processed (with possible distortion, warpage and shrinkage) and will be matched to another panel, for example, a transistor array for a color filter. Even though the workpiece at a different time may be neither stress-free, flat nor in the finished state at the specified temperature, there may still be a one-to-one relation between points on the surface of the workpiece and points on the workpiece in the standardised state.

To draw a cross that will appear at a particular x,y coordinate on the finished, tempered, flat and stress-free workpiece there is at every point in time, a point at which the cross should be drawn. The machine for drawing the cross may be controlled by tool and stage coordinates. FIG. 36D shows how the stage and tool coordinates for an abstracted coordinate may be located.

Referring to FIG. 36D, after moving the tool to a standard workpiece x,y coordinate point at S3600D, the standardized coordinate may be corrected for a scale error and for the scale error resulting from the temperature difference between the current point in time and the standardized state at S3602D. At S3604D, any known systematic distortions, such as shrinkage due to high-temperature annealing, may be corrected. At S3606D, clamping and bending distortion may be further corrected. For example, in this context bending may be dilation of the outer surface due to the bending and clamping are other known distortions (e.g., compression due to holding forces). In at least one example embodiment, it may be rela-tively difficult to attach the thinner workpiece to the stage with proper (e.g., perfect) alignment. Thus, it may be easier to attach the workpiece to the stage and then measure the misalignment to the stage. In this example, the system may have alignment sensors that measure the position of the workpiece in machine coordinates. The measured misalignment may be applied in the software to the coordinate system of the workpiece.

Still referring to FIG. 36D, at S3608D, the corrected coordinates may be further corrected for misalignment to the stage. At this point, the workpiece coordinates may be converted to the coordinates or control parameters for the stage and the tool at S3610D. In an example with a cylinder stage and angle encoders on the axis, the conversion at S3610D may include converting an angle and a tool distance along the axis of the cylinder to cylindrical coordinates. If the tool has internal coordinates like a manipulator, a camera or an SLM these internal coordinates may also be calculated.

At S3612D, the tool offset may be applied to the coordinates. If more than one tool or more than one toolbar is used, the tool offsets may be measured for each tool and stored to be used for this correction. In at least one example embodiment, the offset of each tool may be measured against a common reference suitable to the nature of the tools. If the tools are cameras or detectors, for example, the common reference may be a common fiducial. If the tools are exposure tools with light beams the common reference may be, for example, a camera, a detector or the like. For some types of tools where a reference is not readily at hand or not practical (e.g., a microdispenser) auxiliary alignment systems (e.g., auxiliary detectors, camera, light sources, etc.) may be used. The tool and stage may then be moved according to the converted and corrected stage and tool coordinates at S3614D.

FIG. 36E shows a method for converting tool and stage coordinates into standard workpiece coordinates. In other words, the method shown in FIG. 36E is the reverse of the method shown in FIG. 36D. As shown, for example, a specific set of stage and tool coordinates may be recorded and may be converted to abstract workpiece coordinates. Although the methods shown in each of FIGS. 36D and 36E are shown with respect to a particular order, this is for example purposes only. The sequence between steps of the methods shown in these figures may be reversed, one or more steps may be skipped and/or two or more steps may be combined into one operation.

Referring to FIG. 36E, at S3614E, stage and tool coordinates may be input, and tool offset may be corrected at S3612E. The tool and stage coordinates may be converted to standard workpiece coordinates at S3610E. At S3608E, the corrected coordinates may be further corrected for misalignment to the stage. At S3606E, clamping and bending distortion may be further corrected. For example, in this context bending may be dilation of the outer surface due to the bending and clamping are other known distortions (e.g., compression due to holding forces). In at least one example embodiment, it may be relatively difficult to attach the thinner workpiece to the stage with proper (e.g., perfect) alignment. Thus, it may be easier to attach the workpiece to the stage and then measure the misalignment to the stage. In this example, the system may have alignment sensors that measure the position of the workpiece in machine coordinates. The measured misalignment may be applied in the software to the coordinate system of the workpiece.

At S3604E, any known systematic distortions, such as shrinkage due to high-temperature annealing, may be corrected. The standardized coordinate may be corrected for a scale error and for the scale error resulting from the temperature difference between the current point in time and the standardized state at S3602E. The standard workpiece x,y coordinate points may be output at S3600E.

Figure 37A:
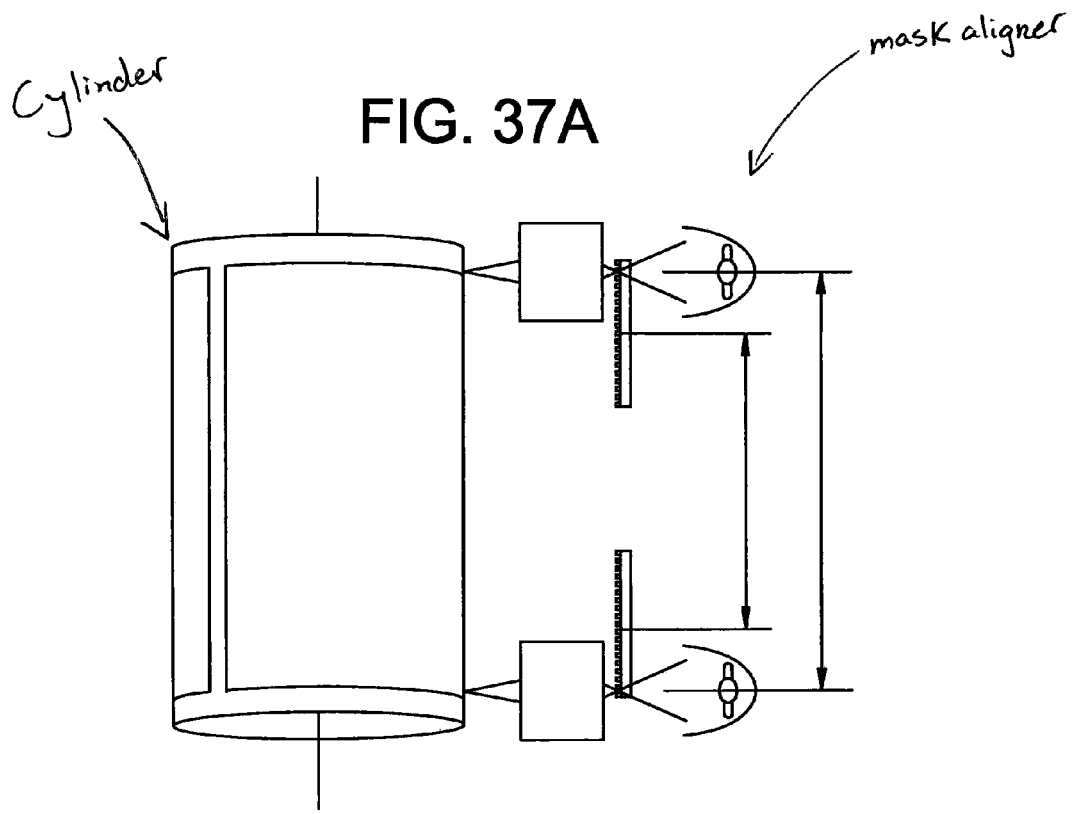
FIGS. 37A and 37B illustrate mask aligners, according to example embodiments.
Figure 37B:
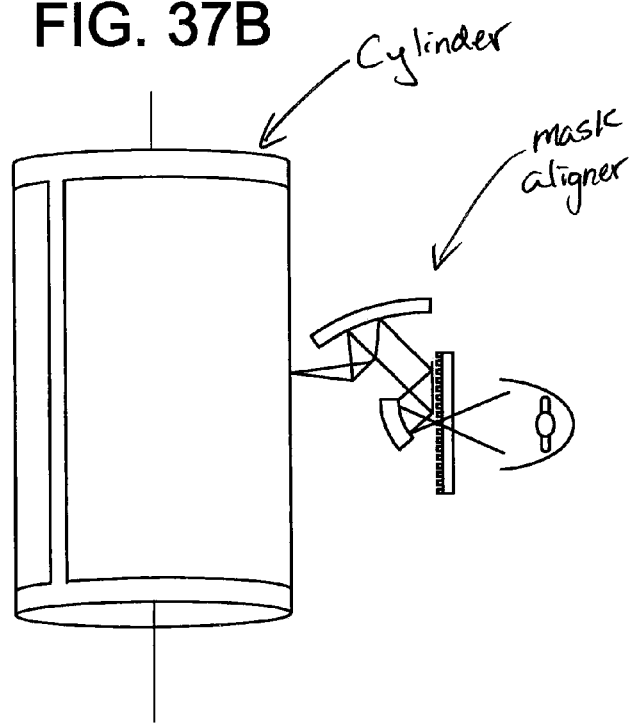

FIGS. 37A and 37B illustrate mask aligners, according to example embodiments. FIGS. 38A-38D show mask aligners, according to other example embodiments. The workpiece may be clamped to a high-speed stage; in at least one example embodiment, the stage may be a cylinder. Compared to the other systems described herein, the toolbar may be more complex and larger. The tool sliding along the toolbar may be an optical projection system projecting an image from part of a mask. While the projection tool is scanning, the mask may scan relative to the tool so that a stationary image may be created on the workpiece.

FIG. 37A shows the projection optics as a black box with a magnification from the mask to the workpiece. The magnification may be in the range 2-5×, for example 3× and the area of the mask may be, for example, nine times smaller than the workpiece. In at least one example embodiment, the mask may contain an image of the pattern of the entire workpiece, so if the workpiece is, for example, 2.4×2.8 m the mask is 0.8×0.93 m. Other magnifications may be used. Smaller magnification, for example, 2× or 2.5×, may relax the requirements on the mask, but may make handling and/or scanning of the mask in the exposing equipment more difficult and/or expensive. Inversely, higher magnification, for example, 4× or 5×, may makes the mechanical design of the projection system easier and the mask blanks smaller, but at the same time the optical complexity of the projection system and the patterning requirements on the mask may be more difficult.

Figure 38B:
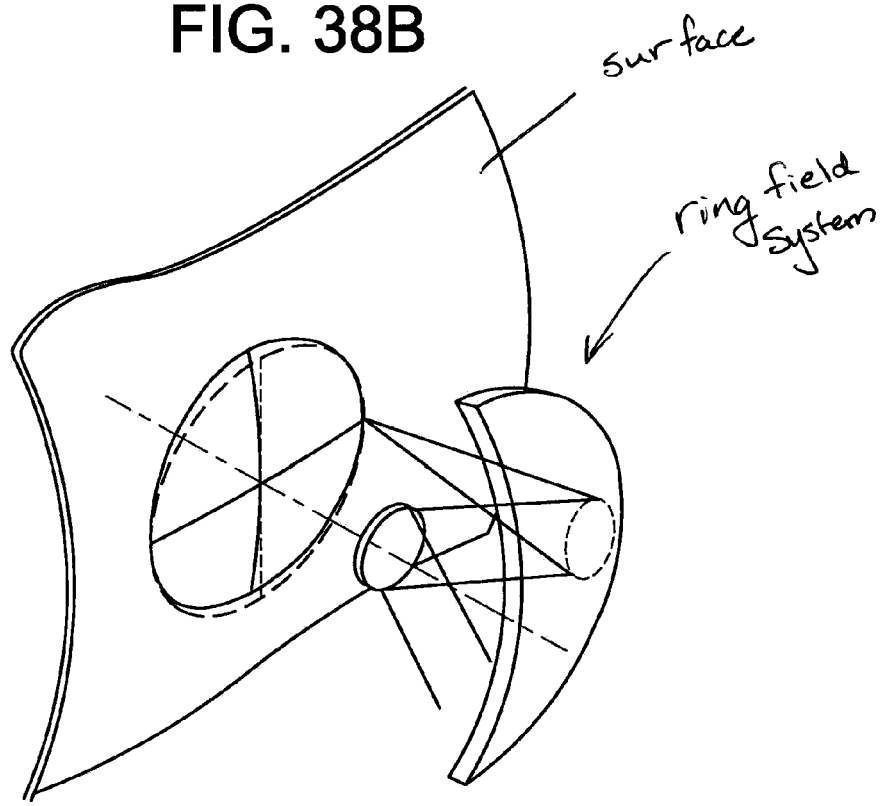
FIGS. 38B-38C show a method for compensating for the bend in the field on the cylinder according to an example embodiment.
Figure 38C:
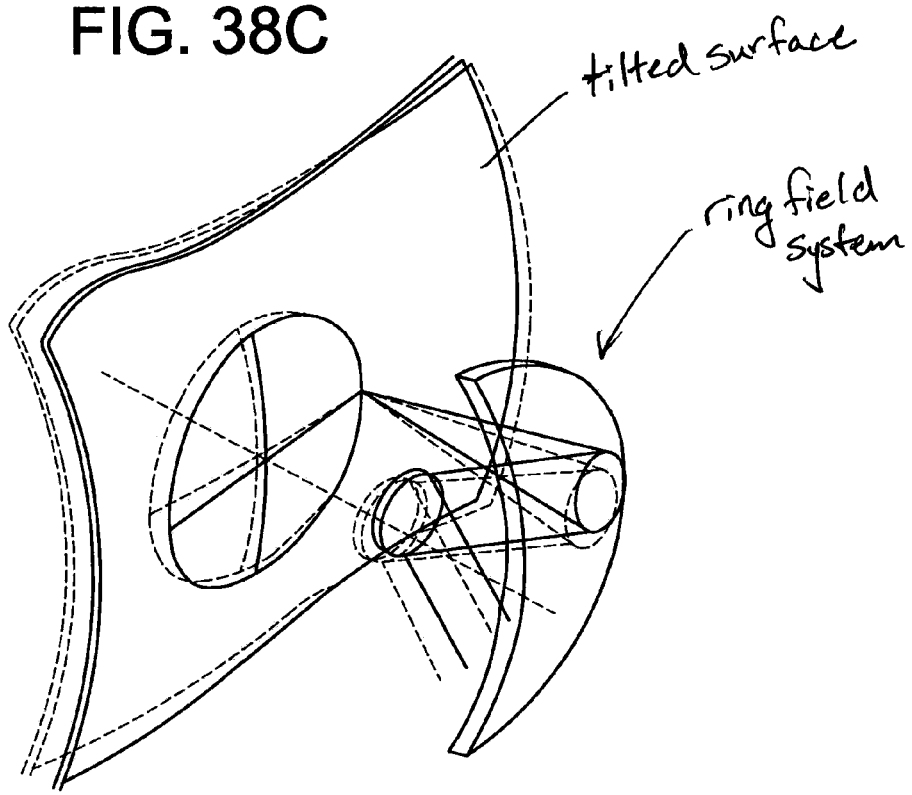

FIGS. 38A-38C shows a more detailed view of the projection system, according to an example embodiment. The drawn stripe may be about 140 mm wide on the workpiece and the scanning speed along the tool axis may be about 1 m/s. There is an overlap of about 20 mm between stripes. As a result, the throughput is 0.1 $m^2$/second or 6 $m^2$ in 60 seconds. The exposed pattern may be distorted to match a known distortion of a previously created pattern on the workpiece, or in anticipation of a distortion that may occur or be later in the process due to patterning, stress, high-temperature processing or matching to a distorted element. Intentional distortion along the tool axis may be created using small changes in the scanning speed of the mask relative to the speed of the projection system. In the tangential direction, for example, small distortions may be created by a small angle movement of the cylinder, by a mechanical offset or tilt of one of the components in the projection system and/or by a small movement of the mask in a direction perpendicular to the scan direction.

The mask may be flat, but the optical field on the cylinder may be curved. The curved field may be corrected in a ring field system, which may be suitable.

FIG. 38B shows the ring field system (Offner type) with a field their best optical quality forming a flat ring. However, the field on the cylinder may be bent by a couple of millimeters away from the mirror at the top and bottom of the stripe.

FIG. 38C shows a method for compensating for the bend in the field on the cylinder according to an example embodiment. In this example embodiment, the surface of the cylinder may be tilted in relation to the axis of the optics. The tilted ring field may fit in the first and second order with the surface of the cylinder. By tilting the field, a telecentricity or a "landing-angle" error may occur. The telecentricity error may be compensated by a shift of the aperture position.

In FIG. 38B, this is shown as a shift of the central flat mirror which in an Offner system acts as the system aperture. The configuration with the optical axis perpendicular to the cylinder is shown hatched and the tilted one in solid lines. The angle between the axis of the optics (mainly the large or primary mirror) and the cylinder depends on the radii of the cylinder and the primary mirror and may be determined by ray tracing to give a focus surface that follows the surface of the cylinder in an optimal way. The offset aperture and the tilted focal plane may give rise to increased aberrations that may be corrected by additional surfaces and/or decenters or by making some surfaces aspheric.

Projection systems, according to example embodiments, with magnifications of a mask containing the entire glass pattern, and built with the cylinder stage, may have benefits, such as, the cylinder stage may allow larger glasses to be used than those possible with flatbed stages, distortion may be compensated inside the pattern based on real-time measurements, and/or the layout of the glass may not be limited by a repeating mask pattern. In the related art, four or six images of a single mask in scale one-to-one are printed on a glass, for example, as shown in FIG. 38E. No display may be made larger than the size of the mask, typically one quarter of the glass, without stitching. Stitching, (e.g., assembly of larger contiguous patterns from smaller areas in the mask) is an undesirable process because the yield problems and/or loss of throughput. With example embodiments the area on a glass may be used more freely, as shown in FIG. 38F. Smaller large displays may be mixed in a way that optimizes the value of the output and the use of the glass sheets. In this way, example embodiments may enable production of larger LCD screens and/or larger screens made by other display technologies.

Figure 37C:
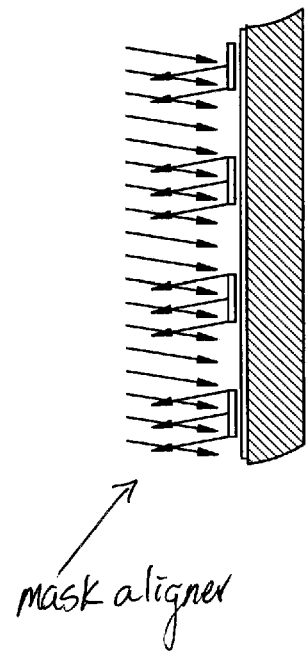
FIGS. 37C-37E illustrate mask aligners according to other example embodiments.
Figure 37D:
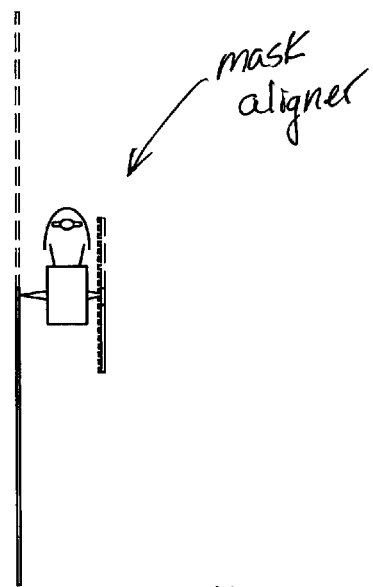
Figure 37E:
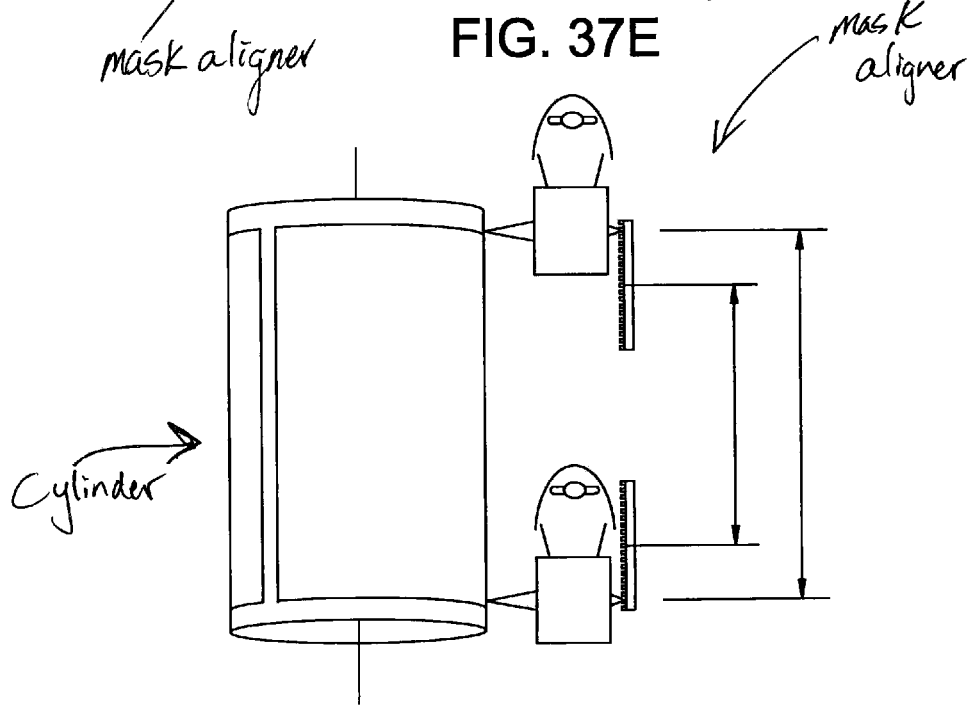

FIGS. 37C-37E illustrate a mask aligner according to another example embodiment. The make aligner may include a reflective mask. The mask may be used in glass or other material with one surface with optical quality. The substrate may be glass, ceramic or a composite material, and may be a hybrid, for example, a thin glass slab fused with a carbon-fiber stiff plate.

Using example embodiments, the thermal expansion of carbon fiber plates and certain ceramics may be closer to zero. Carbon has relatively low weight and a relatively high specific stiffness, which may reduce gravitational and inertial forces on the mask and/or the mask handling system. Using transmission masks, the optical quality through the thickness of the material may be relatively important and relatively large masks may become increasingly expensive because they contain a larger volume of optical-quality material (e.g. fused silica).

FIG. 37C illustrates a reflecting mask, in FIG. 37D the reflecting mask is used with a flat-bed stage (seen from the edge) and in FIG. 37E a cylinder stage is used. The reflecting mask may be non-reflecting and have a pattern in a reflecting film. Alternatively, the reflecting mask may be relatively highly reflecting and have a pattern of an absorbing or anti-reflection film. The mask may also be relatively highly reflecting and have a depth structure creating clear, dark and optionally clear phase-shifted areas by diffraction of the light.

Figure 38D:
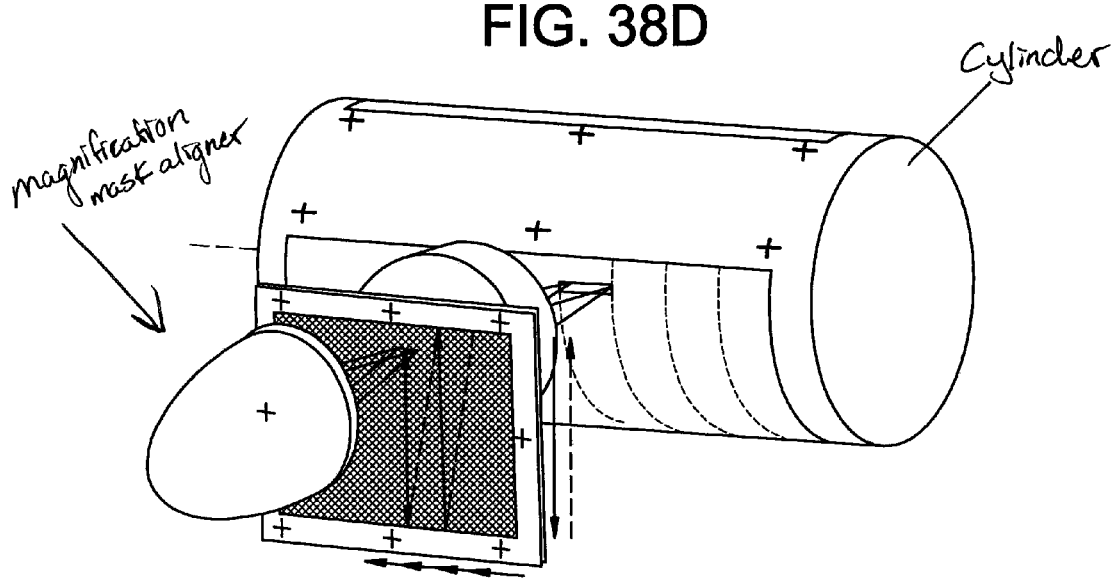
FIG. 38D shows another projection aligner according to an example embodiment.
Figure 38E:
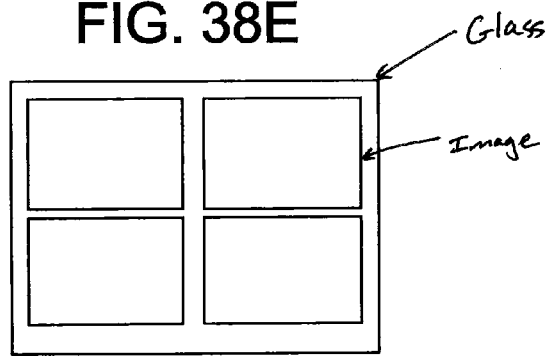
FIG. 38E shows a conventional use of the area on a substrate.
Figure 38F:
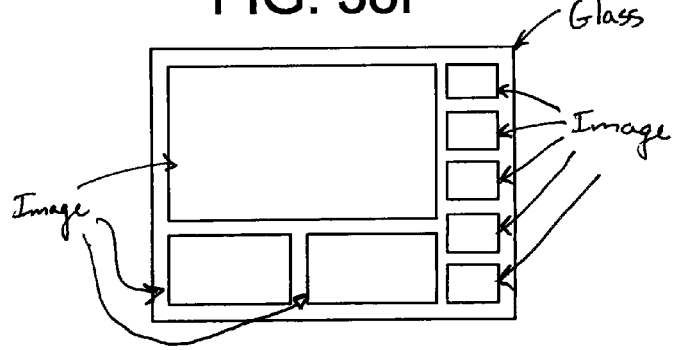
FIG. 38F shows the use made possible by example embodiments.

FIG. 38D illustrates a magnification mask aligner with a cylindrical stage. The scanning in FIG. 38D is in a direction perpendicular to the scanning direction in FIG. 38A. The cylinder rotates with essentially constant speed and the mask tracks it with a vertical linear motion with a speed that is M times smaller, wherein M is the magnification from the mask to the workpiece. This example embodiment may be simpler than the one shown in FIG. 38A because the field may be flat and the optics may move more slowly. On the other hand, but there may be more mechanical overhead because the mask must perform a retrace stroke between every time the mask is projected on to the cylinder. In one example embodiment, the cylinder may be larger than needed for the workpiece and the workpiece may have a gap on the cylinder during which the mask retraces. In a another example embodiment, the mask retraces while the cylinder makes an idle turn. In other words, for example, exposure takes place during every second turn of the cylinder and the mask retrace between each exposure turn. It may also be possible to allow the cylinder to have reciprocal, rotational movement, although this may lead to higher inertial forces, larger motors and/or higher energy consumption.

At least some production processes for displays may be made by roll printing, similar to printing of books on newspapers. All layers on displays may not be equally sensitive to size and/or alignment errors. Cylindrical stages, according to example embodiments of the present invention, are suited for various forms of roll printing. Example embodiments provide methods ensuring higher dimensional accuracy, for example, more accurate creation of a coordinate system and/or more accurate alignment of the workpiece to the printer's internal coordinate system.

Figure 39:
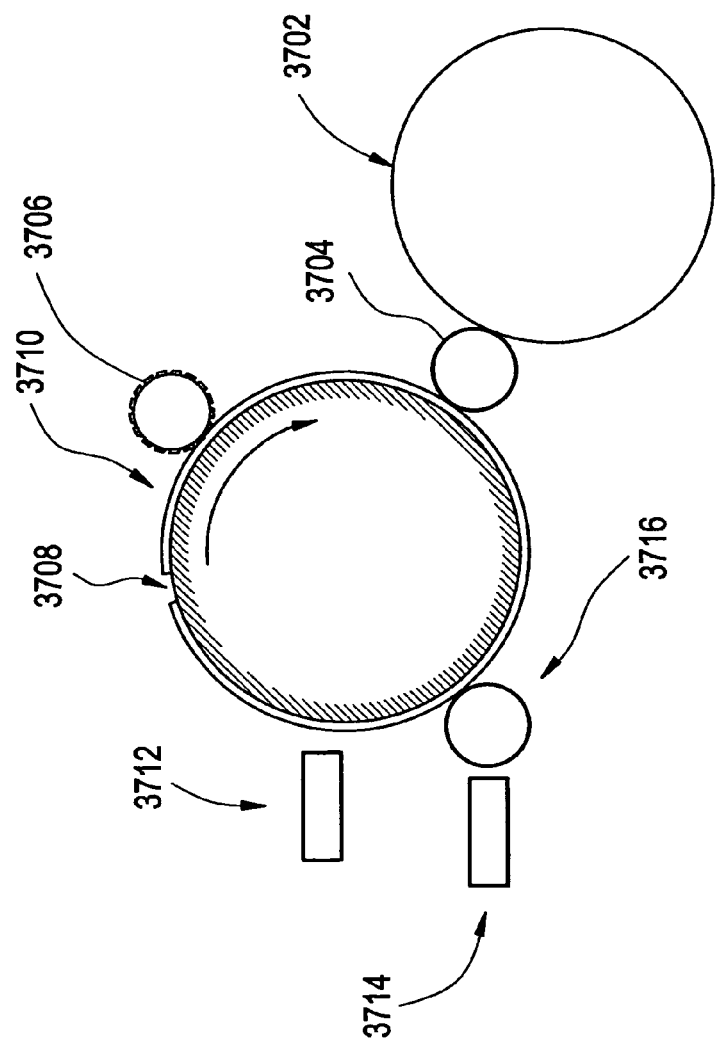
FIG. 39 shows example roll printers, such as, printing from a full-field master.

FIG. 39 shows example roll printers used to print from, for example, a full-field master 3702 (e.g. an offset master or a so called waterless master which uses a pattern of silicon rubber to create a pattern in ink). In one example, the master 3702 may be pressed against cylinder 3708 with the workpiece 3710 directly, or may use a transfer roll 3704. FIG. 39 also shows a transfer roll 3716 with an ink pattern deposited by an ink-jet head 3714. An ink-jet head 3712 may alternatively print directly on the workpiece 3710.

In semiconductor lithography, imprint ("nano-imprint") technology has recently become more popular. A template may be mechanically pressed into a polymer film on the substrate and relatively high (e.g., extremely high), essentially molecular, resolution may be achieved. The pattern may serve a function in the device or be used as a mask (e.g., an etch mask, an implantation mask, or for filt-off) when forming semiconductor and other devices in subsequent processing. Imprinting processes may provide relatively high resolution and/or improved defect properties for display manufacturing. FIG. 39 also shows an imprinting template 3706 for imprinting on the workpiece. The formation of the imprinted pattern may be done by heat embossing, heat hardening, photohardening of a polymer, etc.

Referring again to FIG. 39, the master 3702 and transfer rolls 3704, 3716 may be driven by a precise drive and control systems allowing more accurate positioning of the pattern on the surface of the workpiece 3710.

Using cylinders, according to example embodiments, multiple operations may be performed on one or more workpieces simultaneously. Different operations may be easier to shield from each other than on a flatbed system and a workpiece may be accessible from different sides at the same time.

Figure 40:
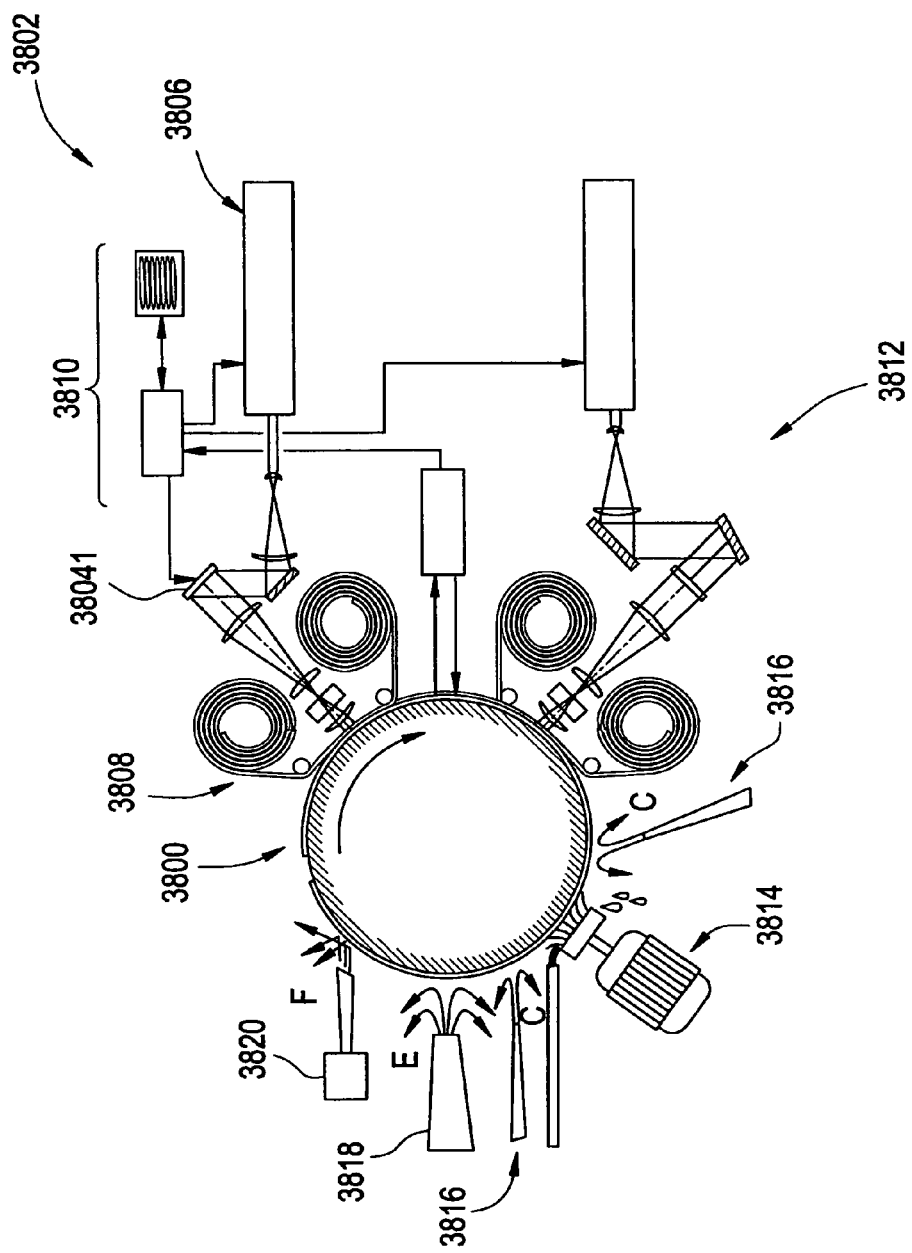
FIG. 40 shows an example embodiment of a multi-operation system.

FIG. 40 shows an example embodiment of a multi-operation system. Referring to FIG. 40, a thermal transfer device 3802 using a spatial light modulator (SLM) 3804 is shown. A laser (e.g., a pulsed laser) 3806 illuminates the SLM (e.g., a DMD device or SLM) 3804 and may create a patterned light spot on a donor film 3808. The patterned light spot may be an image of the data loaded into the SLM 3804 by data path 3810. Heat energy may cause the transfer material (e.g., transfer an entire OLED stack thereby forming semiconductor devices on the workpiece) to leave the donor film 3808 and adhere to the workpiece 3800.

Still referring to FIG. 40, the multi-operation system may further include another thermal transfer tool 3812 using a transmission mask. Both described tools 3802 and 3812 may be used to create patterns, but each may also leave debris and/or particles after the donor film has been removed. The multiple-operation system may also include a wet scrubber 3814 for cleaning the surface of the workpiece 3800 to remove loose particles. Air knifes or air barriers 3816 may also be included in the multiple operation system of FIG. 40. Air barriers 3816 are physical barriers that do not make contact with the surface of the workpiece 3800, but instead blow a flat sheet of pressurized air on the surface of the workpiece 3800 so that water drops are repelled and may not pass. The air barrier 3816 protects the other tools in the multiple operation system from debris, such as, splashes from the scrubber 3814.

Still referring to FIG. 40, the multiple operation system may also include a hot-air drier 3818 and a $CO_2$ snow blaster 3820 for cleaning the surface of the workpiece 3800 to remove loose particles.

Figure 41:
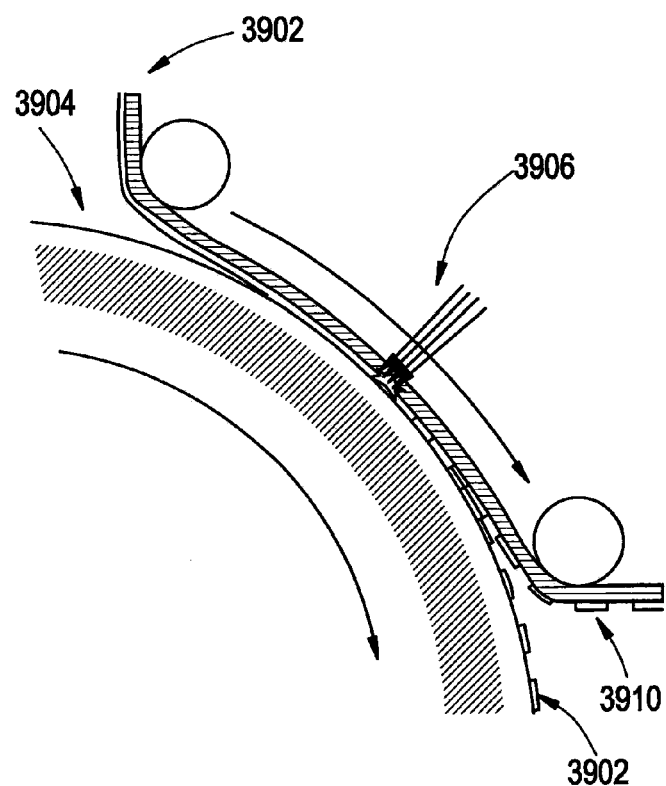
FIG. 41 shows a thermal transfer patterning apparatus, according to an example embodiment.

FIG. 41 shows a portion of a thermal transfer device (e.g., thermal transfer device 3802 of FIG. 40), according to an example embodiment. As shown, donor film 3902 may be pressed against the workpiece 3904. The film may be pressed into intimate contact with the workpiece by being stretched over the curved surface of the cylinder as shown in FIG. 41. Other example embodiments may push the film in contact by pressurized gas, mechanical roll or the like. The donor film 3902 may be, for example, a transparent carrier film with the transfer material facing the workpiece 3904. One or more interface layers may be formed between the transfer material and the carrier film, which may increase absorption of laser energy. A pulsed laser beam 3906 passes through the donor film 3902 and heats the transfer material. In at least some example embodiments, the transfer material may melt and stick to the workpiece 3904. However, in other example embodiments an interface layer may explode due to the absorbed energy, pushing the transfer material in contact with the workpiece 3904. When the donor film 3902 is separated from the workpiece 3904, areas that have been transferred (such as, area 3908) may adhere to the workpiece 3904, whereas non-transferred areas (such as, 3910) may remain on the donor film 3902. Another example embodiment uses an inverse transfer where the film to be patterned is already on the workpiece. In areas where the transfer material is to be removed, it may be wielded, fused or photochemically bound to the carrier film with a photon beam and when the film is peeled from the workpiece parts of the film to be patterned leaves the workpiece and follows the carrier film.

Figure 42A:
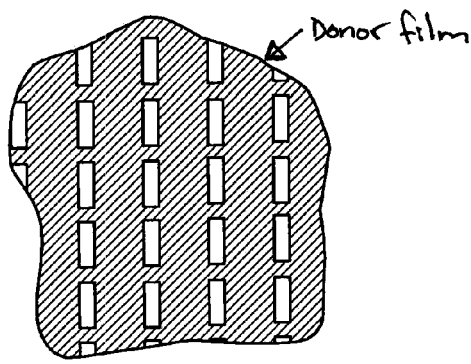
FIGS. 42A and 42B show example donor films that have been reused.
Figure 42B:
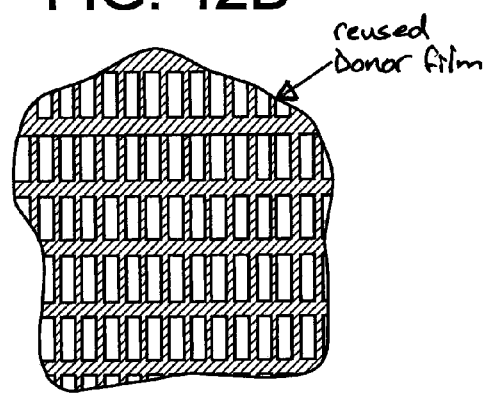

FIG. 42A shows an example donor film after one color in a color filter has been written. FIG. 42B shows an example donor film that has been reused three times to economize the transfer material. For each time the donor film is used, the donor film is displaced so that an unused area may be used. Color filters may be simple regular patterns where this is easily done, and the pigments used are relatively expensive. The same methods may be used for depositing patches of LED stacks with different colors on an LED display panel.

In accordance with example embodiment, glass panels must withstand bending onto a cylinder. Once this is accomplished, many different types of processing equipment may be performed using a cylinder. As described in this application, entire factories may be based on cylindrical machinery and/or handling. The workpiece may be rolled up on the cylinder and fastened. A chemical or physical process may be performed on the workpiece and semiconductor devices may be formed on the surface, while the cylinder and the workpiece are spinning, for example, relatively slowly. Monitoring instruments may be mounted such that the process may be monitored in real time. The workpiece may be rinsed and dried before being unloaded. The chemical process may be, for example, an etching process, and a physical process may be, for example, coating with a polymer dissolved in a solvent.

FIG. 43 illustrates a developing or processing system, according to an example embodiment. The developing system of FIG. 43 may be, for example, a wet processing system.

Referring to FIG. 43, a plurality of (e.g., two) liquid dispensers 4102 may be isolated by a plurality of air barriers 4104 and a hot-air drying section 4106. The developing system of FIG. 43 may also include two integrated instruments 4108 and 4110. Instrument 4110 may be a microscope including a linewidth measurement instrument forming a real image of the pattern after or during processing. Instrument 4108 may be a scatterometer forming an image of the light diffracted from the surface. In on example embodiment, both instruments 4108 and 4110 may be integrated onto the same processor; however, alternatively each instrument 4108 and 4110 may be integrated on separate processors.

Figure 44:
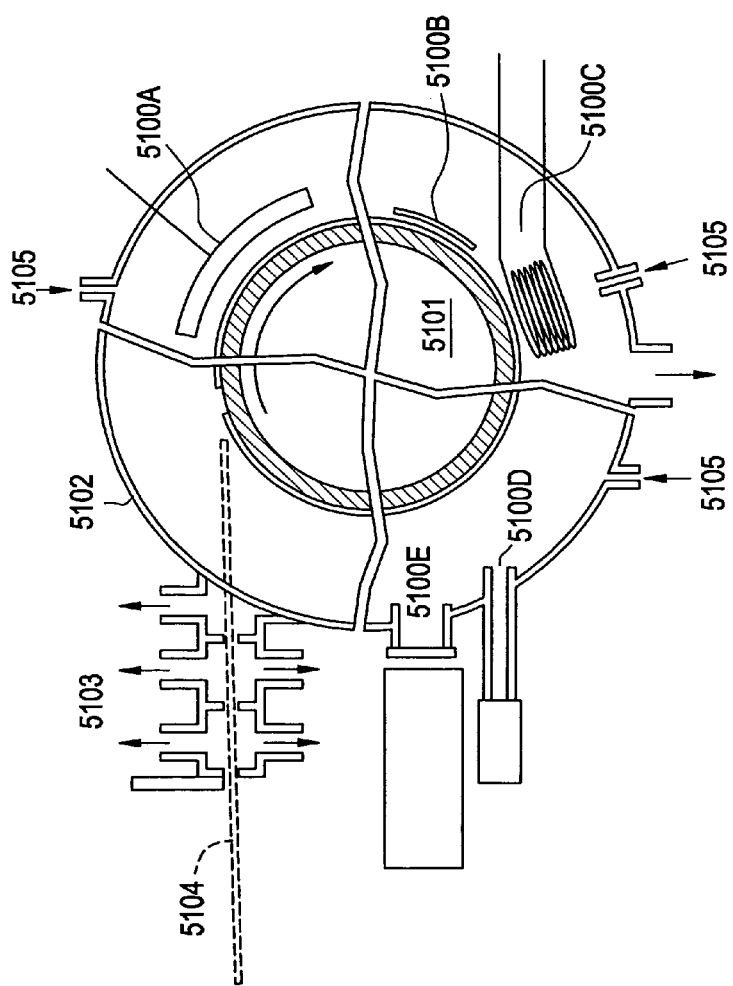
FIG. 44 shows several example vacuum or closed environment processes using a cylinder stage, according to an example embodiment.

FIG. 44 shows several example vacuum or closed environment processes for forming semiconductor and other devices using a cylinder stage, according to an example embodiment. The cylinder 5101 may be enclosed in a hermetically sealed vessel 5102. The vessel 5102 may be sealed using, for example, a vacuum introduced via access point 5105. Alternatively, the access point 5105 may be used to control the atmosphere of the sealed vessel 5102. A load-lock 5103 may be differentially pumped so that workpieces 5104 are loaded into the chamber while maintaining the vacuum. After the machine has been loaded, the load-lock 5103 may be closed.

Referring still to FIG. 44, within the sealed vessel 5102, the cylindrical stage may be used in a sputtering process 5100A, a plasma etching process 5100B, inductive plasma etching or deposition 5100C, photon, electron, or ion beam rubbing 5100D and/or laser annealing/re-crystallization 5100E. Each of these processes is well-known in the art, and thus, a detailed discussion thereof will be omitted for the sake of brevity. In addition, although only processes 5100A-5100E are discussed herein, many more processes than those shown may be implemented using a similar or substantially similar system. A cylinder or cylindrical stage, according at least some example embodiments, may also be used as an infrastructure for inspection and/or repair.

Figure 45:
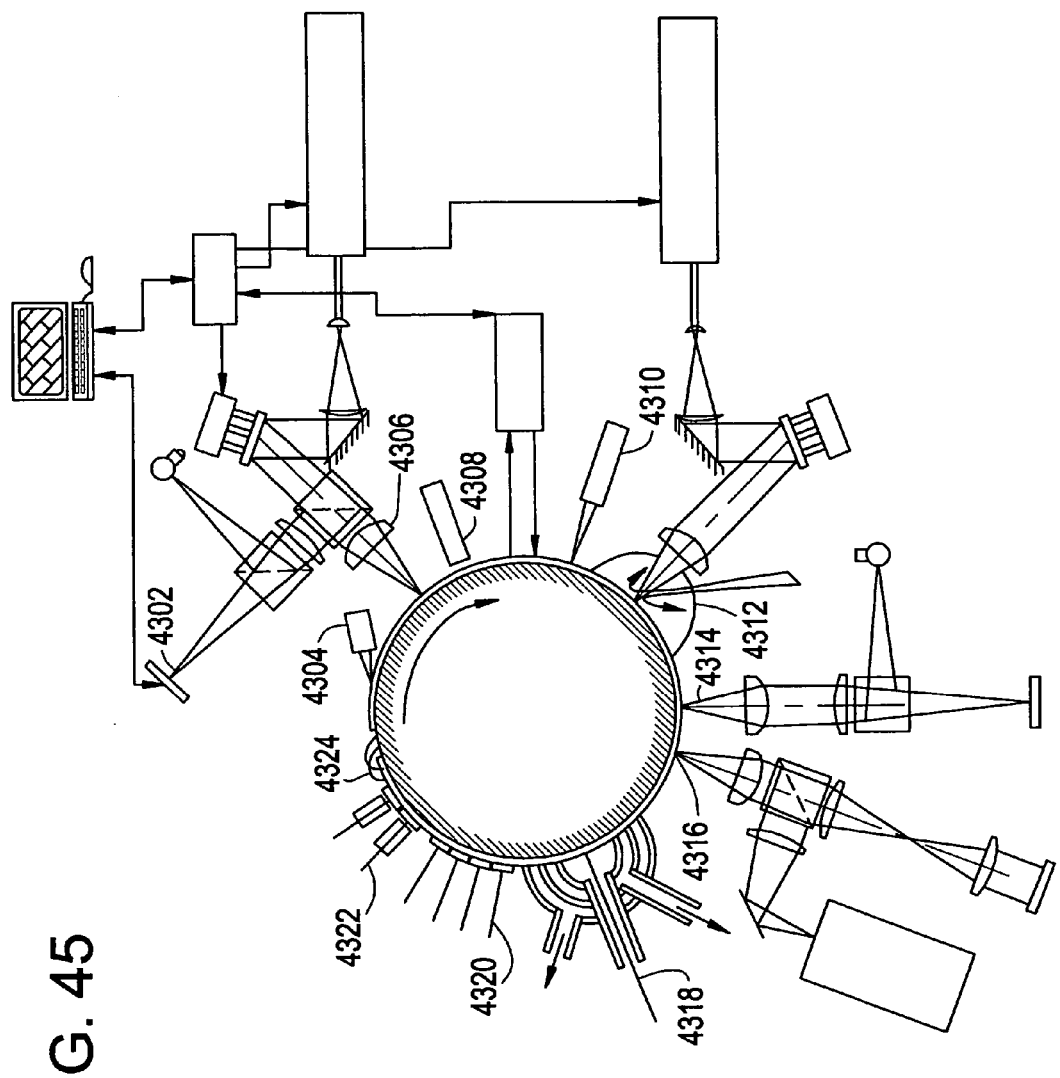
FIG. 45 illustrates a system including several example inspection and repair tools.

FIG. 45 illustrates an example system including a plurality of inspection and/or repair tools, according to an example embodiment. As discussed herein, a single machine may have one or more tools, for example, for inspection only, for defect review only, for repair only or for any combination of these or other functions. Standardized interfaces and modular units may provide more freedom to configure systems for different combinations of tasks. As shown in FIG. 45, for example purposes, the tools are a combined defect review and guiding microscope 4302, a laser zapper for dark repair by removal of material 4306, a micromechanical knife for removal of extraneous material 4304, an ink-jet head for filling in missing material 4308 (e.g., in color filters), a micropipette for adding material 4310, a laser assisted deposition tool for addition of material 4312 (e.g., to close metal open defects and fill in holes in the black matrix), an optical inspection head 4314 for comparing the pattern to itself shifted or to a database representation, an optical inspection tool forming an image in the Fourier space 4316 for spectral analysis, a micro-vacuum cell with electron and/or ion beams 4318 both for analysis, sectioning and repair of defects, capacitive probes for electrical testing 4320 of metal or semiconductor patterns, Kelvin probes for sensing the potential of the surface 4322, and contact probes 4324 for exciting the workpiece with voltage and sensing the impedance. Not shown is a microgrinder for abrasively grinding down protrusions. In addition to those described above, any suitable tool may be included in the infrastructure shown in FIG. 43.

FIGS. 46A and 46B show methods for forming a black matrix, according to an example embodiment. The black matrix is part of the color filter in a LCD-TFT display. The display includes two glass panels with a liquid crystal material in-between. One panel may include a transistor array, which together with the liquid crystal, forms a light valve. The color filter may be the other glass panel with the color patches allowing the display to create strong saturated colors. Around the transparent color patches is the black matrix which improves saturation by reducing light leakage around the color filter patches, and protecting the transistors of the transistor array from having the function disturbed by the light from the back light unit. The black matrix may be a metal mesh or alternatively a mesh formed in dark pigmented resin.

Referring to FIG. 46A, a coarse black polymer pattern may be deposited by ink-jet head, for example, covering at least a portion (e.g., partially or completely covering) of the surface, which will include the finished black matrix. Because the ink-jet head may not be sufficiently accurate and the black matrix may be geometrically critical, the area of the final black matrix may be printed with a safety margin around the edges.

As shown in FIG. 46B, the black matrix may be cleaned and the size of the holes may be adjusted to a final measure using, for example, laser ablation. Multiple passes and overlap between stripes may be used to reduce visible artefacts, so called mura. As shown in FIG. 46B, a two-pass operation where the edges between fields (e.g., stripes, mask images, or similar fields) in the two passes are offset may be used. Two example cases are shown in FIG. 46B. In example 1, (interlace) each hole is exposed only once, but multiple (e.g., two) passes are needed to form all holes. The stripe or field boundaries are displaced between the passes, so that visibility of the boundaries is reduced.

In example 2, (multi-exposure) each hole is exposed in multiple (e.g., two) passes, and as in example 1, the field or stripe boundaries are displaced between the passes. Again, the visibility of the field boundaries is reduced. The letters A and B illustrate which holes are exposed in passes A or B, and in field 1 or 2. In both example 1 and 2, the result is an effective blending between the two passes, reducing the visibility of the fields in the final black mask. Example embodiments may be generalized to N passes, N being any number larger than 1. Example embodiments are not limited to black matrix patterns, however, but may be applied to any similar pattern that is visually sensitive to field boundaries.

Figure 47:
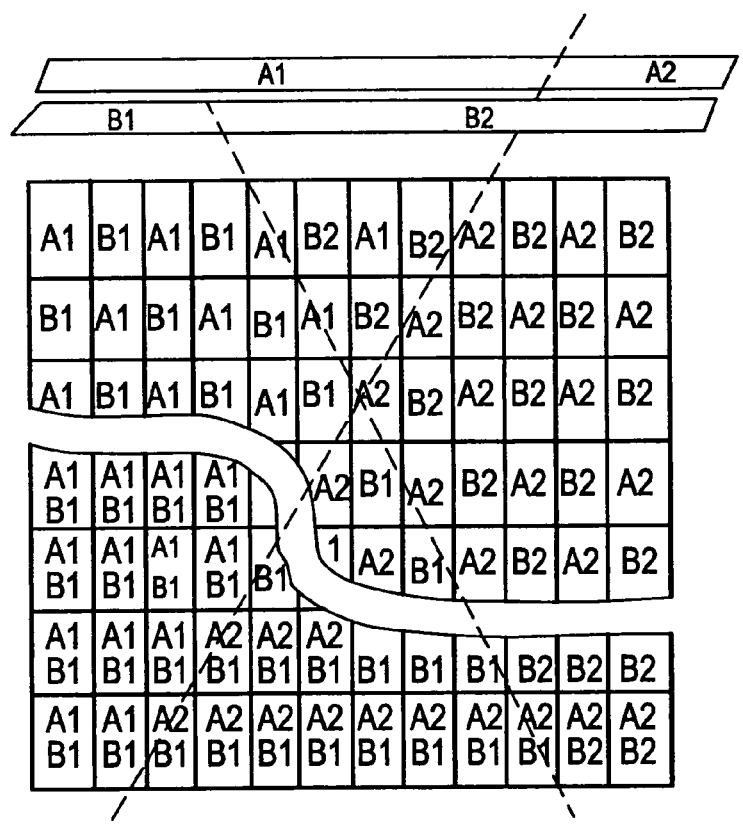
FIG. 47 shows another method for forming a black matrix, according to an example embodiment.

FIG. 47 shows another example case, similar to FIG. 46B, but with oblique boundaries between the fields, which may further reduce visibility of the fields in the finished display. FIG. 47 is similar to examples 1 and 2 described above, except that the field or stripe boundaries are oblique with different angles. The oblique and different boundaries may make it more difficult for the eye to spot the boundaries between the fields, partly because the eye is more sensitive along the horizontal and vertical axes, and/or partly because the field boundaries will criss-cross the TFT-panel (or other device) in a more confusing way.

FIG. 48 shows the area of the cylinder covered by tools including in a processing platform, according to an example embodiment. As shown, the workpiece may be rolled onto a cylinder 4606. An area 4602 scanned by a tool 4604 on a toolbar is shown. When the cylinder rotates, each part of the workpiece may be accessed, and after one turn the same point is reached again. As in the right portion of FIG. 48, this may be illustrated by a flattened glass, each turn being represented by a separate image of the workpiece. A point on the workpiece on left is represented by two separate points to the right (as many points if the figure was continued). The figure to the right may be used to visualize movements of the tool or tools across the gap on the cylinder. The shortest distance in the graph on the right is the shortest distance on the cylinder.

Figure 49D:
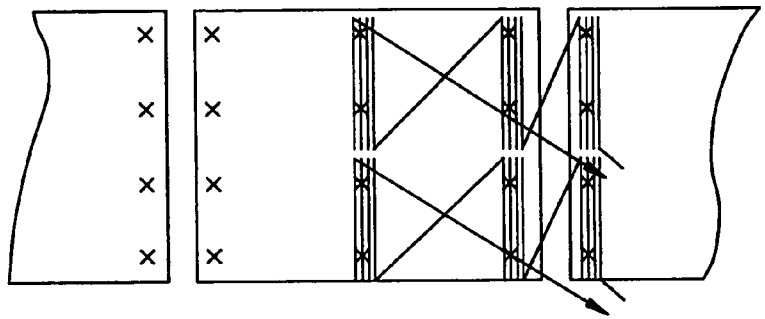
FIGS. 49A-49D illustrate methods for performing sequential random-access moving of a tool, according to example embodiments.
Figure 49C:
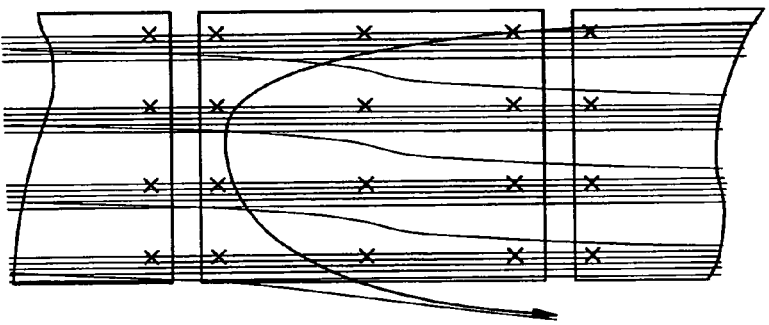
Figure 49B:
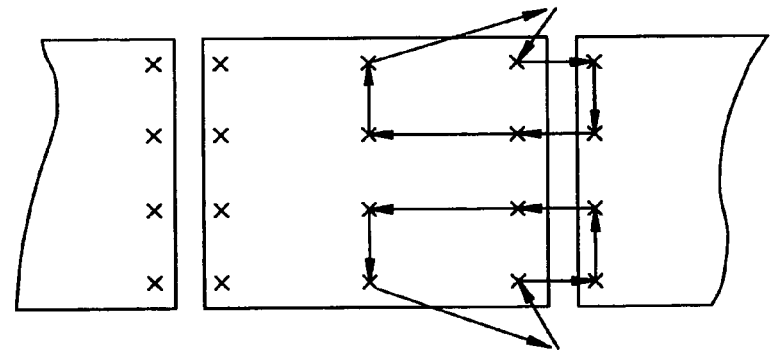
Figure 49A:
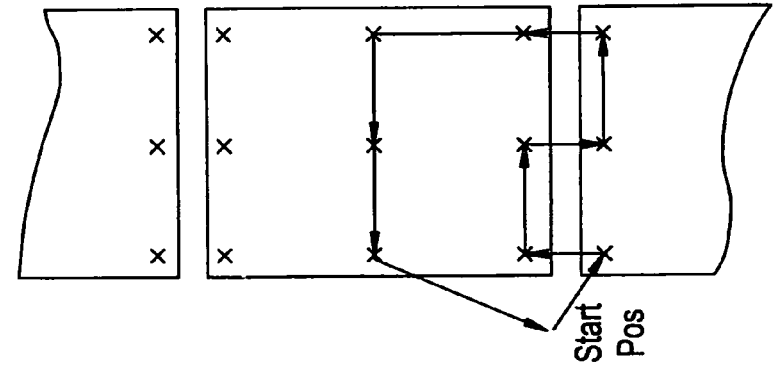

FIG. 49A illustrates a method for performing sequential random-access moving of a tool, according to an example embodiment. The tool may move a shortest distance to the next point, even though the single tool may have to cross the edge of the workpiece. The tool and the cylinder may be controlled independently of each other for random access.

In FIG. 49B, two tools may be controlled independently to randomly access twice as many points per time unit. Both tools may access points with the same tangential coordinate at the same time and if the points are located symmetrically or in a repeatedly along the tool axis the tool may perform the same movement or the tools may perform mirror images of the others movement as shown.

FIG. 49C shows a faster scanning mode in which the cylinder spins with a constant speed and the tool scans the surface or parts of the surface perpendicular to the direction of rotation movement.

In FIG. 49D the cylinder is rotated slowly and the tool or tools are scanned rapidly. As shown, two tools are scanned synchronously with a slow stepping motion of the cylinder, and then the cylinder is rotated to the next area.

All of the scanning modes shown in FIGS. 49A-49D have uses. In addition, hybrids of these modes may also be used. To support the scanning modes shown in FIGS. 49A-49D, for example, the cylinder and tool may have DC motors, linear motors or similar drive systems that may be position-controlled while stationary or moving. Having such a motion system may provide flexibility and/or speed to at least some example embodiments, for example, to an instrument platform, a defect review and repair station, etc.

Figure 50A:
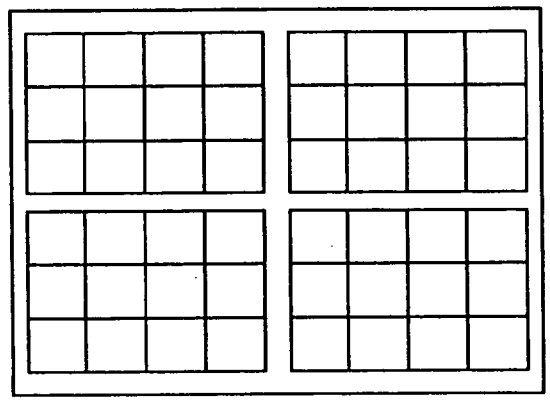
FIGS. 50A-50C shows how intentional distortion created by the introduction of position errors in the tool and cylinder control systems may match a distortion already on the workpiece or predicted to occur after processing.
Figure 50B:
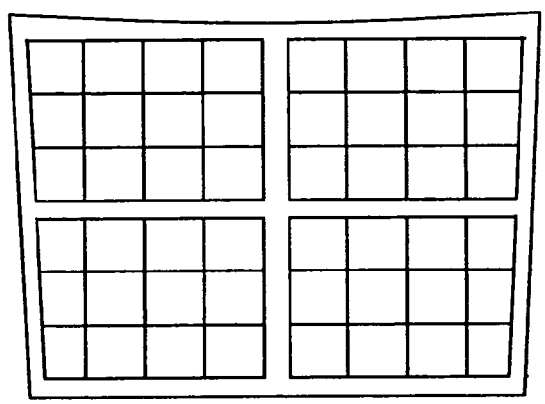
Figure 50C:
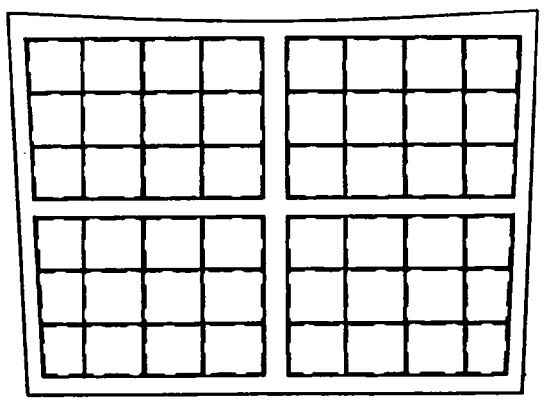

FIGS. 50A-50C show how intentional distortion created by the introduction of position errors in the tool and cylinder control systems may match a distortion already on the workpiece or predicted to occur after processing.

FIG. 50A illustrates an ideal pattern formed on a workpiece. FIG. 50B shows the same pattern as in FIG. 50A, but after a being distorted by a high-temperature step. FIG. 50C shows a second layer formed and patterned on the first layer, but distorted to match the distortion of the first layer. The ability to measure and correct the distortion in real-time may enable the use of smaller transistors and smaller black matrix tolerances. This may result in a faster display with higher transmission.

An alternative when processing the glass in FIGS. 50A-50C, for example, may be to distort the pattern in the first layer in anticipation that warpage will occur. This may provide a finished product with smaller geometrical tolerances. According to example embodiments, both predistortion before warpage occurs and post-distortion of the residual or non-systematic warpage in the layer is patterned may be used. This may provide a product with better geometrical accuracy and/or internal overlay.

Figure 51:
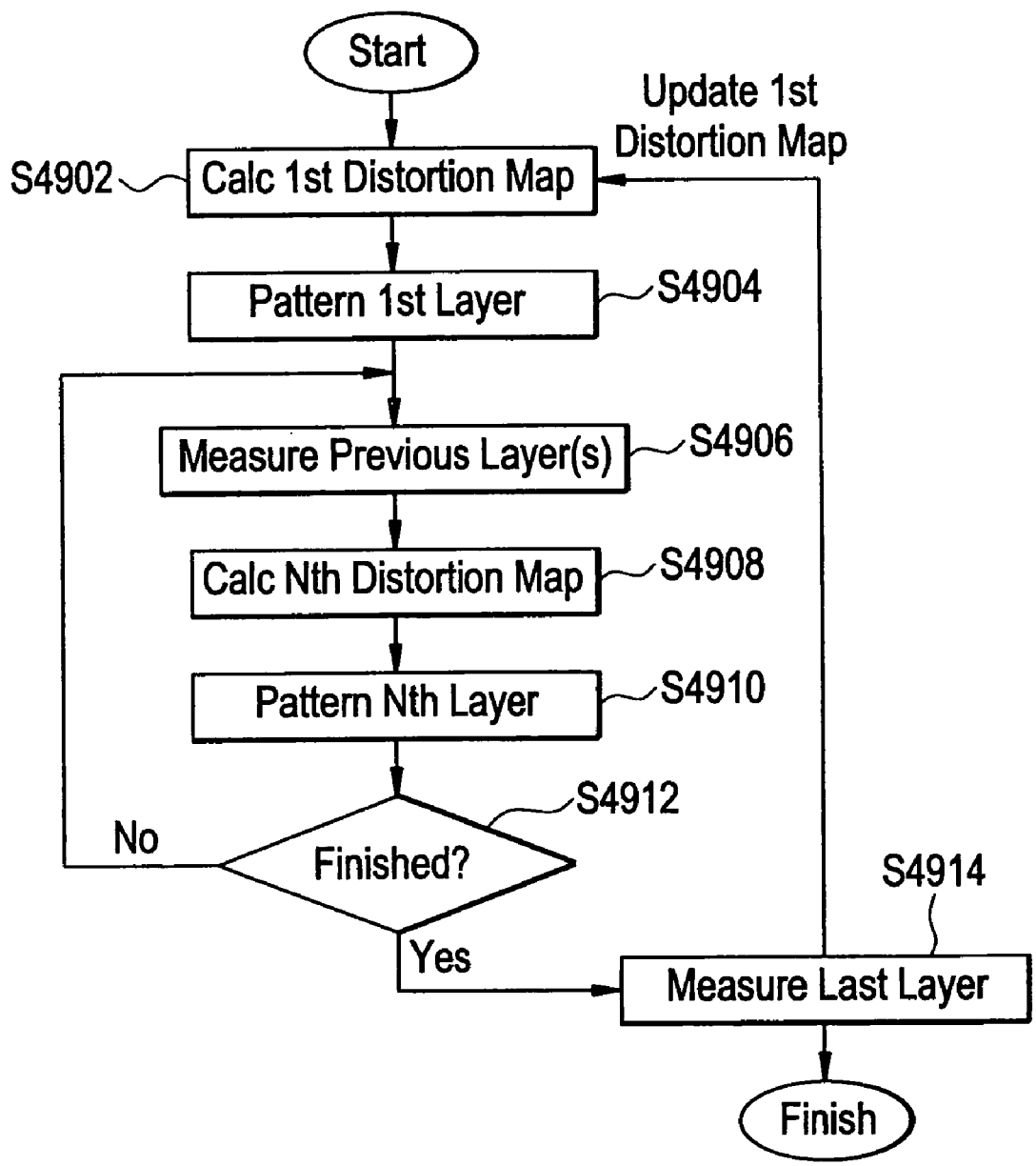
FIG. 51 is a flow chart illustrating a method for correcting systematic accumulated distortion and residual non-systematic overlay errors between the layers, according to an example embodiment.

FIG. 51 is a flow chart illustrating a method for correcting systematic accumulated distortion and residual non-systematic overlay errors between the layers, according to an example embodiment.

Figure 53:
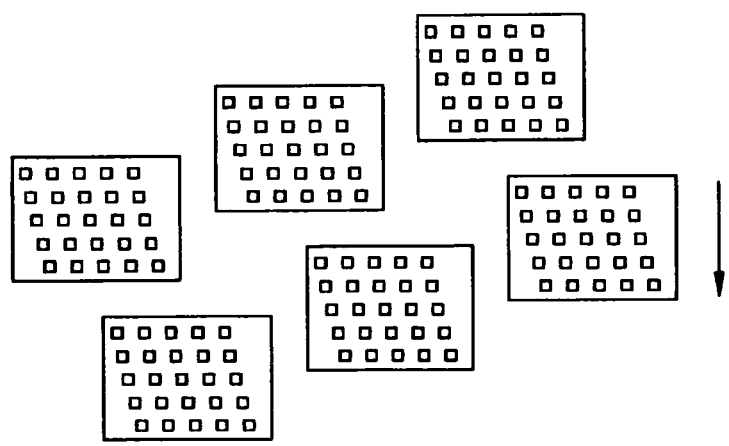
FIG. 53 illustrates multiple fields printed simultaneously.

In FIG. 53 multiple fields may be printed simultaneously to increase throughput.

A common problem with optically written patterns, as well as with inkjet-printed ones is the formation of "mura." The formation of mura refers to the formation of visible bands or patterns due to the visibility of the fields or stripes and/or due to moiré effects between the pattern and the writing mechanism.

At least some example embodiments provide a method for assembling optical fields to a display pattern by repetition along an x and a y axis. The fields may be SLM fields, stepper fields for making displays or scan brushes in a laser-scanning tool. If a stitching artefact between the fields, the stitching artefact may fall on the same row or column throughout a display and may affect the linewidth or the stray capacitances. The stitching artefact may result in a visible artefact in the finished display.

FIGS. 54A-54D show methods for suppressing the occurrence of mura and/or weakening the effects of moiré. As shown, in example embodiments, the pattern may be rotated versus the axes of the writing mechanism.

Figure 54A:
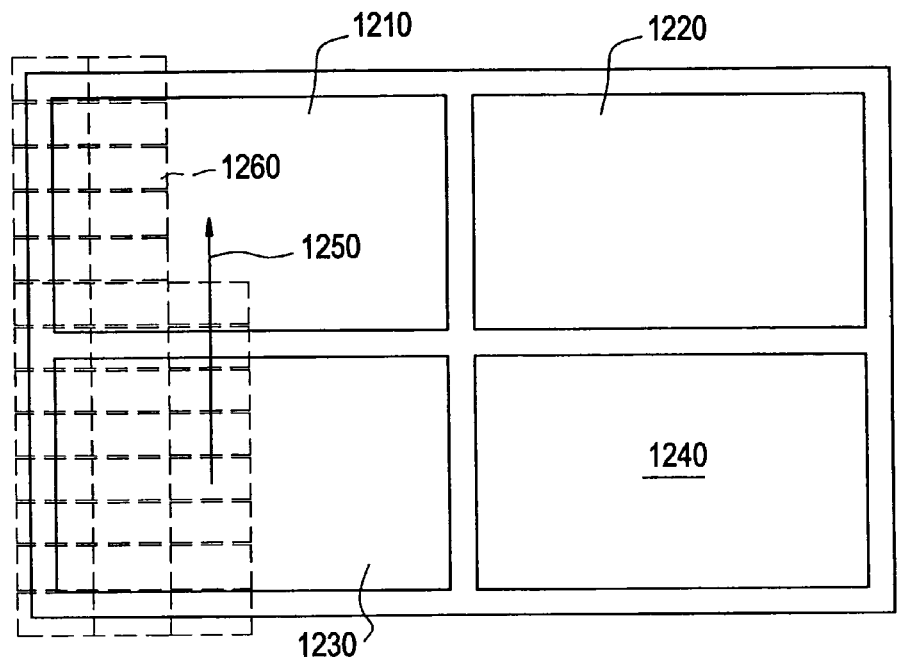
FIGS. 54A-54D show methods for suppressing this occurrence, and weaken the effects of moiré, according to example embodiments.
Figure 54B:
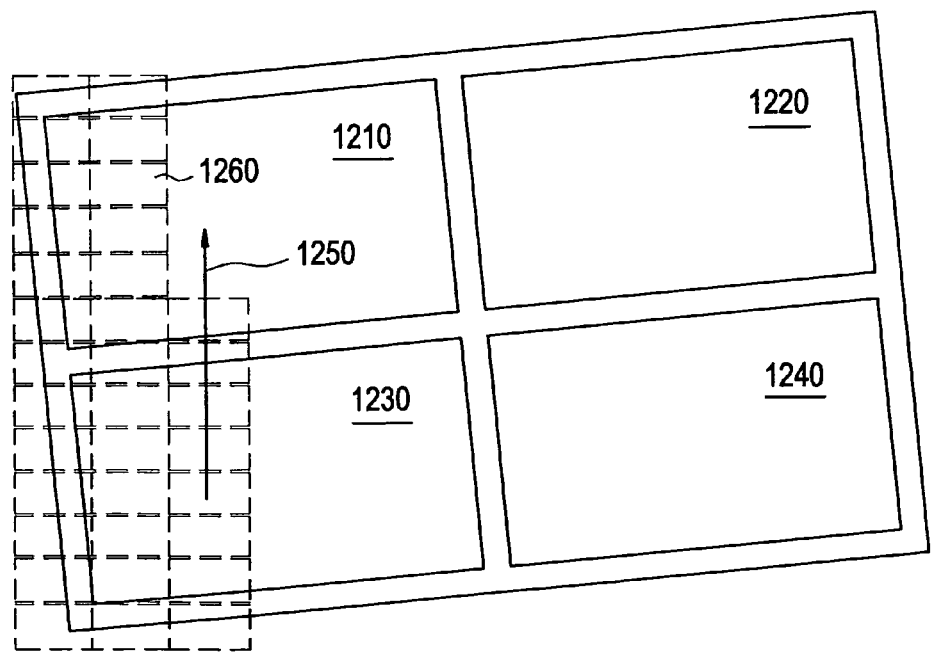

Referring to FIG. 54A, arrow 1250 indicates the rotation direction of the workpiece relative to the stamp 1260. In FIG. 54A, the rotation direction may be parallel, or substantially parallel, to the one of the sides of the SLM chip. In FIG. 54B the workpiece may be wrapped onto the workpiece holder, and may not be in parallel with the central axis of the workpiece holder. The SLM may be arranged in the rotor scanner with one of its outer sides in parallel, or substantially in parallel, with the rotation direction.

Figure 54C:
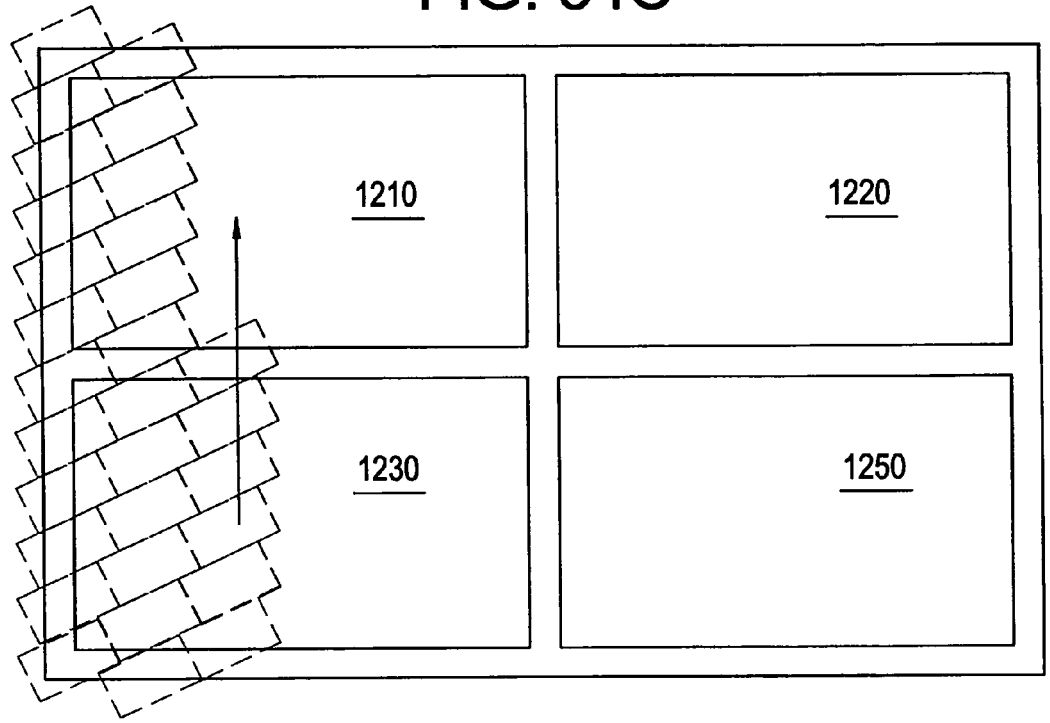
Figure 54D:
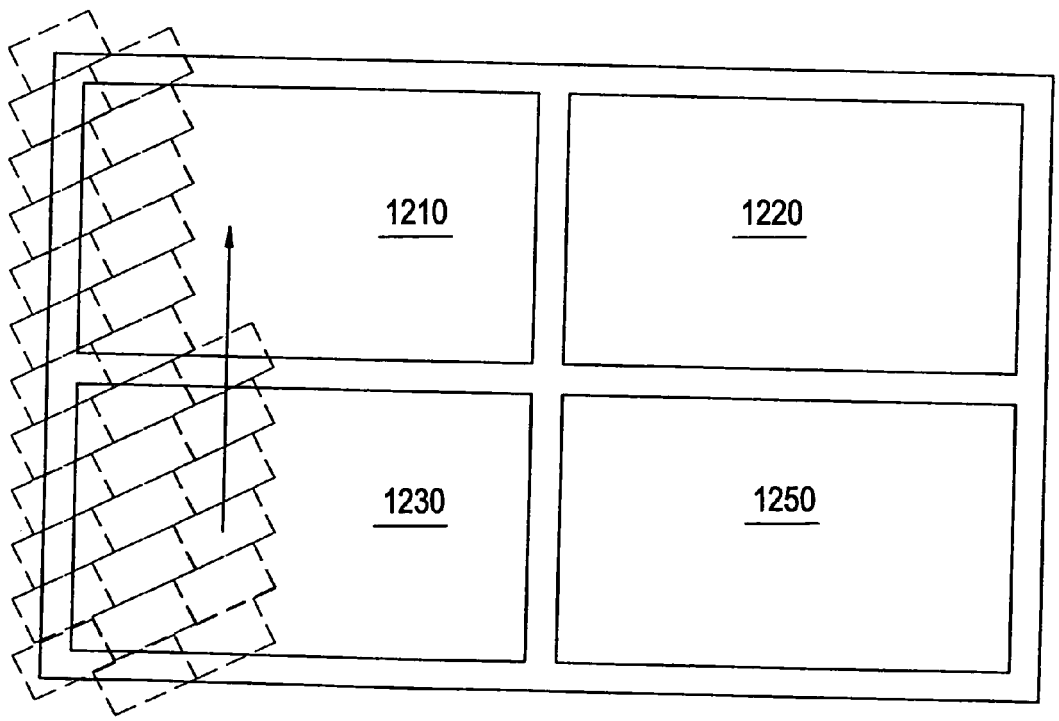

In FIG. 54C, the SLM is arranged in the rotor scanner with none of its outer sides in parallel to the rotational direction. The workpieces may be arranged with one of its symmetry axis in parallel to the central axis of the workpiece holder. In FIG. 54D none of the sides of the workpieces are in parallel with the rotational direction or the sides of the SLM.

FIG. 55 illustrates an example embodiment in which the workpiece 5500 is rotated, the writing head is rotated and an intentional distortion is introduced. FIGS. 56 and 57 show two example methods for rotating workpiece patterns, according to example embodiments.

In FIG. 56, the entire workpiece 5600 may be rotated, whereas in FIG. 57 the workpiece 5700 may be mounted straight, and the patterns 5702 on the workpiece may be rotated. In each of the example methods shown in FIGS. 56 and 57, part of the area scanned by the writing head may be lost due to the rotated patterns.

To reduce mura or moiré effects, different axes in the pattern may be rotated relative to each other. For example, axes on which the pattern (e.g., the rows and columns of the pixels if the pattern is a display or similar device) resides, axes of the pixels in the writer, a stripe axis of the writing mechanism, and/or the directions of repletion of the stitched fields may be rotated relative to each other. Turning these axes away from alignment with each other may reduce mura effects. One source of mura is the difference in behavior between pixel rows and/or pixel columns in the writing hardware. If the pattern is aligned, every pixel in a column of a display device may have a left edge printed with a non-typical hardware column. Likewise, if the fields repeat along the pattern axes a field boundary may fall systematically on the edge of a pixel row across the entire display. Rotating these axes a relatively small angle from each other may ensure that many different hardware pixel rows contribute to a single display pixel row. Likewise, the field boundary may, at one position, fall on the display pixel edge, but in the next field may fall elsewhere.

An angle to reduce mura effects may be about 0.01 to about 0.05 radians, inclusive, or larger, and the particular angle may depend on the write mechanism, the scale and the type of pattern. The angle may be adjustable from one writing job to the next or fixed and built into the writing hardware.

As described above, there are many axes in the combination of stage movement, optical write head and pattern. The fewer of them that are aligned or close to aligned the better. The two axes of a 2D SLM or the axes of stripe and scan in a laser writer need not be perpendicular to each other. There are many possible configurations of coordinate axes in the field of the writing channel, in the pattern and in the stage travel (or field repletion). In one example, the fields may repeat along two axes that are not the same as the axes of the pattern. In another example, the axes of the pixel matrix within an SLM field forming an angle with the axes of the pattern. In another example, the axes of the 2D SLM forms an angle with axes for repetition of the fields. In this example, the stripe and scan axes of a laser scanner may be considered equivalent to the axes of a 2D SLM.

FIGS. 64A-64E illustrate methods for filling an area using continuous scanning in the x and y directions, according to an example embodiment.

FIG. 64A shows an array of pixels in the x-direction along the tool axis. The array may move with a constant speed and after the cylinder rotates one turn, the array stitches to the printed pattern. If the array is not sufficiently dense, the scanning speed may be reduced to, for example, half so that two turns are needed to move the width of the array. The scanning speed may also be reduced more or less depending on the density of the array. The array may be parallel or not parallel to the tool axis.

FIG. 64B shows another method for patterning, according to an example embodiment, in which the array is not parallel to the tool axis. In FIG. 64C, an array parallel to the y-axis is used to fill the surface by continuous scanning in the x and y directions as FIG. 64D shows an example embodiment in which an array is less dense then those illustrated in FIGS. 64A-64C. In this example, a second array is needed to fill voids in the less dense array. The second array may be a physical array as shown in FIG. 65D or may be the same array in a later pass.

FIG. 64E shows two passes on top of each other. A first of the two passes scans to the right, and a second of the two passes scans to the left. The simultaneous scanning of x and y may provide an oblique angle and the two passes may have opposite angles. This may reduce visibility of resultant stripes. The two passes may be written sequentially with the same pixel array, or with two pixel arrays moving in opposite x-directions, for example, simultaneously. The two pixel arrays may be two physical write heads arranged on two different toolbars. The system shown in, for example, FIG. 58 with continuous scanning in x and reciprocating scanning in y may be used to write two passes in a single operation.

FIGS. 58-63 and FIGS. 71A-71C, and 72A-72C illustrate stages in the modular system of FIG. 2B according to other example embodiments. Each example embodiment may enable patterning of relatively large substrates with increased processing (e.g., in particular writing) speed and/or higher precision. By using the same components and communication and control interfaces as the cylinder stage many of the properties are similar. The choice may be made based on specifics such as precision, processing speed, floor space, size, flexibility of the substrates, etc.

Figure 58:
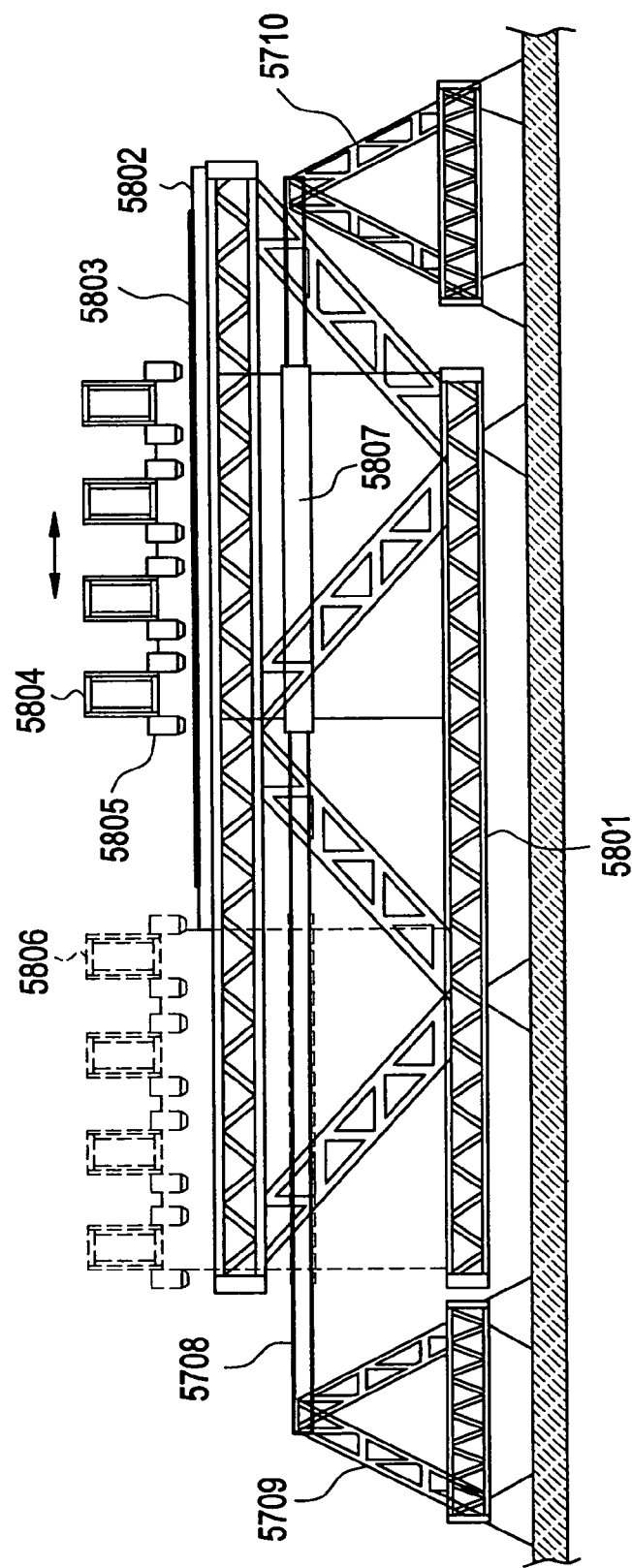
FIG. 58 illustrates a platform, according to another example embodiment.

FIG. 58 illustrates a flatbed platform, according to an example embodiment. The platform shown in FIG. 58 may be a lightweight frame, shown for example purposes as a truss. However, example embodiments may be built with thin walled tubes that may be temperature controlled by fluid (e.g., air, water and/or gas) flowing within the tubes. The frame may provide a more rigid support for a stationary stage top 5802 supporting the workpiece 5803. At least one toolbar may extend across the stage multiple toolbars are possible and standardized seats, fixtures and connectors, plus infrastructure for the creation of a common coordinate system makes it easy to configure the stage with one or many tool on one or many tool bars. The figure shows as an example with four bars 5804. Each of the toolbars may have one or more tools 5805. The tools may be mounted or arranged in a similar or substantially similar manner to that as described above with regard to the cylindrical stage. The number of toolbars and the tools attached to each toolbar may be configured according to the application and/or need for capacity.

FIG. 58 shows how toolbars are moveable and may access any point on the workpiece, and how the toolbars may be moved out of the way (dashed) 5806 for loading and unloading. FIG. 58 shows a linear motor 5807 driving the toolbar assembly and the stator of the linear motor is attached to a rod 5708 that goes between two supports 5709, 5710 standing separately on the floor. In another example embodiment, a freely moving counter mass (not shown) may be connected to the stator so that neither part of the linear motor is connected to the ground. The linear motor may move the toolbar assembly and the counter mass by applying a force there between, while keeping a common, stationary center of gravity. A separate system including a motor (not shown) applying a weak force between the ground and the counter mass may keep the counter mass centered within a range of movement.

Figure 59:
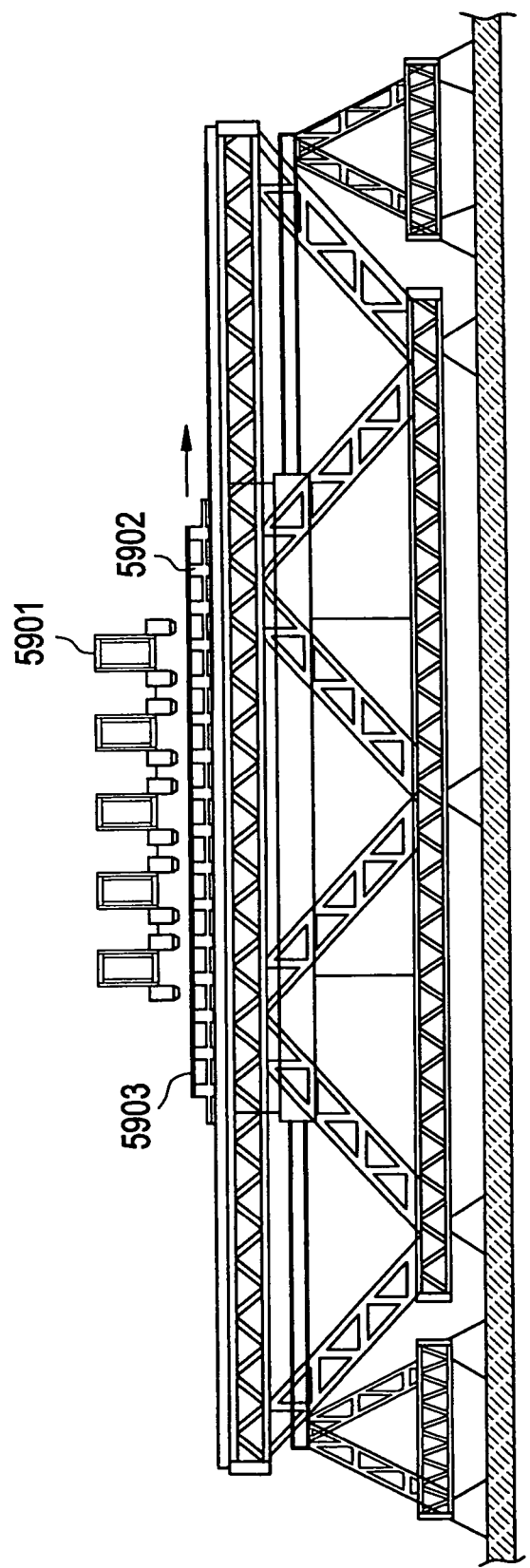
FIGS. 59, 60, 61, 61A and 61B show general-purpose platforms, according to other example embodiments.

FIG. 59 shows a flatbed platform according to another example embodiment. It is similar to the embodiment in FIG. 58 but has stationary tool bars 5901 and a moveable stage top in the form of a shuttle 5902. The shuttle is a light-weight design, and in an example embodiment it is made from carbon fiber. The workpiece 5903 is held by vacuum and the shuttle floats on air cushions. The linear motor pushes the shuttle from end to end of the stage and the tool bars do their processing on the workpiece.

Figure 60:
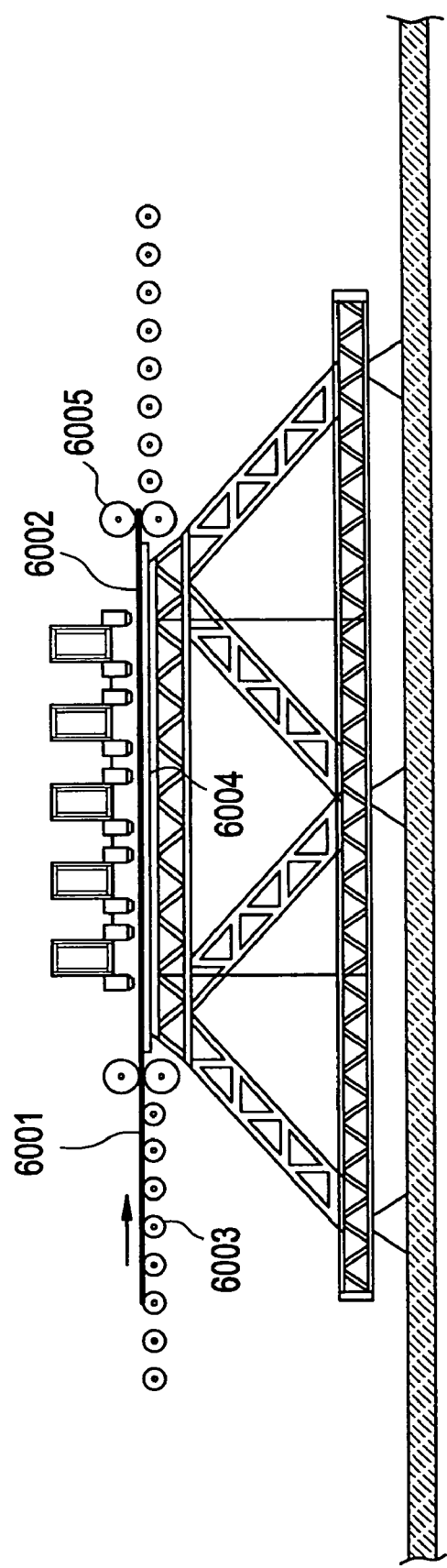

In FIG. 60 is in example form a "low-footprint" flatbed stage where only the part 6002 of the workpiece 6001 that is being processed is on the stage and the ends are resting on a conveyor 6003. In an example embodiment the workpiece may float on an air cushion 6004, most suitably on an air cushion, known in the art, which has both suction and pressure and will hold the workpiece within a defined distance, e.g. 30 microns, from the surface of the air pad. The transport of the workpiece must be well controlled and FIG. 60 shows wheels 6005 to drive the workpiece and monitor its movement.

FIGS. 61 and 61A shows a more detailed top view of the "low-footprint stage" of FIG. 60 with particular reference to xy-metrology. The substrate 6101 moves up to the system on a conveyor 6102, or similar transport system used in the factory. The transport through the system is guided and monitored by rollers 6106 and 6107. The rollers stabilize the movement enough so that the fiducials do not fall outside of the capture fields of the cameras and provide an approximate coordinate system between the fiducials. The substrate has an array of fiducials 6103 that need to be measured. A number of cameras 6104 are position on one or more rulers 6105 so that they will see the fiducials when the substrate passes through the system. The basic mode of operation is with the substrate moving continuously and the cameras acquiring images while the substrate moves. This can be done by TDI (time delay and integrate) cameras or by using illumination by short pulses that freeze the image. Other schemes like moiré beating are possible with special fiducials. The cameras are somewhat redundant, at least one and possibly many of the fiducials are captured on more than one camera. The cameras have accurately known positions, as calibrated by measurement of a known "golden" sample substrate. The redundant measurements allow the position of the fiducials on a test substrate to be accurately determined. The system in FIG. 61A gives an accurate distortion map of the fiducials after the substrate has passed through it.

Figure 61B:
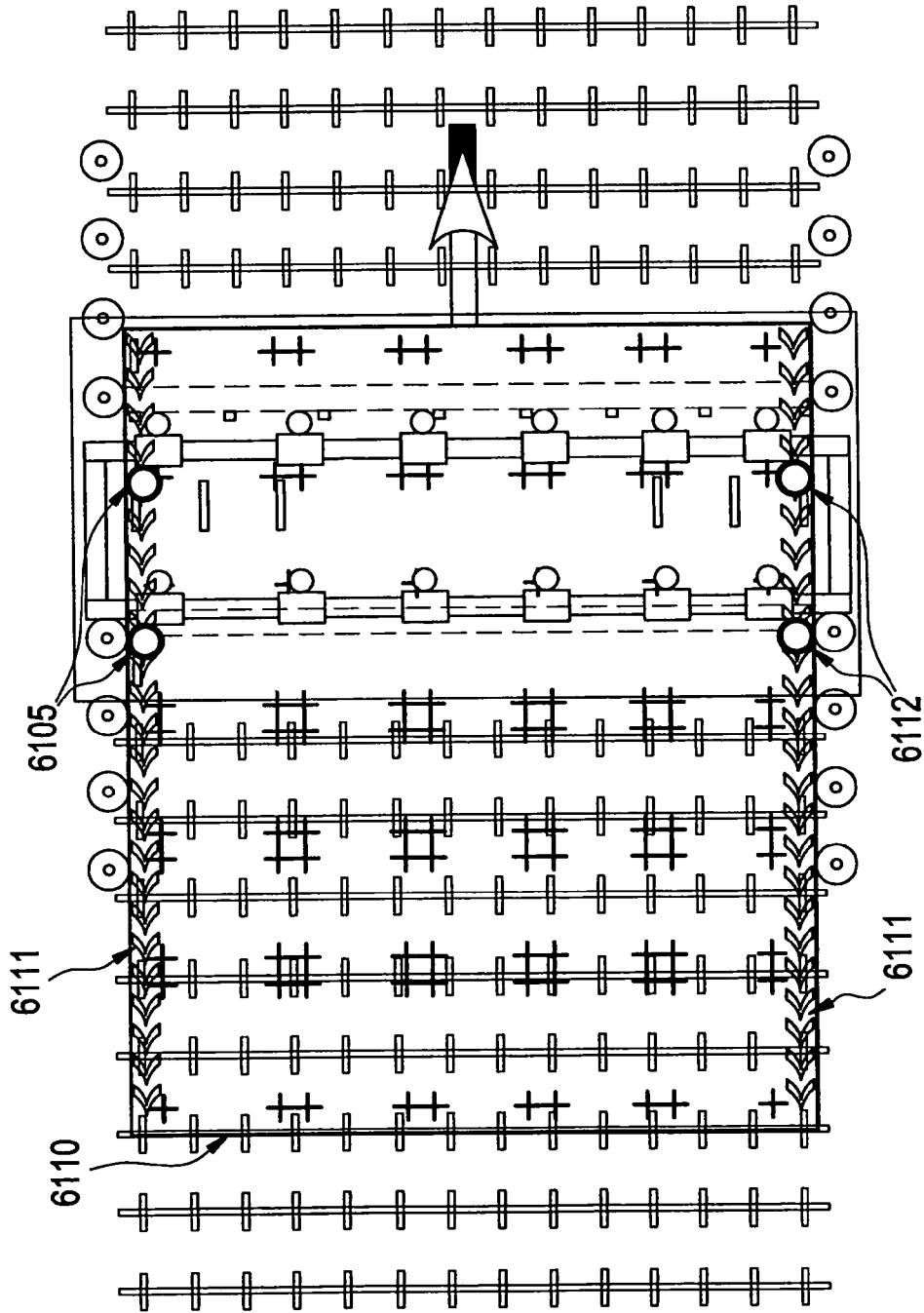

FIG. 61B illustrates an improved optical system for metrology and establishment of an accurate coordinate system. One or more continuous or semi-continuous bands 6111 is printed along the sides of the substrate 6110, e.g. together with the first pattern layer. A separate set of special cameras 6112 measure the movement of the band with the substrate. Note that the accuracy of the band is not part of the accuracy of the measurement. The accuracy is built up from the relative placement accuracy of the special cameras. The special cameras may be arranged three on one side of substrate and one on the other side (two plus two shown). The metrology scheme of FIG. 61B can be used for metrology but also for establishing the coordinate system when exposing a pattern.

Figure 62:
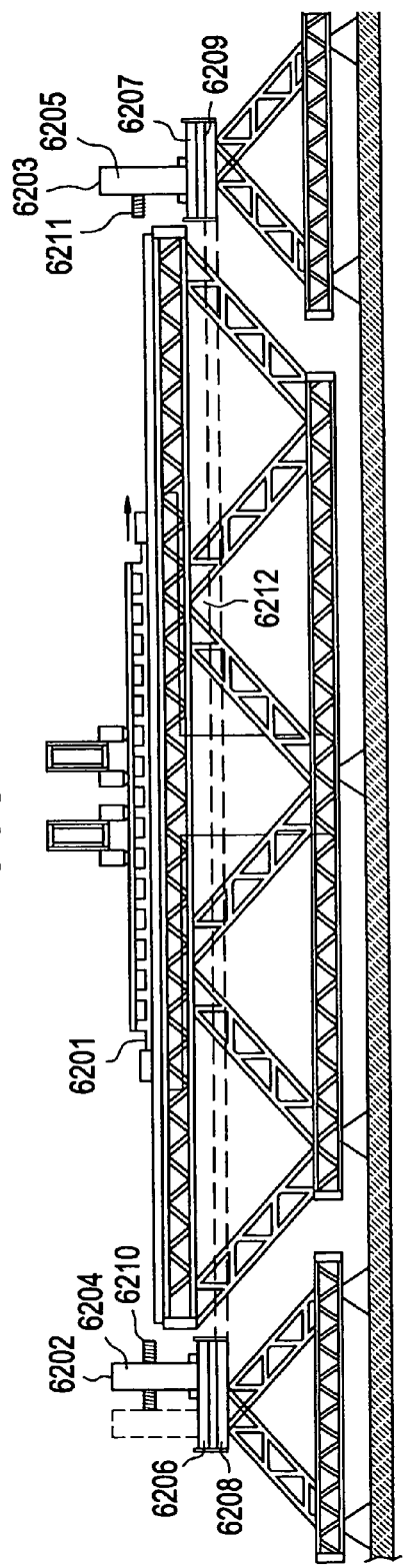
FIG. 62 shows an example operation of the platform in FIG. 60 for higher-speed patterning of workpieces.

FIG. 62 shows an example operation of a flatbed platform for higher-speed patterning of workpieces, according to an example embodiment. For example purposes, this example operation will be described with regard to FIG. 59; however, other flatbed platforms, according to example embodiments, may operate in similar or substantially similar manners. The platform may have the same or substantially the same or substantially the same type of lightweight board frame and a floating lightweight stage, hereinafter referred to as the "shuttle."

Referring to FIG. 62, in example writing operation, the shuttle 6201 may bounce between stops 6202, 6203 at the ends of each stroke. Counter masses 6204, 6205 may be associated with the stops and may freely move via slides 6206, 6207, but may be affected by the force of linear motors 6208, 6209. When the stage bounces against a counter mass the stage may lose at least a portion of kinetic energy. The force during the impact may be controlled by spring constants of springs 6210, 6211 compressed during the impact. The stage bounces at both ends of a stroke and there may be at least two counter masses controlled individually by the linear motors, or at least one counter mass joined to the stops by a fixed rod. Another linear motor 6212 may be positioned under the stage and may accelerate the stage towards a first impact when the stage movement begins. The liner motor may also be used to move and stop the stage at any position, and/or maintain a constant or substantially constant speed during scanning. The stage may operate at a constant speed, moving to the left or to the right, or may be used for the bounces. The stiffness of the springs may be selected such that the maximum acceleration is within the operating bounce of the stage, not causing the workpiece to slide on the stage and not generating excessive vibrations in the stage. The sequence of operation may be like this: the shuttle starts stationary from the center of the stage. The linear motor throws it to the right, with an acceleration known not to make the substrate slip on the shuttle. Meanwhile the linear motor to the right has accelerated the right counter mass (bouncing weight) to the left so that it meets the shuttle with some speed. At the impact the impulse from the counter mass is transferred to the shuttle and the shuttle shoots to the left. A control system (not shown) together with the linear motor 6212 keeps the shuttle moving at a predetermined speed. Meanwhile the right counter weight, which moved to the right after the impact is braked and the velocity is reversed in order to once more hit the shuttle when it comes back. When the shuttle has moved along the stage to the left side it meets the left counter weight moving to the right, impacts and shoots to the right again. The left counter weight moves to the left after the impact, turns slowly to come back and hit the shuttle the next time it comes to the left side. The shuttle moves much like a tennis ball between two rackets. The system can be designed so that the shuttle moves at high speed most of the time, the time spent in impact is limited and the forces during impact are also limited. Most of the kinetic energy is kept during the bounce, what is lost is compensated for by the movement of the counter weights (bouncing mass) and by the linear motor 6212.

In order to reduce the weight of the stage, the stage may be comprised of, for example, a leaf spring with pads floating on the support structure and other pads holding the workpiece. Alternatively, the shape of the stage may be determined by the shape of the supporting surface.

Figure 63:
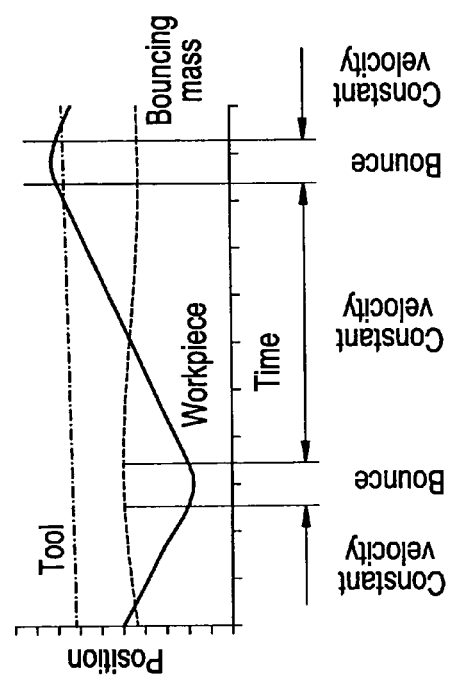
FIG. 63 shows a diagram over the position of the stage and the counter masses during scanning.

FIG. 63 shows a diagram over the position of the stage and the counter masses during scanning. FIG. 63 also shows the position of the tool scanning at a constant speed in the direction perpendicular to the paper. When the stage is scanning to the right an oblique line is traced by the tool across the workpiece and after the bounce and other oblique line is traced with a different angle. With the proper relation between the tool width, the stage speed, and the tool speed two contiguous passes may be written on top of each other. Both passes may have stripes inclined to the scanning axis of the stage which may reduce periodic defects in a pattern as shown.

If the workpiece is about 2.8 m long, the acceleration is about 10 g during bounce, and the constant speed about 6 m/s, the average scanning speed including bounce-time is approximately 5 m/s. Momentum may be transferred between the counter masses and the stage, none of which are connected to the supporting structure or to the floor. After the bounce counter mass recedes with a speed significantly lower than the stage, the linear motor may reduce the speed and reverse the velocity of the counter mass until the next bound with the same counter mass. If the two counter masses are connected with a rod, or alternatively if a single counter mass is arranged at the center of the stage is used, the demands on the linear motor may be reduced. In this example, bounces at each end reverse the velocity of the counter mass(es), and the movement of the counter mass may be similar or substantially similar to that of the stage, except slower and with less range.

In at least some examples embodiments, a rotor scanner may be in the form of a ring. In this example, each of a plurality of optical writing units may be arranged and configured to emit electromagnetic radiation in the form of at least one laser beam. The laser beams may be emitted in at least two directions. In at least some examples embodiments, the laser beams may be emitted in at least two parallel directions. In at least some examples embodiments, the laser beams may be emitted in a radial direction inward toward a workpiece arranged on a cylindrical holder positioned inside the ring-shaped rotor scanner.

In at least some examples embodiments, the rotor scanner may be in the form of a disc. In this example, each of the plurality of optical writing units may be arranged and configured to emit electromagnetic radiation in the form of at least one laser beam in a radial direction outward toward at least one workpiece arranged so as to at least partly enclose the disc-shaped rotor scanner. Alternatively, the disc-shaped rotor scanner may be ring-shaped.

For the sake of clarity, a rotor scanner including optical writing units arranged and configured to emit electromagnetic radiation in the form of at least one laser beam in an outward radial direction will be referred to hereinafter as a disc rotor scanner, whereas the rotor scanner including optical writing units arranged and configured to emit electromagnetic radiation in the form of at least one laser beam in an inward radial direction will be referred to herein as the ring rotor scanner. A rotor scanner configured to emit electromagnetic radiation in the form of at least one laser beam in an axial direction will be referred to herein as an axial rotor scanner. Hereinafter, when discussing aspects of example embodiments applicable to both the disc rotor scanner and the ring rotor scanner, the disc rotor scanner and the ring rotor scanner will be referred to collectively as a rotor scanner.

The workpiece may be flexible (e.g., very flexible) and may need a cylindrical support to have and maintain a desired radius. The inner part of the workpiece may more easily assume a cylindrical shape; however, at edges parallel to the cylinder axis, a bending moment may be introduced to start bending the workpiece at the proper bending radius. This bending moment may be on the order of a few kg*cm, and may be introduced by a lengthwise clamp. This clamp may also support the workpiece as workpiece is loaded into the machine.

The workpiece may have a thickness tolerance of about +/−70 μm and a variation of less than about 20 μm over a length of about 150 mm. This variation may disturb the focus position and may be corrected in focus and/or in the shape of the workpiece. For example, the shape from the rotor scanner may be measured, and the shape of the workpiece may be corrected. The active workpiece shape may be corrected only within the writing zone. In this example, the corrector hardware may follow along with the rotor scanner assembly, which may reduce the number of actuators. The use of a corrector may use optics with a shorter depth of field.

The rotor scanner may be supported by bearing pads (e.g., air bearing pads) that may control the position of the axis of rotation and/or the lengthwise position of the rotor scanner. The positioning in the direction of rotation may be adjusted by timing of the pattern. The dynamic positioning in the axis lengthwise direction may, depending on the design, need active components to move the image plane.

The rotor scanner position may be determined by several different methods, according to example embodiments. For example, in the ring rotor scanner marks on the periphery may be detected, for example, optically, and the position of the rotor scanner may be interpolated between these marks or positions. The air friction may be reduced (e.g., to about 0.1 N), and the speed may be increased. The time between markers may be shorter and/or the possible deviations due to residual forces may decrease as this "time between markers" squared. In example embodiments having a vertical axis, internal accelerometers in the rotor scanner may be mused to achieve a more accurate feedback signal. The feedback signal may be used for velocity control. In example embodiments having a horizontal axis, accelerometers may also be used; however, in this case the accelerometers may need to be balanced such that the direction of the forces of gravity is unseen. Although not described herein, interferometry or any other suitable methods may also be used.

Velocity differences of the scanner rotor may be measured with, for example, internal rotation accelerometers and the rotational accuracy may be improved. Angular position of the rotor scanner may be measured using a plurality of markers (e.g., optical markers) around an outer edge of the rotor scanner. A control system may use the markers as an absolute measurement of position of the rotor, and may interpolate the "in between position" by time. The accuracy of the interpolation may be increased by using internal rotational accelerometers.

The rotor may be balanced using distance sensors, a pressure signal from a bearing pad, or any other suitable measuring device. In example embodiments, the rotor scanner may be supported by bearings, air bearings, air bearing pads, etc.

In at least some examples, transfer of data may be eased by rendering the patterns such that they are streamed to the rotor with little adjustment. In this example, the data may be rendered in a predistorted manner, and stored so that each arc is represented by a column of data in the memory. As the workpiece is written, columns may be read (e.g., successively) from left to right in a memory matrix and the data may be sent through to the rotor scanner.

Figure 65A:
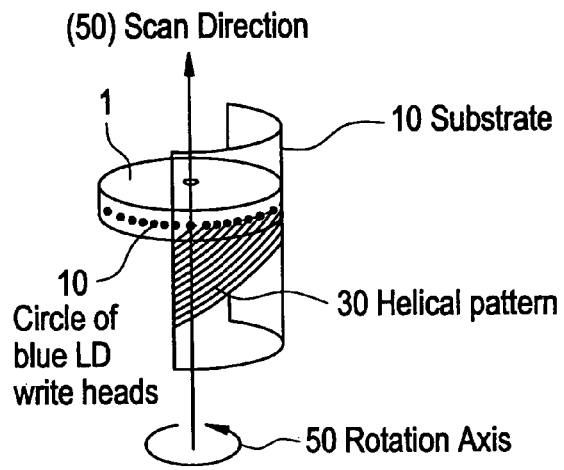
FIG. 65A illustrates a rotor scanner with a single ring of single-point writing units, according to an example embodiment.
Figure 65B:
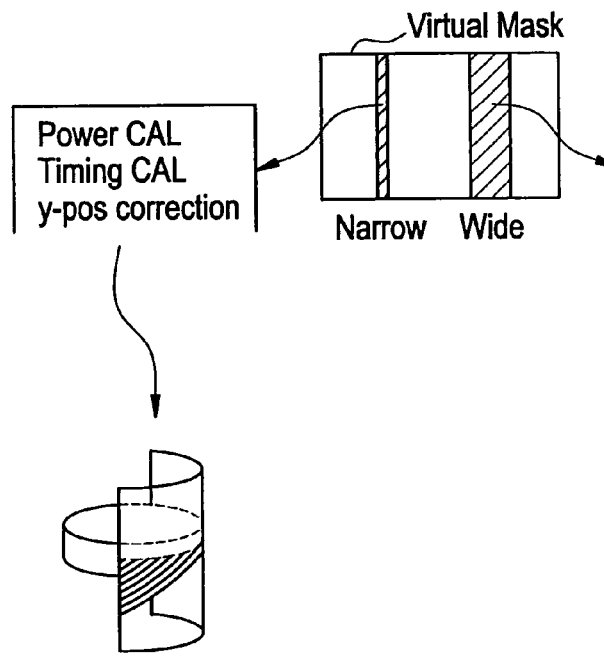
FIG. 65B illustrates a simplified view of the single-ring, single-point scanner writing sequentially lines from edge to edge of the workpiece and the adjustments needed for each writing unit, according to an example embodiment.
Figure 65C:
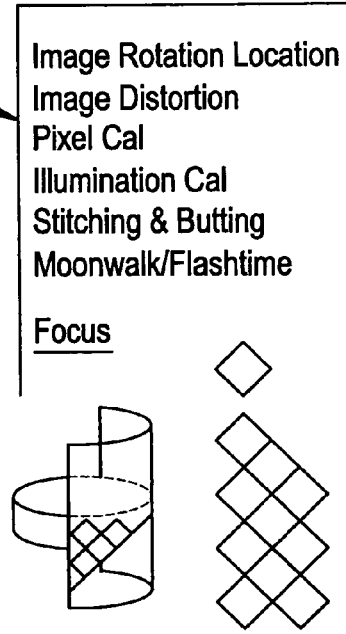
FIG. 65C shows an example embodiment of the rotor scanner using spatial light modulators (SLMs) building the image from SLM fields ("stamps") and the adjustments needed for each writing unit, according to an example embodiment.

FIG. 65A shows a rotor scanner with a single ring of single-point optical writing units, according to an example embodiment. FIG. 65B shows a simplified view of the single-ring, single-point scanner writing sequentially lines from edge to edge of the workpiece, and the adjustments needed for each writing unit. FIG. 65C shows an example embodiment of a rotor scanner using SLMs to generate the image from SLM fields ("stamps") and the adjustments needed for each writing unit.

Referring to FIG. 65A, the pattern generation apparatus may include a rotor scanner 1. The rotor scanner 1 may be disc shaped and may include at least one (e.g., a plurality of) writing head 10. Each of the write heads 10 may emit light in a radial direction. A workpiece 20 may partly enclose the rotor scanner 1. The rotor scanner 1 may be rotatable and may rotate at a constant or substantially constant speed. A power slip ring may be placed at the center. The slip ring may be a graphite/copper slip ring, an HF transformer contactless slip ring, a frictionless slip ring, or any other suitable slip ring. In example embodiments, an HF slip ring may reduce (e.g., eliminate) dust common with ordinary slip rings.

Still referring to FIG. 65A, a workpiece may be bent such that the curvature of the workpiece has a radius larger (e.g., slightly larger) than that of the disc rotor scanner and/or such that the focal spot of the optical system may be matched. Alternatively, in example embodiments of the ring rotor scanner, a workpiece may be bent such that the curvature of the workpiece has a radius less than that of the ring rotor scanner and/or such that the focal spot of the optical system may be matched. In example embodiments in which the workpiece is bent or curved, the workpiece may be, for example, a workpiece capable of bending to a desired curvature, such as, a glass workpiece, a plastic workpiece, etc.

In an example embodiment in which a workpiece is bent (e.g., wrapped) to a curvature spanning about 180°, the disc rotor scanner may have a diameter of, for example, about 1.4 meters (m). A smaller bend radius (e.g., a minimum bend radius) of about 1.3 m may be used when the workpiece is wrapped about 180 degrees around a disc write head. The cylindrical support for a glass wrapped approximately 180 degrees may have a radius of between about 1 and about 2 meters, inclusive.

In a system for writing one workpiece at a time the workpiece may be bent to about or near 360°. A workpiece (e.g. glass, plastic, metal, ceramic, etc.) may be between about 2 and about 3 meters, inclusive, or up to about 6 meters and the corresponding cylinder for a single glass may have a radius of about 0.35 to about 0.6 meters, inclusive, and up to about 1 meter. Bending a glass workpiece with a radius of about 1.3 meters may produce a stress of around 31 MPa per mm workpiece thickness. With workpiece thickness of about 0.7 mm the stress may be about 22 MPa, and only a smaller fraction of the safe stress.

In another example, if the workpiece is wrapped to a curvature spanning about 120°, the disc rotor scanner may have a diameter of about 2.1 m. In this case it may be suitable to employ a cylindrical support with a radius of about 2 to about 3 m, inclusive. In these examples, the overall width of the pattern generator may be smaller than that of conventional pattern generators and/or writing apparatuses, for example, about 2 m wide. The workpiece may be sectional (e.g., cut into sheets) or in a continuous form, for example, for roll-to-roll processing of displays and/or solar panels.

Referring back to FIG. 65A, the rotor scanner may rotate in a counter-clockwise direction; however, alternatively the rotor scanner may rotate in a clockwise direction. As shown in FIG. 65A, while rotating, the rotor scanner 1 may be moved in an upward vertical scan direction 50; however, it will be understood that the rotor scanner may move in a downward direction or a horizontal direction (e.g., to the right or to the left). A pattern to be printed on the workpiece 20 may be determined by a modulation of the writing heads 10. During operation (e.g., patterning or writing), electromagnetic radiation from the writing heads 10 may form a helical pattern 30 on the workpiece 20.

The lengthwise scan of the workpiece 20 may be accomplished by moving the workpiece 20 and/or the rotor scanner 1. Because the rotor scanner 1 may be thinner or substantially thinner than the workpiece 20 and/or workpiece holder (not shown), the rotor scanner 1 may be moved and the workpiece 20 may be written without a need for additional length. The non-rotating part of the rotor scanner 1, or bearing pads may perform the axial scan and/or carry other (e.g., all other) functions.

A rotor scanner 1 may be supported by bearing pads (e.g., air bearing pads). In this example, the ring design may have additional room for the bearing pads on the inner ring radius.

The rotor scanner 1 may be balanced (e.g., very accurately balanced). Any residual unbalance may be more easily detected, for example, by back-pressure variations in the bearing pressure pads (e.g., air bearing pressure pads) or by other position sensors. An automatic balancing system that may continuously balance the rotor scanner may also be used. Disturbances to the rotor scanner 1 may be a result of airflow between the rotor scanner and/or a rotor scanner shield. If the air flow between the rotor scanner and the rotor scanner shield is forced to be laminar, for example, by choosing a suitably small gap (e.g., a few mm at 5 m/s), stability of the operating conditions may be increased. The laminar flow may introduce forces, for example, stationary forces. In example embodiments, the power loss to friction may be reduced (e.g., to a few watts), and the rotor scanner may be driven by any suitable motor. For example, the friction at a 1 mm gap at 5 m/s may have a loss of 0.5 W per m². The bearing pads may have a smaller gap and/or larger drag, which may be offset by the smaller area. The motor may have a drive system having uniform, or substantially uniform, torque while turning.

The number of optical writing units included in the disc rotor scanner 1 may be based on write speed. In at least one example embodiment, the writing units may be fed data from a data channel with a higher (e.g., a very high) data rate, (e.g., about 200, 400, 500 or more Gbit/sec). Because the machine may be used for production, the pattern may be the same or substantially the same at all times. If the pattern is stored locally inside the rotor scanner, the pattern may be loaded at a lower speed (e.g., through a conventional high speed link) while the rotor scanner is stationary. The pattern may then reside (e.g., permanently reside) in memory. This may avoid the rotating data joint.

Figure 1B:
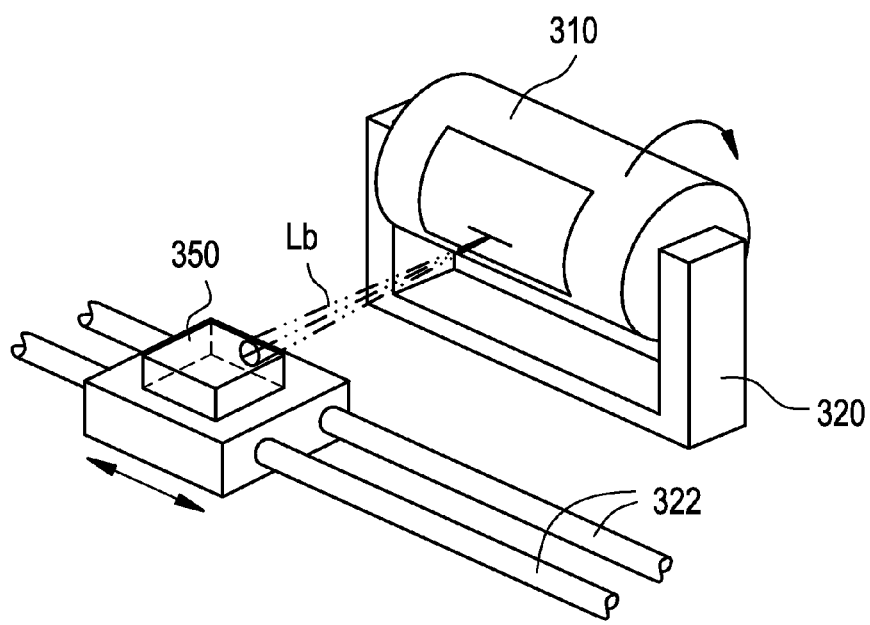

As shown in FIGS. 1A and 1B, the optical writing units may be, for example, single point laser diodes. The laser diodes may be of any commercial available wavelength such as blue, red, violet, etc. The power of a laser diode may be, for example, about 5 mW to about 65 mW, inclusive for single mode, and about 5 mW to about 300 mW, inclusive for multimode diodes. An electro-optical efficiency of a laser diode may be, for example, about 13%. The laser diodes may act as an optical power source and a modulator, for example, simultaneously. Alternatively, as shown in FIG. 65C, the optical writing units may be SLMs.

The axis of rotation of the rotor scanner may be vertical, horizontal, or any angle there between. The vertical axis arrangement may have a constant, or substantially constant, acceleration of the optical writing units at all times. The horizontal axis arrangement may handle the workpiece more efficiently and/or with less effort absent the need to counteract forces of gravity.

Figure 71A:
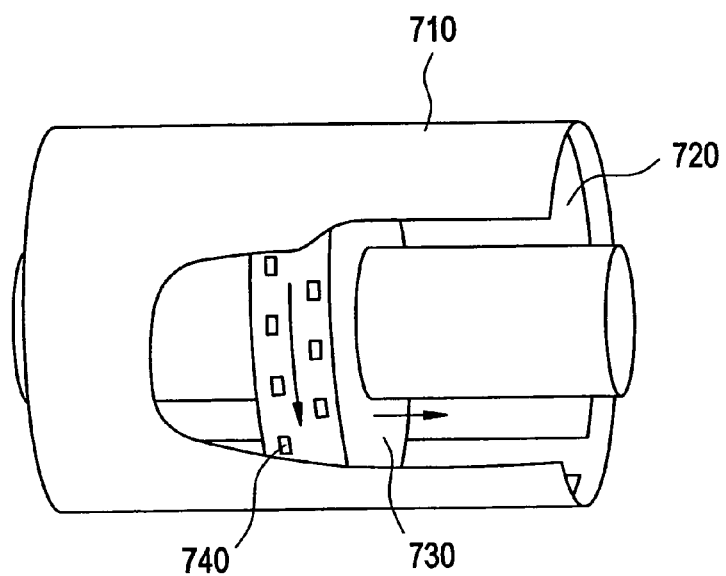
FIGS. 71A-71C illustrate different implementations and orientations of a disc-type writing apparatus, according to example embodiments.
Figure 71B:
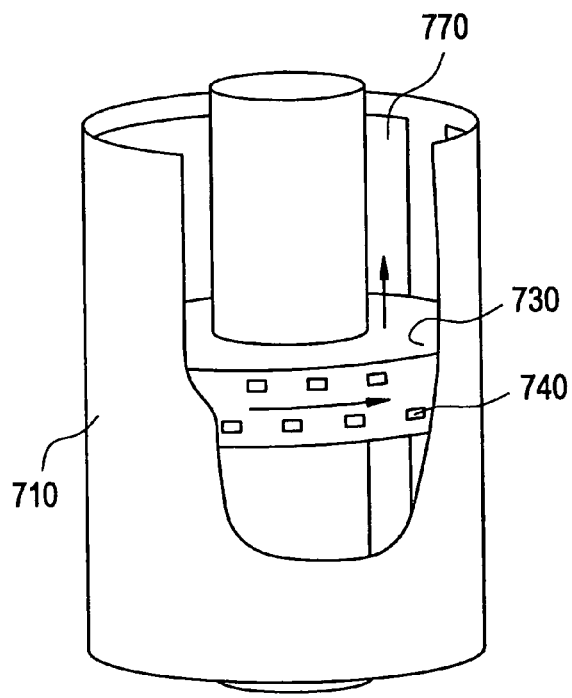
Figure 71C:
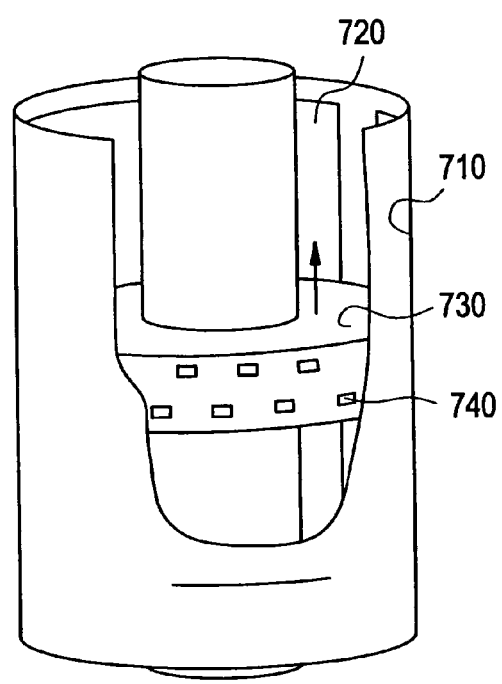

FIGS. 71A-71C illustrate different implementations and orientations of a writing apparatus, according to example embodiments. The disc rotor scanner discussed below with regard to FIGS. 71A-71C may be the same or substantially the same as the disc rotor scanner 1 of FIG. 65A. Therefore, a detailed discussion will be omitted for the sake of brevity.

Referring to FIG. 71A, the writing apparatus 700 may include a holder (e.g., a tubular holder) 710, a disc rotor scanner 730 and/or at least one optical writing unit 740. In at least some examples embodiments, the disc rotor scanner 730 may include a plurality of optical writing units 740.

The workpiece 720 may be arranged inside the workpiece holder 710. A central axis of the formed holder 710 may be arranged, for example, horizontally. The holder 710 may be kept at a fixed position, while the disc rotor scanner 730 rotates and/or moves in a direction parallel or substantially parallel to the central axis. The optical writing units 740 may be arranged on an outer edge of the disc rotor scanner in at least one row, but are shown as including two rows in FIG. 71A. The optical writing units 740 may face an inner surface of the workpiece holder 710. Alternatively a single row or greater than two rows of optical writing units 740 may be used.

Referring to FIG. 71B, the central axis of the workpiece holder 710 may be arranged vertically. The workpiece 720 may be arranged inside the holder 710 as discussed above with regard to FIG. 71A. The workpiece 720 may be fixed in the holder 710 by forces, which may flatten, or substantially flatten the workpiece 720. Alternatively, the workpiece 720 may be fixed to the holder 710 by vacuum nozzles. In this example, the workpiece 720 may be fixed in the holder 710 by removing the air between the workpiece 720 and the holder 710. The workpiece 720 and holder 710 may be fixed while the disc rotor scanner 730 may rotate and/or move vertically (e.g., upward and/or downward).

Referring to FIG. 71C, the writing apparatus of FIG. 71C may be similar or substantially similar to the writing apparatus discussed above with regard to FIG. 71B. However, in the writing apparatus of FIG. 71C, the workpiece 720 and/or the holder 710 may rotate while the disc rotor scanner 730 moves in a vertical direction (e.g., upwards and/or downwards).

Figure 66:
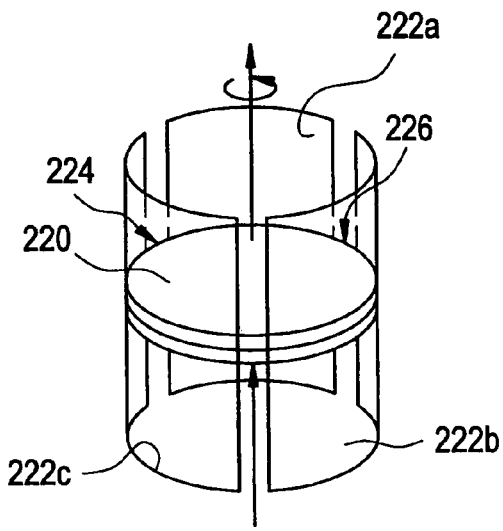
FIG. 66 illustrates a writing apparatus, according to another example embodiment.

FIG. 66 illustrates a writing apparatus, according to yet another example embodiment. As shown, the writing apparatus of FIG. 66 may be used to pattern a plurality of workpieces concurrently or simultaneously. Although the writing apparatus of FIG. 66 will be discussed with respect to patterning three workpieces 222A, 222B and 222C, simultaneously, it will be understood that any number of workpieces may be patterned concurrently. The rotor scanner 220 of FIG. 66 may be the same or substantially the same as the rotor scanner 1 of FIG. 65A.

Referring to FIG. 66, the workpieces 222A, 222B and 222C, may at least partially enclose or surround the rotor scanner 220. As shown, openings 224, 226, and 228 may be left between each of the workpieces 222A, 222B and 222C. At least one of a detector and a calibration sensor (not shown, but described in more detail below) may be positioned in each space between the workpieces. In at least one example embodiment, the detector and/or calibration sensor may monitor the position, focus and/or power of the rotor scanner 220. Any misalignment of the rotor scanner 220 relative to a desired position may be compensated, for example, using dose, modulation delaying, timing, image distortion, or any other suitable manner.

Figure 67:
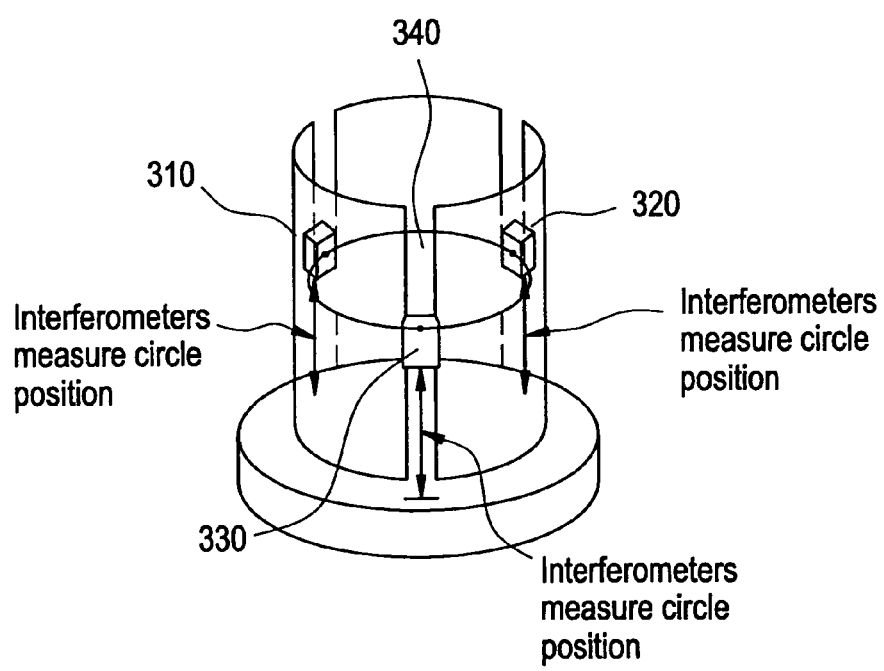
FIG. 67 illustrates an arrangement of calibration sensors between workpieces, according to an example embodiment.

FIG. 67 illustrates a plurality of calibration sensors 310, 320 and 330 positioned in the openings 224, 226 and 228, respectively. As shown in FIG. 67, three workpieces are held by the writing apparatuses and three calibration sensors are used. In accordance with example embodiments, the number of calibration sensors may be correlated to the number of workpieces concurrently arranged in the writing apparatus. In some example embodiments, the number of calibration sensors may be equal to the number of workpieces.

Figure 68:
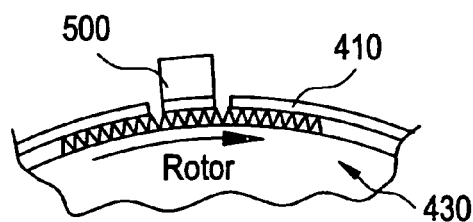
FIG. 68 is a side-view of a calibration sensor, according to an example embodiment.
Figure 76:
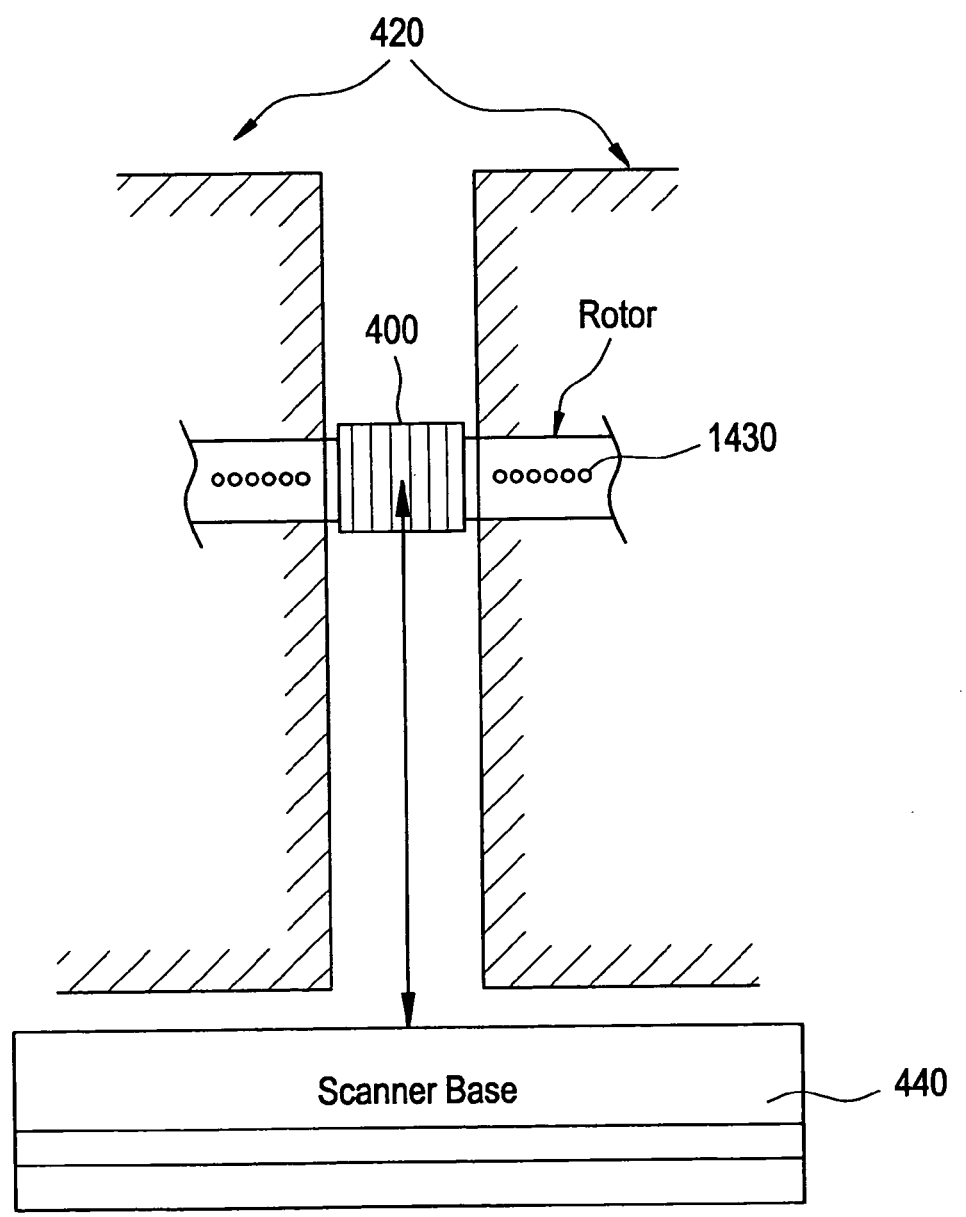
FIG. 76 is a top-view of a calibration sensor, according to an example embodiment.

FIG. 68 is a top view of a portion of the writing apparatus of FIG. 66 including a calibration sensor (e.g., a calibration eye), according to an example embodiment. FIG. 76 is a side view corresponding to the top view of FIG. 68.

Referring to FIGS. 68 and 76, the calibration sensor 400 may detect position, power and/or may focus individual beams 410 of a rotor scanner 430 based on characteristics of the electromagnetic radiation emitted from the optical writing units (not shown) of the rotor scanner 430. In at least some example embodiments, the calibration sensor 400 may include an interferometer (not shown) for measuring the position (e.g., the vertical position of the rotor scanner if the pattern generation apparatus is oriented vertically) of the rotor scanner 430. Interferometers are well-known in the art, and therefore, a detailed discussion will be omitted for the sake of brevity. The rotor scanner 430 may be the same or substantially the same as the rotor scanners 1 and/or 220, and thus, a detailed discussion will be omitted for the sake of brevity.

If a single workpiece 420 is wrapped on the holder, the calibration sensor 410 may be arranged between the edges of the workpiece 420. In example embodiments, the workpiece 420 may be wrapped onto a holder (e.g., a tubular shaped holder). The rotor scanner 430 may rotate inside the wrapped workpiece 420. In at least example embodiments, a distance between a scanner base 440 and the rotor scanner 430 may be measured using, for example, laser interferometry or any other suitable technique.

Figure 69:
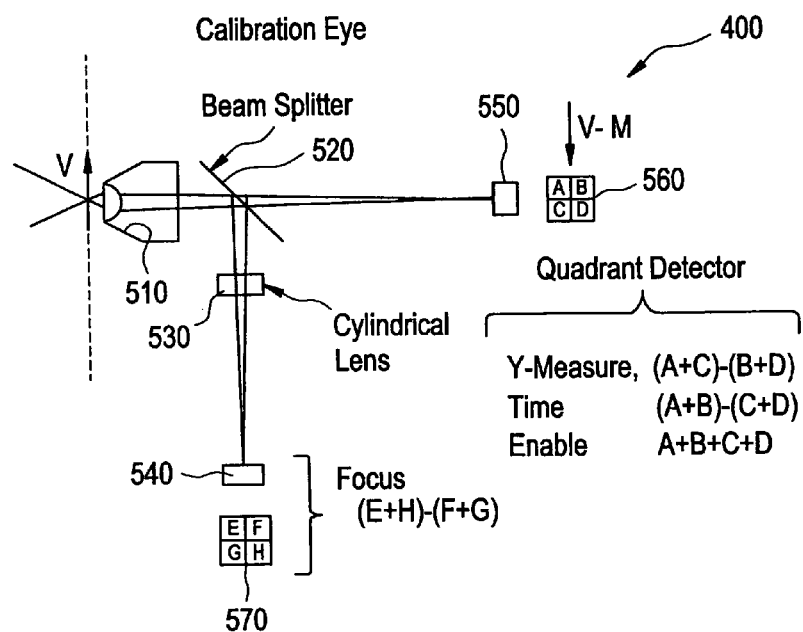
FIG. 69 is a schematic representation of a calibration sensor, according to an example embodiment.

FIG. 69 is a schematic representation of the calibration sensor 400, according to example embodiments. The calibration sensor 400 may include a lens assembly 510 through which electromagnetic radiation, emitted from the optical writing units of the rotor scanner may pass. The electromagnetic radiation may be partially reflected by a beam splitter 520. A first portion of the electromagnetic radiation may pass through the beam splitter 520 and irradiate a first quadrant detector 550. A second portion of the electromagnetic radiation may be reflected by the beam splitter 520, be focused by a cylindrical lens 530 and impinge a focus detector 550. The quadrant detector 550 may further include a plurality of quadrant detectors A, B, C and D, collectively referenced by 560. The focus detector 540 may include plurality of quadrant detectors E, F, G and H, collectively referenced by 570.

In example embodiments, the quadrant detector 550 may determine a Y-measure using the equation (A+C)−(B+D), the timing of the rotor scanner using the equation (A+B)−(C+D) and the enable of the rotor scanner using the equation (A+B+C+D). The focus detector 540 may determine the focus of the beams emitted by the writing units using the equation (E+H)−(F+G). The focus detector 540 may be any suitable device for measuring de-focus using, for example, an astigmatic (on axis) optical system. The astigmatism is added using the cylindrical lens 540. The cylindrical lens 540 adds power along an axis perpendicular to the axis of rotation of the cylinder. The axis of the cylinder may be tilted such that that the cylinder passes through centers of, for example, detectors E and H.

Using the cylinder lens, an imaging system with two different powers may be realized. In one direction (D1), where the cylinder adds its power, and another direction (D2), where it does not.

When the focus position matches the power of D1, a line image passing through the center of detectors E and H (e.g., along the axis of the cylinder) is produced. Conversely, if the focus point position matches the power of D2, line image is produced along the center of detectors F and G. Thus, the difference (E+H)— (F+G) is proportional to a position of the focal point.

The calibration sensor of FIG. 69 may be used to calibrate focus, power and/or position of the optical writing units. For example, the focus detector 540 and the position detector 550 in FIG. 69 may be used to calibrate a focus and position detector in each optical writing unit. A focus and position detector and each optical writing unit will be described in more detail with regard to FIG. 70 below.

Figure 70:
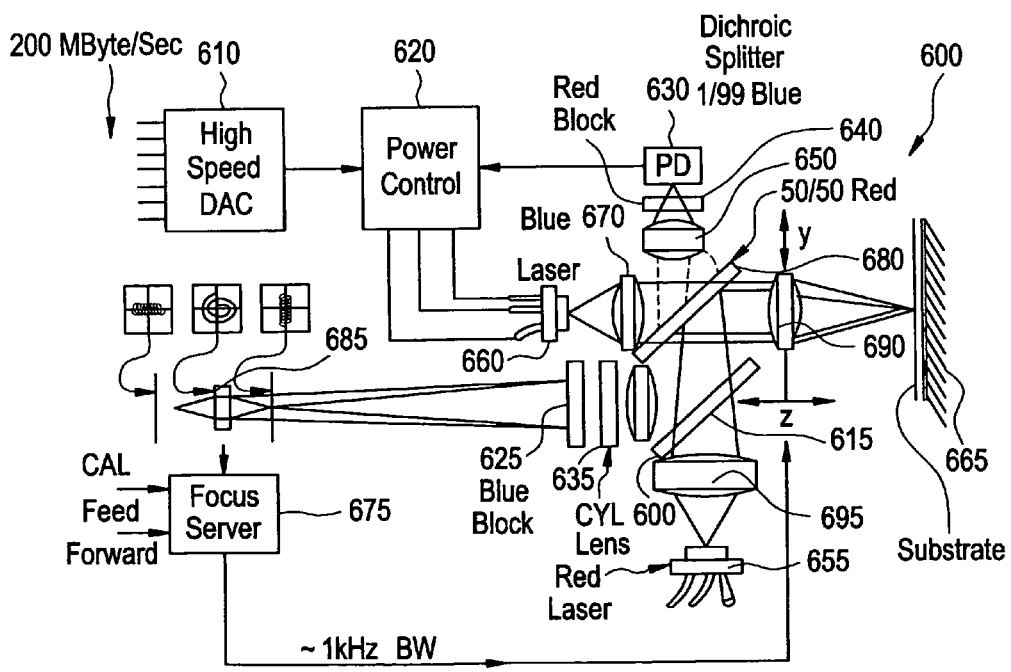
FIG. 70 illustrates a combination optical writing unit and optical measurement unit, according to an example embodiment.

FIG. 70 illustrates an optical writing unit (e.g., a writing laser diode), according to an example embodiment. The optical writing unit 600 of FIG. 70 may be used as the optical writing units 740 of FIGS. 71A-71C and/or the optical writing units 840 of FIGS. 72A-72C.

Referring to FIG. 70, the optical writing unit 600 may include a digital-to-analog converter (DAC, e.g., a high speed DAC) 610 for transforming pattern data into modulation signals for the blue laser diode 660. The pattern data may be received via a data channel (not shown). The data channel may be, for example, a fiber-optic cable, a radio-frequency (RF) link passing through the center of the HF transformer, or any other suitable data channel capable of providing higher data rates, such as, 200 Gbits/s, 400 Gbits/s, 500 Gbits/s, etc.

The modulation signals generated by the DAC 610 may be output to a power controller 620. The power controller 620 may control the power of a blue laser 660 based on the modulation signals from the DAC 610 and power control signals output by a power detector 630. The blue laser 660 may emit electromagnetic radiation (e.g., blue laser beam) for patterning the workpiece 665 based on power control signals output from the power controller 620. The blue laser output from the blue laser 660 may pass through a lens assembly 670, which may make the beam telecentric. After passing through the lens assembly 670, the telecentric blue laser may be incident on a beam splitter 680. The beam splitter 680 may direct a portion (e.g., a relatively small portion) toward the lens assembly 650. The remaining portion of the blue laser beam may pass through the beam splitter 680 and be focused on the workpiece by the focus lens assembly 690.

The redirected portion of the blue laser beam may be focused by the lens assembly 650, pass through red block 640 and be incident on the power detector 630. The power detector 630 may detect the power of the incident blue laser light, and output a power control signal indicative of the detected laser power. The red block 640 may block (e.g., reflect, absorb, etc.) all, or substantially all, red laser light incident thereon.

A red laser diode 655 may also emit electromagnetic radiation in the form of red laser beam. The red laser beam may be used for positioning, focus control and/or determining shape of the workpiece. In at least one example embodiment, the red laser beam may pass through a telecentric lens assembly 645 and be incident on a beam splitter 615. The telecentric lens assembly 645 may be the same or substantially the same as the telecentric lens assembly 670 discussed above. Thus, for the sake of brevity, a detailed discussion will be omitted. A beam splitter 615 may transmit the red laser beam to the beam splitter 680, which may direct the red laser beam onto the workpiece 665. The red laser beam may be reflected by the workpiece 665 back toward the beam splitter 680, which may relay the red laser beam toward the beam splitter 615. The beam splitter 615 may direct the red laser light toward the focus and position detector 685 via cylindrical lens 635 and/or blue laser block 625. The blue laser block 625 may block (e.g., reflect, absorb, etc.) all, or substantially all, blue laser light incident thereon.

The focus and position detector 685 may output positioning signals to a focus Z servo 675. The focus Z servo 675 may receive the positioning signals from the position detector 685 and calibration data, and control the position of the lens assembly 690 via a data connection (e.g., a 1 kHz bandwidth data line). For example, the focus Z servo 675 may move the lens assembly 690 in an X-direction, Y-direction and/or Z-direction depending on the shape of the signal from the focus and position detector 685. The control loop signals may be supplemented by feed forward signals from a control system (e.g., a computer or processor, not shown) to correct for known distortions such as focus errors.

According to at least some example embodiments, a position and/or form of the workpiece may be determined using laser diodes having a wavelength not affecting the electromagnetic radiation sensitive layer on top of the workpiece. In at least some examples, blue laser diodes may affect the electromagnetic radiation sensitive layer and red laser diodes may be used for measurement of the position and form of the workpiece. Laser diodes exposing the workpiece and laser diodes used for measurement and not affecting the electromagnetic radiation sensitive layer may be arranged in the writing head (rotor).

Figure 75:
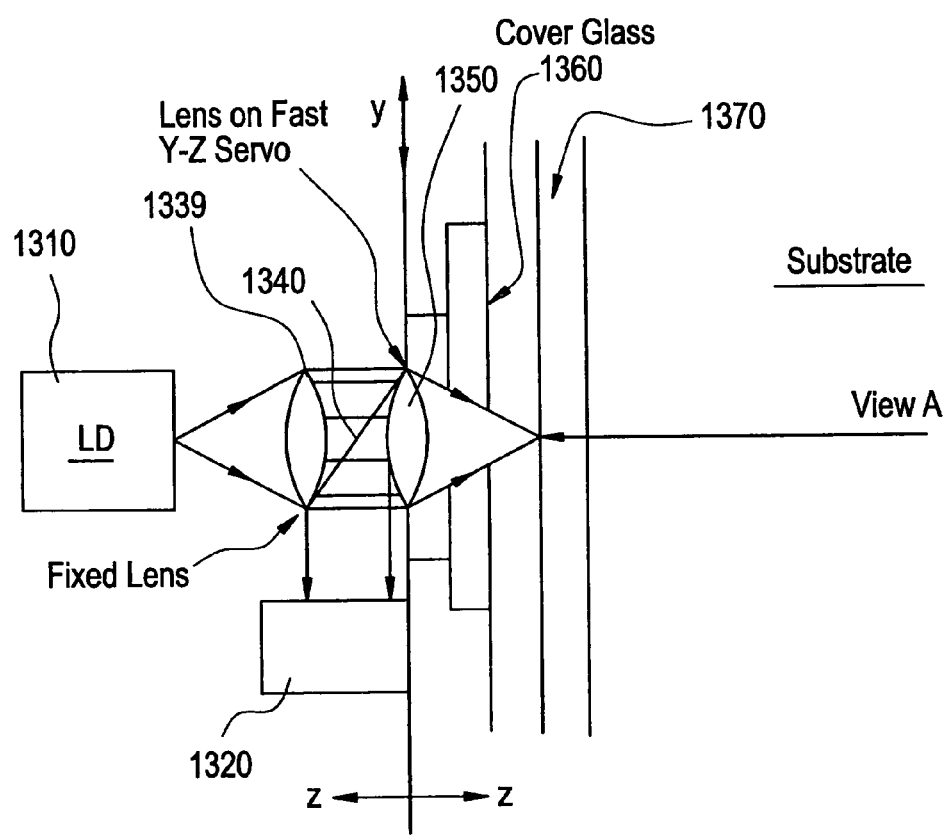
FIG. 75 illustrates an auto focus arrangement, according to an example embodiment.

FIG. 75 is a more detailed illustration of an auto focus arrangement of an optical writing unit for focusing and position (or displacement) determination, according to an example embodiment. Emitted electromagnetic radiation (e.g., a laser beam) from a laser diode 1310 enters a lens assembly 1330, which telecentrizes the beam. The telecentric beam may impinge on a beam splitter 1340, which directs the beam toward a lens assembly 1350. The lens assembly 1350 may focus the beam onto the workpiece 1370. A cover glass 1360 may be arranged between the lens assembly 1350 and the workpiece 1370 to protect the lens assembly 1350. When the beam impinges on the workpiece 1370, the beam may be reflected back through the lens assembly 1350 to the beam splitter 1340. The beam splitter 1340 may direct the reflected beam onto the detector 1320 for detecting the focus of the laser beam. The detector 1320 may detect the focus of the laser beam in any suitable well-known manner. Because methods for detecting focus of a laser are well-known in the art, a detailed discussion will be omitted for the sake of brevity. The lens assembly 1350 may be moved in any direction based on the read out of the detector 1320.

Referring back to FIG. 70, each optical writing unit 600 may have a set value for each of the power, position and focus parameters. When the optical writing unit 600 passes the calibration sensor of FIG. 69, the optical writing unit 600 obtains data as to how each set parameter value correlates to a parameter value (e.g., power, position and/or focus value) measured by the calibration sensor. The error or difference between the set values stored in the optical writing units 600 and the measured values is sent to the writing head for adjustment, for example, to offset the writing head's internal scale. This adjustment may be done, for example, each time each optical writing unit passes a calibration sensor. However, the adjustment may be performed less often.

According to example embodiments, the calibration of power, focus and/or position (x,y, where x is done by time delay) may be in different calibration sensors, so long as the calibration source of each focus, power and position is common. That is, for example, power, focus and/or position may be calibrated using a different calibration sensor so long as each writing head uses the same calibration sensor for focus, the same calibration sensor for power, and the same calibration sensor for x position and the same calibration sensor for y-position. Power may be measured in a wavelength dependent manner to compensate for variation of wavelength sensitivity of the resist.

Figure 92:
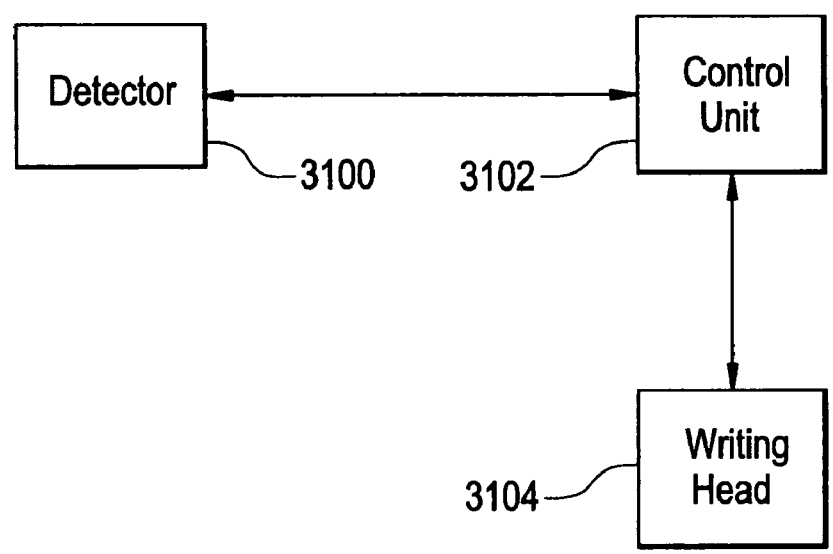
FIG. 92 illustrates a calibration system, according to another example embodiment.

FIG. 92 illustrates a calibration system, according to another example embodiment. As shown, the calibration system may include a detector 3100, a control unit 3102 and a writing head 3104. The detector 3100 may be, for example, a calibration sensor (e.g., as discussed above with regard to FIG. 69) or any other optical detector capable of detecting, for example, focus, power and/or position of one or more optical writing units. The control unit 3102 may be implemented, for example, in the form of software executable on a computer or processor. The writing head 3104 may be a writing head including a plurality of optical writing units, one or more of which may be an optical writing unit as described above with regard to FIG. 70. However, the writing head may be any writing head capable of exposing a workpiece and/or generating a pattern on a workpiece. Each of the detector 3100, the control unit 3102 and/or the writing head 3104 may be connected via a data channel. The data channel may be, for example, a fiber-optic cable, a radio-frequency (RF) link passing through the center of the HF transformer, or any other suitable data channel. An example operation of the calibration system of FIG. 92 will be described with regard to FIG. 93.

Figure 93:
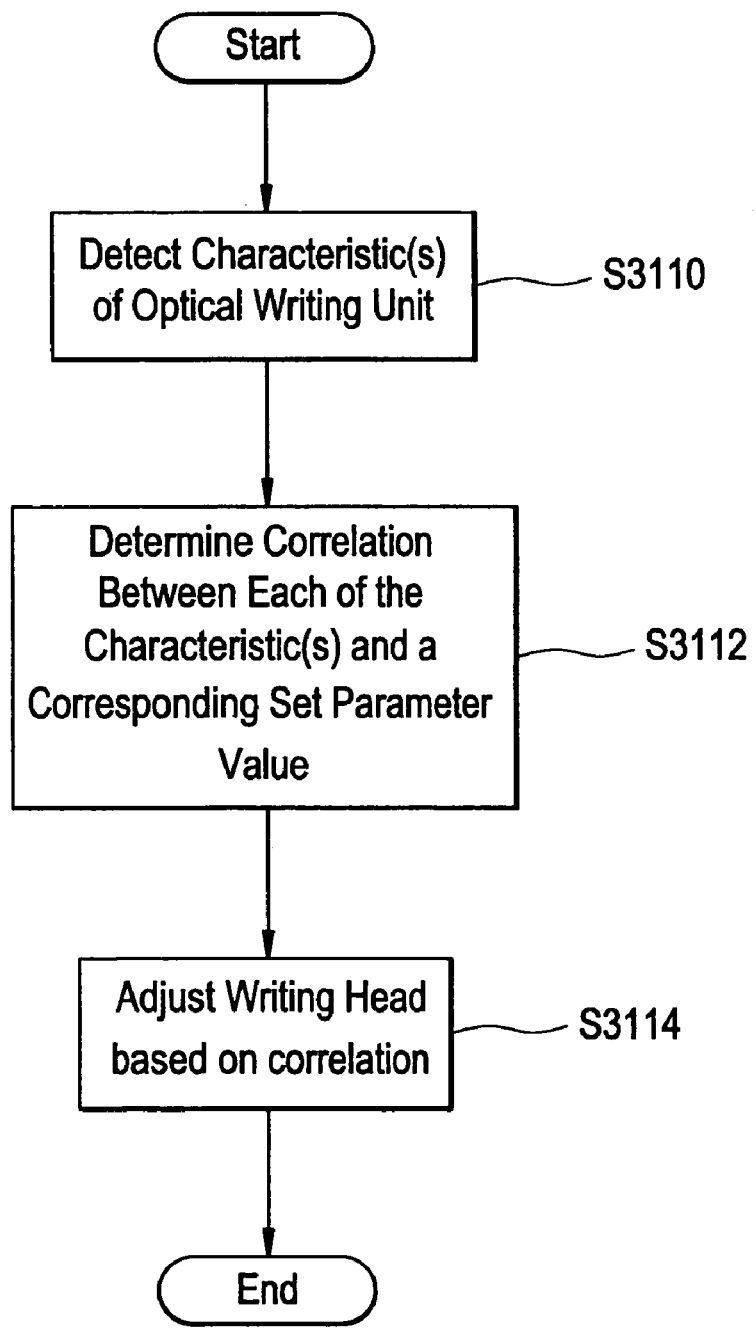
FIG. 93 illustrates a calibration method, according to an example embodiment.

FIG. 93 illustrates a calibration method, according to an example embodiment. As discussed above, the method of FIG. 93 may be performed, for example, by the calibration system of FIG. 92. The method of FIG. 93 may also be performed by one or more calibration sensors (e.g., 400 of FIG. 68) in connection with one or more writing heads (e.g., 430 of FIG. 68). In these examples, the control unit 3102 may correspond to, for example, the power control unit 620 and the focus Z servo 675 of FIG. 70, and the detector 3100 may correspond to the quadrant detector 550 of FIG. 69, the focus detector 540 of FIG. 69 and the power detector 630 of FIG. 70. In the example embodiment shown in FIG. 30, the quadrant detector 550 of FIG. 69, the focus detector 540 of FIG. 69 and the power detector 630 of FIG. 70 may be located at the detector 3100, and the power control unit 620 and the focus Z servo 675 may be located at the control unit 3102. Alternatively, however, other configurations are possible.

Referring to FIG. 93, at S3110, when an optical writing unit of the writing head 3104 passes the detector 3100 may detect at least one characteristic of the optical writing unit. For example, the detector 3100 may detect characteristics, such as, focus, position and/or power of electromagnetic radiation (e.g., the laser beam) emitted from the optical writing unit. The detector 3100 may send the at least one detected characteristic to the control unit 3102.

At S3112, the control unit 3102 determines a correlation between the detected characteristics and a corresponding set parameter value. For example, a detected focus characteristic may be compared with a set focus parameter value, a detected power characteristic may be compared with a set power value and/or a detected position characteristic may be compared with a set position value. The set parameter values may be set, for example, by a human operator, based on empirical data. In at least one example embodiment, the correlation associated with each detected characteristic and corresponding set parameter value may be an error or difference between the set value and the measured characteristic value. The set parameter values may be stored in a memory at the control unit 3102. The memory may be any suitable storage medium, such as, a flash memory or the like.

At S3114, the control unit 3104 may adjust the writing head based on the determined correlation. For example, the determined correlations may be used to offset the internal scale of the writing head 3104.

Although only a single iteration of this method is shown in FIG. 93, the operation described therein may be done, for example, each time each optical writing unit passes a calibration sensor. However, the adjustment may be performed less often.

FIGS. 72A-72C illustrate different implementations and orientations of a ring-type writing apparatus, according to another example embodiment.

Referring to FIG. 72A, the writing apparatus may include a holder (e.g., a cylindrical stage or tube formed holder) 810, a rotor scanner 830 and/or at least one optical writing units 840. A workpiece 820 may be arranged on the outside of the holder 810. The workpiece 820 may be fixed onto the holder 810 using, for example, vacuum nozzles 850. The rotor scanner 830 may rotate outside the workpiece holder 810 and optical writing units 840 may emit radiation in a radial direction inward toward the central axis of the holder 810. In example embodiments, the optical writing units may be, for example, 840 may be, for example, single point laser diodes, multi-point laser diodes or spatial light modulators (SLMs). The laser diodes may be of any commercial available wavelength such as blue, red, violet, etc. The power of a laser diode may be, for example, about 5 mW to about 65 mW, inclusive, for single mode, and about 5 mW to about 300 mW for multimode diodes. An electro-optical efficiency of a laser diode may be, for example, 13%. The laser diodes may act as an optical power source and a modulator, for example, simultaneously. The spatial light modulators (SLMs) 840 may be at least partially transmissive spatial light modulators, and may create stamps or patterns 860 on the workpiece 820. SLMs are well-known in the art, and thus, a detailed discussion will be omitted for the sake of brevity. As shown in FIG. 72A, the central axis of the workpiece holder 810 may be oriented horizontally.

Still referring to FIG. 72A, in operation, the ring rotor scanner 830 may rotate around the central axis of the holder 810 and move in an axial direction relative to the holder 810 and parallel to the central axis of the holder 810. In addition, the holder 810 may rotate around its central axis in a rotational direction opposite to that of the ring rotor scanner 830.

FIG. 72B shows an example embodiment including a stationary cylindrical holder 810 holding a wrapped workpiece 820, and a rotating writing head 830. Referring to FIG. 72B, the workpiece holder includes a slit 870 in which a calibration sensor 850 is arranged. The calibration sensor 850 may be movable or fixed. The writing head 830 includes a plurality of optical writing units 840 creating patterns 860 on the workpiece 820. An alignment camera 880 may capture an existing pattern on the workpiece 820 such that a written pattern may be aligned with higher accuracy, thereby increasing overlay precision.

FIG. 72C shows an example embodiment including a rotating cylindrical holder 810 holding a wrapped workpiece 820, and a stationary writing head 830. The writing head 830 may include a plurality of optical writing units 840 creating patterns 860 on the workpiece 820. The optical writing units 840 of FIG. 72C may be the same or substantially the same as the optical writing units 840 of FIG. 72A. As is the case with respect to FIG. 72B, the writing head 830 may include multiple writing units 840, although, for the sake of clarity, only one writing unit 840 is illustrated.

Figure 73:
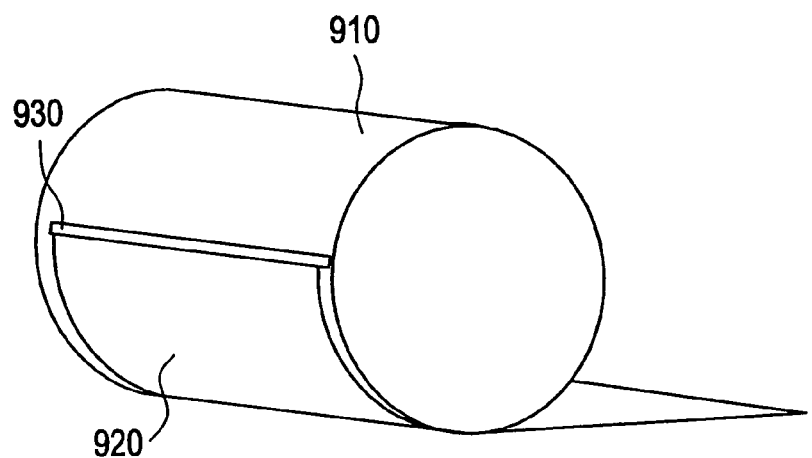
FIG. 73 illustrates a horizontal oriented cylindrical stage or holder, according to an example embodiment.

FIG. 73 shows a horizontal orientation of a cylindrical stage or holder 910, according to an example embodiment. When loaded horizontally, a workpiece 920 may be kept in place by gravitational force. The workpiece 920 may be held in place by a vacuum to ensure that the surface follows the surface of the cylinder 910 closely. The ends of the workpiece 920 may be fastened securely to the cylinder by a latch 930. The latch 930 may be controlled to capture or release the edge of the workpiece 920.

The workpiece may be pushed or pulled onto or into the cylindrical support surface to assume the proper shape. In another example, a vacuum clamp or any other suitable clamp may also be used. The edges along the cylindrical part may bend locally away from the center or curvature (e.g., similar to bending an eraser). This bending may be restrained by a fixture system (e.g., a vacuum fixture system).

FIG. 83 shows a vacuum arrangement for holding the workpiece on the cylinder. As shown, vacuum and pressure devices may be alternately arranged. A push-pull vacuum clamping system may be used to counteract workpiece deformation in the x-y plane. As shown in FIG. 83, the system may have pressure and vacuum holes spaced closer together (e.g., on a millimeter scale). The vacuum holes may hold the workpiece and reduce the deformation, and the pressure pads may keep the workpiece away from the supporting surface. The workpiece may not touch the support surface, and may be supported at a few μm (e.g., 1, 2, 10, 20, etc. μm) away from the support surface. This may allow the workpiece to more freely assume natural shape in the plane of the workpiece. The vacuum arrangement of FIG. 83, or an arrangement similar or substantially similar thereto may be used in conjunction with each example embodiment described herein.

Figure 74:
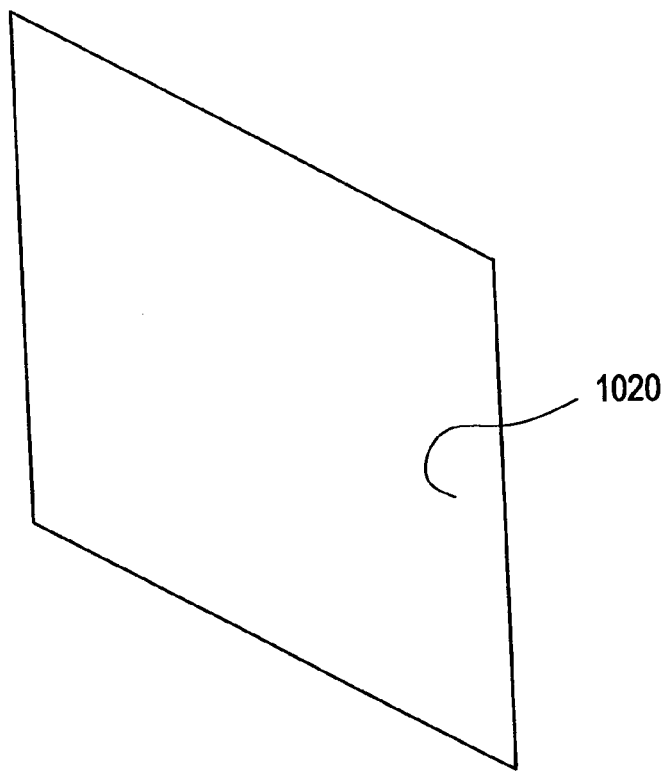
FIG. 74 illustrates a flat workpiece, which may be written using a writing apparatus, according to one or more example embodiments.

FIG. 74 illustrates a workpiece 1020 in a flat state, as may be patterned in at least some example embodiments.

FIGS. 94A-94K illustrate a plurality of (e.g., eleven) different positions of a writing head in relation to the direction of the rotor scanner relative to the glass. The arrow in each of FIGS. 94A-94K represents the scanning direction.

Figure 94:
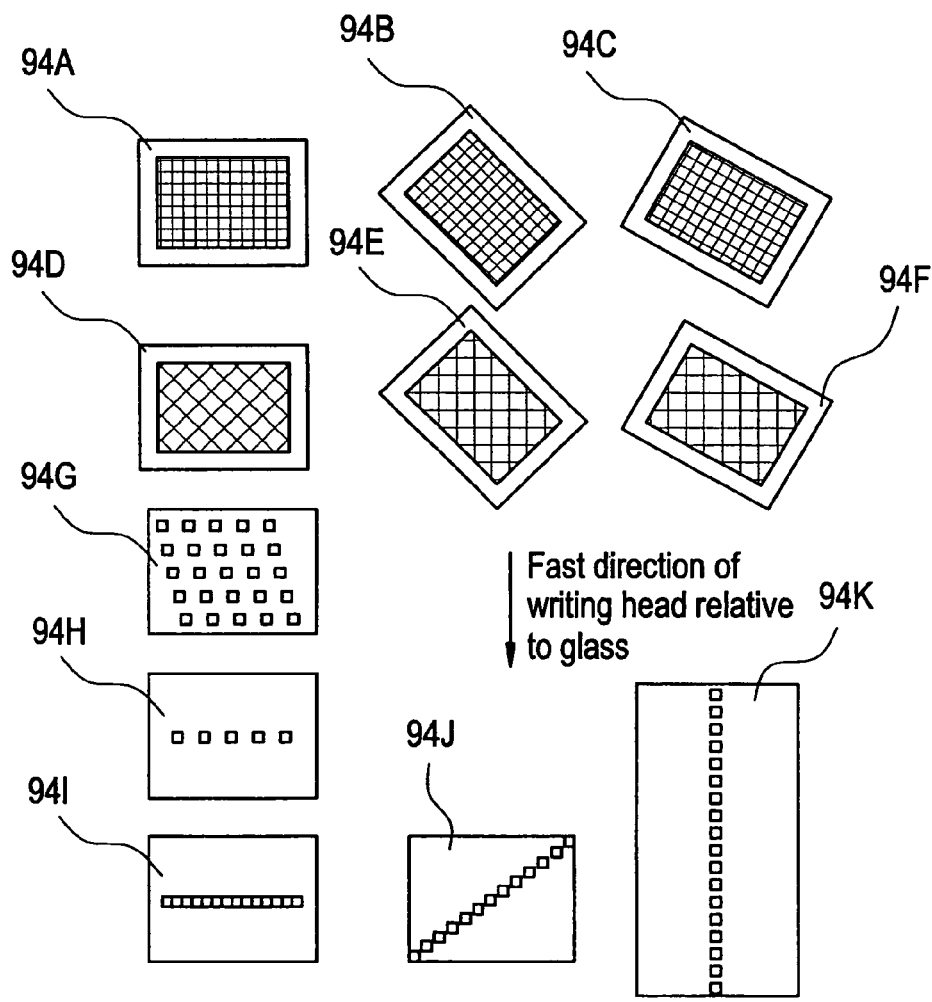
FIGS. 94A-94K illustrate a plurality of different positions of a writing head in relation to the direction of a rotor scanner relative to the workpiece, according to at least one example embodiment.

FIGS. 94A-94C show dense matrices of pixels, for example, images of a rectangular spatial light modulator with the rows and columns of the array aligned with the sides of the rectangle. FIG. 94A illustrates an SLM in which a pixel grid is parallel, or substantially parallel, to the writing direction. FIG. 94B illustrates an SLM pixel grid, which is tilted relative to the writing direction. FIG. 94C illustrates an SLM pixel grid, which is tilted relative to the writing direction, the tilt in FIG. 94C being less than as compared to the tilt of the pixel grid axis in FIG. 94B.

FIGS. 94D-94F show images of a dense matrix with the array rotated relative to the SLM sides, for example, by 0°, 45° and a third angle. The third angle may be an angle other than 0°, 45° or 90°. FIG. 94D illustrates an SLM with a pixel grid slanted 45° with respect to the writing direction. In example embodiments, the pixel grid may not be parallel with the edges of an outer edge of an SLM chip as in FIG. 94A-94C.

In FIG. 94E the SLM chip is shown slanted such that one of the axes in the pixel grid may be parallel, or substantially parallel, to the writing direction.

In FIG. 94F the SLM chip may be slanted so that the neither the outer edge of the SLM chip nor any one of the pixel grid axis are parallel, or substantially parallel, to the writing direction. The axes of the sides of the matrix of pixels (e.g., an SLM) and/or the axes of the pixel grid may be rotated with respect to the axes of movement during writing and/or the axes of the written pattern, thus providing, at least four sets of coordinate directions as will be described below with regard to FIGS. 95B-95D.

FIG. 94G shows a relatively sparse matrix skewed or rotated so that the rows fall at different positions during scanning. In example embodiments, the area may be filled in one or several scans. In FIG. 94G a plurality of laser diodes or beam from a fan-out element like in FIGS. 9B,C (e.g., five lines and/or five rows) slanted to the writing direction.

FIG. 94H shows relatively a sparse row of pixels, for example, a plurality of (e.g., three) laser diodes or beams from a fan-out element like in FIGS. 9B,C may be arranged orthogonal to the writing direction. If utilizing the example embodiment shown in FIG. 94H, multiple passes may be required to fill a desired area.

FIG. 94I shows a relatively dense row of pixels, for example, an image of a one-dimensional SLM in which a plurality of (e.g., seventeen) laser diodes or beams may orthogonal to the writing direction.

FIGS. 94J and 94K show single rows with the pixels displaced in the scanning direction. FIG. 94J illustrates a plurality of (e.g., twelve) laser diodes or beams in a row slanted to the writing direction. FIG. 94K illustrates a line of a plurality of (e.g., seventeen) laser diodes or beams slanted to the writing direction according to an example embodiment. The pixels in FIGS. 94A-K may in another example embodiment be ink-jet nozzles.

A common problem with optically written patterns, as well as with inkjet-printed ones is the formation of "Mura." The formation of Mura refers to the formation of visible bands or patterns due to the visibility of the fields or stripes and/or due to moiré effects between the pattern and the writing mechanism. "Mura" is an issue for image devices (displays and cameras) but not for other laser-written patterns such as PCBs and PCB masks.

At least some example embodiments provide a method for assembling optical fields to a display pattern by repetition along an x and a y axis. The fields may be, for example, SLM fields, an SLM pixel pattern, or an array of pixels formed by another writing mechanism such as an array of diodes.

As discussed above with regard to FIG. 95A, the arrangement according to the conventional art is used in higher-precision pattern generators and may produce acceptable levels of "Mura" defects. However, example embodiments provide writing systems having 10, 100, or even 1,000 times higher throughput than conventional pattern generators, but with essentially the same or substantially the same "Mura" reduction requirements. Higher speed, larger pixels, multiple writing units and/or multiple writing heads, may contribute to more geometrical errors in the written pattern. As will be described in more detail with regard to FIG. 95B-95D, the pattern and the axes of the writing head may be rotated relative to each other, such that a single pixel is not repeatedly printed on the edge of adjacent pixels. Furthermore, the axes between the movement system and the pixel grid created by the writing units may be rotated relative to each other. The pattern may be aligned with the movement axes, the pixel grid or neither. The rotation may be an angle different from 0, 45 and 90°.

As discussed above with regard to FIG. 95A, the rotation direction is parallel to a side of the SLM chip in the conventional art.

FIGS. 95B-95E show example embodiments, which may suppress the occurrence of Mura and/or weaken the effects of Moiré in the pattern. As shown, in example embodiments, the pattern may be rotated relative to the axes of the writing mechanism and/or the movement system (e.g., scanning direction of the SLM).

For example purposes, FIGS. 95B-95E will be described with regard to an SLM pattern. However, similar principles apply to other example embodiments, such as, any suitable writing unit.

In FIG. 95B, the workpiece may be wrapped onto the workpiece holder, and may not be in parallel with the central axis of the workpiece holder. The SLM, or more generally the writing unit, may be arranged in the rotor scanner with an outer side of the SLM chip, or more generally the axes between the pixels formed in the pattern by the writing unit, in parallel, or substantially parallel, with the scanning direction. For example, the scanning direction and the SLM field are aligned, while the workpiece is rotated relative to the scanning direction and the sides of the SLM pattern. With this rotation of the workpiece, the effect of a stitching artefact no longer accumulate along a single line of the device but will pass from line to line, spreading the disturbance to many lines. In addition, a Moiré pattern, which is really an intermodulation product between frequency components of the pattern and the writing mechanism (e.g. display pixels and laser scanner pixels), may be relocated to a higher frequency that is less visible in the finished display.

Figure 95C:
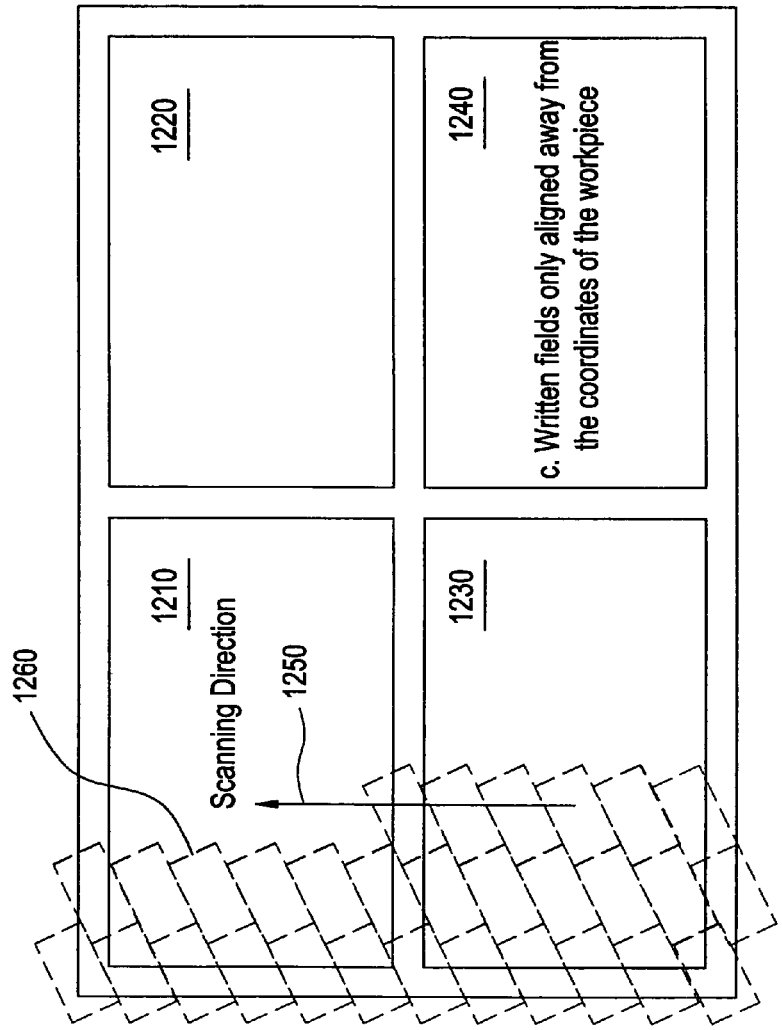

In FIG. 95C the SLM chip, or a similar pixel map formed by the writing units, may be arranged in the rotor scanner with at least coordinate axes non-parallel to the rotational direction. The workpieces may be arranged with an axis of symmetry in parallel to the central axis of the workpiece holder.

In FIG. 95D all three coordinate systems are non-parallel to each other. Together with any one or more of FIGS. 94A-94K, it is possible to define four coordinate systems, which may be rotated relative to each other. Two, three or four coordinate systems may be made oblique relative to each other in order to reduce "Mura" effects, while all four parallel defines the prior art.

In FIG. 95E, the workpiece is rotated, the writing SLM field is rotated and intentional distortion is introduced to correct for a measured distortion in a previous layer or a predicted distortion during subsequent processing.

An angle between the sides of the SLM pattern and the workpiece for reducing Mura effects may be greater than or equal to about 0.01 radians (e.g., between about 0.01 and about 0.05 radians, inclusive). The angle used, however, may depend on the write mechanism, scale and/or type of the pattern. The angle may be adjustable from one writing job to the next, or on the other hand, fixed and built into the writing hardware.

FIGS. 86A-86E illustrate methods for continuous scanning in the x and y directions, according to an example embodiment.

FIG. 86A shows an array of pixels in the x-direction along the tool axis. The array may move with a constant speed and after the cylinder rotates one turn, the array stitches to the printed pattern. If the array is not sufficiently dense, the scanning speed may be reduced to, for example, half so that two turns are needed to move the width of the array. The scanning speed may also be reduced more or less depending on the density of the array. The array may be parallel or not parallel to the tool axis.

FIG. 86B shows another method for patterning, according to an example embodiment, in which the array is not parallel to the tool axis.

In FIG. 86C, an array parallel to the y-axis of the workpiece and perpendicular to the tool axis. In this example embodiment, the surface of the workpiece is patterned by continuous scanning in the x and y directions.

Figure 86D:
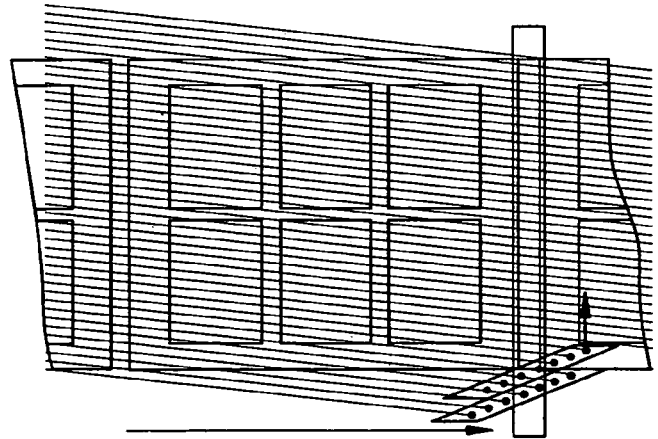

FIG. 86D shows an example embodiment in which an array is less dense then those illustrated in FIGS. 86A-86C. In this example, a second array is needed to fill voids in the less dense array. The second array may be a physical array or the same array in a later pass.

Figure 86E:
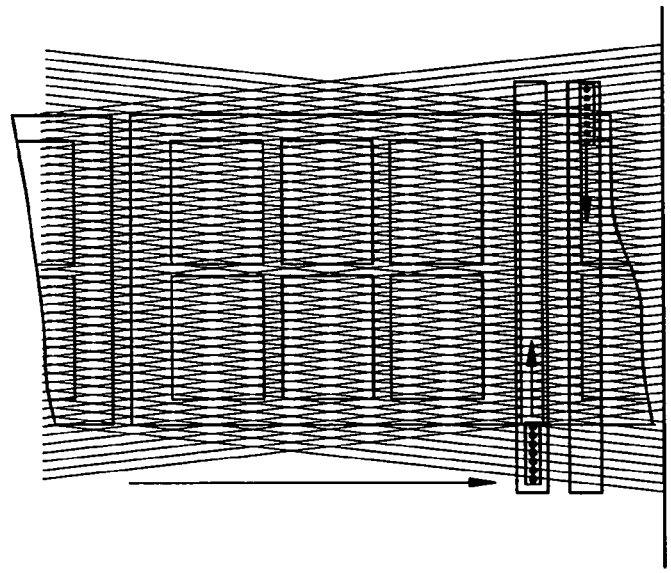

FIG. 86E shows two passes on top of each other. A first of the two passes scans to the right, and a second of the two passes scans to the left. The simultaneous scanning of x and y may provide an oblique angle and the two passes may have opposite angles. This may reduce visibility of resultant stripes. The two passes may be written sequentially with the same pixel array, or with two pixel arrays moving in opposite x-directions, for example, simultaneously. The two pixel arrays may be two physical write heads arranged on two different toolbars. The system shown in, for example, FIG. 87 with continuous scanning in x and reciprocating scanning in y may be used to write two passes in a single operation.

As described above, the oblique writing is possible and indeed natural for a writing system with cylindrical motion. However, oblique writing is also beneficial in flat-bed writers, such as will be described in more detail below.

Figure 84:
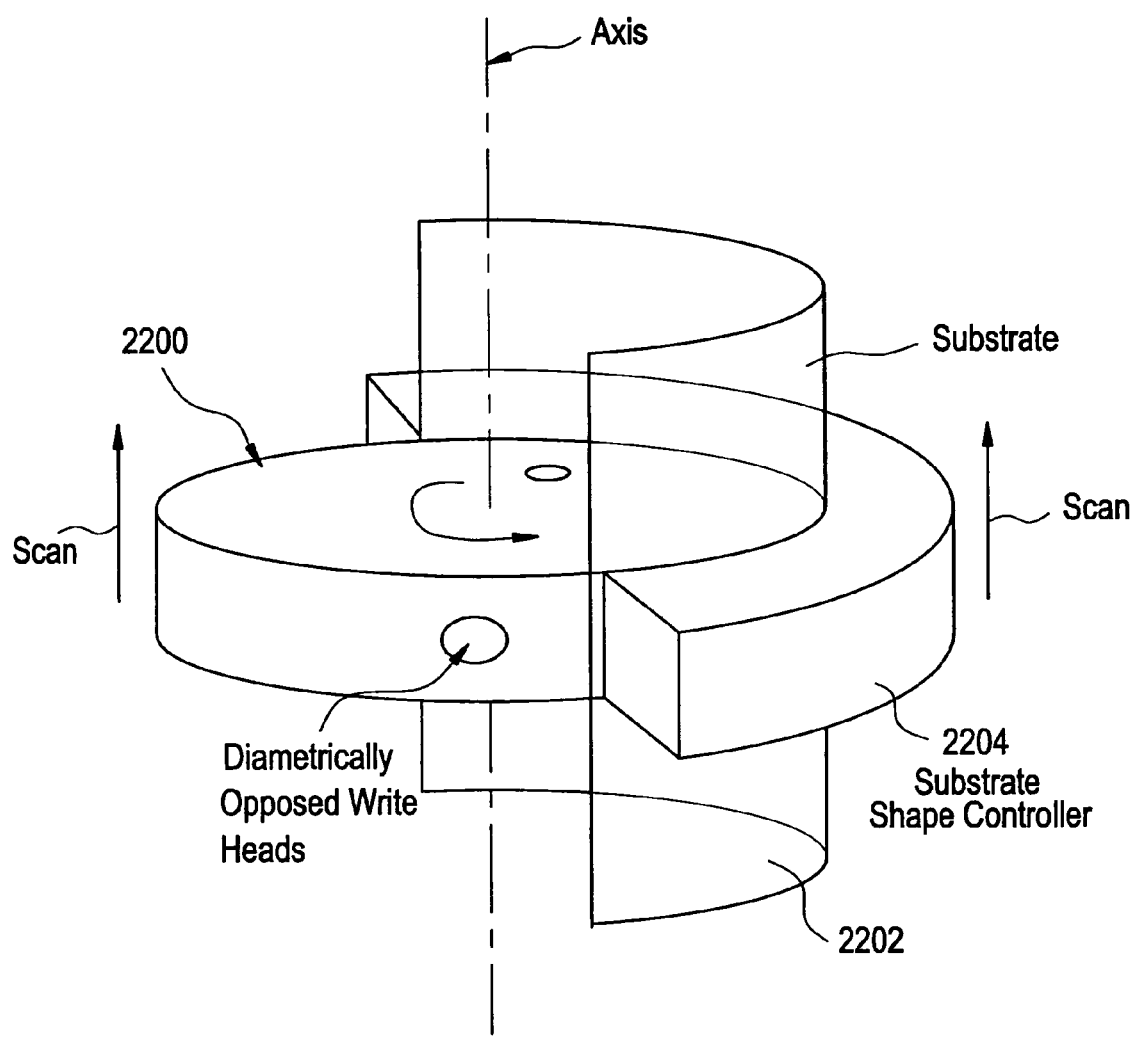
FIG. 84 illustrates a writing apparatus, according to another example embodiment.

FIG. 84 illustrates a writing apparatus, according to another example embodiment. As shown, the writing apparatus may include a rotor scanner 2200 for generating a pattern on a workpiece 2202. The example embodiment shown in FIG. 84 may be similar or substantially similar to the example embodiment shown in, for example, FIGS. 65, 71A, 71B and/or 71C, however, the example embodiment shown in FIG. 84 may further include a workpiece shape controller 2204. The workpiece shape controller 2204 may scan in the same direction as the rotor scanner 2200. In at least one example embodiment, the workpiece shape controller may scan the workpiece 2202 such that the workpiece shape controller 2204 and the rotor scanner stay in constant horizontal alignment.

Figure 77:
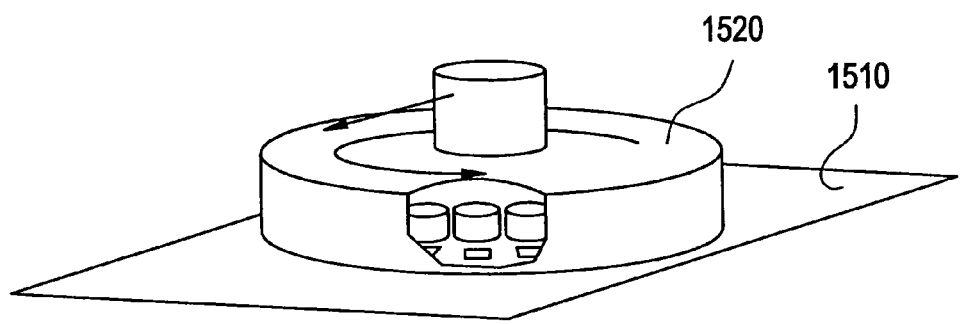
FIG. 77 is a perspective view of a writing apparatus, according to another example embodiment.

FIG. 77 is a perspective view of a writing apparatus, according to another example embodiment. The rotor scanner of FIG. 77 may be used to pattern a flat workpiece, such as the workpiece shown in FIG. 74.

Referring to FIG. 77, the rotor scanner 1520 may include a plurality of optical writing units (not shown) arranged on a flat portion (e.g., a top and/or bottom surface) of the rotor scanner 1520. The plurality of optical writing units may be arranged such that they emit electromagnetic in an axial direction relative to the rotor scanner 150. In at least one example embodiment, the optical writing units may be arranged around the outer edge of the bottom of the rotor scanner 1520. As shown, the rotor scanner 1520 may rotate and/or move along the surface of a workpiece 1510. The width of the rotor scanner 1520 may cover the width of the workpiece 1510. In example embodiments, the rotor scanner may scan the workpiece in a varying direction, and may form a relatively shallow and/or run across the workpiece at an angle such that the arc is not tangent to 0, 45 or 90 degrees. This geometry may be used with thicker and/or non-bendable masks.

Figure 79:
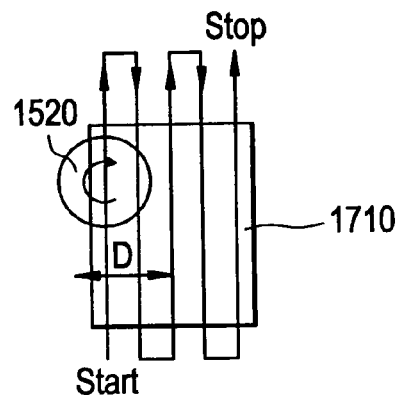
FIG. 79 is a top view of the writing apparatus 1520 shown in FIG. 15.

FIG. 79 is a top view of writing apparatus shown in FIG. 77. Referring to FIG. 79, the diameter D of the rotor scanner 1520 is narrower than the width of the workpiece 1710. In example embodiments, the rotor scanner may track or scan back and forth over the workpiece 1710 so as to cover the entire workpiece 1710. In example embodiments, the rotor scanner 1520 may write continuously regardless of which direction the rotor scanner is moving. In an alternative example embodiment, the rotor scanner may write in a single direction.

Figure 80:
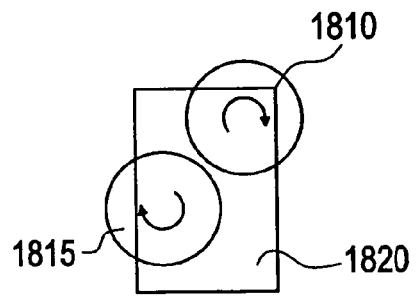
FIG. 80 illustrates a writing apparatus, according to another example embodiment.

FIG. 80 is a top view of a portion of a writing apparatus, according to another example embodiment. The example embodiment of FIG. 80 may be similar or substantially similar to the example embodiment discussed above with regard to FIG. 79, however, the example embodiment of FIG. 80 may include at least two rotor scanners 1810 and 1815. In example embodiments, the rotor scanners 1810 and 1815 may pattern the same workpiece 1820, for example, simultaneously.

Figure 81A:
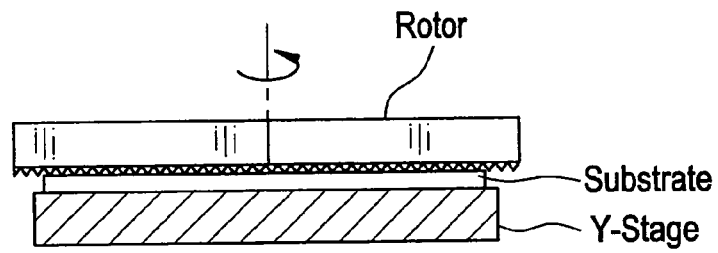
FIG. 81A is a side view of a writing apparatus, according to another example embodiment.
Figure 81B:
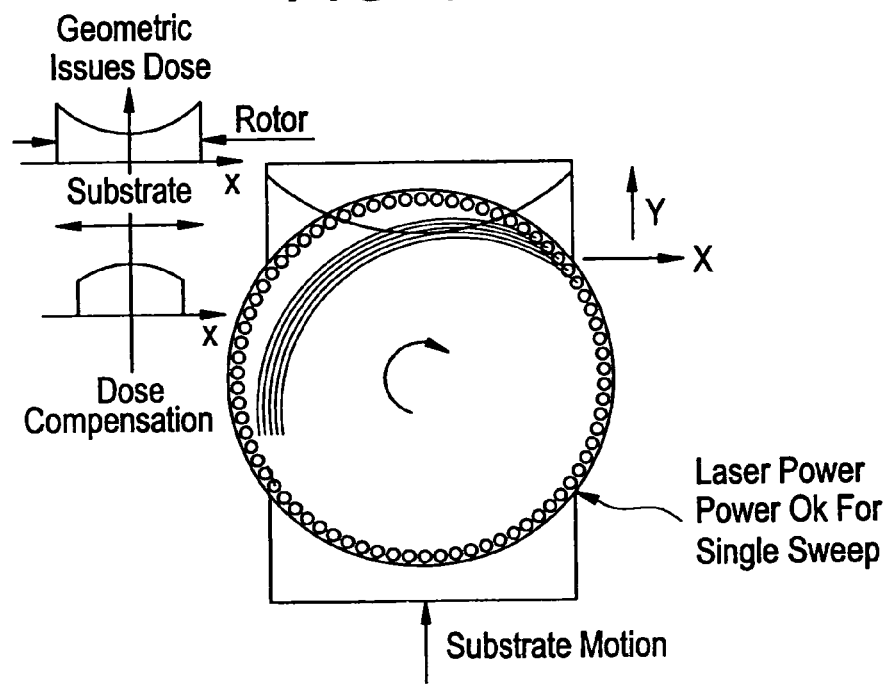
FIG. 81B is a top view of the writing apparatus shown in FIG. 81A.

FIG. 81A illustrates a side view of a rotor scanner according to an example embodiment, and FIG. 81B illustrates a top view of the rotor scanner shown in FIG. 81A. In the example embodiment shown in FIGS. 81A and 81B, the diameter D of the rotor scanner 1520 is greater than the width of the workpiece. The rotor scanner of FIGS. 81A and 81B may track laser diodes at a side of a workpiece in parallel with the workpiece motion. This tracking or scanning illustrated in FIGS. 81A and 81B may result in a higher dose at the sides of the workpiece than the dose in the middle of the workpiece, given that the dose of the laser diodes is the same. This may be compensated for by increasing the dose of the diodes and/or pixels when patterning the center part of the workpiece.

Figure 78:
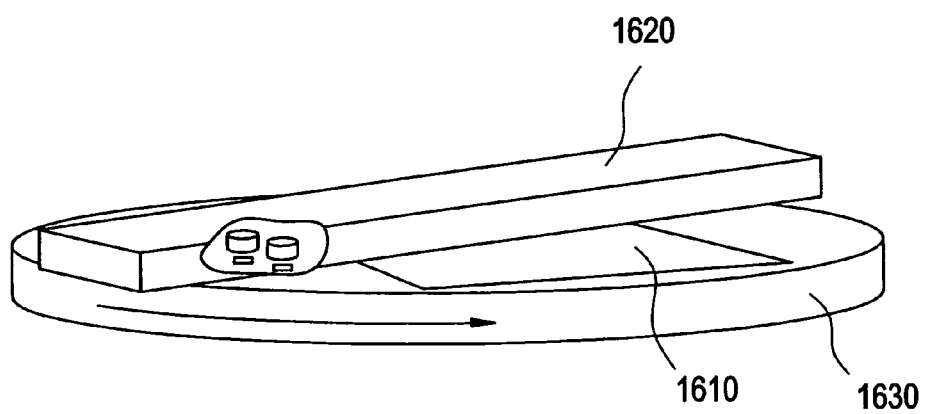
FIG. 78 illustrates a writing apparatus, according to another example embodiment.

FIG. 78 is a perspective view of a writing apparatus, according to another example embodiment.

Referring to FIG. 78, the writing apparatus may include a circular stage 1630 on which a workpiece 1610 may be fixed. A writing head 1620 may be arranged so as to span at least the diameter of the circular stage 1630. The writing head 1620 may include a plurality of optical writing units (not shown) arranged on a surface portion of the writing head, such that electromagnetic radiation emitted by the optical writing heads impinges on the workpiece 1610 during writing. In example operation, the circular stage, and thus, the workpiece 1610 may rotate while the writing head 1620 moves perpendicular to the rotational axis of the circular stage 1610.

Figure 85:
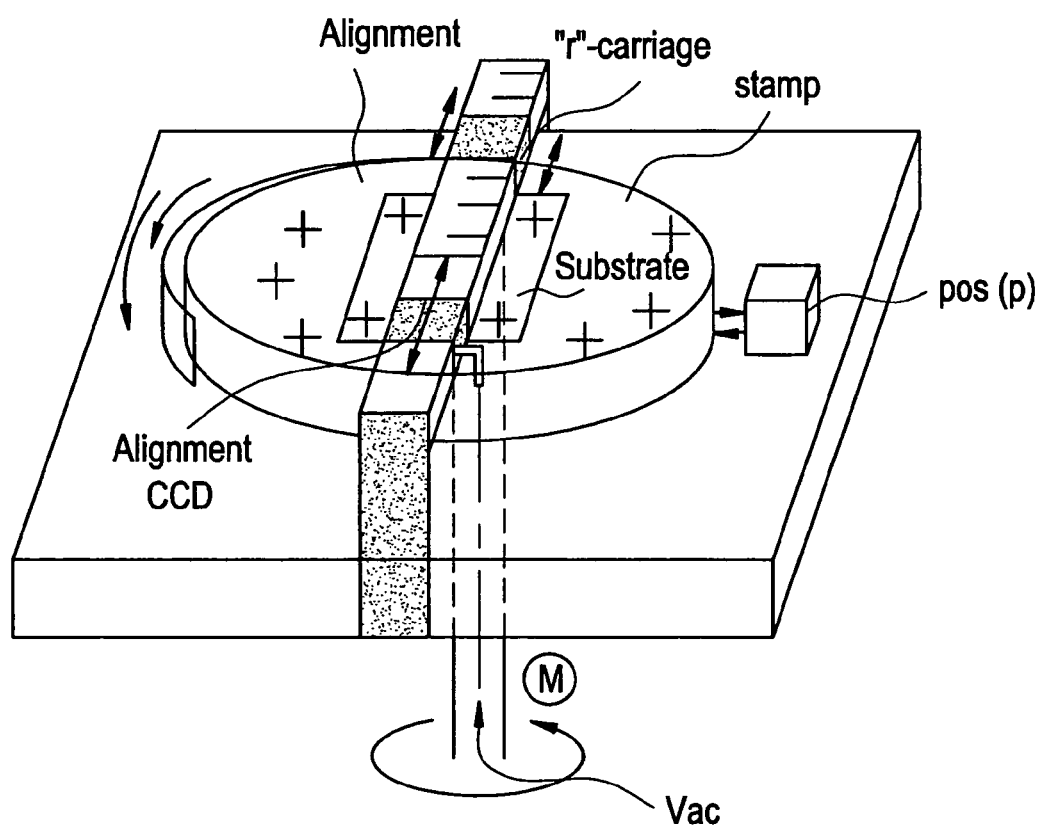
FIG. 85 is a more detailed illustration of the pattern generator shown in FIG. 78.

FIG. 85 is a more detailed illustration of the pattern generator shown in FIG. 78.

Figure 82:
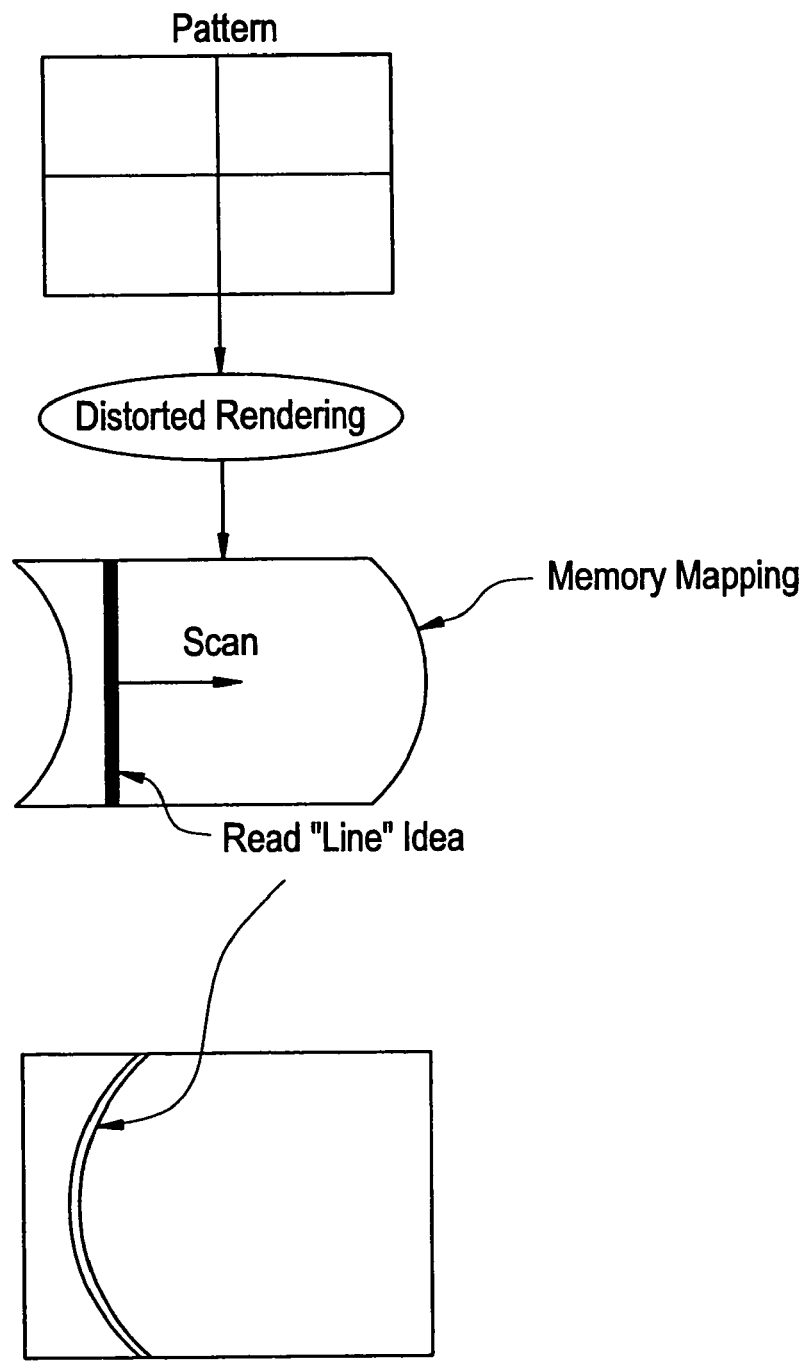
FIG. 82 illustrates a method for transformation of a Cartesian grid into a bent coordinate system, according to an example embodiment.

FIG. 82 illustrates a non-Cartesian coordinate system in a rotor scanner, according to an example embodiment. For example, the coordinate system may be bent. In this example, a memory mapping may be performed before, during or after patterning to transform pixels in the Cartesian grid to pixels in the bent coordinate system defined by the rotating pixels relative to the workpiece. For each circle created by a single pixel in the writing head a transformation may be made from a Cartesian grid into the bent coordinate system FIGS. 87-90 illustrate flatbed platforms, according to example embodiments.

Figure 87:
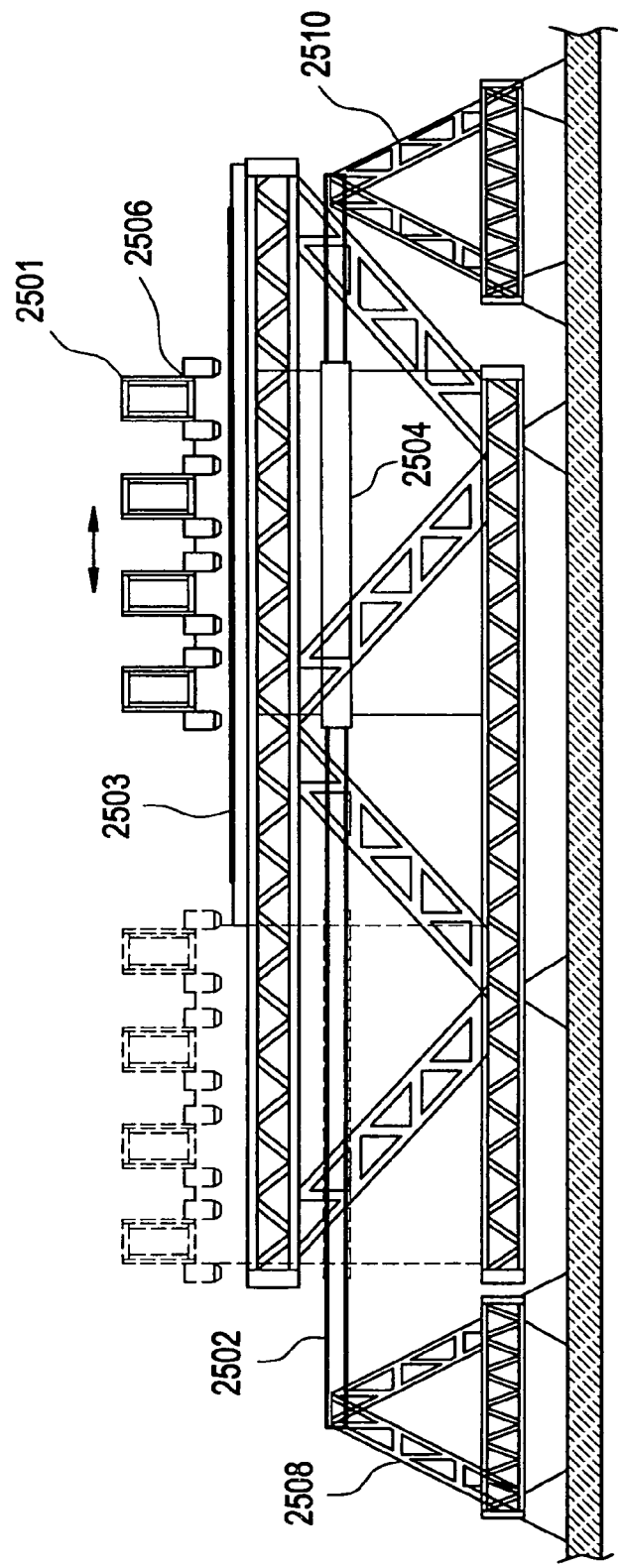
FIGS. 87-90 illustrate flatbed platforms, according to example embodiments.

FIG. 87 illustrates a flatbed platform, according to an example embodiment. The platform shown in FIG. 87 may be a lightweight frame, shown for example purposes as a truss. However, example embodiments may be built with thin walled tubes that may be temperature controlled by fluid (e.g., air, water and/or gas) flowing within the tubes. The frame may provide a more rigid support for a stationary stage top. Writing heads (e.g., mechanical units holding writing optics) may be arranged on mechanical support structures, herein referred to as tool bars, near the surface of the workpiece. At least one toolbar may extend across the stage. Each of the toolbars may include one or more tools (e.g., writing heads). The tools may be mounted or arranged in a similar or substantially similar manner to that as described above with regard to the cylindrical stage. The toolbars may have fixtures or tools (e.g., which may be standardized). The number of toolbars and the tools attached to each toolbar may be configured according to the application and/or need for capacity.

FIG. 87 shows how toolbars 2501 access any point on the workpiece 2503, and how the toolbars may be moved out of the way for loading and unloading. The platform of FIG. 87 may include a linear motor 2504 for driving the toolbar assembly 2506. The linear motor may be attached to a rod 2502 extending between supports 2508 and 2510 standing separately on the floor. A freely moving counter mass (not shown) may be used so that neither part of the linear motor is connected to the ground. The linear motor may move the toolbar assembly 2506 and the counter mass by applying a force there between, while keeping a common, stationary center of gravity.

A separate system including the motor applying a weak force between the ground and the counter mass may keep the counter mass centered within a range of movement.

The moving stage may slide on bearings (e.g., air bearings) and may hold the workpiece using, for example, vacuum, electrostatic force or any other suitable clamping mechanism. The moving stage may more accurately monitor and/or control the position of the stage relative to the coordinate system of the machine. The platform of FIG. 87 may be suitable for many processes, such as, metrology, patterning, etc.

Figure 88:
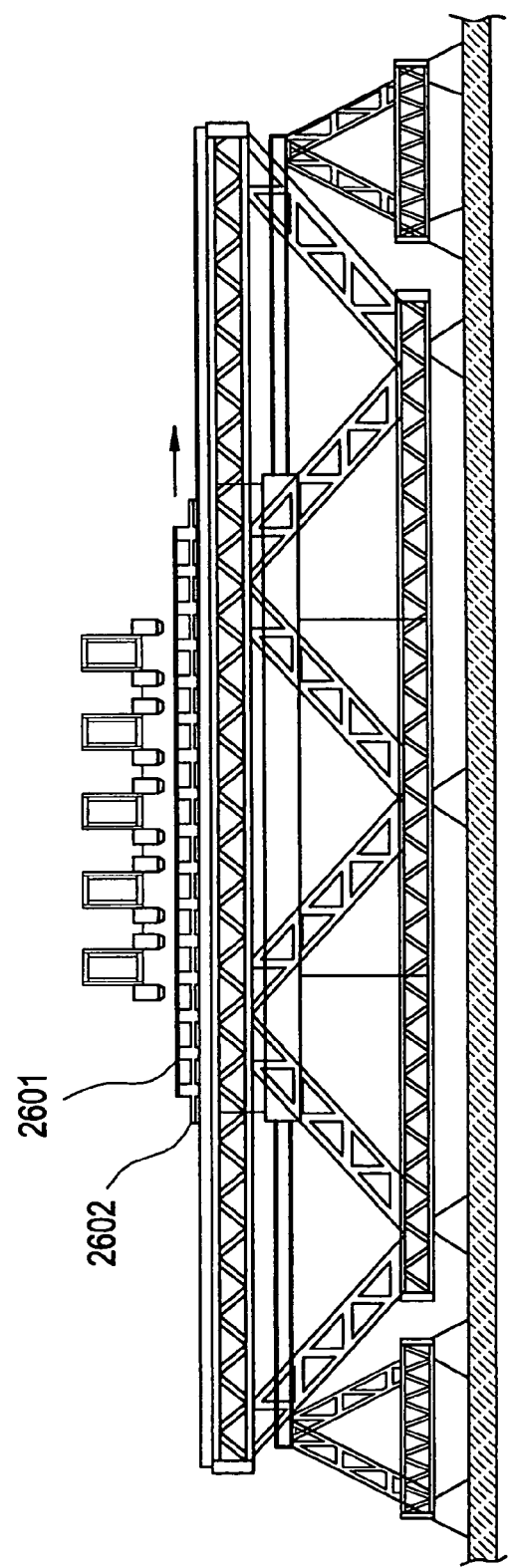

FIG. 88 illustrates a flatbed platform, according to another example embodiment. The example embodiment shown in FIG. 88 may be similar or substantially similar to the flatbed platform of FIG. 87; however, the flatbed platform of FIG. 88 may include a different number of toolbars (e.g., five toolbars) mounted in a fixed position. In this example embodiment, the workpiece 2601 shuttles back and forth on a lightweight shuttle 2602.

Referring to FIG. 88, the stage may be relatively lightweight similar or substantially similar to the shape of the support. The stage may be driven by linear motor and the reaction force from the motor is isolated from the support of the stage either by separate connections to the ground or by a counter mass. The stage may slide on bearings (e.g., air bearings) and may hold the workpiece using vacuum, electrostatic force or any other suitable clamping mechanism.

Figure 89:
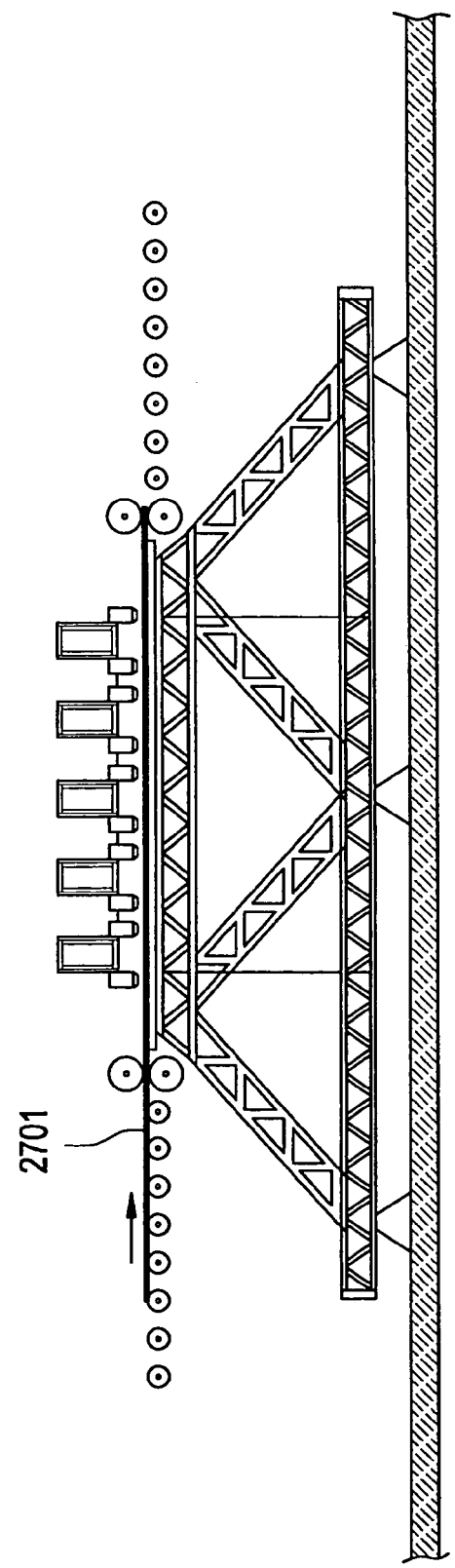

FIG. 89 illustrates another example embodiment in which the workpiece 2701 passes under the tool bars and may be patterned in passing. The workpiece may be in the form of cut sheets or a roll-to-roll endless band. As discussed above, patterning may involve exposure of photoresist, patterning of thermally sensitive resists of films, any photoactivation of the surface, ablation, thermal transfer or any similar processes using reaction to photon energy and/or heat of a light beam. According to at least some example embodiments, light refers to any electromagnetic radiation with a wavelength from EUV (e.g., down to 5 nm) to IR (e.g., up to 20 microns).

Figure 90:
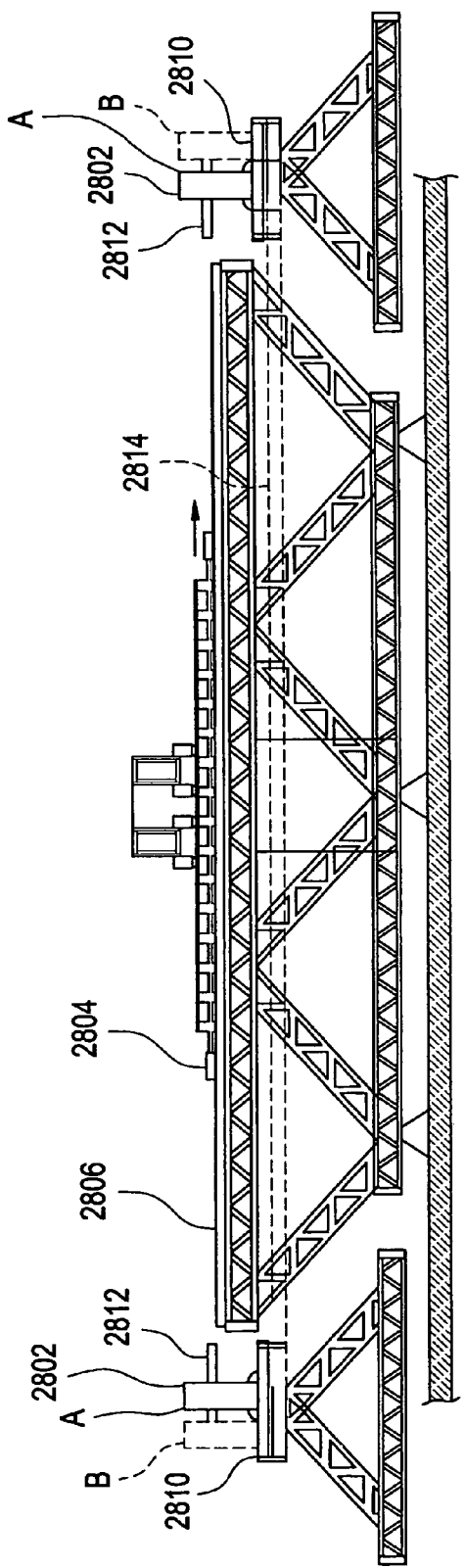

FIG. 90 shows an example operation of a flatbed platform for higher-speed patterning of workpieces, according to an example embodiment. For example purposes, this example operation will be described with regard to FIG. 88; however, other flatbed platforms, according to example embodiments, may operate in similar or substantially similar manners. The platform may have the same or substantially the same type of lightweight board frame and a floating lightweight stage, hereinafter referred to as a "shuttle," 2804.

Referring to FIG. 90, in example operation, the shuttle 2804 may oscillate (e.g., bounce) between counter masses 2802 positioned at each end of the support 2806. The counter masses 2802 may freely move between position A and B via slides 2810, but may be affected by the force of the linear motor. When the shuttle 2804 impacts or hits against a counter mass 2802 the shuttle 2804 loses at least a portion of kinetic energy. The force during the impact may be controlled by spring constants of springs 2812 compressed during the impact. At an end of each stroke, the shuttle 2804 impacts the counter mass 2802. The counter masses 2802 may be joined by a fixed rod 2814 or controlled individually by one or more linear motors.

A linear motor may also be positioned, for example, under the shuttle 2804 and may accelerate the shuttle 2804 toward a first impact when the shuttle 2804 begins moving. The liner motor may also be used to move and stop the shuttle at any position, and/or maintain a constant or substantially constant speed during scanning. The shuttle may operate at a constant speed, moving, for example, to the left or to the right in FIG. 90. The stiffness of the springs 2812 may be selected such that the maximum acceleration is within a desired range, such that the workpiece does not slide on the stage and such that excessive vibrations are not generated in the stage.

In at least some example embodiments, the stage may be comprised of, for example, a leaf spring with pads floating on the support structure and other pads holding the workpiece. With a flexible light-weight shuttle the shape of the stage may be determined by the shape of the supporting surface.

Figure 91:
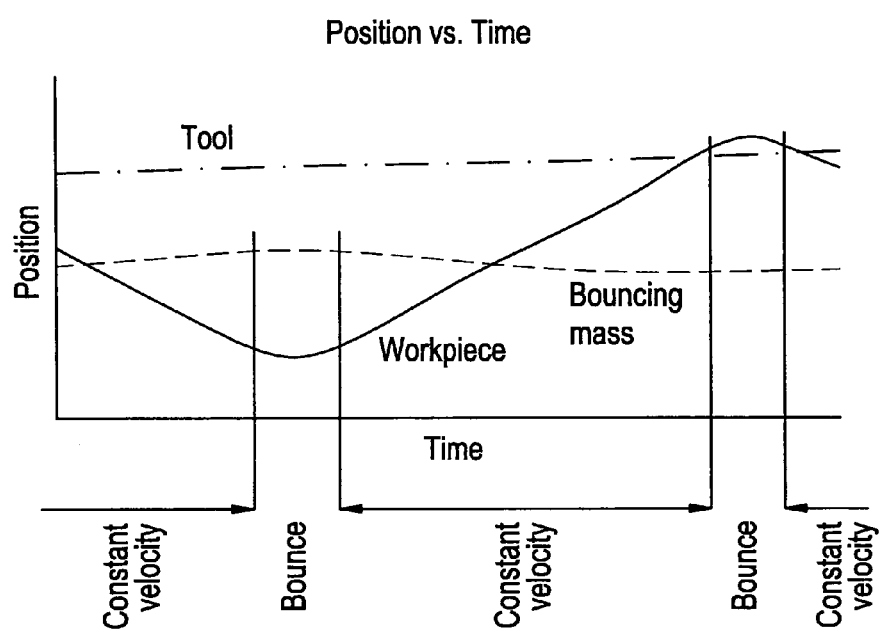
FIG. 91 shows a diagram over the position of the stage and the counter masses during scanning.

FIG. 91 shows a diagram over the position of the stage and the counter masses during scanning. FIG. 91 also shows the position of the tool scanning at a constant speed in the direction perpendicular to the paper. When the stage is scanning to the right an oblique line is traced by the tool across the workpiece and after the bounce and other oblique line is traced with a different angle. With the proper relation between the tool width, the stage speed, and the tool speed two contiguous passes may be written on top of each other. Both passes may have stripes inclined to the scanning axis of the stage which may reduce periodic defects in a pattern as shown.

If the workpiece is about 2.8 m long, accelerating at about 10 g during bounce, and moving at a constant speed of about 6 m/s otherwise, the average scanning speed including bounce-time is approximately 5 m/s. Momentum may be transferred between the counter masses 2802 and the stage, none of which are connected to the supporting structure or to the floor. After the bounce counter mass 2802 recedes with a speed significantly lower than the stage, the linear motor may reduce the speed and reverse the velocity of the counter mass until the next impact with the same counter mass.

If the counter masses 2802 are connected by a rod, or alternatively, if a single counter mass is arranged at the center of the stage is used, the demands on the linear motor may be reduced. In this example, bounces at each end reverse the velocity of the counter mass(es), and the movement of the counter mass may be similar or substantially similar to that of the stage, except slower and with less range.

In one or more example embodiments, patterns may be written on workpieces (e.g., glass sheets, plastic sheets, etc.) used in, for example, electronic display devices such as LCDs. In these example embodiments, a workpiece larger than about 1500 mm may be used. An optical writing head (e.g., a rotor scanner) with a plurality of writing units (e.g., greater than or equal to 5) may be used. A data channel with a data rate (e.g., greater than or equal to 100, 200, 400 Gbits/s, etc.) may provide data, and the workpiece and the optical writing head (or rotor scanner) may be rotated relative to one another in at least one direction. The workpiece and the writing head may also be moved relative to one another in a plane, for example, between 45 and 135 degrees relative to the plane of rotation. For example, in at least one example embodiment, the plane of rotation may be perpendicular to the plane of movement.

Although example embodiments have been described with regard to workpieces, it will be understood that workpieces may be used interchangeably with workpiece. In addition, writing apparatuses, according to example embodiments, may be used in conjunction with conventional pattern generation systems.

According to at least some example embodiments, the written pattern is not sub-divided into stripes. In at least some example embodiments with non-interfering pixels (e.g., FIG. 65A and FIGS. 94G-94K) an image may be built from parallel lines extending from one side of the workpiece to the other.

In some example embodiments, (e.g., FIG. 65A), the lines may be written from edge to edge and in sequence by the writing units. Two adjacent lines may be written by two adjacent writing units thereby reducing (e.g., minimizing) the risk of the workpiece and/or writing head moving by drift and/or mechanical movement from one line to the next. The sequentially written edge-to-edge pattern local errors may be reduced and "Mura" effects may be reduced.

In an example embodiment similar to FIG. 65A, but including more than one ring of writing units (e.g., FIG. 71A) or with an arrangement of writing units or non-interfering pixels as shown, for example, in FIG. 94G-94K the lines may not be sequentially written. However, with multiple writing units distributed around the perimeter of the cylinder, two adjacent lines may still be written by writing units in proximity to one another on the perimeter of the writing head (e.g., within 90° from each other and in relatively close time proximity). In addition, multiple writing units distributed around the perimeter of the cylinder may still limit the freedom for drift and/or vibration between the lines.

In example embodiments using SLMs to form simultaneously contiguous arrays of pixels (e.g., one-dimensional (1D or two-dimensional (2D)) adjacent arrays may be written sequentially and/or in close proximity in time, thereby reducing the stitching areas between the pixel arrays (SLM stamps). Helical scanning with multiple writing units, together with the calibration of writing units against the same calibration sensor, may reduce mismatch between the images from the writing units, whether the images are single points, clusters of non-interfering pixels or dense areas of pixels (SLM stamps).

As shown in FIG. 65B, lines traced by the writing units may be oblique relative to the workpiece. This can be corrected if the workpiece is rotated on its support. However, as described above, obliqueness may be used to reduce "Mura" effects, and thus, an increase in the obliqueness of the traced lines may be desirable. A pixel pattern is defined by the scan lines and may be rotated relative to the axes of the pattern, for example, the pixel pattern of the display devices.

A third coordinate system is defined by the movement of the writing head and the rotation/shuttle movement. If the oblique angle between the pixel grid is changed by rotation of the workpiece on the cylindrical support, all three coordinate systems are rotated relative to each other. In other example embodiments only two of the three coordinate systems are oblique to each other.

FIG. 65C illustrates images created by an SLM during scanning. As shown, the images in FIG. 65C are also rotated relative to the workpiece. As discussed in relation to, for example, FIGS. 94A-94K and/or FIGS. 95A-95E, in this example embodiment, four coordinate systems exist and two, three or all four may be rotated relative to each other to reduce "Mura" effects in the written pattern. Reduction of "mura" by rotation of the various coordinates systems may be used while scanning either cylindrically or in a flat-bed stage. In the circular stages shown in FIG. 77 and/or FIG. 78 the coordinate system of the movements rotate during the stroke from edge-to-edge thus creating a local but non-constant rotation between the coordinate systems.

The helical scanning may be implemented by rotating the workpiece, the writing head, or both, and the workpiece can be inside or outside of the writing head.

Example embodiments of the present invention may be implemented, in software, for example, as a web browser, or any other suitable computer program. For example, a program in accordance with one or more example embodiments of the present invention may be a computer program product causing a computer to execute one or more of the example methods described herein.

The computer program product may include a computer-readable medium having computer program logic or code portions embodied thereon for enabling a processor of the apparatus to perform one or more functions in accordance with one or more of the example methodologies described above. The computer program logic may thus cause the processor to perform one or more of the example methodologies, or one or more functions of a given methodology described herein.

The computer-readable storage medium may be a built-in medium installed inside a computer main body or removable medium arranged so that it can be separated from the computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal (e.g., wireless or terrestrial) embodied in a carrier wave. The computer data signal embodying one or more instructions or functions of an example methodology may be carried on a carrier wave for transmission and/or reception by an entity that executes the instructions or functions of the example methodology. For example, the functions or instructions of the example embodiments may be implemented by processing one or more code segments of the carrier wave, for performing example embodiments of the present invention, as described herein.

Further, such programs, when recorded on computer-readable storage media, may be readily stored and distributed. The storage medium, as it is read by a computer, may enable performance of example embodiments of the present invention as described herein.

The example embodiments of the present invention being thus described, it will be obvious that the same may be varied in many ways. For example, the methods according to example embodiments of the present invention may be implemented in hardware and/or software. The hardware/software implementations may include a combination of processor(s) and article(s) of manufacture. The article(s) of manufacture may further include storage media and executable computer program(s), for example, a web-browser.

Example embodiments of the present invention may be implemented, in software, for example, Example embodiments of the present invention may be implemented, in software, for example, as a web browser, or any other suitable computer program. For example, a program in accordance with one or more example embodiments of the present invention may be a computer program product causing a computer to execute one or more of the example methods described herein.

The computer program product may include a computer-readable medium having computer program logic or code portions embodied thereon for enabling a processor of the apparatus to perform one or more functions in accordance with one or more of the example methodologies described above. The computer program logic may thus cause the processor to perform one or more of the example methodologies, or one or more functions of a given methodology described herein.

The computer-readable storage medium may be a built-in medium installed inside a computer main body or removable medium arranged so that it can be separated from the computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal (e.g., wireless or terrestrial) embodied in a carrier wave. The computer data signal embodying one or more instructions or functions of an example methodology may be carried on a carrier wave for transmission and/or reception by an entity that executes the instructions or functions of the example methodology. For example, the functions or instructions of the example embodiments may be implemented by processing one or more code segments of the carrier wave, for example, in a computer, where instructions or functions may be executed for performing one or more example embodiments of the present invention as described herein.

Further, such programs, when recorded on computer-readable storage media, may be readily stored and distributed. The storage medium, as it is read by a computer, may enable performing of one or more example embodiments of the present invention as described herein.

The example embodiments of the present invention being thus described, it will be obvious that the same may be varied in many ways. For example, the methods according to example embodiments of the present invention may be implemented in hardware and/or software. The hardware/software implementations may include a combination of processor(s) and article(s) of manufacture. The article(s) of manufacture may further include storage media and executable computer program(s), for example, an executable computer program(s), part of externally supplied propagated signal(s), or any other suitable computer program including instructions to perform operations or functions according to example embodiments of the present invention.

The computer program product may include a computer-readable medium having computer program logic or code portions embodied thereon for enabling a processor of the apparatus to perform one or more functions in accordance with one or more of the example methodologies described above. The computer program logic may thus cause the processor to perform one or more of the example methodologies, or one or more functions of a given methodology described herein.

The computer-readable storage medium may be a built-in medium installed inside a computer main body or removable medium arranged so that it can be separated from the computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal (e.g., wireless or terrestrial) embodied in a carrier wave. The computer data signal embodying one or more instructions or functions of an example methodology may be carried on a carrier wave for transmission and/or reception by an entity that executes the instructions or functions of the example methodology. For example, the functions or instructions of the example embodiments may be implemented by processing one or more code segments of the carrier wave, for example, in a computer, where instructions or functions may be executed for one or more example embodiments as described herein.

Further, such programs, when recorded on computer-readable storage media, may be readily stored and distributed. The storage medium, as it is read by a computer, may enable the performance of one or more example embodiments of the present invention as described herein.

Example embodiments of the present invention being thus described, it will be obvious that the same may be varied in many ways. For example, the methods according to example embodiments of the present invention may be implemented in hardware and/or software. The hardware/software implementations may include a combination of processor(s) and article(s) of manufacture. The article(s) of manufacture may further include storage media and executable computer program(s).

The executable computer program(s) may include the instructions to perform the described operations or functions. The computer executable program(s) may also be provided as part of externally supplied propagated signal(s). Such variations are not to be regarded as departure from the spirit and scope of the example embodiments of the present invention, and all such modifications as would be obvious to one skilled in the art are intended to be included within the scope of the following claims.

What is claimed is:

1. A processing platform configured to write a pattern on a nominally flat workpiece larger than about 5 m$^2$ and less than about 1 mm thick, the pattern being defined in a first coordinate system on the workpiece in a flat state, the processing platform comprising:
    at least one writing tool;
    a stage configured to clamp the workpiece to a cylinder, thereby bending the workpiece to a curved state in which the workpiece is to be written when rotated relative to the at least one writing tool;
    a position controller configured to control movements of the at least one writing tool relative to the stage in a second coordinate system on the curved surface of the workpiece;

a metrology system configured to provide metrology information regarding two-dimensional deviations based on an ideal shape of the workpiece, an ideal shape of a surface of the cylinder, and a relative movement between the workpiece and the cylinder; and a processor configured to convert the first coordinate system to the second coordinate system; wherein the processor corrects for the two-dimensional deviations using the metrology information when converting the first coordinate system to the second coordinate system.

2. The processing platform according to claim 1, further comprising:

at least two writing tools aligned to a same workpiece coordinate system with a differential alignment accuracy of at least about one micron.

3. The processing platform according to claim 2, further comprising:

at least two toolbars mounted on the stage, the at least two toolbars including the at least two writing tools, and the at least two toolbars being aligned to the same workpiece coordinate system with a differential alignment accuracy of at least about one micron.

4. The processing platform according to claim 1, further comprising:

at least two writing tools aligned to a same workpiece coordinate system with a differential alignment accuracy of at least about 100 nanometers.

5. The processing platform according to claim 4, further comprising:

at least two toolbars mounted on the stage, the at least two toolbars including the at least two writing tools, and the at least two toolbars being aligned to the same workpiece coordinate system with a differential alignment accuracy of at least about 100 nanometers.

6. The processing platform according to claim 1, further comprising:

a sensor for measuring the position of the workpiece.

7. The processing platform according to claim 6, wherein the at least one writing tool is an optical writing tool for writing the pattern.

8. The processing platform according to claim 7, wherein the pattern written by said optical writing tool is translated depending on a concurrent alignment measurement by the sensor.

9. The processing platform according to claim 7, wherein said pattern is generated by a rasterizer feeding data to the optical writing tool.

10. The processing platform according to claim 7, wherein said pattern comes from a mask.

11. The processing platform according to claim 10, wherein said mask is reduced by a factor between 2 and 5 from the intended printed pattern.

12. The processing platform of claim 1, wherein the second coordinate system is determined based on a measured radius of curvature of the workpiece.

13. The processing platform of claim 1, wherein the second coordinate system is determined based on a measured thickness of the workpiece.

14. The processing platform of claim 1, wherein an offset of a plurality of tools are measured against a common reference.

15. The processing platform of claim 14, wherein at least one camera or detector associated with at least one of the plurality of tools is used to measure the common reference in form of a common fiducial.

16. The processing platform of claim 1, wherein the first coordinate system of the workpiece is aligned to the second coordinate system on the curved surface by introduction of a common coordinate system.

17. The processing platform of claim 1, wherein the at least one writing tool is aligned to the second coordinate system by the introduction of a common coordinate system.

18. The processing platform of claim 1, wherein a conversion of coordinates of the first coordinate system to the second coordinate system includes at least one of an angle and a tool distance along an axis of the stage to cylindrical coordinates.

19. The processing platform of claim 1, wherein the coordinates of the first coordinate system are converted to coordinates, or control parameters, for both the second coordinate system and the at least one writing tool.

20. The processing platform of claim 1, wherein the stage is adapted to the writing of a pattern on the workpiece during the bending of the workpiece.

21. The processing platform of claim 20, wherein the stage is adapted to bend the workpiece to fully or partially cylinder-shape during writing.

22. The processing platform of claim 1, wherein the processor is configured to determine and integrate a dilation tensor over the surface of the workpiece to determine the distortion.

* * * * *